US008795944B2

(12) United States Patent
Saegusa et al.

(10) Patent No.: US 8,795,944 B2

(45) Date of Patent: *Aug. 5, 2014

(54) ACTINIC RAY-SENSITIVE OR RADIATION-SENSITIVE RESIN COMPOSITION AND PATTERN FORMING METHOD USING THE COMPOSITION

(75) Inventors: Hiroshi Saegusa, Shizuoka (JP); Kaoru Iwato, Shizuoka (JP); Shuji Hirano, Shizuoka (JP); Yusuke Iizuka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 96 days.

This patent is subject to a terminal disclaimer.

(21) Appl. No.: 13/139,193

(22) PCT Filed: Dec. 11, 2009

(86) PCT No.: PCT/JP2009/071068

§ 371 (c)(1), (2), (4) Date: Jun. 10, 2011

(87) PCT Pub. No.: WO2010/067898

PCT Pub. Date: Jun. 17, 2010

(65) Prior Publication Data

US 2011/0318687 A1 Dec. 29, 2011

Related U.S. Application Data

(60) Provisional application No. 61/122,166, filed on Dec. 12, 2008, provisional application No. 61/122,185, filed on Dec. 12, 2008.

(30) Foreign Application Priority Data

| | | |
|---|---|---|
| Dec. 12, 2008 | (JP) | 2008-317751 |
| Dec. 12, 2008 | (JP) | 2008-317752 |
| Dec. 12, 2008 | (JP) | 2008-317753 |
| Dec. 12, 2008 | (JP) | 2008-317754 |
| Mar. 6, 2009 | (JP) | 2009-054291 |
| Apr. 3, 2009 | (JP) | 2009-091616 |
| May 20, 2009 | (JP) | 2009-122470 |
| May 29, 2009 | (JP) | 2009-131275 |
| Jul. 15, 2009 | (JP) | 2009-167004 |
| Oct. 30, 2009 | (JP) | 2009-251478 |

(51) Int. Cl.

| | |
|---|---|
| ***G03F 7/004*** | (2006.01) |
| ***G03F 7/028*** | (2006.01) |
| ***G03F 7/039*** | (2006.01) |
| ***G03F 7/26*** | (2006.01) |

(52) U.S. Cl.

USPC ........ 430/270.1; 430/326; 430/907; 430/910; 430/921; 430/925

(58) Field of Classification Search

USPC ............... 430/270.1, 326, 907, 910, 921, 925

See application file for complete search history.

(56) References Cited

U.S. PATENT DOCUMENTS

| | | | | |
|---|---|---|---|---|
| 2003/0194644 | A1 | 10/2003 | Hatakeyama et al. | |
| 2004/0241580 | A1* | 12/2004 | Nishimura et al. | 430/270.1 |
| 2005/0287473 | A1 | 12/2005 | Kodama | |
| 2007/0059639 | A1* | 3/2007 | Kanda et al. | 430/270.1 |
| 2007/0128555 | A1 | 6/2007 | Harada et al. | |
| 2007/0148595 | A1 | 6/2007 | Kanda | |
| 2007/0160929 | A1 | 7/2007 | Hasegawa et al. | |
| 2007/0178405 | A1 | 8/2007 | Kanda et al. | |
| 2007/0218401 | A1* | 9/2007 | Ando et al. | 430/270.1 |
| 2008/0118860 | A1* | 5/2008 | Harada et al. | 430/270.1 |
| 2008/0305433 | A1 | 12/2008 | Kanda et al. | |
| 2009/0069521 | A1 | 3/2009 | Nagai et al. | |
| 2009/0098485 | A1 | 4/2009 | Kanda | |
| 2009/0197204 | A1 | 8/2009 | Shiono et al. | |
| 2010/0324329 | A1 | 12/2010 | Nagai et al. | |
| 2011/0236828 | A1* | 9/2011 | Hirano et al. | 430/270.1 |
| 2012/0077125 | A1 | 3/2012 | Shiono et al. | |

FOREIGN PATENT DOCUMENTS

| | | | |
|---|---|---|---|
| EP | 1720072 | A1 | 11/2006 |
| EP | 1764652 | A2 | 3/2007 |
| EP | 1804120 | A1 | 7/2007 |
| EP | 1 975 705 | * | 10/2008 |
| JP | 2002-003533 | A | 1/2002 |
| JP | 2004-004697 | A | 1/2004 |
| JP | 2005-326609 | A | 11/2005 |
| JP | 2006-146143 | A | 6/2006 |
| JP | 2006-171667 | A | 6/2006 |
| JP | 2006-309245 | A | 11/2006 |
| JP | 2007-153982 | A | 6/2007 |
| JP | 2007-182488 | A | 7/2007 |
| JP | 2007-199709 | A | 8/2007 |
| JP | 2007-304537 | A | 11/2007 |
| JP | 2007-304545 | A | 11/2007 |
| JP | 2008-111103 | A | 5/2008 |
| JP | 2008-231059 | A | 10/2008 |
| JP | 2010-032994 | A | 2/2010 |
| WO | 2006/121096 | A1 | 11/2006 |

OTHER PUBLICATIONS

International Search Report (PCT/ISA/210) issued on Jan. 12, 2010 in the PCT Application No. PCT/JP2009/071068.

Written Opinion (PCT/ISA/237) issued on Jan. 12, 2010 in the PCT Application No. PCT/JP2009/071068.

Office Action dated Oct. 29, 2013, issued by the Japanese Patent Office in corresponding Application No. 2009-281055.

Office Action dated Feb. 12, 2014 issued by the Japanese Patent Office in counterpart Japanese Patent Application No. 2009-281056.

Office Action dated Feb. 4, 2014 issued by the Japanese Patent Office in counterpart Japanese Patent Application No. 2009-281057.

* cited by examiner

*Primary Examiner* — Anca Eoff

(74) *Attorney, Agent, or Firm* — Sughrue Mion, PLLC

(57) ABSTRACT

Provided is an actinic ray-sensitive or radiation-sensitive resin composition including: (A) a resin capable of increasing the solubility in an alkali developer by the action of an acid, (B) a compound capable of generating an acid upon irradiation with an actinic ray or radiation, and (C) a resin which contains (c) a repeating unit having at least one polarity conversion group and has at least either a fluorine atom or a silicon atom.

28 Claims, No Drawings

ACTINIC RAY-SENSITIVE OR RADIATION-SENSITIVE RESIN COMPOSITION AND PATTERN FORMING METHOD USING THE COMPOSITION

TECHNICAL FIELD

The present invention relates to an actinic ray-sensitive or radiation-sensitive resin composition, that is, an actinic ray-sensitive or radiation-sensitive resin composition for use in the production process of a semiconductor such as IC or in the lithography process for the production of a circuit board of liquid crystal, thermal head and the like or for other photofabrications, and a pattern forming method using the composition. More specifically, the present invention relates to a resist composition suitable for exposure by an immersion projection exposure apparatus using a light source that emits a far ultraviolet ray at a wavelength of 300 nm or less, a resin for use in the resist composition, and a pattern forming method using the positive resist composition for use in the synthesis of the resin.

BACKGROUND ART

Along with miniaturization of a semiconductor device, the trend is moving into a shorter wavelength of the exposure light source and a higher numerical aperture (higher NA) of the projection lens, and a so-called immersion method of filling a high refractive-index liquid (hereinafter sometimes referred to as an "immersion liquid") between the projection lens and the sample is known with an attempt to raise the resolution by more shortening the wavelength. The immersion method is effective for all pattern profiles and furthermore, can be combined with the super-resolution technology under study at present, such as phase-shift method and modified illumination method.

Since the advent of a resist for KrF excimer laser (248 nm), an image forming method called chemical amplification is used as an image forming method for a resist so as to compensate for sensitivity reduction caused by light absorption. For example, the image forming method by positive chemical amplification is an image forming method of decomposing an acid generator in the exposed area upon exposure to produce an acid, converting an alkali-insoluble group into an alkali-soluble group by using the generated acid as a reaction catalyst in the baking after exposure (PEB: Post Exposure Bake), and removing the exposed area by alkali development.

The resist for ArF excimer laser (193 nm) using this chemical amplification mechanism is predominating at present, but when the resist is immersion-exposed, this involves a pattern collapse problem of causing collapse of the formed line pattern to give rise to a defect at the production of a device, or the performance in terms of line edge roughness of the pattern side wall being roughened is not satisfied yet.

Also, it is pointed out that when the chemically amplified resist is applied to immersion exposure, the resist layer comes into contact with the immersion liquid at the exposure, as a result, the resist layer deteriorates or a component adversely affecting the immersion liquid bleeds out from the resist layer. To solve this problem, in JP-A-2006-309245 (the term "JP-A" as used herein means an "unexamined published Japanese patent application"), JP-A-2007-304537, JP-A-2007-182488 and JP-A-2007-153982, there is described a case of preventing the bleed-out by adding a resin containing a silicon atom or a fluorine atom In addition, as a resist material ensuring little change of profile at the dry exposure and the immersion exposure and being excellent in the process applicability, JP-A-2008-111103 discloses a resist having added thereto a specific polymer compound having a fluorine atom and a lactone structure.

Furthermore, in the immersion exposure process, when the exposure is performed using a scanning-type immersion exposure machine, unless the immersion liquid moves following the movement of lens, the exposure speed decreases and this may affect the productivity. In the case where the immersion liquid is water, the resist film is preferably hydrophobic because of good flowability of water.

In addition, even when immersion exposure is performed using the above-described technique, it is demanded to more reduce a development defect called BLOB defect or generation of a scum.

SUMMARY OF INVENTION

An object of the present invention is to provide an actinic ray-sensitive or radiation-sensitive resin composition capable of forming a resist pattern improved in the elution of generated acid, line edge roughness, development defect and scum generation and assured of good followability for the immersion liquid at the immersion exposure, and a pattern forming method using the actinic ray-sensitive or radiation-sensitive resin composition.

As a result of intensive studies to attain the above-described object, the present inventors have accomplished the present invention.

<1> An actinic ray-sensitive or radiation-sensitive resin composition comprising:

(A) a resin capable of increasing the solubility in an alkali developer by the action of an acid, (B) a compound capable of generating an acid upon irradiation with an actinic ray or radiation, and (C) a resin which contains (c) a repeating unit having at least one polarity conversion group and has at least either a fluorine atom or a silicon atom.

<2> The actinic ray-sensitive or radiation-sensitive resin composition as described in <1> above, wherein the repeating unit (c) has at least either a fluorine atom or a silicon atom.

<3> The actinic ray-sensitive or radiation-sensitive resin composition as described in <1> or <2> above, wherein the repeating unit (c) has at least one of partial structures represented by the following formulae (KA-1) and (KB-1), and the polarity conversion group is represented by X in the partial structure represented by the formula (KA-1) or (KB-1):

(KA-1)

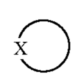

(KB-1)

$$Y^1—X—Y^2$$

wherein

X represents any one of a carboxylic acid ester, an acid anhydride, an acid imide, a carboxylic acid thioester, a carbonic acid ester, a sulfuric acid ester and a sulfonic acid ester, and each of $Y^1$ and $Y^2$, which may be the same or different, represents an electron-withdrawing group.

<4> The actinic ray-sensitive or radiation-sensitive resin composition as described in any one of <1> to <3> above, wherein the repeating unit (c) contains at least one of partial structures represented by the following formulae (KA-1-1) to (KA-1-17):

KA-1-1

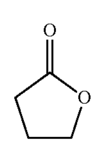

-continued
KA-1-2
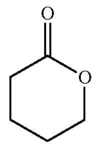
KA-1-3
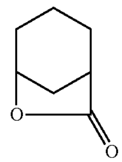
KA-1-4
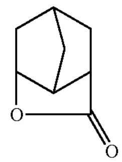
KA-1-5
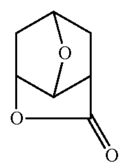
KA-1-6
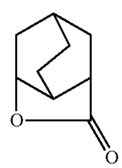
KA-1-7
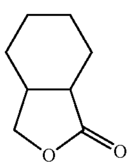
KA-1-8
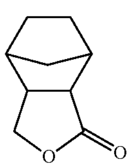
KA-1-9
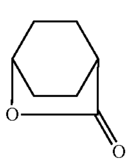
KA-1-10
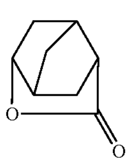
-continued
KA-1-11
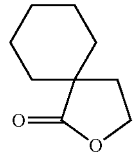
KA-1-12
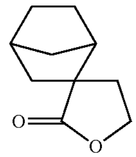
KA-1-13
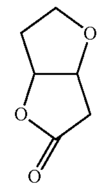
KA-1-14
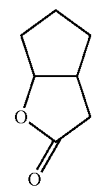
KA-1-15
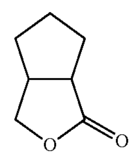
KA-1-16
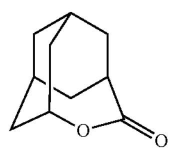
KA-1-17
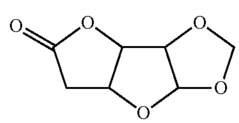
<5> The actinic ray-sensitive or radiation-sensitive resin composition as described in any one of <1> to <4> above, wherein
the repeating unit (c) has at least one group represented by any of the following formulae (F2) to (F4) and formulae (CS-1) to (CS-3):
(F2)
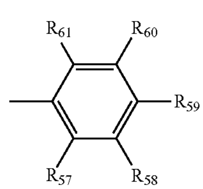

-continued (F3)

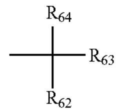

(F4)

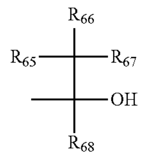

wherein each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or a fluoroalkyl group, and $R_{62}$ and $R_{63}$ may combine with each other to form a ring;

(CS-1)

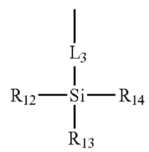

(CS-2)

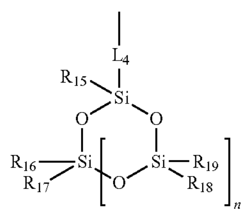

(CS-3)

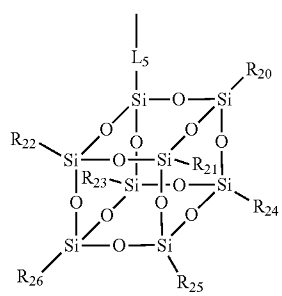

wherein each of $R_{12}$ to $R_{26}$ independently represents an alkyl group or a cycloalkyl group, each of $L_3$ to $L_5$ represents a single bond or a divalent linking group, and n represents an integer of 1 to 5.

<6> The actinic ray-sensitive or radiation-sensitive resin composition as described in any one of <1> to <5> above, wherein the resin (A) contains a repeating unit represented by the following formula (3):

(3)

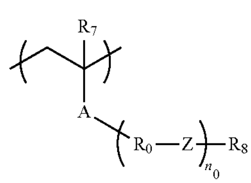

wherein

A represents an ester bond (—COO—) or an amide bond (—CONH—), $R_0$ represents an alkylene group, a cycloalkylene group or a combination thereof, and when a plurality of $R_0$'s are present, each $R_0$ may be the same as or different from every other $R_0$, Z represents an ether bond, an ester bond, a carbonyl bond, an amide bond, a urethane bond or a urea bond, and when a plurality of Z's are present, each Z may be the same as or different from every other Z, $R_8$ represents a monovalent organic group having a lactone structure, $n_0$ is a repetition number of the structure represented by —$R_0$—Z— in the repeating unit represented by the formula (3) and represents an integer of 1 to 5, and $R_7$ represents a hydrogen atom, a halogen atom or an alkyl group.

<7> The actinic ray-sensitive or radiation-sensitive resin composition as described in any one of <1> to <6> above, wherein the acid generated from the compound (B) upon irradiation with an actinic ray or radiation has a molecular weight of 300 or more and contains a monocyclic or polycyclic, alicyclic or aromatic ring which may contain a heteroatom.

<8> The actinic ray-sensitive or radiation-sensitive resin composition as described in any one of <1> to <7> above, wherein the content of the resin (C) is from 0.1 to 10 mass % based on the entire solid content of the actinic ray-sensitive or radiation-sensitive resin composition.

<9> The actinic ray-sensitive or radiation-sensitive resin composition as described in any one of <1> to <8> above, wherein with respect to a photosensitive film formed from the actinic ray-sensitive or radiation-sensitive resin composition, the receding contact angle with water is 70° or more.

<10> A resist film formed from the actinic ray-sensitive or radiation-sensitive resin composition described in any one of <1> to <9> above.

<11> A pattern forming method comprising steps of immersion-exposing and developing the resist film described in <10> above.

DESCRIPTION OF EMBODIMENTS

The present invention is described in detail below.

Incidentally, in the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present invention, the term "actinic ray" or "radiation" indicates, for example, a bright line spectrum of mercury lamp, a far ultraviolet ray typified by excimer laser, an extreme-ultraviolet ray, an X-ray or an electron beam. Also, in the present invention, the "light" means an actinic ray or radiation.

Furthermore, in the present invention, unless otherwise indicated, the "exposure" includes not only exposure with a mercury lamp, a far ultraviolet ray typified by excimer laser, an X-ray, EUV light or the like but also lithography with a particle beam such as electron beam and ion beam.

[1] (A) Resin Capable of Increasing the Solubility in an Alkali Developer by the Action of an Acid The resin (A) is a resin capable of increasing the solubility in an alkali developer by the action of an acid, and this is a resin having a group capable of decomposing by the action of an acid to produce an alkali-soluble group (hereinafter sometimes referred to as an "acid-decomposable group"), on either one or both of the main chain and the side chain of the resin.

The acid-decomposable group preferably has a structure where an alkali-soluble group is protected by a group capable of decomposing and leaving by the action of an acid.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Among these alkali-soluble groups, preferred are a carboxyl group, a fluorinated alcohol group (preferably hexafluoroisopropanol) and a sulfonic acid group.

The group preferred as the acid-decomposable group is a group where a hydrogen atom of such an alkali-soluble group is replaced by a group capable of leaving by the action of an acid.

Examples of the group capable of leaving by the action of an acid include —$C(R_{36})(R_{37})(R_{38})$ and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The resin (A) preferably contains a repeating unit having an acid-decomposable group. The repeating unit having an acid-decomposable group is preferably a repeating unit represented by the following formula (AI):

(AI)

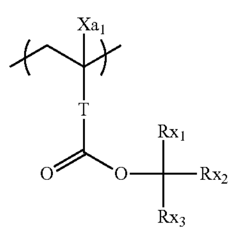

In formula (AI), $Xa_1$ represents a hydrogen atom, a methyl group which may have a substituent, or a group represented by —$CH_2$—$R_9$. $R_9$ represents a hydroxyl group or a monovalent organic group, and the monovalent organic group includes, for example, an alkyl group having a carbon number of 5 or less and an acyl group and is preferably an alkyl group having a carbon number of 3 or less, more preferably a methyl group. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

An embodiment where $Rx_1$ is a methyl group or an ethyl group and $Rx_2$ and $Rx_3$ are combined to form the above-described cycloalkyl group is preferred.

The repeating unit having an acid-decomposable group preferably has a monocyclic or polycyclic acid-decomposable group. The mono cyclic acid-decomposable group includes a case where as described above, any one of $Rx_1$ to $Rx_3$ is a monocyclic cycloalkyl group, and a case where two members out of $Rx_1$ to $Rx_3$ are combined to form a monocyclic cycloalkyl group, and the monocyclic cycloalkyl group is preferably a cyclopentyl group or a cyclohexyl group. The polycyclic acid-decomposable group includes a case where any one of $Rx_1$ to $Rx_3$ is a polycyclic cycloalkyl group, and a case where two members out of $Rx_1$ to $Rx_3$ are combined to form a polycyclic cycloalkyl group, and the polycyclic cycloalkyl group is preferably a norbornyl group, a tetracyclodecanyl group, a tetracyclododecanyl group or an adamantyl group.

Each of these groups may have a substituent, and examples of the substituent include an alkyl group (preferably having a carbon number of 1 to 4), a halogen atom, a hydroxyl group, an alkoxy group (preferably having a carbon number of 1 to 4), a carboxyl group and an alkoxycarbonyl group (preferably having a carbon number of 2 to 6). The carbon number of the substituent is preferably 8 or less.

The content of the repeating unit having an acid-decomposable group is preferably from 20 to 50 mol %, more preferably from 25 to 45 mol %, based on all repeating units in the resin (A).

Specific preferred examples of the repeating unit having an acid-decomposable group are set forth below, but the present invention is not limited thereto.

(In formulae, Rx represents H, $CH_3$, $CF_3$ or $CH_2OH$, and each of Rxa and Rxb represents an alkyl group having a carbon number of 1 to 4.)

1

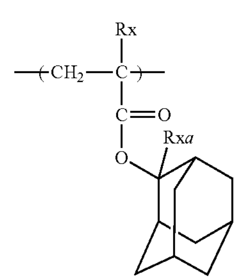

-continued
2
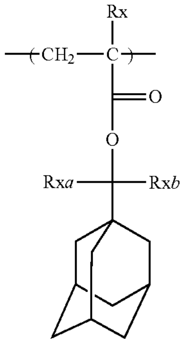
3
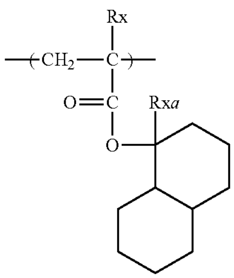
4
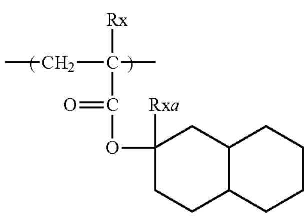
5
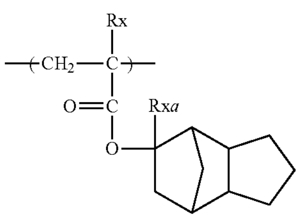
6
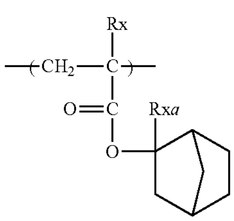
7
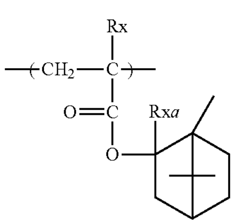
-continued
8
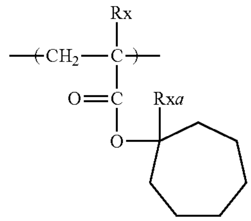
9
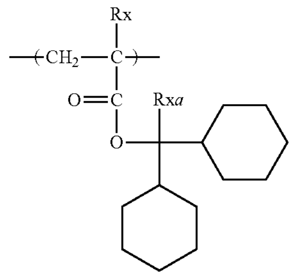
10
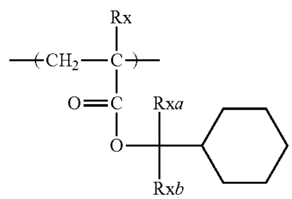
11
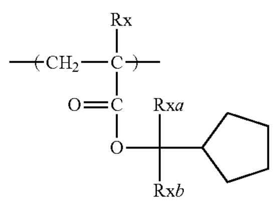
12
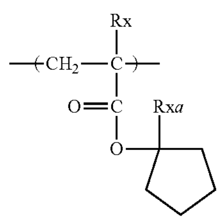
13
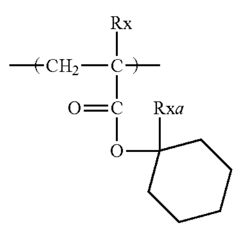
14
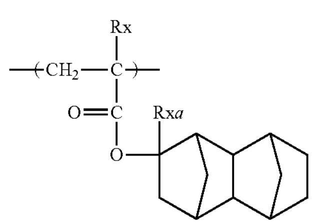

-continued
15
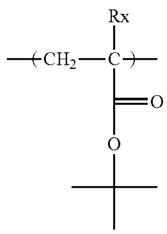
16
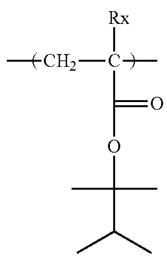
17
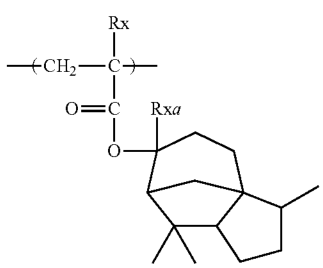
18
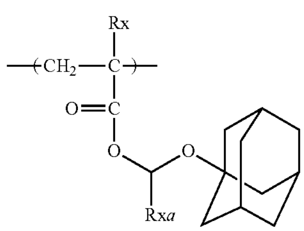
19
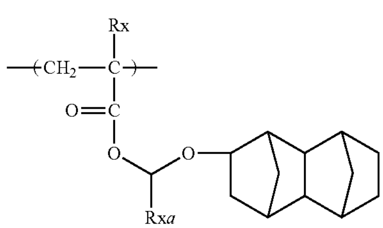
20
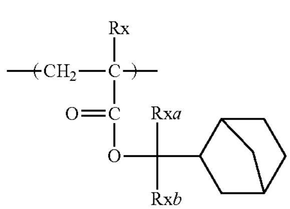
-continued
21
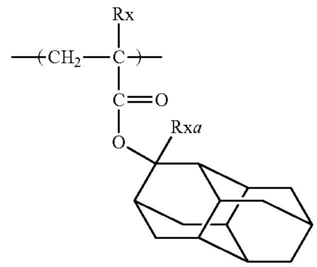
22
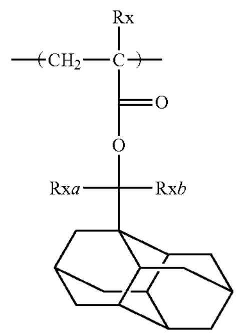
23
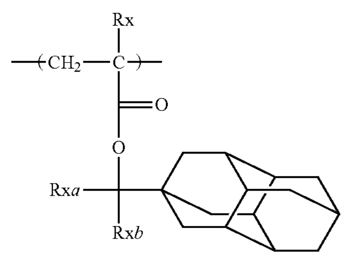
24
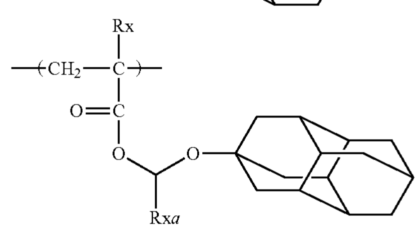
25
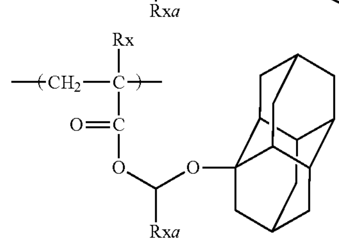
In the following formulae, $Xa_1$ represents H, $CH_3$, $CF_3$ or $CH_2OH$.
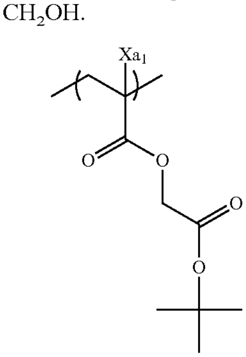
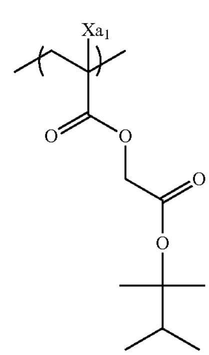

-continued
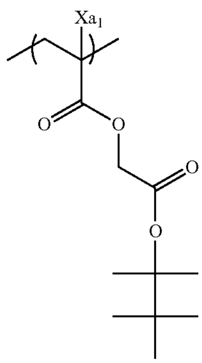
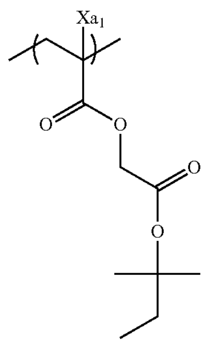
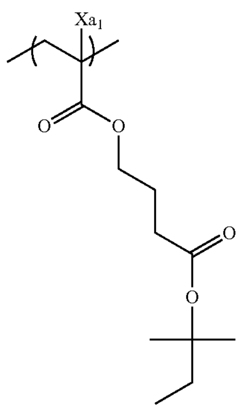
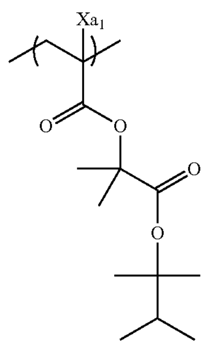
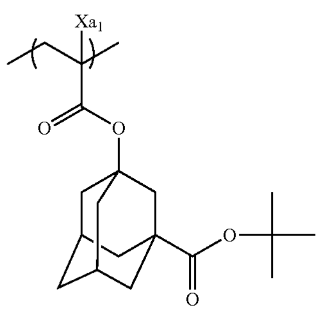
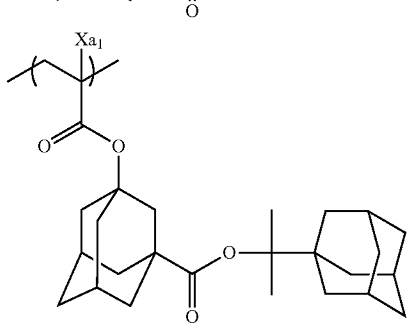
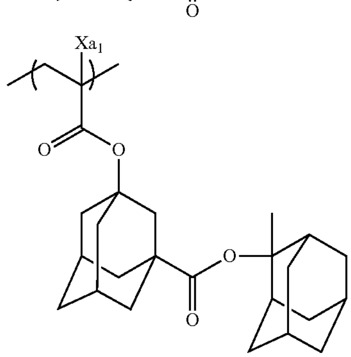
-continued
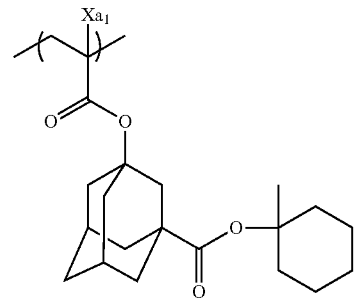
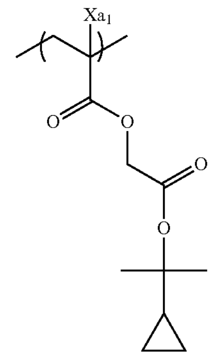
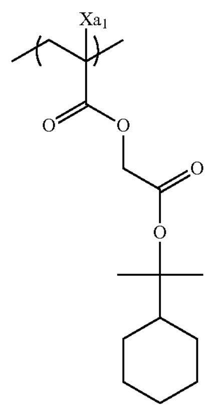
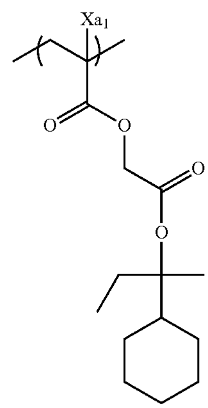
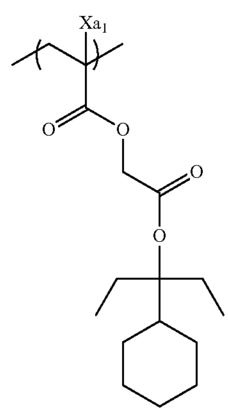
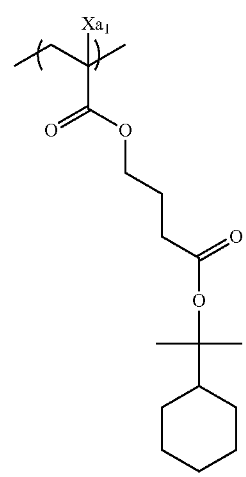
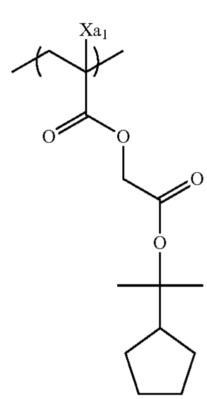
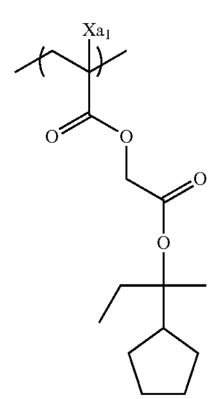

-continued
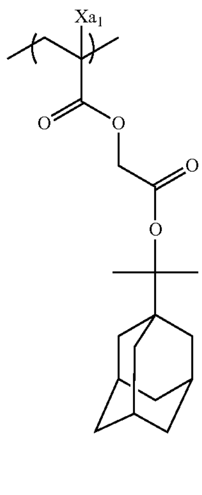
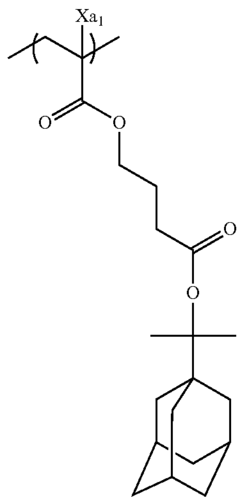
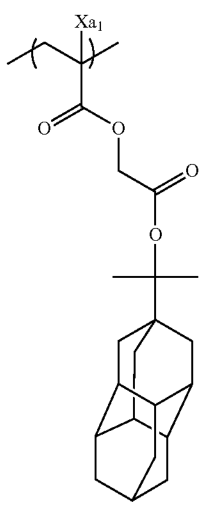
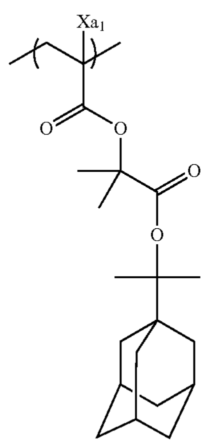
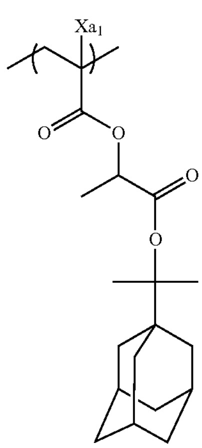
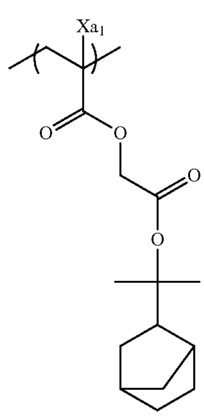
-continued
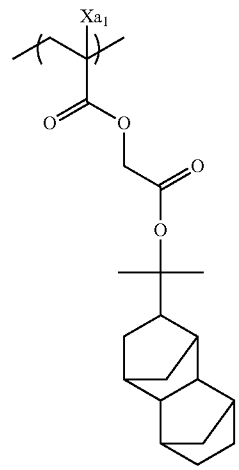
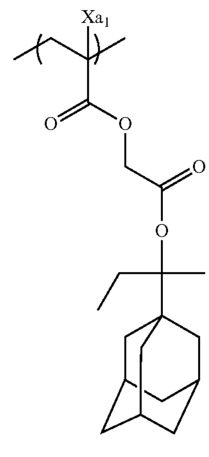
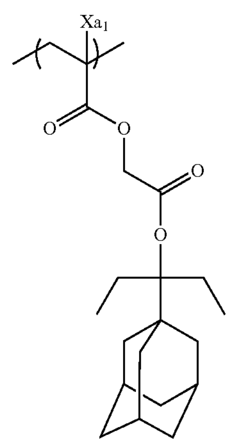
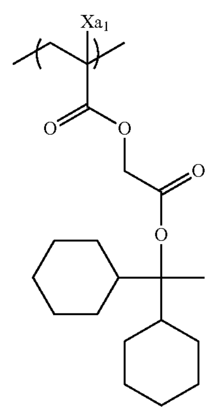
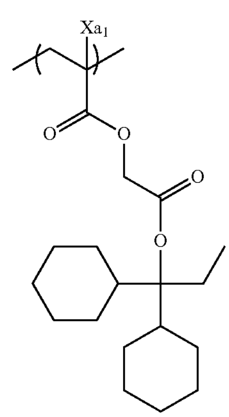

-continued

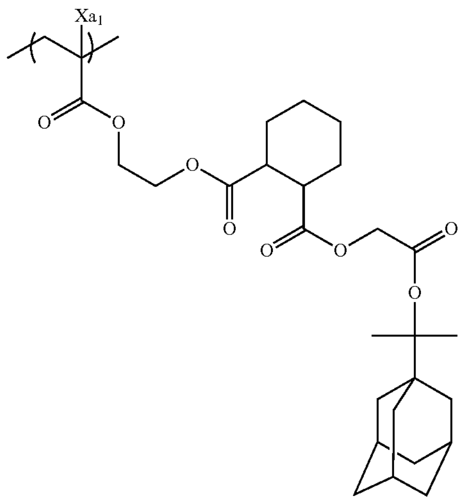

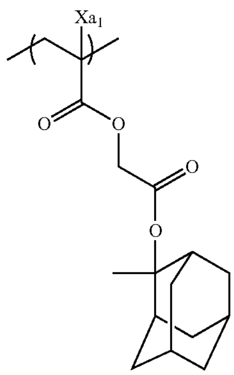

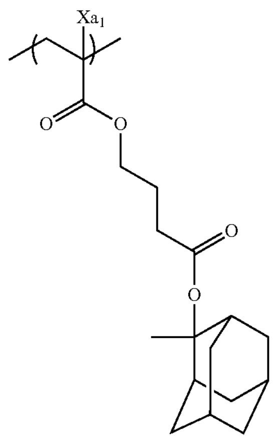

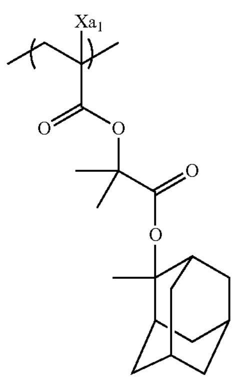

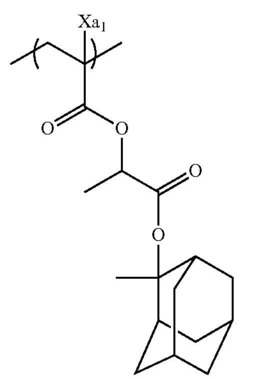

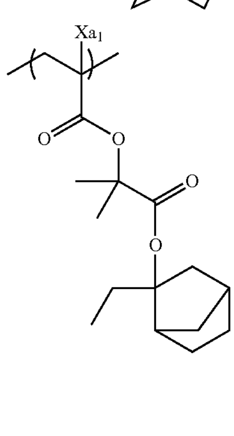

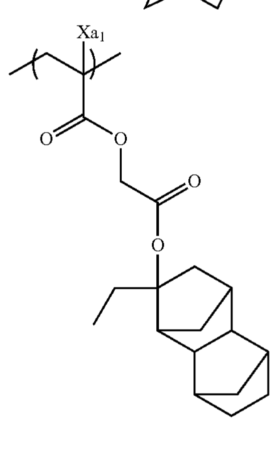

-continued

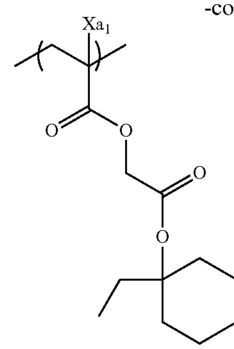

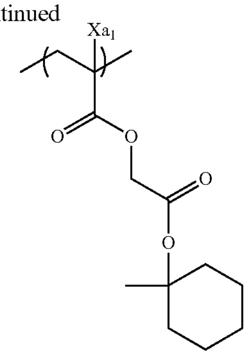

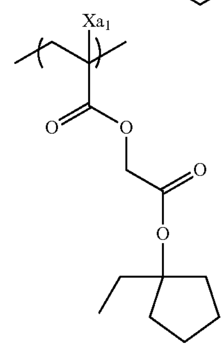

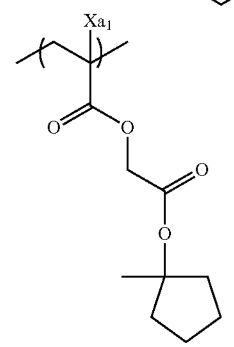

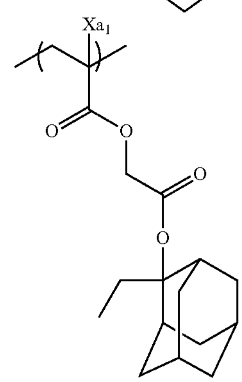

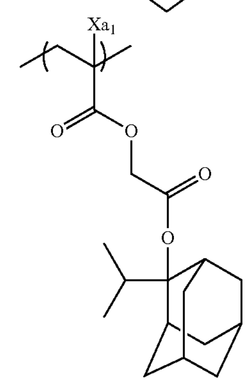

The resin (A) is more preferably a resin having, as the repeating unit represented by formula (AI), at least either a repeating unit represented by formula (1) or a repeating unit represented by formula (2).

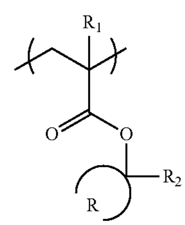

(1)

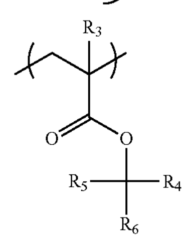

(2)

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

$R_1$ is preferably a hydrogen atom, a methyl group, a trifluoromethyl group or a hydroxymethyl group.

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R is preferably a monocyclic alicyclic structure, and the carbon number thereof is preferably from 3 to 7, more preferably 5 or 6.

$R_3$ is preferably a hydrogen atom or a methyl group, more preferably a methyl group.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Specific examples and preferred examples of the organic group or $R_9$ are the same as those described for $R_9$ of formula (AI).

Examples of the repeating unit represented by formula (1) include a repeating unit represented by the following formula (1-1). In the formula, $R_1$ and $R_2$ have the same meanings as those in formula (1).

(1-1)

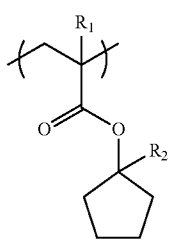

The repeating unit represented by formula (2) is preferably a repeating unit represented by the following formula (2-1):

(2-1)

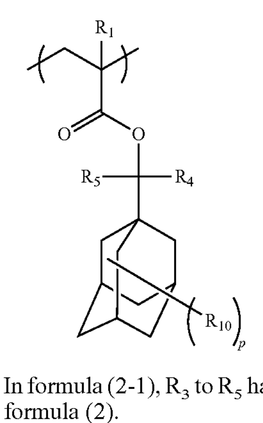

In formula (2-1), $R_3$ to $R_5$ have the same meanings as those in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a polar group itself such as hydroxyl group, cyano group, amino group, alkylamide group and sulfonamide group, and a linear or branched alkyl group or cycloalkyl group having such a polar group. The polar group-containing substituent is preferably an alkyl group having a hydroxyl group, more preferably a branched alkyl group having a hydroxyl group, and the branched alkyl group is preferably an isopropyl group.

p represents an integer of 0 to 15. p is preferably an integer of 0 to 2, more preferably 0 or 1.

The resin (A) may contain a plurality of acid-decomposable group-containing repeating units.

As described above, the resin (A) is preferably a resin containing, as the repeating unit represented by formula (AI), at least either one of a repeating unit represented by formula (1) and a repeating unit represented by formula (2). In another embodiment, the resin (A) is preferably a resin containing, as the repeating unit represented by formula (AI), at least two kinds of repeating units represented by formula (1) or both a repeating unit represented by formula (1) and a repeating unit represented by formula (2).

Also, the resist composition of the present invention may contain a plurality of kinds of resins (A), and the acid-decomposable group-containing repeating units contained in the plurality of resins (A) may be different from each other. For example, a resin (A) containing a repeating unit represented by formula (1) and a resin (A) containing a repeating unit represented by formula (2) may be used in combination.

Preferred examples of the combination when the resin (A) contains a plurality of acid-decomposable group-containing repeating units and when a plurality of resins (A) contain different acid-decomposable group-containing repeating units, are set forth below. In the formulae below, each R independently represents a hydrogen atom or a methyl group.

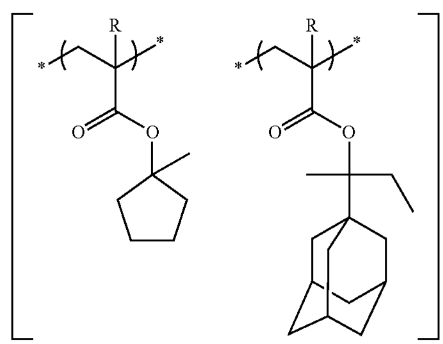

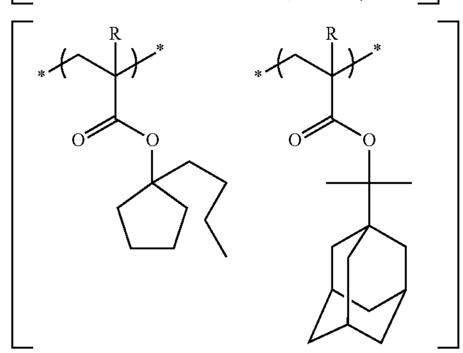

-continued
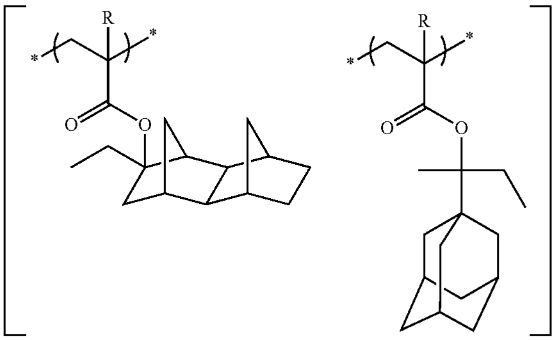
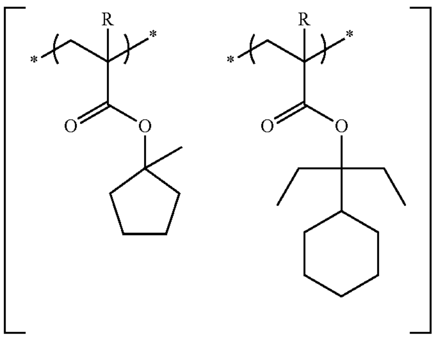
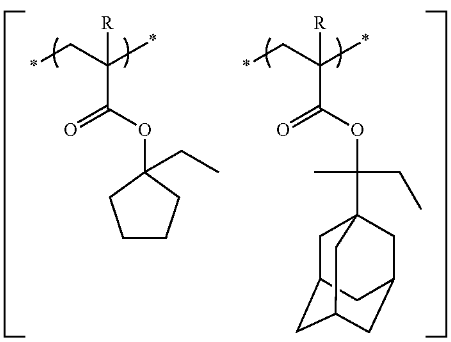
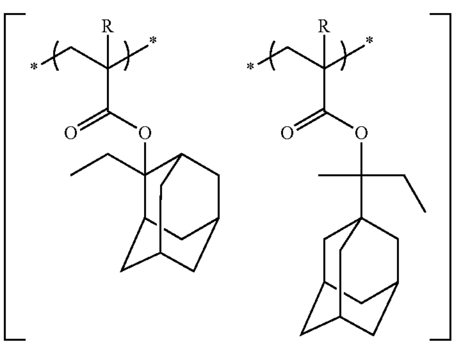
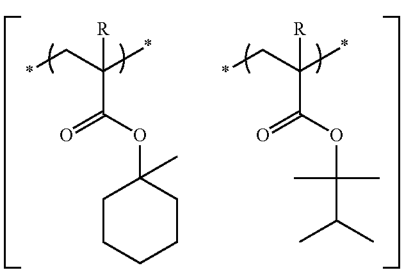
-continued
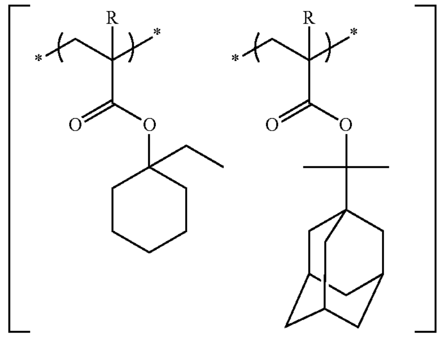
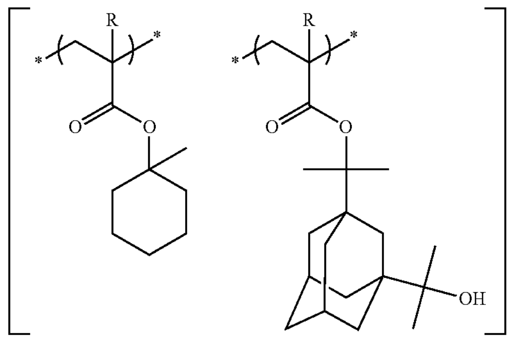
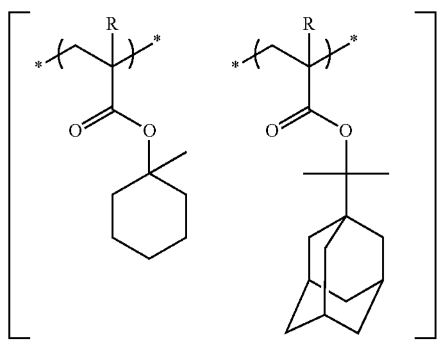
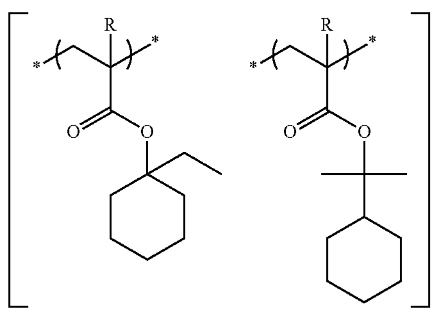
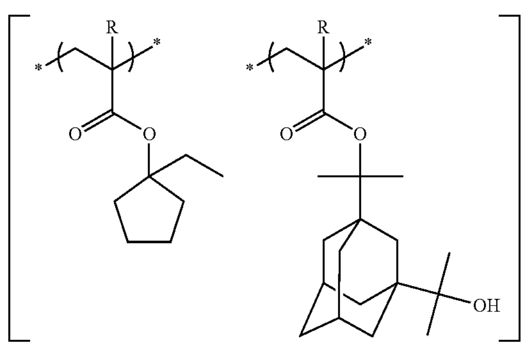

-continued
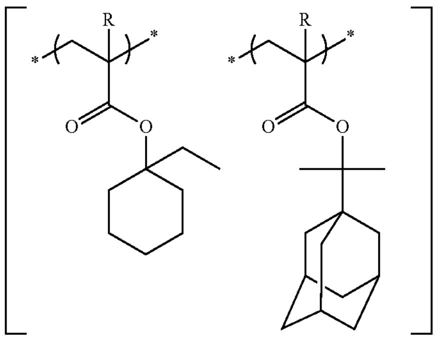
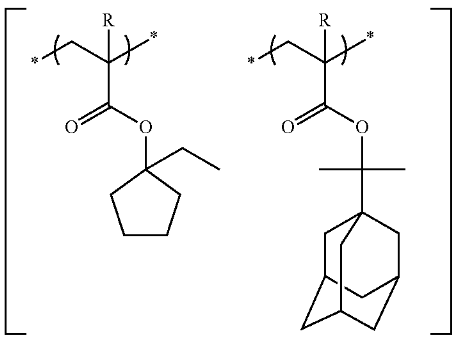
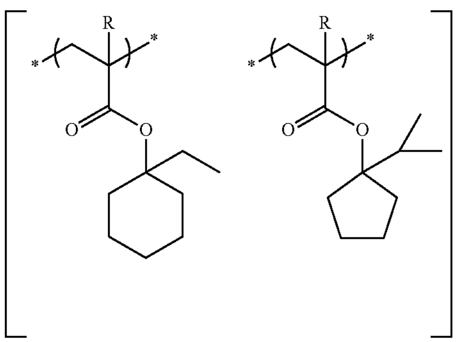
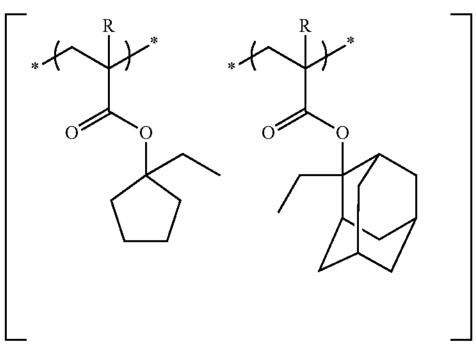
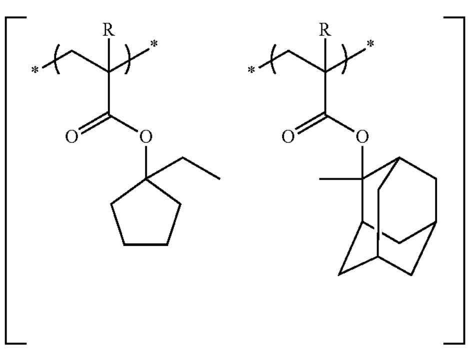
-continued
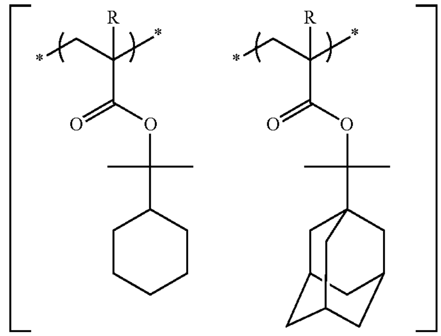
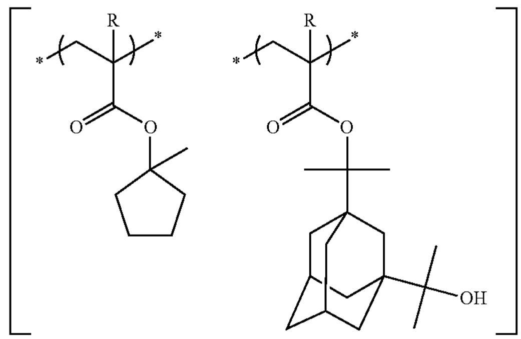
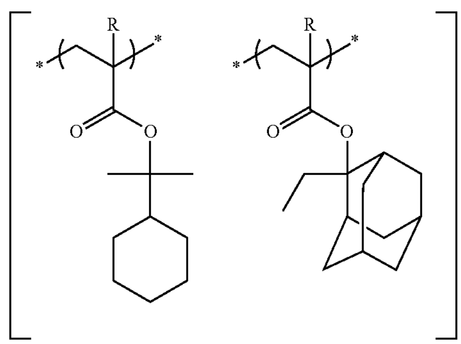
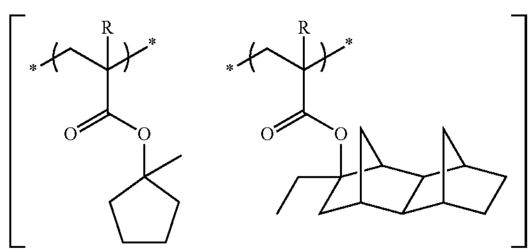
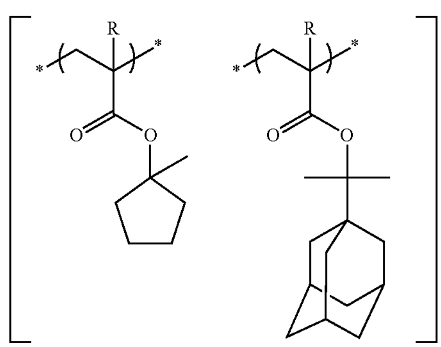

-continued

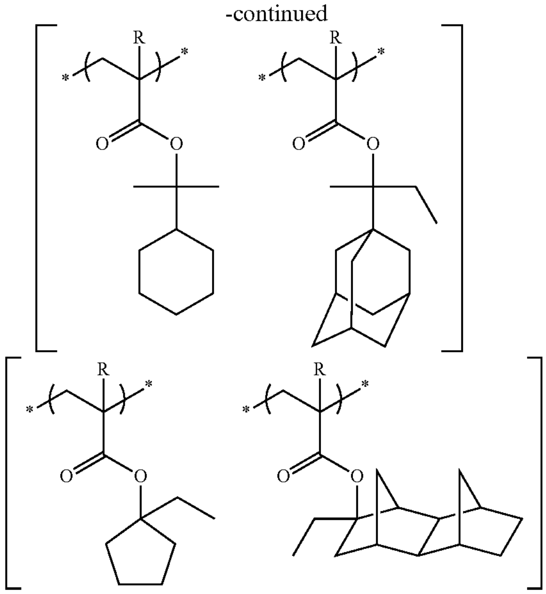

The resin (A) preferably contains a repeating unit having at least one kind of a group selected from a lactone group, a hydroxyl group, a cyano group and an alkali-soluble group.

The lactone group-containing repeating unit that can be contained in the resin (A) is described below.

As for the lactone group, any group may be used as long as it has a lactone structure, but the lactone structure is preferably a 5- to 7-membered ring lactone structure, and a structure where another ring structure is condensed to the 5- to 7-membered ring lactone structure in the form of forming a bicyclo or spiro structure is preferred. The resin more preferably contains a repeating unit having a lactone structure represented by any one of the following formulae (LC1-1) to (LC1-17). The lactone structure may be bonded directly to the main chain. Among these lactone structures, preferred are (LC1-1), (LC1-4), (LC1-5), (LC1-6), (LC1-13), (LC1-14) and (LC1-17). By virtue of using a specific lactone structure, the line edge roughness and development defect are improved.

LC1-1

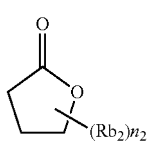

LC1-2

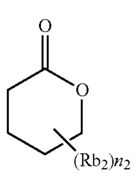

LC1-3

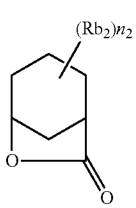

-continued

LC1-4

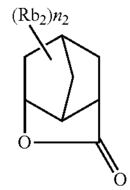

LC1-5

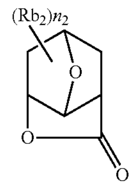

LC1-6

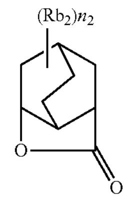

LC1-7

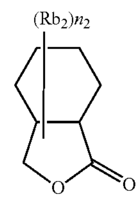

LC1-8

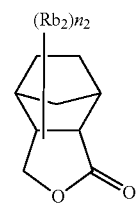

LC1-9

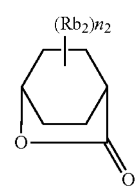

LC1-10

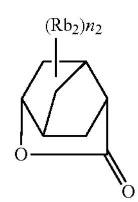

LC1-11

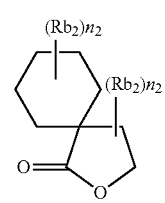

-continued

LC1-12

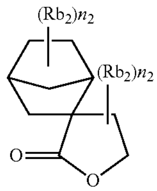

LC1-13

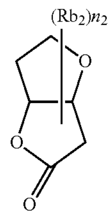

LC1-14

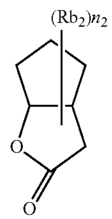

LC1-15

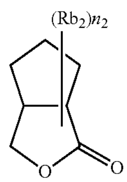

LC1-16

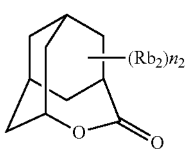

LC1-17

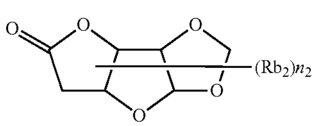

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent ($Rb_2$) and also, one substituent ($Rb_2$) may combine with another substituent ($Rb_2$) to form a ring.

The repeating unit having a lactone structure represented by any one of formulae (LC1-1) to (LC1-17) includes a repeating unit represented by the following formula (AII):

(AII)

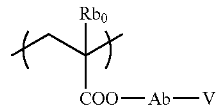

In formula (AII), $Rb_0$ represents a hydrogen atom, a halogen atom or an alkyl group having a carbon number of 1 to 4 which may have a substituent. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group comprising a combination thereof, and is preferably a single bond or a divalent linking group represented by $-Ab_1-CO_2-$.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a lactone structure and specifically includes a group having a structure represented by any one of formulae (LC1-1) to (LC1-17).

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The content of the repeating unit having a lactone group is preferably from 15 to 60 mol %, more preferably from 20 to 50 mol %, still more preferably from 30 to 50 mol %, based on all repeating units in the resin (A).

Out of the units represented by formula (AII), when Ab is a single bond, the repeating unit having a particularly preferred lactone group includes the repeating units shown below. By selecting an optimal lactone group, the pattern profile and the iso/dense bias are improved.

Rx represents a hydrogen atom, an alkyl group which may have a substituent, or a halogen atom and is preferably a hydrogen atom, a methyl group or an alkyl group having a substituent, that is, a hydroxymethyl group or an acethyloxymethyl group.

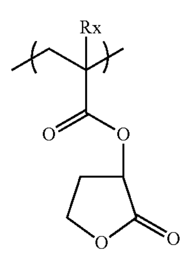

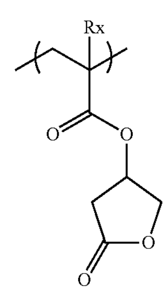

-continued

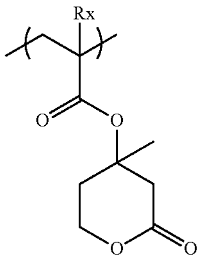

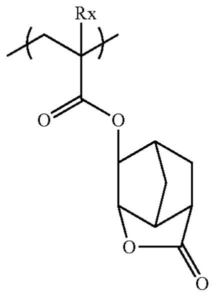

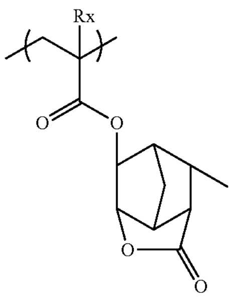

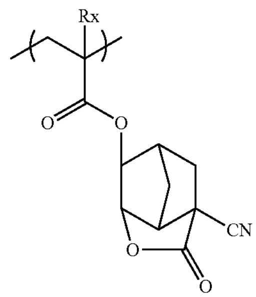

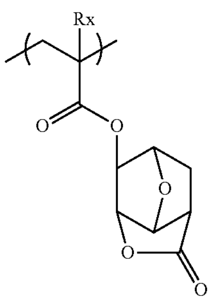

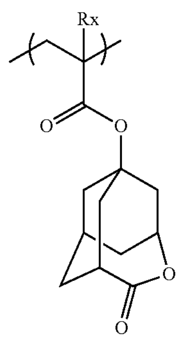

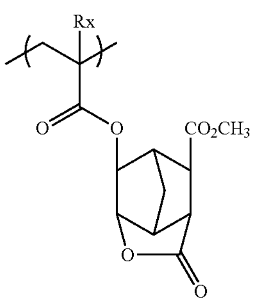

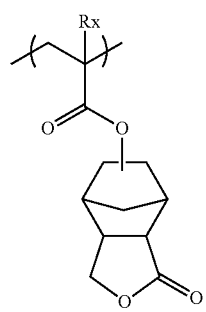

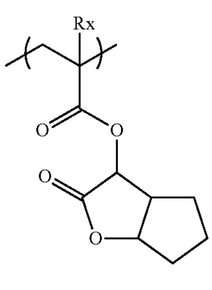

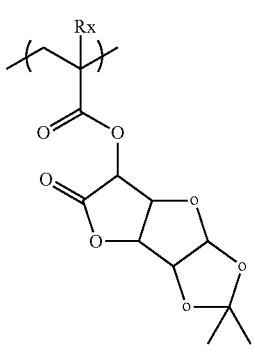

-continued

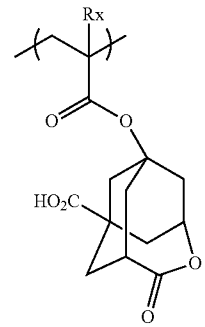

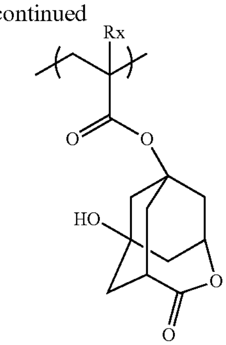

In particular, for more enhancing the effects of the present invention, the resin (A) preferably contains a lactone structure-containing repeating unit represented by the following formula (3):

(3)

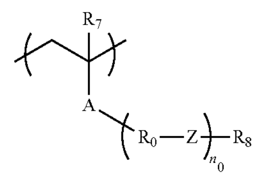

In formula (3), A represents an ester bond (—COO—) or an amide bond (—CONH—).

$R_0$ represents, when a plurality of $R_0$'s are present, each independently represents, an alkylene group, a cycloalkylene group or a combination thereof.

Z represents, when a plurality of Z's are present, each independently represents, an ether bond, an ester bond, a carbonyl bond, an amide bond, a urethane bond or a urea bond.

$R_8$ represents a monovalent organic group having a lactone structure.

$n_0$ is a repetition number of the structure represented by $—R_0—Z—$ in the repeating unit represented by formula (3) and represents an integer of 1 to 5.

$R_7$ represents a hydrogen atom, a halogen atom or an alkyl group which may have a substituent.

Each of the alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group. The alkyl group in $R_7$ may be substituted, and examples of the substituent include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, and an acyloxy group such as acetyloxy group and propionyloxy group. $R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably from 1 to 5, and examples thereof include a methylene group, an ethylene group and a propylene group. The cycloalkylene is preferably a cycloalkylene having a carbon number of 3 to 20, and examples thereof include cyclohexylene, cyclopentylene, norbornylene and adamantylene. For bringing out the effects of the present invention, a chain alkylene group is more preferred, and a methylene group is especially preferred.

The lactone structure-containing substituent represented by $R_8$ is not limited as long as it has a lactone structure. Specific examples thereof include lactone structures represented by formulae (LC1-1) to (LC1-17) and of these, a structure represented by (LC1-4) is preferred. Structures where $n_2$ in (LC1-1) to (LC1-17) is an integer of 2 or less are more preferred.

$R_8$ is preferably a monovalent organic group having an unsubstituted lactone structure or a monovalent organic group containing a lactone structure having a methyl group, a cyano group or an alkoxycarbonyl group as the substituent, more preferably a monovalent organic group containing a lactone structure having a cyano group as the substituent (cyanolactone).

Specific examples of the lactone structure-containing repeating unit represented by the following formula (3) are set forth below, but the present invention is not limited thereto.

In the following specific examples, R represents a hydrogen atom, an alkyl group which may have a substituent, or a halogen atom and is preferably a hydrogen atom, a methyl group or an alkyl group having a substituent, that is, a hydroxymethyl group or an acetyloxymethyl group.

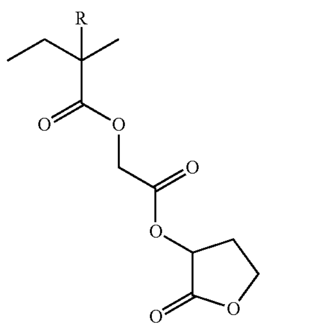

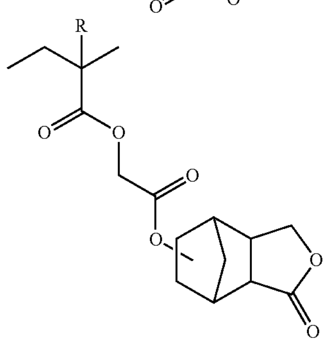

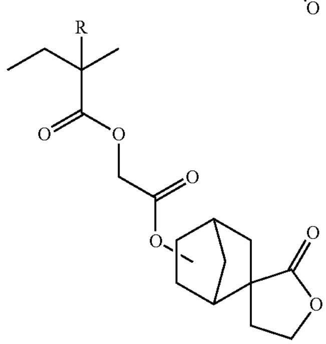

-continued

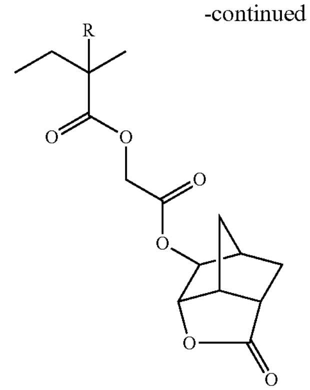

The lactone structure-containing repeating unit is preferably a repeating unit represented by the following formula (3-1):

(3-1)

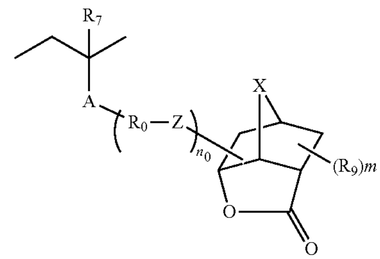

In formula (3-1), $R_7$, A, $R_0$, Z and $n_0$ have the same meanings as in formula (3).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. Examples of the cycloalkyl group include a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group and a butoxy group. These groups may have a substituent, and examples of the substituent include a hydroxy group, an alkoxy group such as methoxy group and ethoxy group, a cyano group, and a halogen atom such as fluorine atom.

$R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is an integer of 1 or more, at least one $R_9$ is preferably substituted at the α-position or β-position, more preferably at the α-position, of the carbonyl group of lactone Specific examples of the repeating unit having a lactone structure-containing group represented by formula (3-1) are set forth below, but the present invention is not limited thereto. In the formulae, R represents a hydrogen atom, an alkyl group which may have a substituent, or a halogen atom and is preferably a hydrogen atom, a methyl group or an alkyl group having a substituent, that is, a hydroxymethyl group or an acetyloxymethyl group.

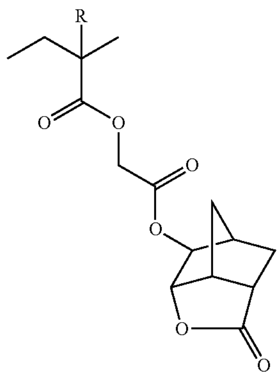

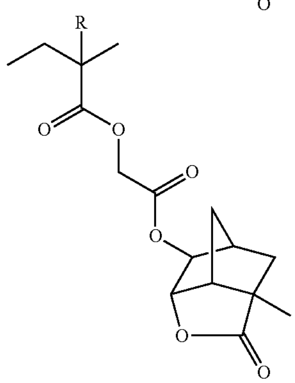

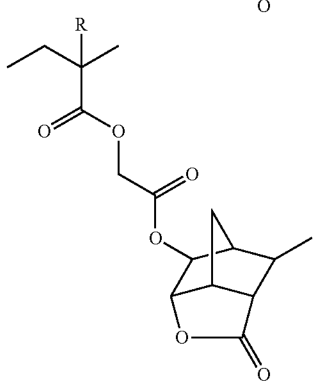

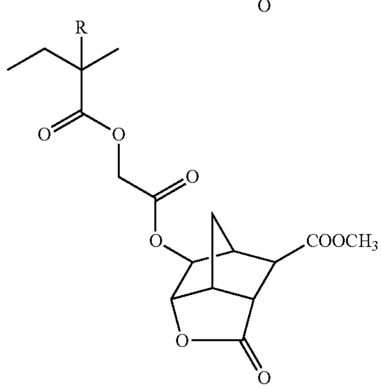

-continued

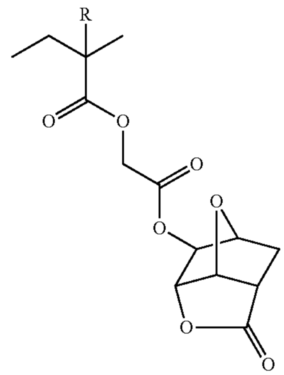

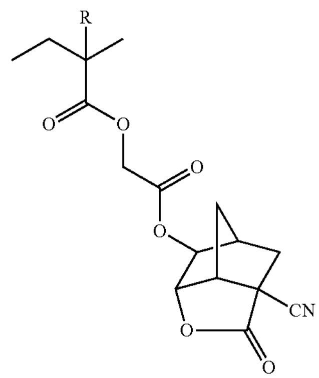

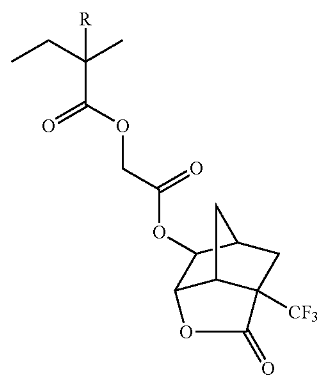

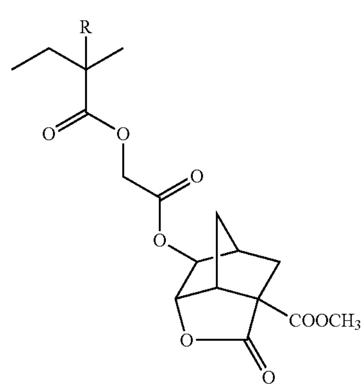

-continued
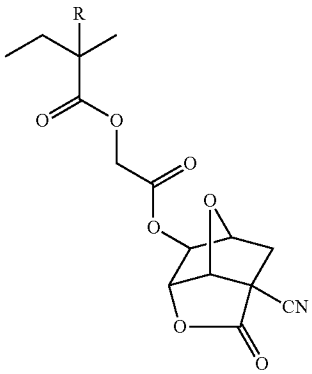
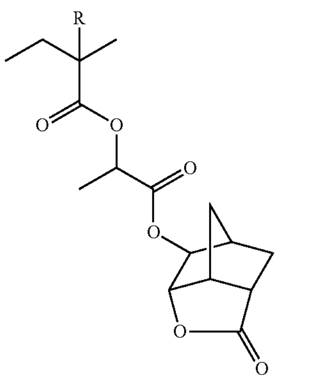
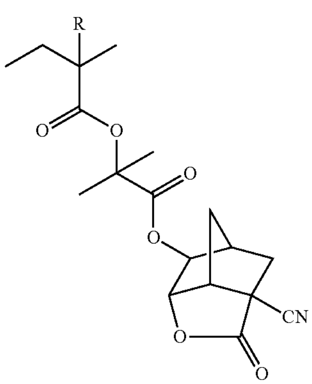
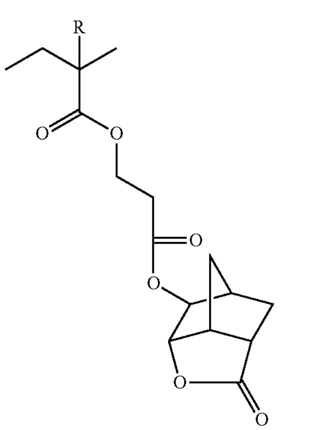
-continued
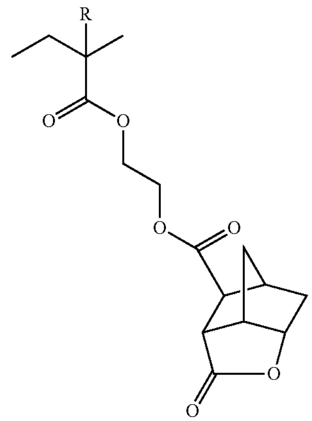
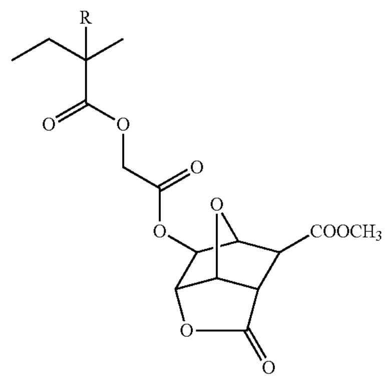
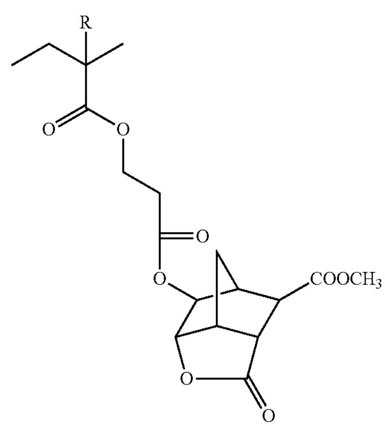
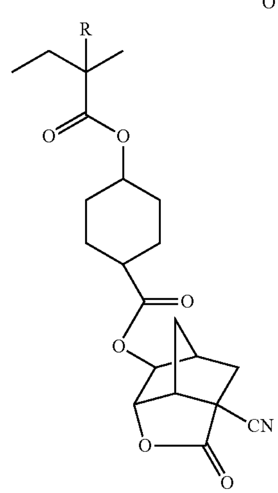

-continued

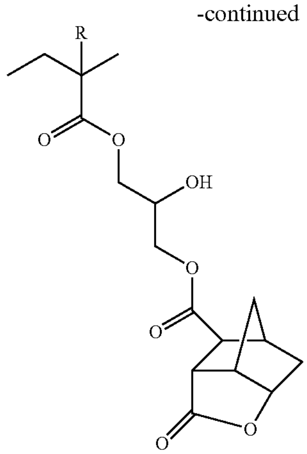

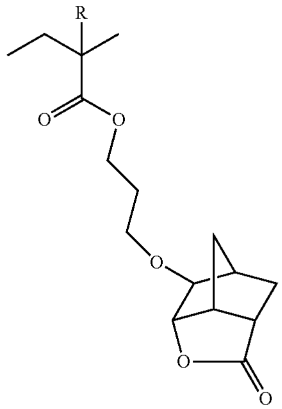

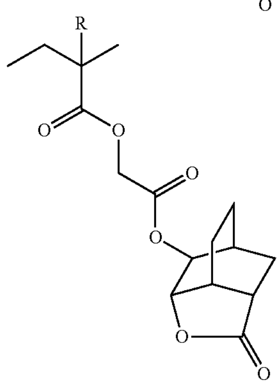

The repeating unit having a lactone group usually has an optical isomer, but any optical isomer may be used.

The content of the repeating unit having a lactone group is preferably from 15 to 60 mol %, more preferably from 20 to 50 mol %, still more preferably from 30 to 50 mol %, based on all repeating units in the resin.

Two or more kinds of lactone repeating units selected from formula (AII) may also be used in combination for enhancing the effects of the present invention. In the case of using the repeating units in combination, two or more kinds of repeating units selected from lactone repeating units where $n_0$ is 1 out of formula (3-1) are preferably used in combination. It is also preferred that a lactone repeating unit where Ab in formula (AII) is a single bond and a lactone repeating unit where $n_0$ is 1 out of formula (3-1) are used in combination.

The resin (A) preferably contains a repeating unit having a hydroxyl group or a cyano group, other than the repeating units represented by formulae (AI) and (AII). Thanks to this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group and preferably contains no acid-decomposable group.

The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. Preferred examples of the alicyclic hydrocarbon structure substituted by a hydroxyl group or a cyano group include a monohydroxyadamantyl group, a dihydroxyadamantyl group, a monohydroxydiamantyl group, a dihydroxyadamantyl group and a cyano group-substituted norbornyl group.

The alicyclic hydrocarbon structure substituted by a hydroxyl group or a cyano group is preferably a partial structure represented by the following formulae (VIIa) to (VIId):

(VIIa)

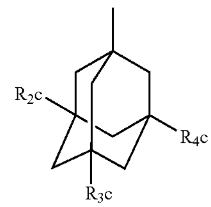

(VIIb)

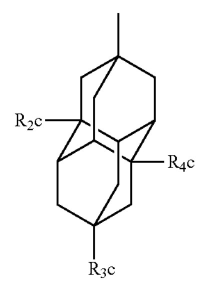

(VIIc)

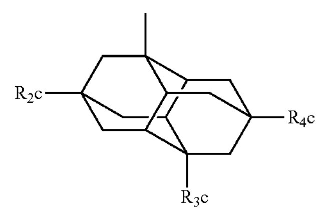

(VIId)

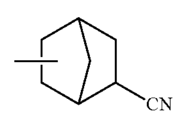

In formulae (VIIa) to (VIIc), each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (VIIa), it is more preferred that two members out of $R_{2c}$ to $R_4c$ are a hydroxyl group and the remaining is a hydrogen atom.

The repeating unit having a partial structure represented by formulae (VIIa) to (VIId) includes repeating units represented by the following formulae (AIIa) to (AIId), with a repeating unit represented by formula (AIIa) being preferred.

(AIIa)

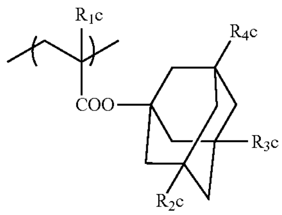

(AIIb)

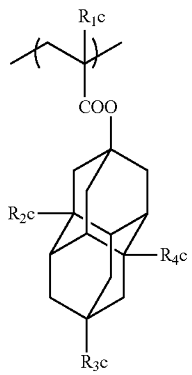

(AIIc)

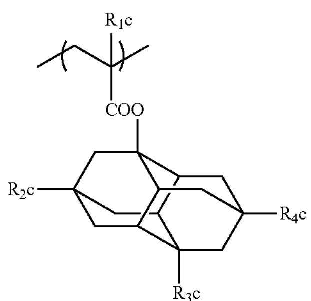

(AIId)

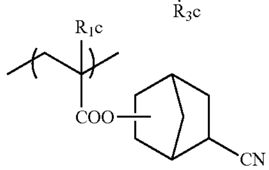

In formulae (AIIa) to (AIId), $R_1c$ represents a hydrogen atom, a methyl group, a trifluoromethyl group or a hydroxymethyl group.

$R_2c$ to $R_4c$ have the same meanings as $R_2c$ to $R_4c$ in formulae (VIIa) to (VIIc).

The content of the repeating unit having a hydroxyl group or a cyano group is preferably from 5 to 40 mol %, more preferably from 5 to 30 mol %, still more preferably from 10 to 25 mol %, based on all repeating units in the resin (A).

Specific examples of the repeating unit having a hydroxyl group or a cyano group are set forth below, but the present invention is not limited thereto.

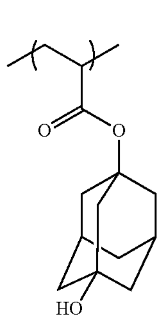

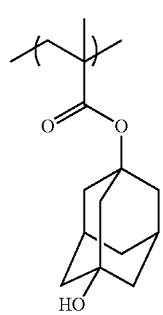

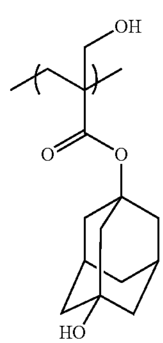

-continued

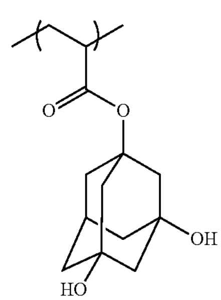

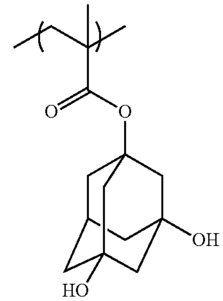

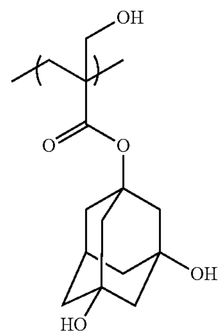

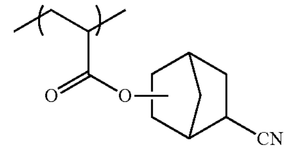

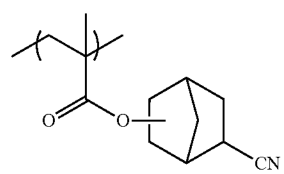

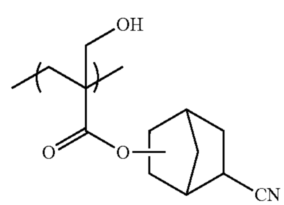

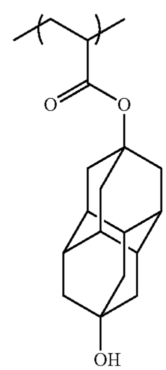

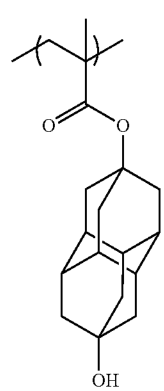

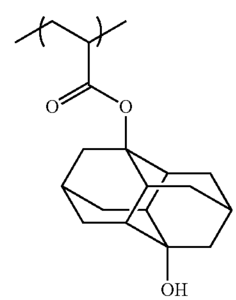

-continued

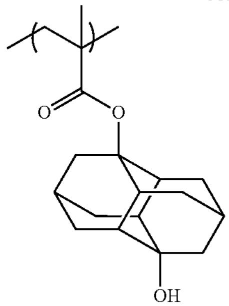

The resin (A) preferably contains a repeating unit having an alkali-soluble group. The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol group. The resin more preferably contains a repeating unit having a carboxyl group. By virtue of containing the repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the resin (A).

Specific examples of the repeating unit having an alkali-soluble group are set forth below, but the present invention is not limited thereto.

(In the formulae, Rx is H, $CH_3$, $CF_3$ or $CH_2OH$.)

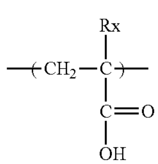

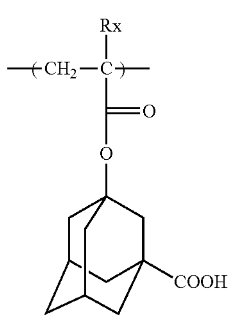

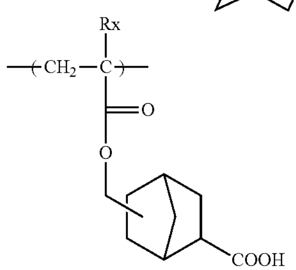

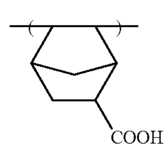

-continued

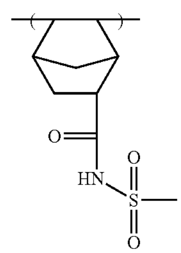

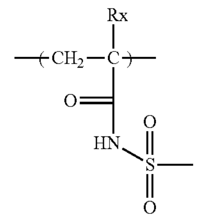

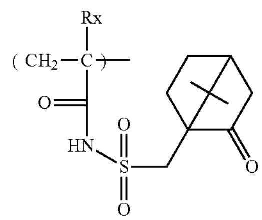

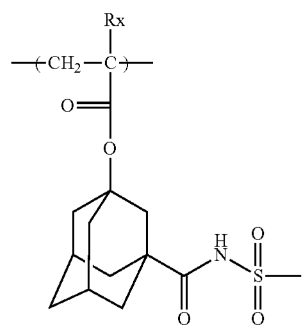

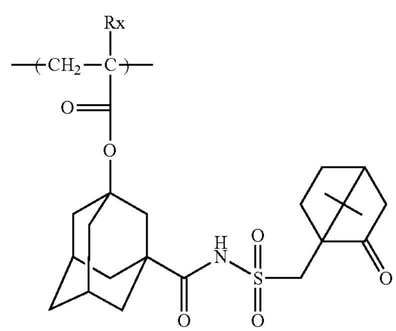

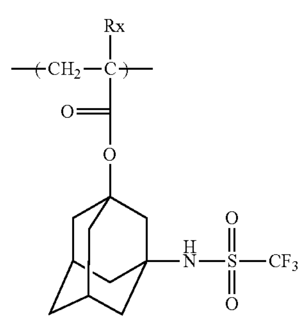

-continued

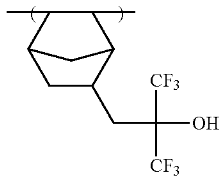

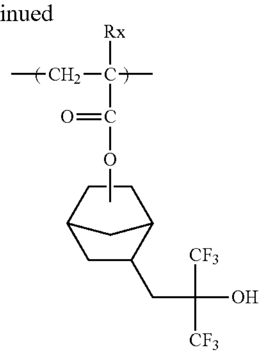

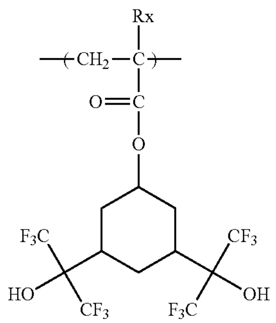

The repeating unit having at least one kind of a group selected from a lactone group, a hydroxyl group, a cyano group and an alkali-soluble group is preferably a repeating unit having at least two members selected from a lactone group, a hydroxyl group, a cyano group and an alkali-soluble group, more preferably a repeating unit having a cyano group and a lactone group. In particular, a repeating unit having a structure where a cyano group is substituted on the lactone structure of (LC1-4) is preferred.

The resin (A) preferably further contains a repeating unit represented by formula (I) having neither a hydroxyl group nor a cyano group.

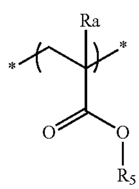

(4)

In formula (4), $R_5$ represents a hydrocarbon group having at least one cyclic structure and having neither a hydroxyl group nor a cyano group.

Ra represents a hydrogen atom, an alkyl group or a —$CH_2$—O—$Ra_2$ group, wherein $Ra_2$ represents an alkyl group or an acyl group. Examples of Ra include a hydrogen atom, a methyl group, and a trifluoromethyl group.

The cyclic structure possessed by $R_5$ includes a monocyclic hydrocarbon group and a polycyclic hydrocarbon group. Examples of the monocyclic hydrocarbon group include a cycloalkyl group having a carbon number of 3 to 12, such as cyclopentyl group, cyclohexyl group, cycloheptyl group and cyclooctyl group, and a cycloalkenyl group having a carbon number of 3 to 12, such as cyclohexenyl group. The monocyclic hydrocarbon group is preferably a monocyclic hydrocarbon group having a carbon number of 3 to 7, more preferably a cyclopentyl group or a cyclohexyl group.

The polycyclic hydrocarbon group includes a ring gathered hydrocarbon group and a crosslinked cyclic hydrocarbon group. Examples of the ring gathered hydrocarbon group include a bicyclohexyl group and a perhydronaphthalenyl group. Examples of the crosslinked hydrocarbon ring include a bicyclic hydrocarbon ring such as pinane ring, bornane ring, norpinane ring, norbornane ring and bicyclooctane ring (e.g., bicyclo[2.2.2]octane ring, bicyclo[3.2.1]octane ring), a tricyclic hydrocarbon ring such as homobledane ring, adamantane ring, tricyclo[5.2.1.$0^{2,6}$]decane ring and tricyclo[4.3.1.$1^{2,5}$]undecane ring, and a tetracyclic hydrocarbon ring such as tetracyclo[4.4.0.$1^{2,5}$.$1^{7,10}$]dodecane ring and perhydro-1,4-methano-5,8-methanonaphthalene ring. The crosslinked cyclic hydrocarbon ring also includes a condensed cyclic hydrocarbon ring, for example, a condensed ring formed by condensing a plurality of 5- to 8-membered cycloalkane rings, such as perhydronaphthalene (decalin) ring, perhydroanthracene ring, perhydrophenathrene ring, perhydroacenaphthene ring, perhydrofluorene ring, perhydroindene ring and perhydrophenalene ring.

Preferred examples of the crosslinked cyclic hydrocarbon ring include a norbornyl group, an adamantyl group, a bicyclooctanyl group and a tricyclo[5,2,1,$0^{2,6}$]decanyl group. Of these crosslinked cyclic hydrocarbon rings, a norbornyl group and an adamantyl group are more preferred.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4, the substituted methyl group is preferably a methoxymethyl group, a methoxythiomethyl group, a benzyloxymethyl group, a tert-butoxymethyl group or a 2-methoxyethoxymethyl group, the substituted ethyl group is preferably a 1-ethoxyethyl group or a 1-methyl-1-methoxyethyl group, the acyl group is preferably an aliphatic acyl group having a carbon number of 1 to 6, such as formyl group, acetyl group, propionyl group, butyryl group, isobutyryl group, valeryl group and pivaloyl group, and the alkoxycarbonyl group is preferably an alkoxycarbonyl group having a carbon number of 2 to 4.

The resin (A) may not contain a repeating unit represented by formula (4) having neither a hydroxyl group nor a cyano group, but when the resin contains the repeating unit, the content of the repeating unit having a repeating unit represented by formula (4) having neither a hydroxyl group nor a cyano group is preferably from 10 to 40 mol %, more preferably from 10 to 20 mol %, based on all repeating units in the resin (A).

Specific examples of the repeating unit represented by formula (4) are set forth below, but the present invention is not limited thereto. In the formulae, Ra represents H, $CH_3$ or $CF_3$.

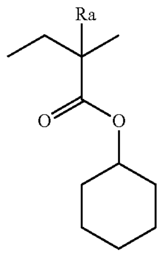
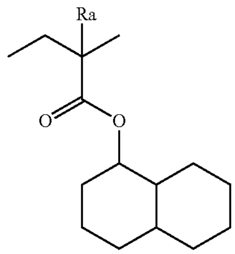
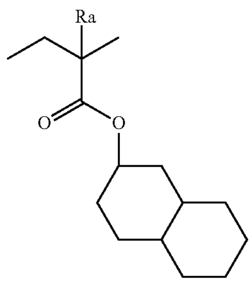
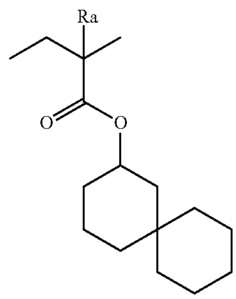
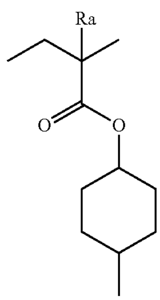
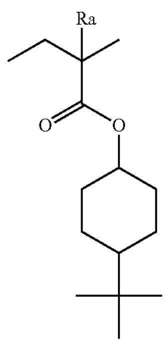
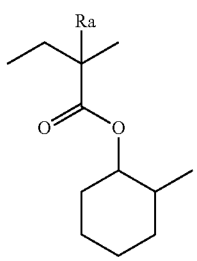
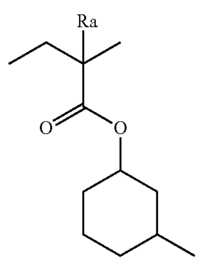
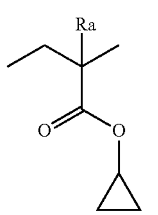
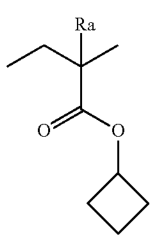
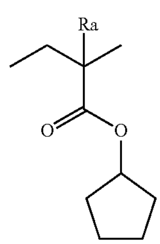
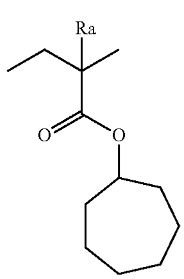
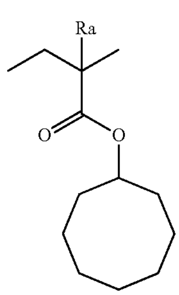

-continued

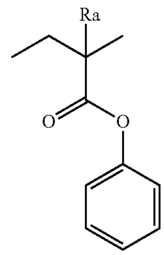
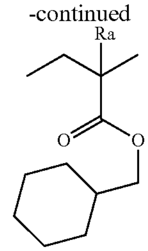
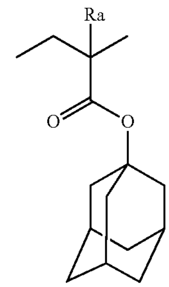
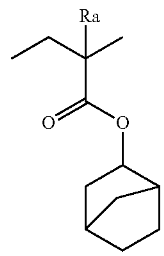
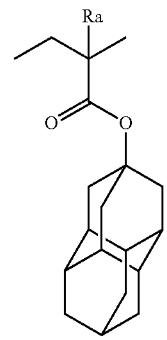
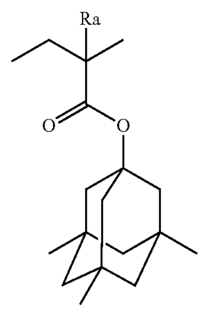

The resin (A) may contain, in addition to the above-described repeating structural units, various repeating structural units for the purpose of controlling the dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

Thanks to such a repeating structural unit, the performance required of the resin (A), particularly (1) solubility in coating solvent, (2) film-forming property (glass transition point), (3) alkali developability, (4) film loss (selection of hydrophilic, hydrophobic or alkali-soluble group), (5) adherence of unexposed area to substrate, (6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A), the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case where the actinic ray-sensitive or radiation-sensitive resin composition of the present invention is used for ArF exposure, the resin (A) preferably has no aromatic group in view of transparency to ArF light.

Specifically, in the resin, the ratio of an aromatic group-containing repeating is preferably 5 mol % or less, more preferably 3 mol % or less, and ideally 0 mol %, that is, no aromatic group is contained, and the resin (A) preferably has a monocyclic or polycyclic alicyclic hydrocarbon structure.

Also, in view of compatibility with the resin (C), the resin (A) preferably contains no fluorine atom and no silicon atom.

The resin (A) is preferably a resin where all repeating units are composed of a (meth)acrylate-based repeating unit. In this case, all repeating units may be a methacrylate-based repeating unit, all repeating units may be an acrylate-based repeating unit, or all repeating unit may be composed of a methacrylate-based repeating unit and an acrylate-based repeating unit, but the content of the acrylate-based repeating unit is preferably 50 mol % or less based on all repeating units. Also, preferable is a copolymerized polymer containing from 20 to 50 mol % of an acid decomposable group-containing (meth) acrylate-based repeating unit represented by formula (AI), from 20 to 50 mol % of a lactone group-containing (meth) acrylate-based repeating unit, from 5 to 30 mol % of a (meth) acrylate-based repeating unit having an alicyclic hydrocarbon structure substituted by a hydroxyl group or a cyano group, and from 0 to 20 mol % of other (meth)acrylate-based repeating units.

In the case where the actinic ray-sensitive or radiation-sensitive resin composition of the present invention is irradiated with KrF excimer laser light, electron beam, X-ray or high-energy beam at a wavelength of 50 nm or less (e.g., EUV), the resin (A) preferably further contains a hydroxystyrene-based repeating unit, more preferably a hydroxystyrene-based repeating unit, a hydroxystyrene-based repeating unit protected by an acid-decomposable group, and an acid-decomposable repeating unit such as tertiary alkyl (meth) acrylate, in addition to the repeating unit represented by formula (AI).

Preferred examples of the repeating unit having an acid-decomposable group include a repeating unit composed of a tert-butoxycarbonyloxystyrene, a 1-alkoxyethoxystyrene or a tertiary alkyl(meth)acrylate. A repeating unit composed of a 2-alkyl-2-adamantyl(meth)acrylate or a dialkyl(1-adamantyl)methyl(meth)acrylate is more preferred.

The resin (A) can be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate (PGMEA, also known as 1-methoxy-2-acetoxypropane), propylene glycol monomethyl ether (PGME, also known as 1-methoxy-2-propanol) and cyclohexanone. The polymerization is more preferably performed using the same solvent as the solvent used in the actinic ray-sensitive or radiation-sensitive resin composition of the present invention. By the use of this solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only those having a molecular weight not more than a specific value; a reprecipitation method of adding dropwise the resin solution in a poor solvent to solidify the resin in the poor solvent and thereby remove residual monomers and the like; and a purification method in a solid state, such as a method of subjecting a resin slurry separated by filtration to washing with a poor solvent. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected, for example, from a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank, by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The weight average molecular weight of the resin (A) is preferably from 1,000 to 200,000, more preferably from 2,000 to 20,000, still more preferably from 3,000 to 15,000, yet still more preferably from 5,000 to 13,000, in terms of polystyrene by the GPC method. By virtue of setting the weight average molecular weight to be from 1,000 to 200,000, the heat resistance, dry etching resistance and developability can be prevented from deterioration and also, the film-forming property can be prevented from deteriorating due to rise of the viscosity.

The polydispersity (molecular weight distribution) is usually from 1 to 3, preferably from 1 to 2.6, more preferably from 1 to 2, still more preferably from 1.4 to 2.0. As the polydispersity is smaller, the resolution and resist profile are more excellent, the side wall of the resist pattern is smoother, and the property in terms of roughness is more improved.

The amount of the resin (A) added is generally from 50 to 99 mass %, preferably from 70 to 98 mass %, based on the entire solid content of the composition.

In the present invention, as for the resin (A), one kind of a resin may be used or a plurality of kinds of resins may be used in combination.

[2] (B) Compound Capable of Generating an Acid upon Irradiation with an Actinic Ray or Radiation The composition of the present invention contains a compound capable of generating an acid upon irradiation with an actinic ray or radiation (hereinafter sometimes referred to as an "acid generator").

The acid generator which can be used may be appropriately selected from a photo-initiator for cationic photopolymerization, a photo-initiator for radical photopolymerization, a photo-decoloring agent for dyes, a photo-discoloring agent, a compound known to generate an acid upon irradiation with an actinic ray or radiation and used for microresist or the like, and a mixture thereof.

Examples of such a compound include a diazonium salt, a phosphonium salt, a sulfonium salt, an iodonium salt, imidosulfonate, oxime sulfonate, diazodisulfone, disulfone and o-nitrobenzyl sulfonate.

Out of the acid generators, compounds represented by the following formulae (ZI), (ZII) and (ZIII) are preferred.

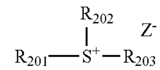

(ZI)

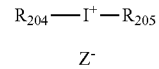

(ZII)

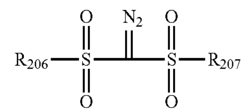

(ZIII)

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion and tris(alkylsulfonyl)methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the resist is enhanced.

Examples of the sulfonate anion include an aliphatic sulfonate anion, an aromatic sulfonate anion and a camphorsulfonate anion.

Examples of the carboxylate anion include an aliphatic carboxylate anion, an aromatic carboxylate anion and an aralkylcarboxylate anion.

The aliphatic moiety in the aliphatic sulfonate anion and aliphatic carboxylate may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion and aromatic carboxylate anion is preferably an aryl group having a carbon number of 6 to 14, and examples thereof include a phenyl group, a tolyl group and a naphthyl group.

Each of the alkyl group, cycloalkyl group and aryl group in the aliphatic sulfonate anion and aromatic sulfonate anion may have a substituent. Examples of the substituent of the alkyl group, cycloalkyl group and aryl group in the aliphatic sulfonate anion and aromatic sulfonate anion include a nitro group, a halogen atom (e.g., fluorine, chlorine, bromine, iodine), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group and ring structure in each group, examples of the substituent further include an alkyl group (preferably having a carbon number of 1 to 15).

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Each of the alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methyl anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group and a neopentyl group. Examples of the substituent of such an alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Incidentally, two alkyl groups in the bis(alkylsulfonyl)imide anion may be the same or different. Similarly, a plurality of alkyl groups in the tris(alkylsulfonyl)methide anion may be the same or different.

In particular, the bis(alkylsulfonyl)imide anion and tris(alkylsulfonyl)methyl anion are an anion represented by the following formula (A3) or (A4):

(A3)

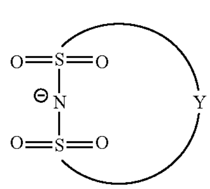

-continued (A4)

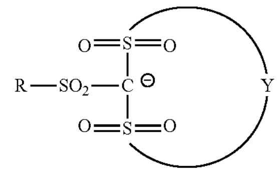

In formulae (A3) and (A4), Y is an alkylene group substituted by at least one fluorine atom, preferably an alkylene group having a carbon number of 2 to 4. The alkylene chain may contain an oxygen atom. Y is more preferably a perfluoroalkylene group having a carbon number of 2 to 4, and most preferably a tetrafluoroethylene group, a hexafluoropropylene group or an octafluorobutylene group.

In formula (A4), R represents an alkyl group or a cycloalkyl group. The alkylene chain in the alkyl or cycloalkyl group may contain an oxygen atom.

Examples of the compound having an anion represented by formula (A3) or (A4) include those described as specific examples in JP-A-2005-221721.

Other examples of the non-nucleophilic anion include fluorinated phosphorus, fluorinated boron and fluorinated antimony.

The non-nucleophilic anion of $Z^-$ is preferably an aliphatic sulfonate anion with at least the $\alpha$-position of the sulfonic acid being substituted by a fluorine atom, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

Examples of the organic group as $R_{201}$, $R_{202}$ and $R_{203}$ include the corresponding groups in the compounds (ZI-1), (ZI-2) and (ZI-3) described later.

The compound may be a compound having a plurality of structures represented by formula (ZI), for example, a compound having a structure where at least one of $R_{201}$ to $R_{203}$ in the compound represented by formula (ZI) is bonded to at least one of $R_{201}$ to $R_{203}$ in another compound represented by formula (ZI) through a single bond or a linking group.

The component (ZI) is more preferably compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having arylsulfonium as the cation.

In the arylsulfonium compound, all of $R_{201}$ to $R_{203}$ may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue, a furan residue, a thiophene residue, an indole residue, a benzofuran residue and a benzothiophene residue. In the case where the arylsulfonium compound has two or more aryl groups, these two or more aryl groups may be the same or different.

The alkyl or cycloalkyl group which is present, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group and a cyclohexyl group.

Each of the aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted at the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ independently represents preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl, ethyl, propyl, butyl, pentyl) and a cycloalkyl group having a carbon number of 3 to 10 (e.g., cyclopentyl, cyclohexyl, norbornyl). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C═O at the 2-position of the above-described alkyl group.

The 2-oxocycloalkyl group is preferably a group having >C═O at the 2-position of the above-described cycloalkyl group.

The alkoxy group in the alkoxycarbonylmethyl group is preferably an alkoxy group having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, having a carbon number of 1 to 5), a hydroxyl group, a cyano group or a nitro group.

The compound (ZI-3) is a compound represented by the following formula (ZI-3), and this is a compound having a phenacylsulfonium salt structure.

(ZI-3)

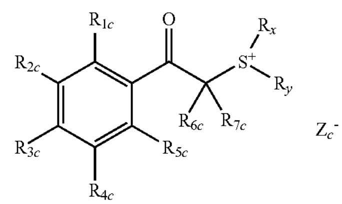

In formula (ZI-3), each of $R_{1c}$ to $R_{5c}$ independently represents a hydrogen atom, a linear or branched alkyl group (preferably having a carbon number of 1 to 12), a cycloalkyl group (preferably having a carbon number of 3 to 8), a linear or branched alkoxy group (preferably having a carbon number of, in the case of a linear alkoxy group, from 1 to 12 and in the case of a branched alkoxy group, from 3 to 8) or a halogen atom.

Each of $R_{6c}$ and $R_{7c}$ independently represents a hydrogen atom, a linear or branched alkyl group (preferably having a carbon number of 1 to 12) or a cycloalkyl group (preferably having a carbon number of 3 to 8).

Each of $R_x$ and $R_y$ independently represents a linear or branched alkyl group (preferably having a carbon number of 1 to 12), a cycloalkyl group (preferably having a carbon number of 3 to 8), an allyl group or a vinyl group.

Any two or more members out of $R_{1c}$ to $R_{5c}$, a pair of $R_{6c}$ and $R_{7c}$, or a pair of $R_x$ and $R_y$ each may combine together to form a ring structure. This ring structure may contain an oxygen atom, a sulfur atom, an ester bond or an amide bond.

$Zc^-$ represents a non-nucleophilic anion, and examples thereof are the same as those of the non-nucleophilic anion of $Z^-$ in formula (ZI).

Each of $R_x$ and $R_y$ is preferably an alkyl or cycloalkyl group having a carbon number of 4 or more, more preferably 6 or more, still more preferably 8 or more.

Specific preferred examples of the compound (ZI-3) include compounds set forth as examples in paragraphs 0046 and 0047 of JP-A-2004-233661 and paragraphs 0040 to 0046 of JP-A-2003-35948.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ in the compound (ZI-1).

Each of the aryl group, alkyl group and cycloalkyl group of $R_{204}$ to $R_{207}$ may have a substituent. Examples of the substituent include those which the aryl group, alkyl group and cycloalkyl group of $R_{201}$ to $R_{203}$ in the compound (ZI-1) may have.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

$$Ar_3—SO_2—SO_2—Ar_4 \qquad \text{(ZIV)}$$

-continued (ZV)

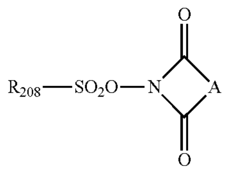

(ZVI)

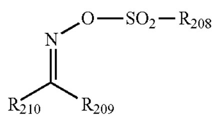

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Among the acid generators, more preferred are the compounds represented by formulae (ZI) to (ZIII).

The acid generator is preferably a compound that generates an acid having one sulfonic acid group or imide group, more preferably a compound that generates a monovalent perfluoroalkanesulfonic acid, a compound that generates a monovalent aromatic sulfonic acid substituted by a fluorine atom or a fluorine atom-containing group, or a compound that generates a monovalent imide acid substituted by a fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity can be enhanced.

Out of the acid generators, particularly preferred examples are set forth below.

(z1)

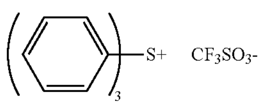

(z2)

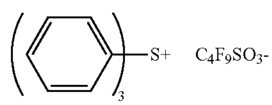

(z3)

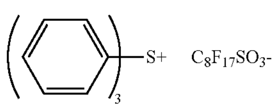

(z4)

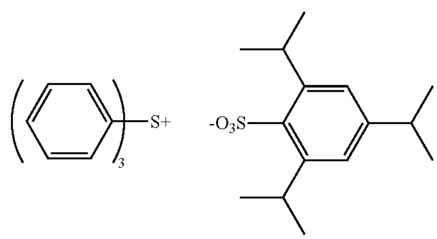

(z5)

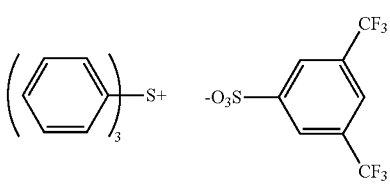

(z6)

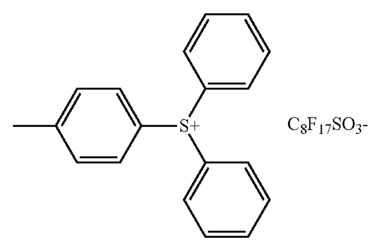

(z7)

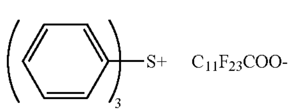

(z8)

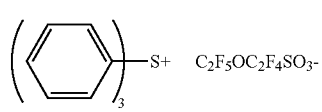

(z9)

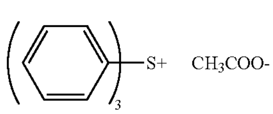

(z10)

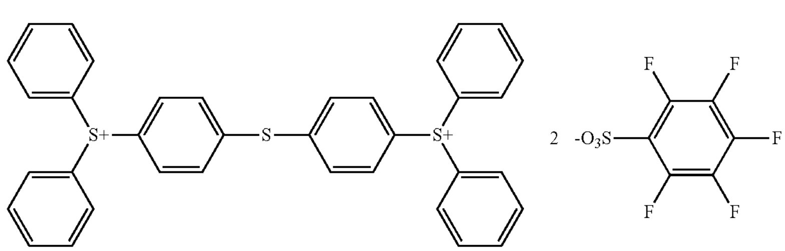

-continued
(z11)
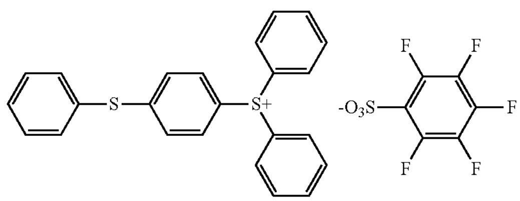
(z12)
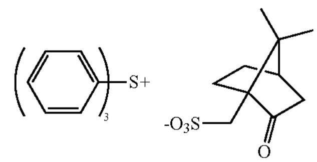
(z13)
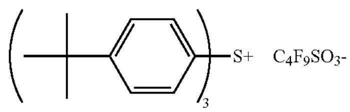
(z14)
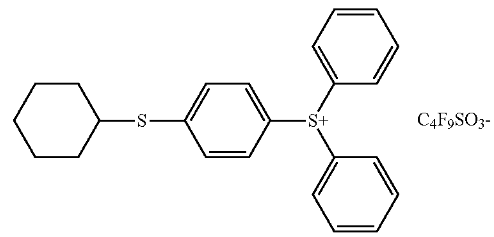
(z15)
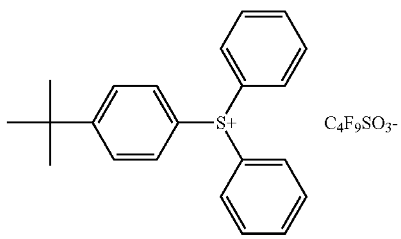
(z16)
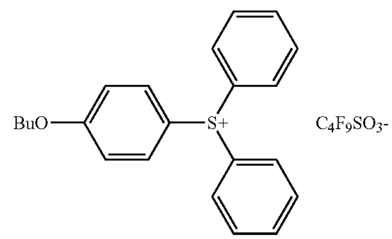
(z17)
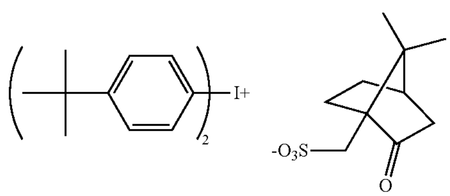
(z18)
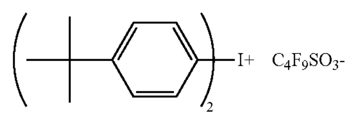
(z19)
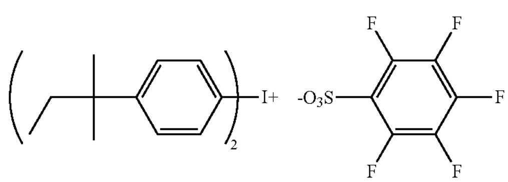
(z20)
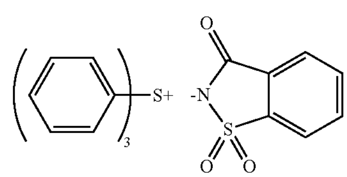
(z21)
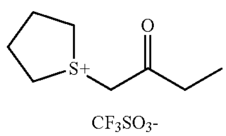
(z22)
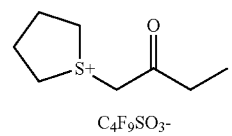
(z23)
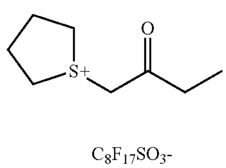
(z24)
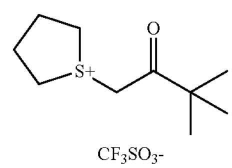
(z25)
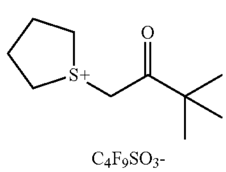
(z26)
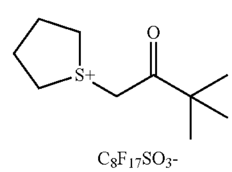

-continued
(z27)
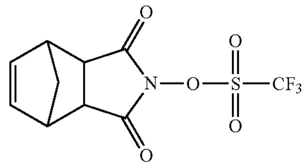
(z28)
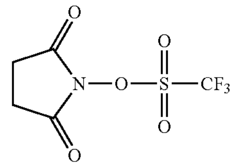
(z29)
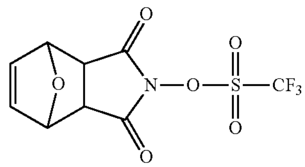
(z30)
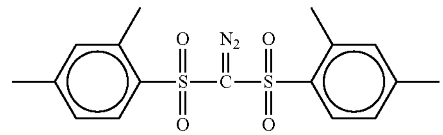
(z31)
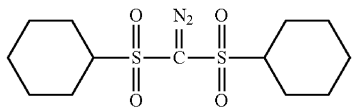
(z32)
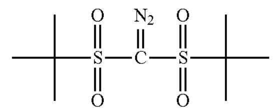
(z33)
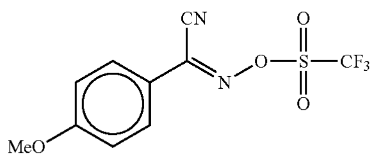
(z34)
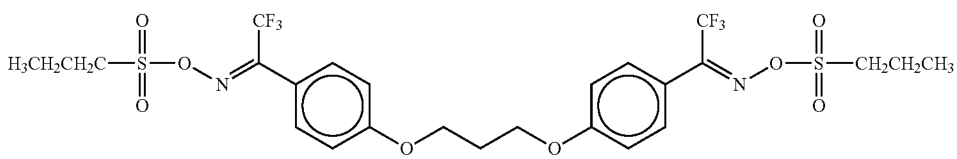
(z35)
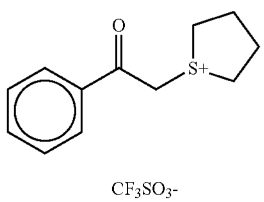
(z36)
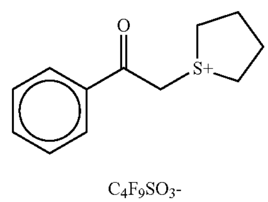
(z37)
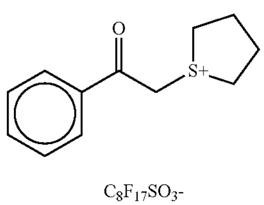
(z38)
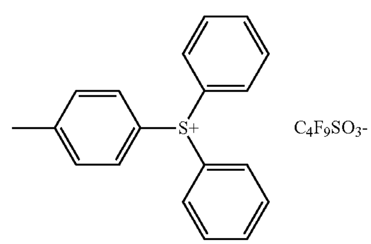
(z39)
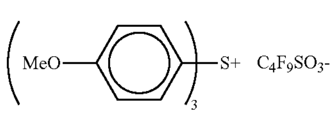
(z40)
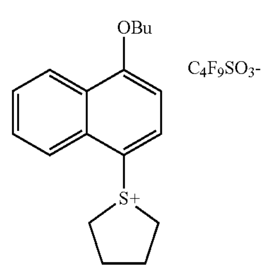

-continued
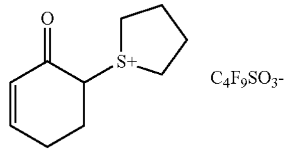
(z41)
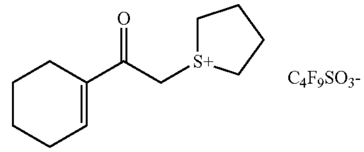
(z42)
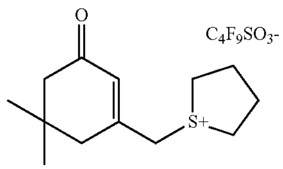
(z43)
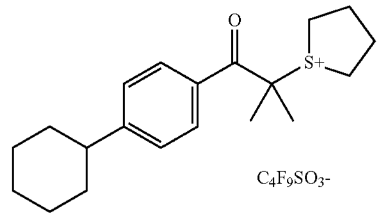
(z44)
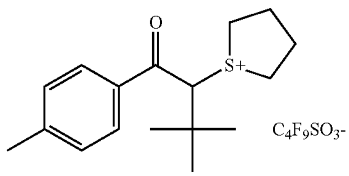
(z45)
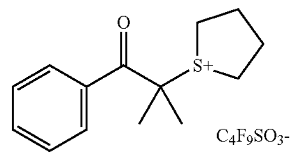
(z46)
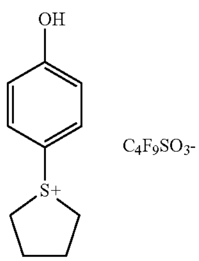
(z47)
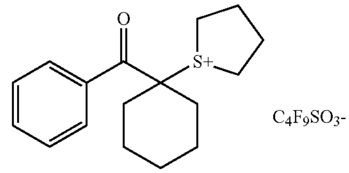
(z48)
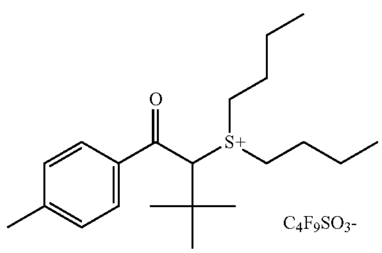
(z49)
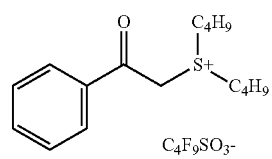
(z50)
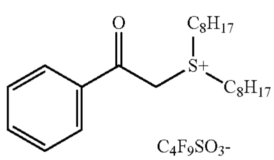
(z51)
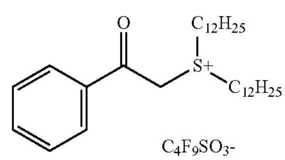
(z52)
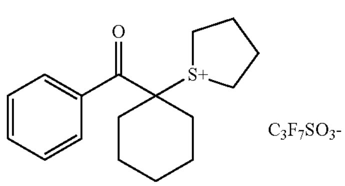
(z53)
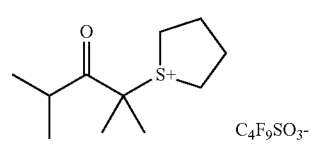
(z54)
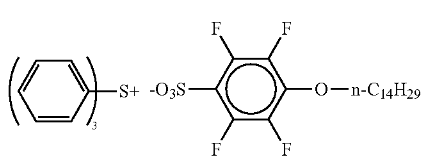
(z55)
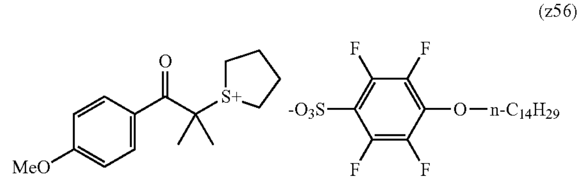
(z56)

-continued
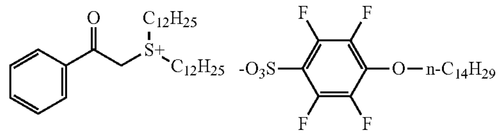
(z57)
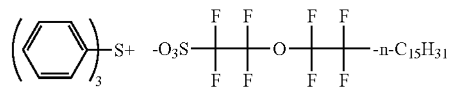
(z58)
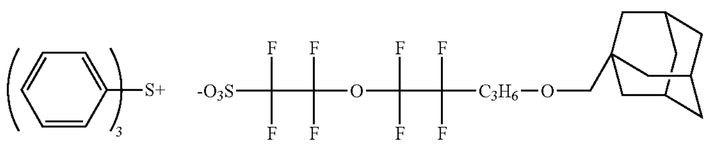
(z59)
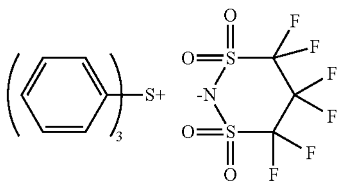
(z60)
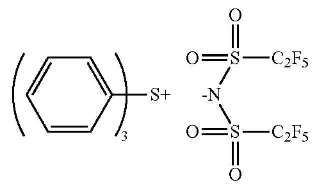
(z61)
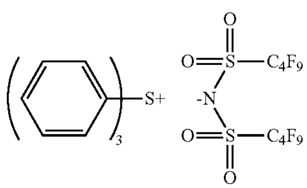
(z62)
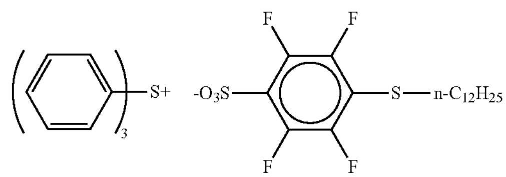
(z63)
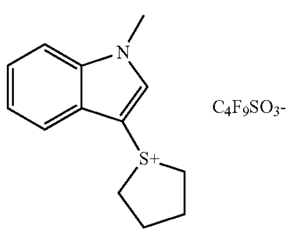
(z64)
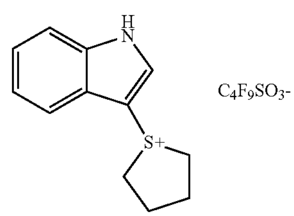
(z65)
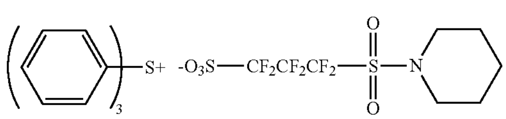
(z66)
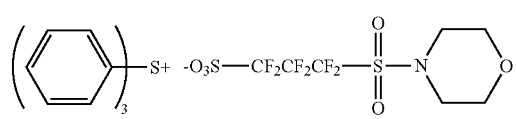
(z67)
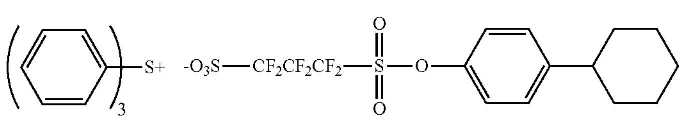
(z68)
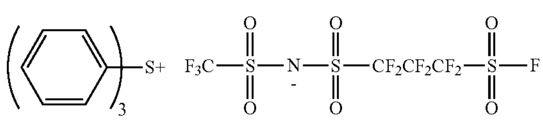
(z69)
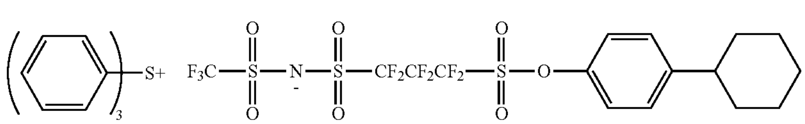
(z70)

-continued
(z71)
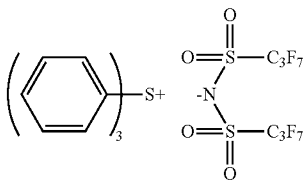
(z72)
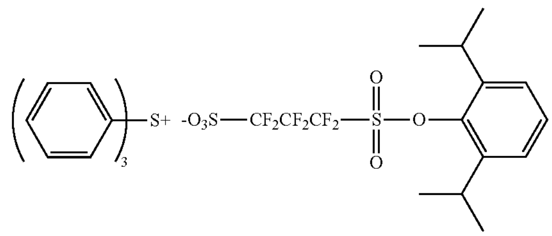
(z73)
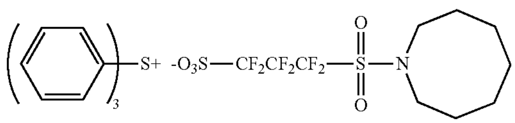
(z74)
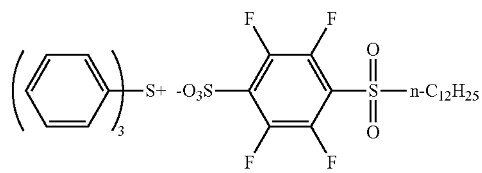
(z75)
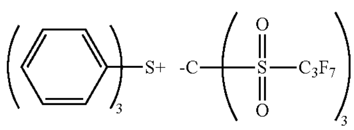
(z76)
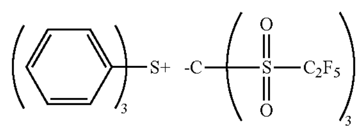
(z77)
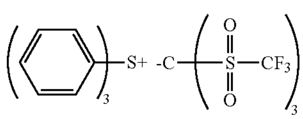
(z78)
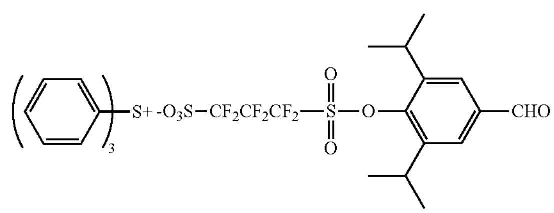
(z79)
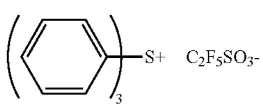
(z80)
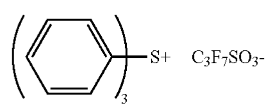
(z81)
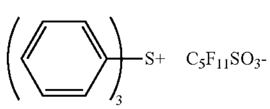
(z82)
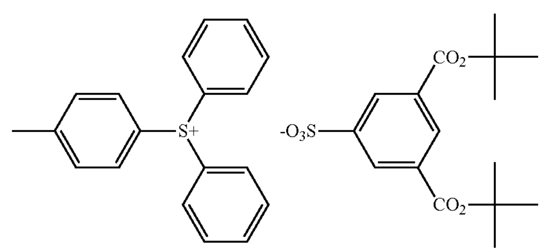
(z83)
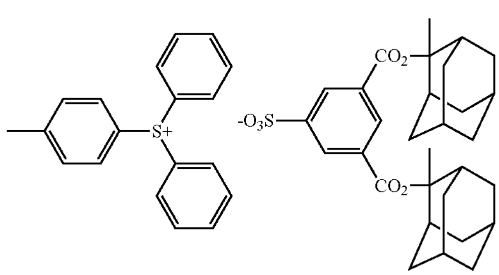
(z84)
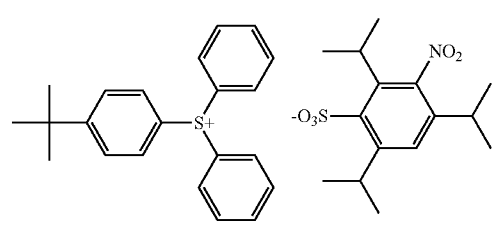

-continued
(z85)
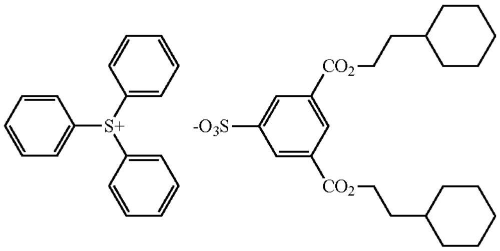
(z86)
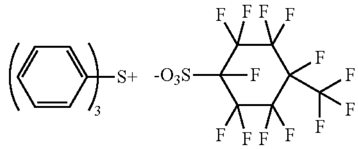
(z87)
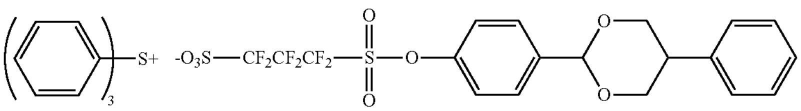
(z88)
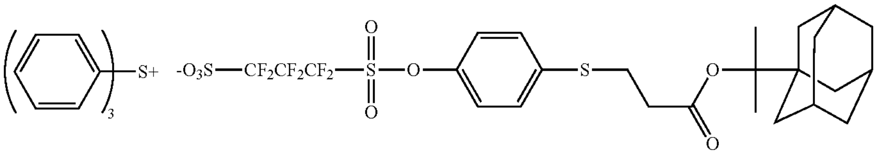
(z89)
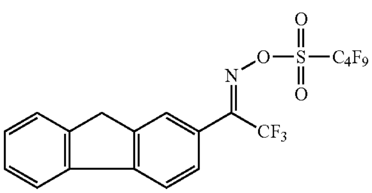
(z90)
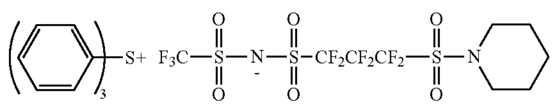
(z91)
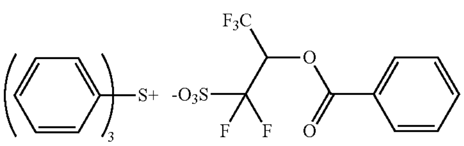
(z92)
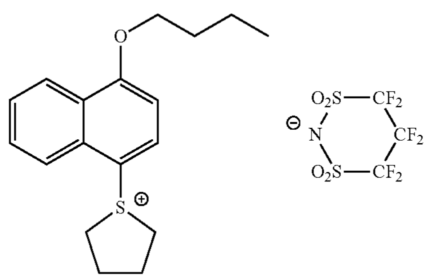
(z93)
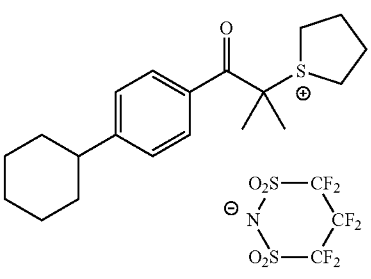
(z94)
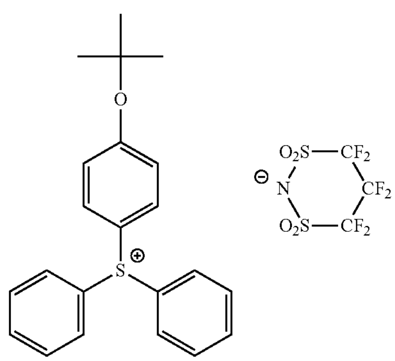

-continued (z95)

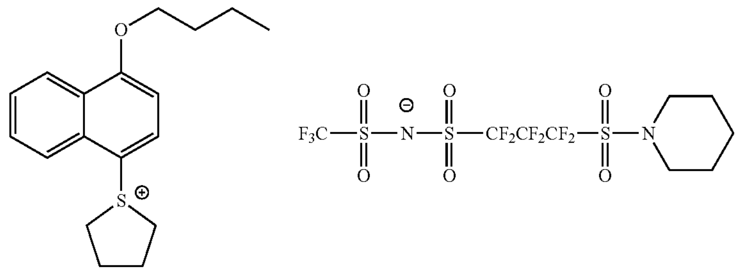

(z96)

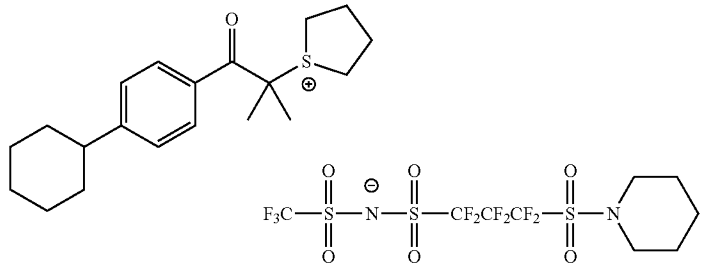

Also, preferred acid generators include a compound represented by the following formula (I) and a compound capable of generating an acid represented by the following formula (P1).

In view of obtaining the effects of the present invention, the acid generator is preferably a compound such that the molecular weight of the acid generated upon irradiation with an actinic ray or radiation (generated acid) is 300 or more and the acid has a monocyclic or polycyclic, alicyclic or aromatic ring which may contain a heteroatom. For example, a compound capable of generating such an acid can be selected from the above-described acid generators, preferably from a compound represented by the following formula (I) and a compound capable of generating an acid represented by the following formula (P1).

The molecular weight of the generated acid is preferably 320 or more, more preferably 340 or more, and most preferably 350 or more. The upper limit of the molecular weight is preferably 600 or less, more preferably 500 or less.

(I)

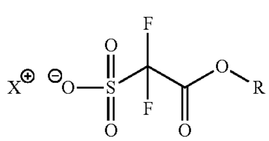

(wherein $X^+$ represents an organic counter ion, and R represents a hydrogen atom or an organic group).

In formula (I), R represents a hydrogen atom or an organic group and is preferably an organic group having a carbon number of 1 to 40, more preferably an organic group having a carbon number of 3 to 20, and most preferably an organic group represented by the following formula (II).

The organic group of R is sufficient if it has one or more carbon atoms, and is preferably an organic group where the atom bonded to the oxygen atom in the ester bond shown in formula (I) is a carbon atom, and examples thereof include an alkyl group, a cycloalkyl group, an aryl group, an aralkyl group and a group having a lactone structure. The organic group may contain a heteroatom such as oxygen atom and sulfur atom in the chain. Also, one of these groups may have another as a substituent, or the organic group may have a substituent such as hydroxyl group, acyl group, acyloxy group, oxy group (=O) or halogen atom. As for the structure of R, a structure represented by the following formula (II) is preferred.

$$—(CH_2)_n\text{-Rc-}(Y)_m \qquad (II)$$

In formula (II), Rc represents a monocyclic or polycyclic cyclic organic group having a carbon number of 3 to 30, which may contain a cyclic ether, cyclic thioether, cyclic ketone, cyclic carbonate, lactone or lactam structure; Y represents a hydroxyl group, a halogen atom, a cyano group, a carboxyl group, a hydrocarbon group having a carbon number of 1 to 10, a hydroxyalkyl group having a carbon number of 1 to 10, an alkoxy group having a carbon number of 1 to 10, an acyl group having a carbon number of 1 to 10, an alkoxycarbonyl group having a carbon number of 2 to 10, an acyloxy group having a carbon number of 2 to 10, an alkoxyalkyl group having a carbon number of 2 to 10, or an alkyl halide group having a carbon number of 1 to 8; m=from 0 to 6; when a plurality of Y's are present, each Y may be the same as or different from every other Y; and n=from 0 to 10.

The total number of carbon atoms constituting the R group represented by formula (II) is preferably 40 or less.

It is preferred that n=from 0 to 3 and Rc is a monocyclic or polycyclic cyclic organic group having a carbon number of 7 to 16.

The molecular weight of the compound represented by formula (I) is generally from 300 to 1,000, preferably from 400 to 800, more preferably from 500 to 700.

Examples of the organic counter ion of $X^+$ include sulfonium cation and iodonium cation.

The preferred embodiment of the compound represented by formula (I) includes compounds represented by formulae ($Z_{SC1}$) and ($Z_{IC1}$):

$Z_{SC1}$

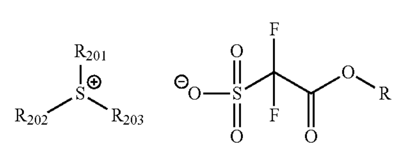

-continued $Z_{IC1}$

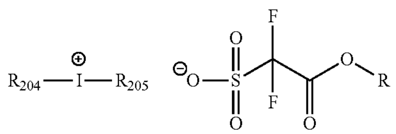

In formula ($Z_{SC1}$), the definition and preferred range of R are the same as those defined in formula (I).

The definitions, specific examples, preferred embodiments and the like of $R_{201}$, $R_{202}$ and $R_{203}$ are the same as those of $R_{201}$, $R_{202}$ and $R_{203}$ in formula (ZI).

In formula ($Z_{IC1}$), the definition and preferred range of R are the same as those defined in formula (I).

The definitions, specific examples, preferred embodiments and the like of $R_{204}$ and $R_{205}$ are the same as those of $R_{204}$ and $R_{205}$ in formula (ZII).

Specific examples of the compound represented by formula (I) are set forth below, but the present invention is not limited to these compounds. In the formulae, the molecular weight of the anion in each compound is shown.

(Y-1)

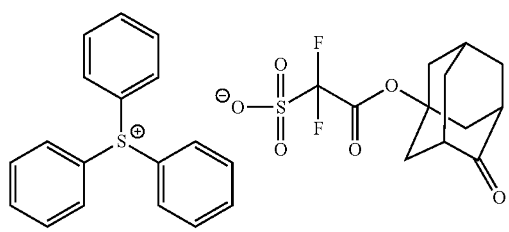

Molecular Weight: 323.29

(Y-2)

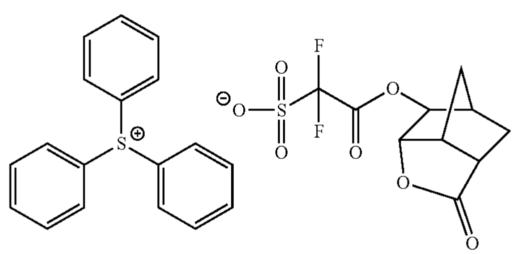

Molecular Weight: 311.24

(Y-3)

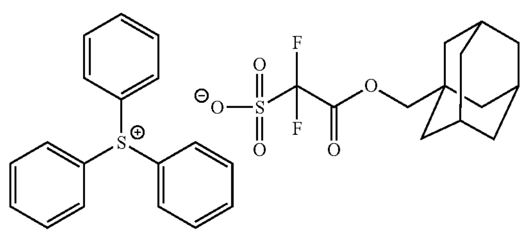

Molecular Weight: 323.33

-continued (Y-4)

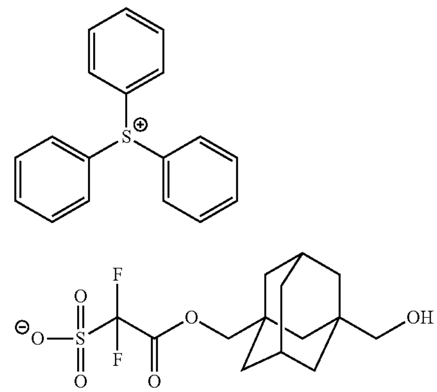

Molecular Weight: 353.36

(Y-5)

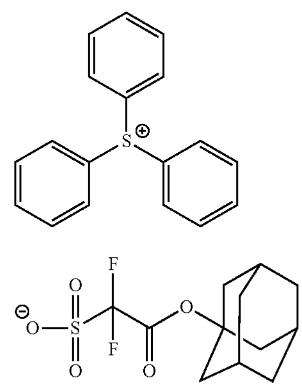

Molecular Weight: 309.31

(Y-6)

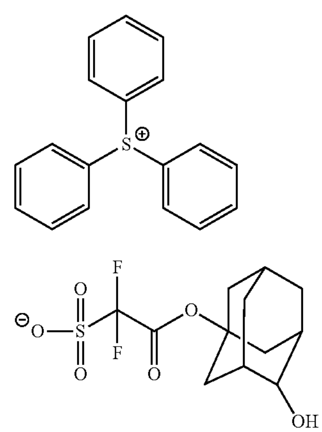

Molecular Weight: 325.31

(Y-7)

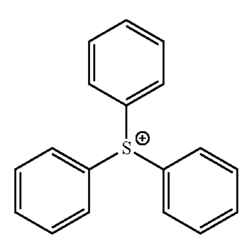

-continued
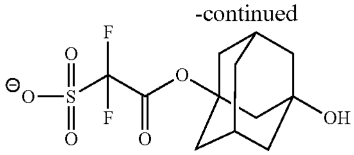
Molecular Weight: 325.31
(Y-8)
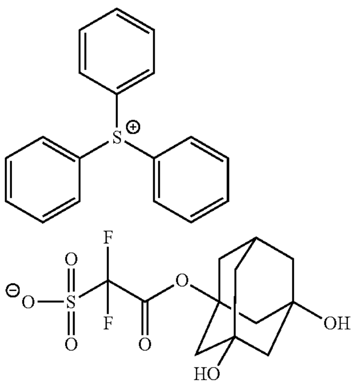
Molecular Weight: 341.31
(Y-9)
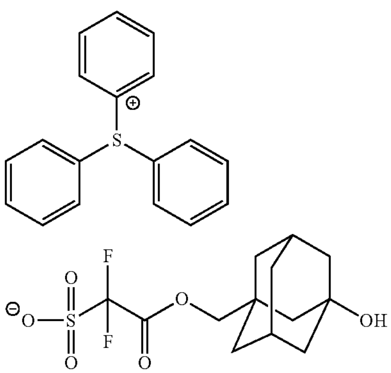
Molecular Weight: 339.33
(Y-10)
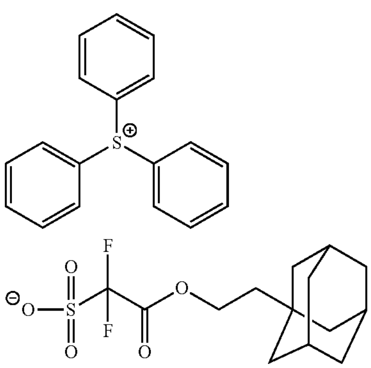
Molecular Weight: 337.36
(Y-11)
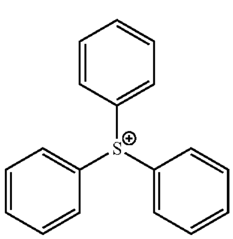
-continued
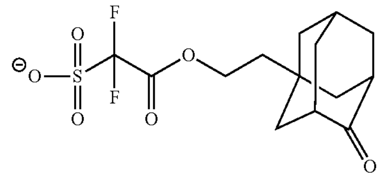
Molecular Weight: 351.34
(Y-12)
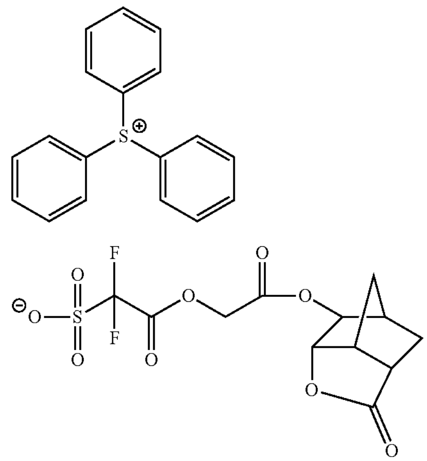
Molecular Weight: 369.27
(Y-13)
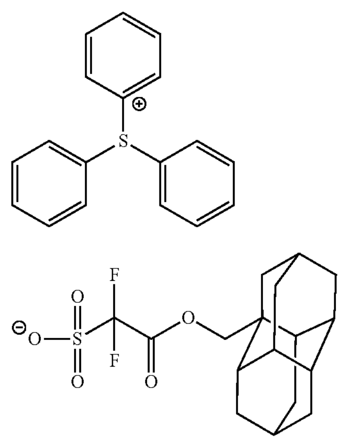
Molecular Weight: 375.41
(Y-14)
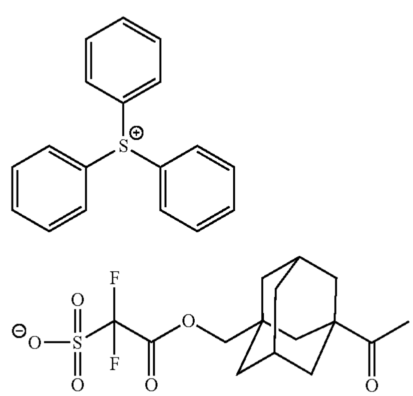
Molecular Weight: 365.37

-continued
(Y-15)
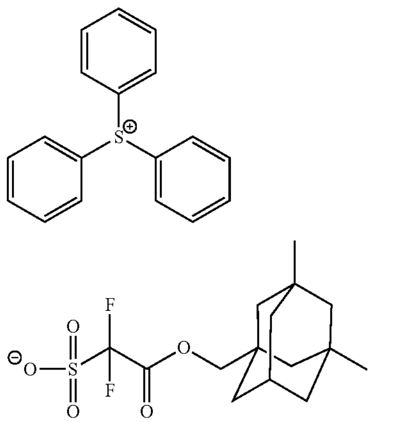
Molecular Weight: 351.39
(Y-16)
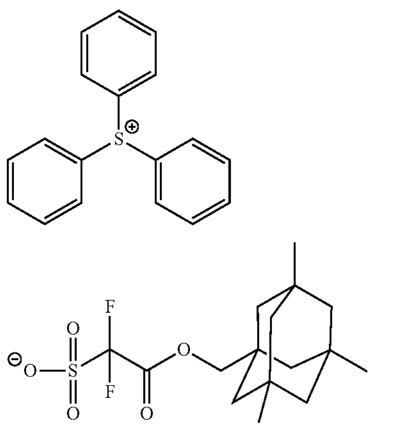
Molecular Weight: 365.41
(Y-17)
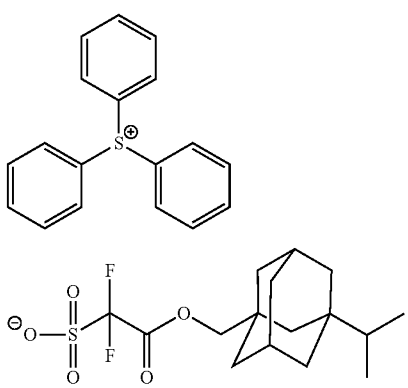
Molecular Weight: 351.39
(Y-18)
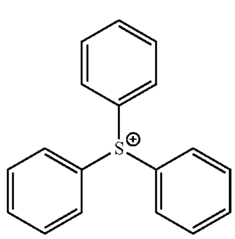
-continued
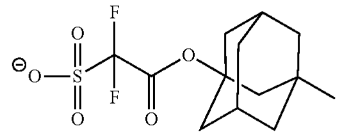
Molecular Weight: 323.33
(Y-19)
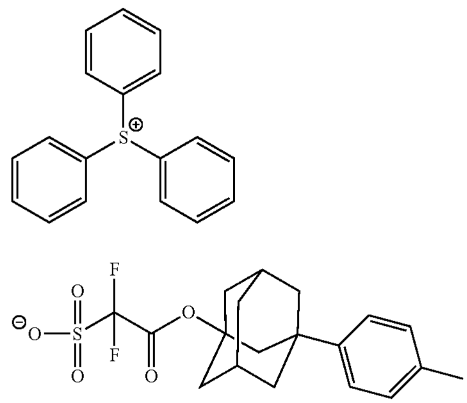
Molecular Weight: 399.43
(Y-20)
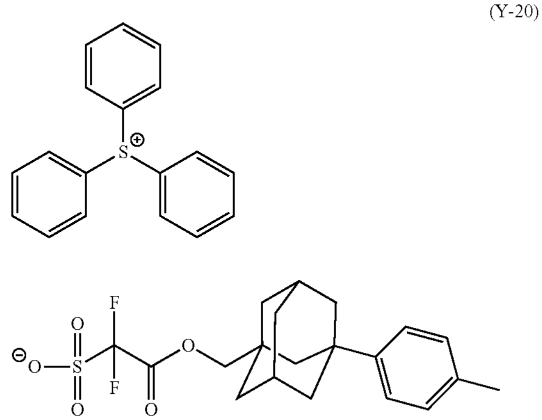
Molecular Weight: 413.46
(Y-21)
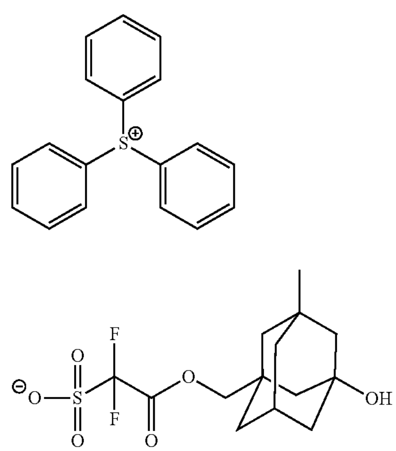
Molecular Weight: 353.36

(Y-22)
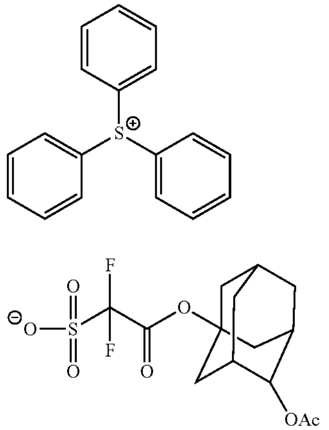
Molecular Weight: 367.34
(Y-23)
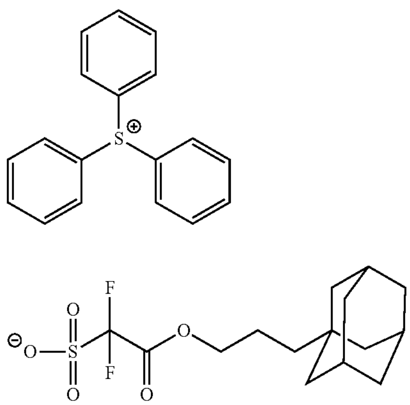
Molecular Weight: 351.39
(Y-24)
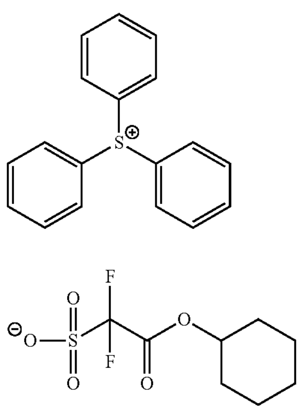
Molecular Weight: 257.23
(Y-25)
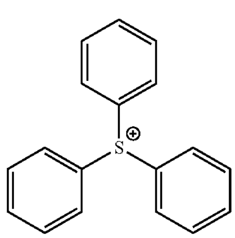
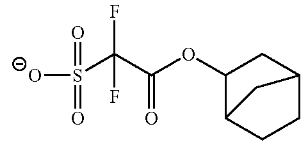
Molecular Weight: 269.24
(Y-26)
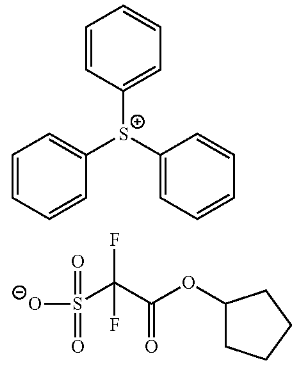
Molecular Weight: 243.21
(Y-27)
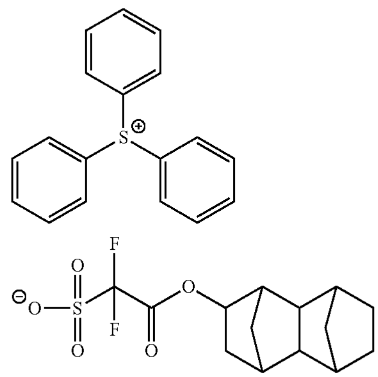
Molecular Weight: 335.34
(Y-28)
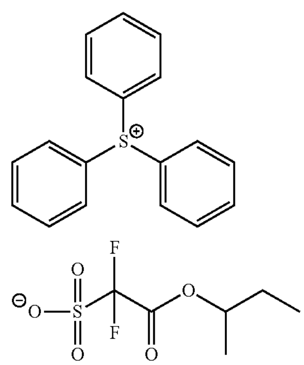
Molecular Weight: 231.20
(Y-29)
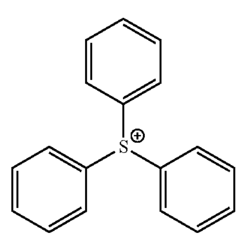

-continued
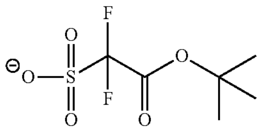
Molecular Weight: 231.20
(Y-30)
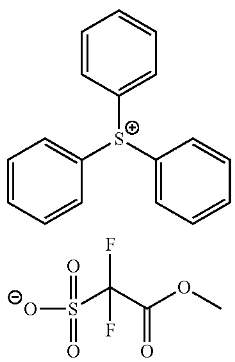
Molecular Weight: 189.12
(Y-31)
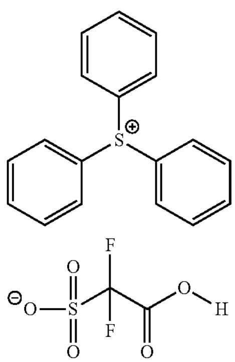
Molecular Weight: 175.09
(Y-32)
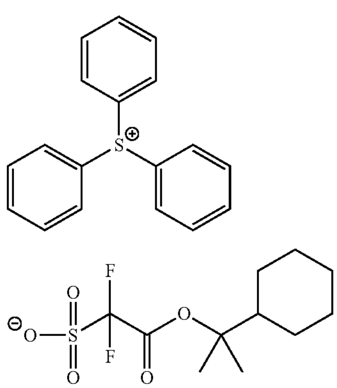
Molecular Weight: 299.31
(Y-33)
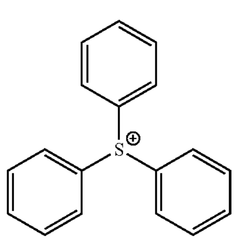
-continued
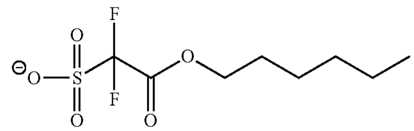
Molecular Weight: 259.25
(Y-34)
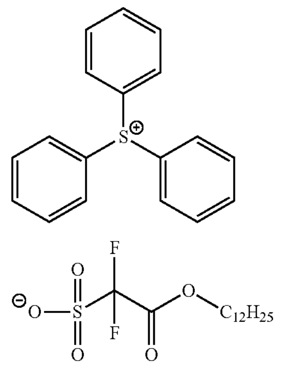
Molecular Weight: 343.41
(Y-35)
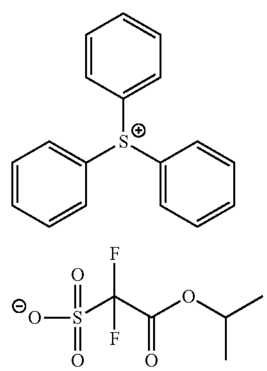
Molecular Weight: 217.17
(Y-36)
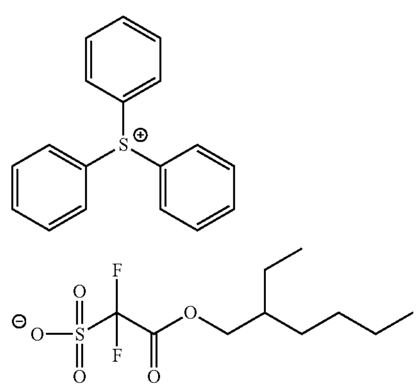
Molecular Weight: 287.30
(Y-37)
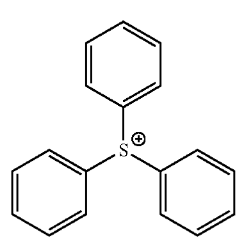

-continued
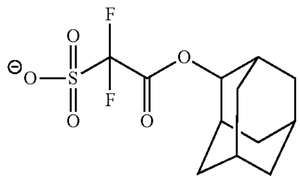
Molecular Weight: 309.31
(Y-38)
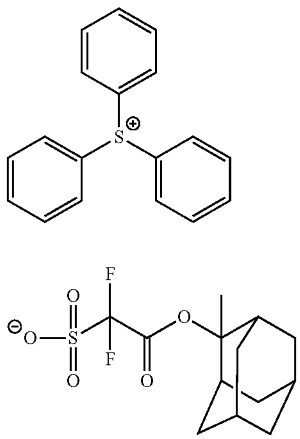
Molecular Weight: 323.33
(Y-39)
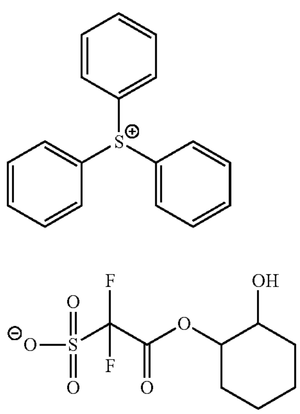
Molecular Weight: 273.23
(Y-40)
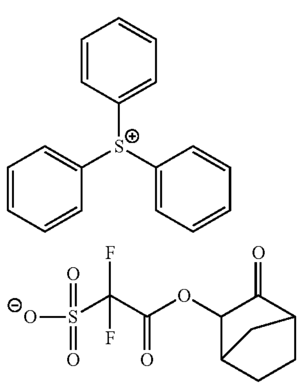
Molecular Weight: 283.23
-continued
(Y-41)
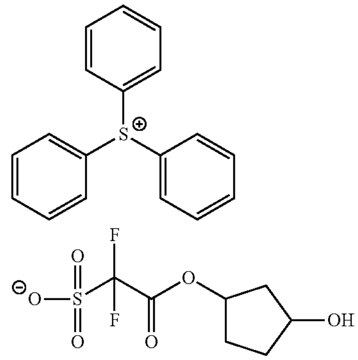
Molecular Weight: 259.21
(Y-42)
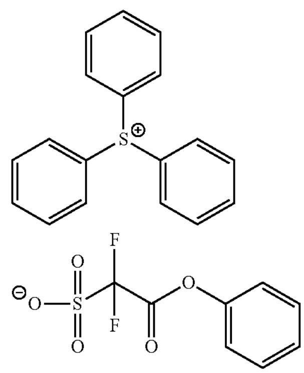
Molecular Weight: 251.18
(Y-43)
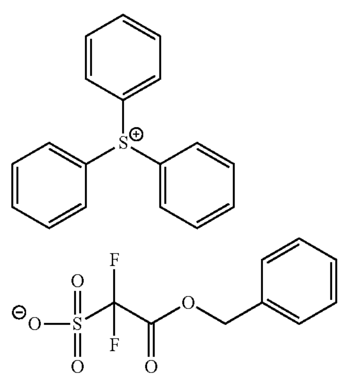
Molecular Weight: 265.21
(Y-44)
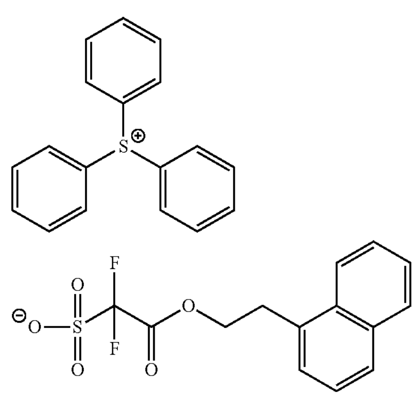
Molecular Weight: 329.30

-continued
(Y-45)
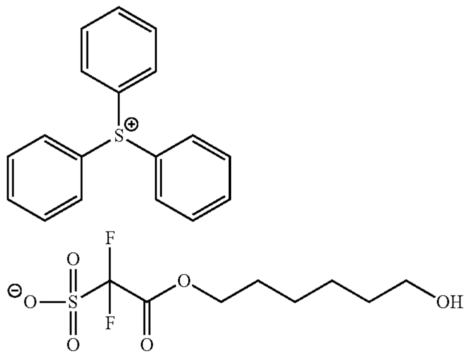
Molecular Weight: 275.25
(Y-46)
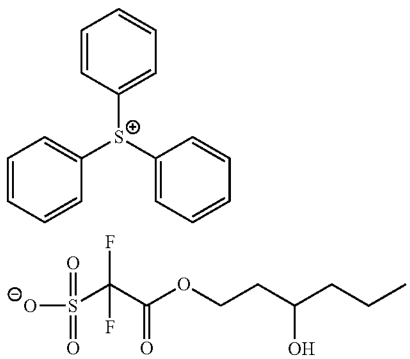
Molecular Weight: 275.25
(Y-47)
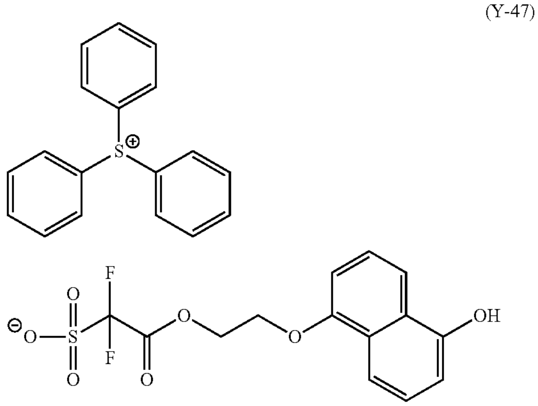
Molecular Weight: 361.30
(Y-48)
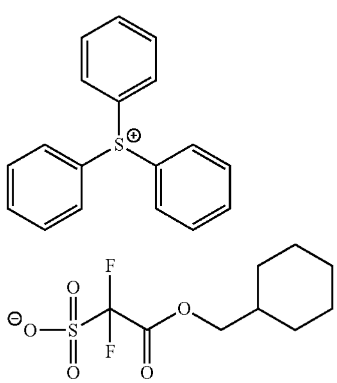
Molecular Weight: 271.26
-continued
(Y-49)
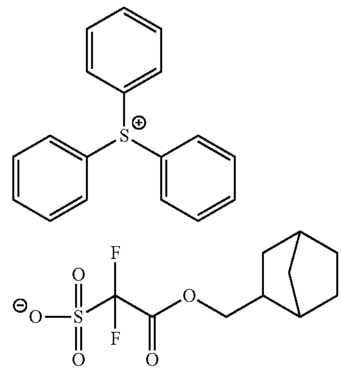
Molecular Weight: 283.27
(Y-50)
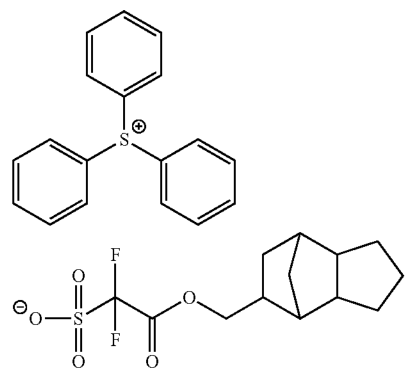
Molecular Weight: 323.33
(Y-51)
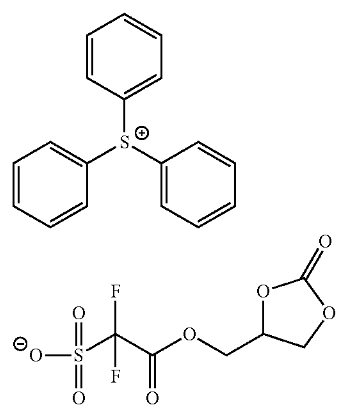
Molecular Weight: 275.16
(Y-52)
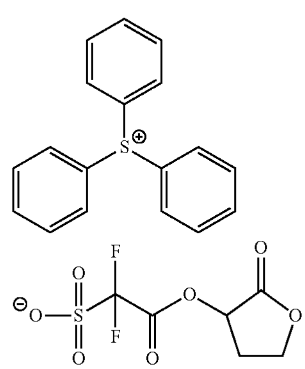
Molecular Weight: 259.16

(Y-53)
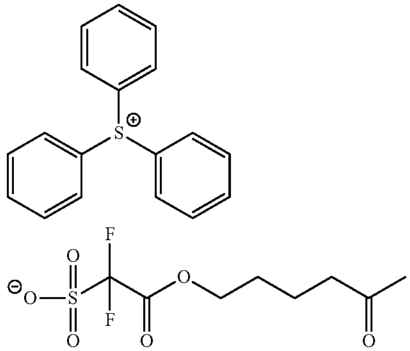
Molecular Weight: 273.23
(Y-54)
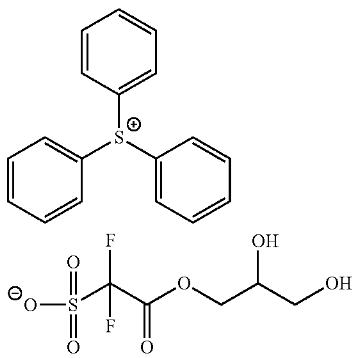
Molecular Weight: 249.17
(Y-55)
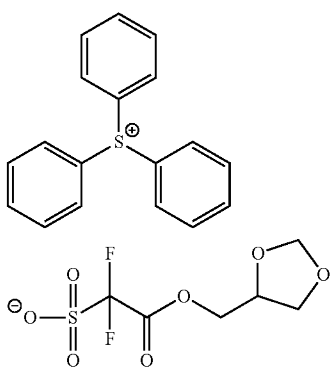
Molecular Weight: 261.18
(Y-56)
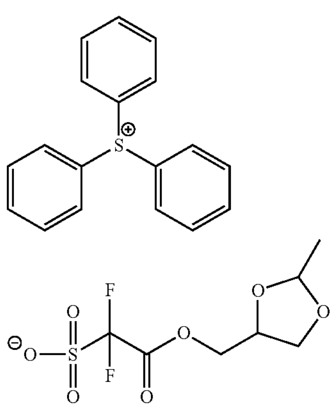
Molecular Weight: 275.20
(Y-57)
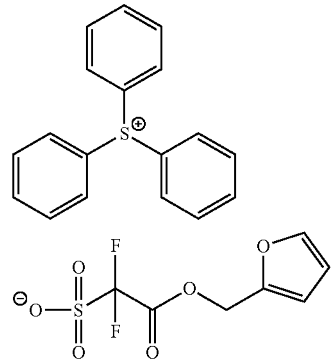
Molecular Weight: 255.17
(Y-58)
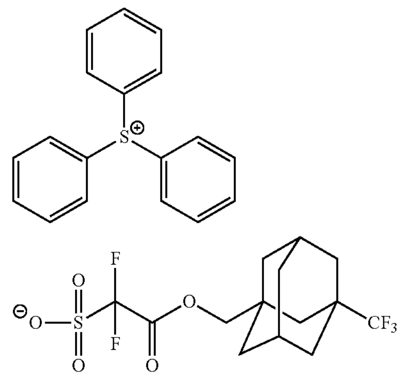
Molecular Weight: 391.33
(Y-59)
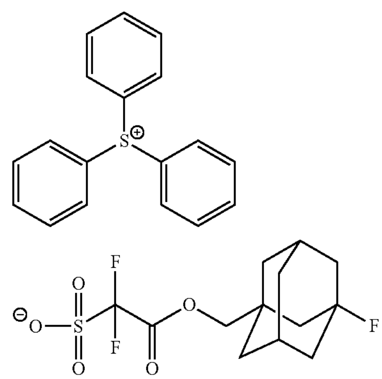
Molecular Weight: 341.32
(Y-60)
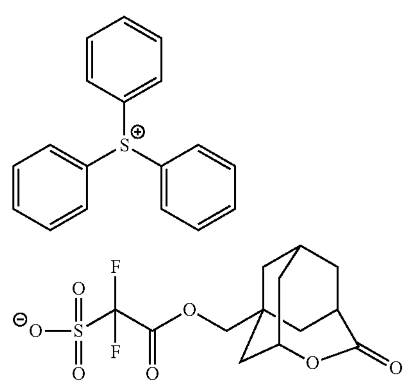
Molecular Weight: 339.29

-continued
(Y-61)
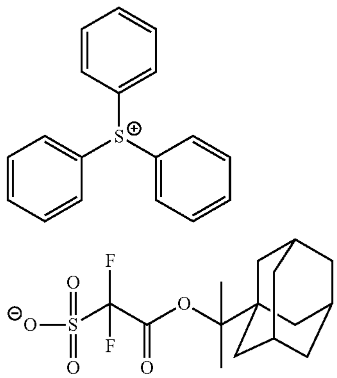
Molecular Weight: 351.39
(Y-62)
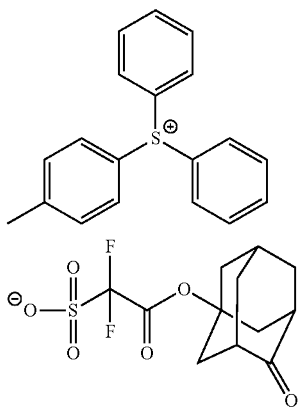
Molecular Weight: 323.29
(Y-63)
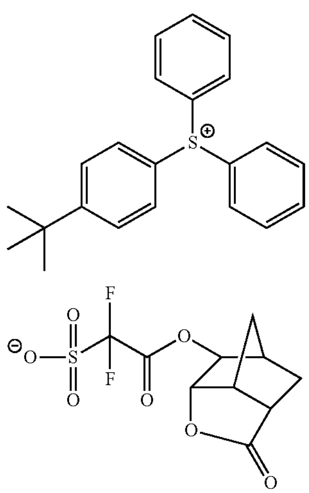
Molecular Weight: 311.24
(Y-64)
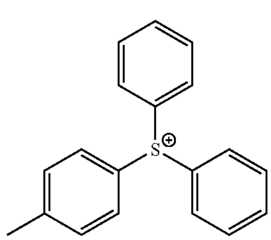
-continued
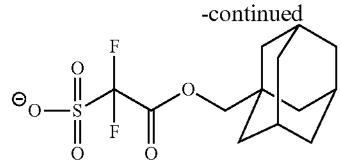
Molecular Weight: 323.33
(Y-65)
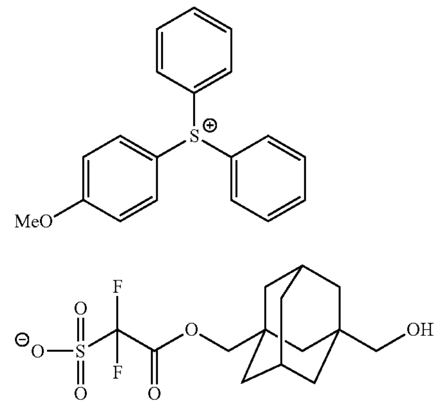
Molecular Weight: 353.36
(Y-66)
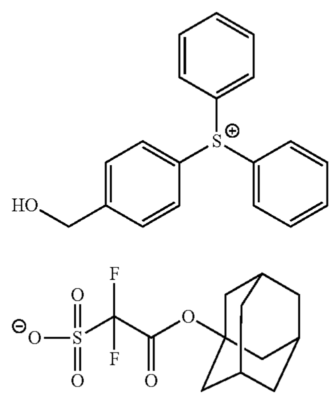
Molecular Weight: 309.31
(Y-67)
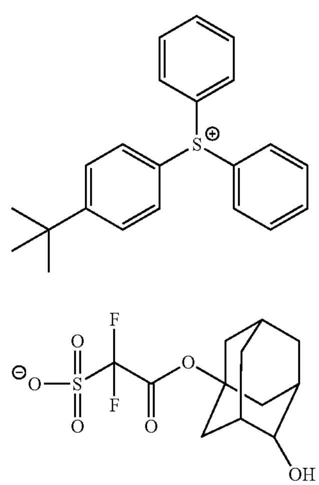
Molecular Weight: 325.31

-continued (Y-68)

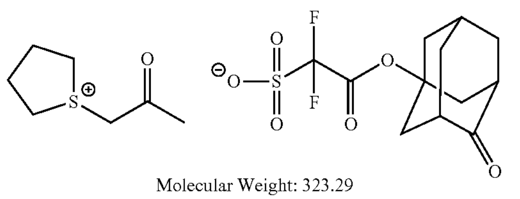

Molecular Weight: 323.29

(Y-69)

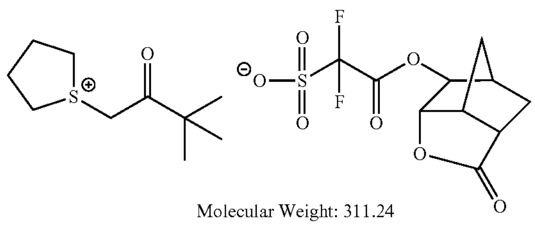

Molecular Weight: 311.24

(Y-70)

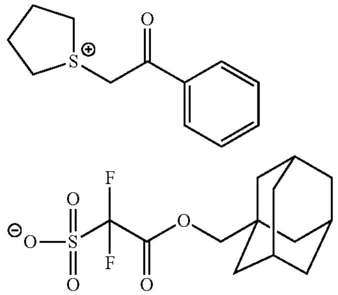

Molecular Weight: 323.33

(Y-71)

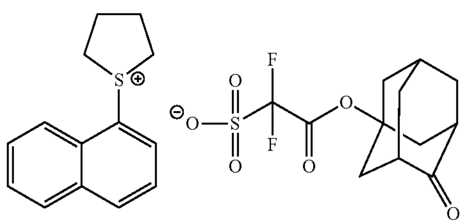

Molecular Weight: 323.29

(Y-72)

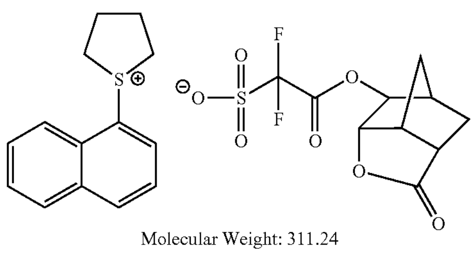

Molecular Weight: 311.24

(Y-73)

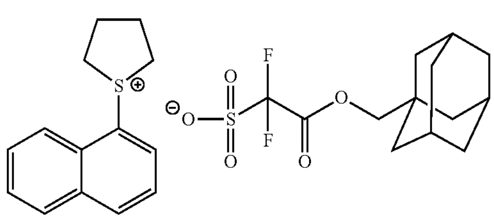

Molecular Weight: 323.33

-continued (Y-74)

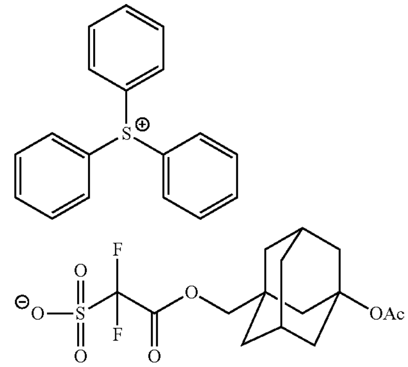

Molecular Weight: 381.37

(Y-75)

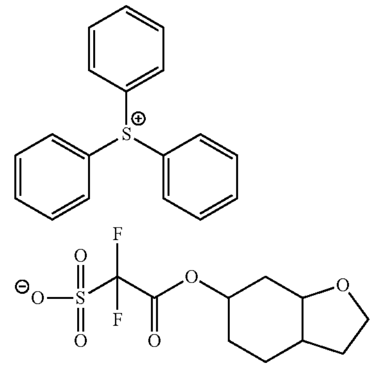

Molecular Weight: 299.27

The compound represented by formula (I) can be synthesized by a known method, for example, can be synthesized in accordance with the method described in JP-A-2007-161707.

As for the compound represented by formula (I), one kind may be used, or two or more kinds may be used in combination.

As for the acid generator, a compound capable of generating an acid represented by the following formula (P1) is also preferred.

(P1)

$$HO_3S-\left(\underset{R_2}{\overset{R_1}{C}}\right)_{m1}-\left(\underset{R_4}{\overset{R_3}{C}}\right)_{m2}-\left[A-\left(\underset{R_6}{\overset{R_5}{C}}\right)_{m3}-\left(\underset{R_8}{\overset{R_7}{C}}\right)_{m4}\right]_{m5}-OR_9$$

In formula (P1), each of $R_1$ to $R_8$ independently represents a hydrogen atom, an alkyl group, a cycloalkyl group, a halogen atom or a hydroxyl group, $R_9$ represents a hydrogen atom, an alkyl group, a cycloalkyl group, an alkenyl group, an acyl group or —$SO_2Rs$, A represents a heteroatom-containing divalent linking group or a single bond, Rs represents an alkyl group, a cycloalkyl group or an aryl group, each of m1 to m4 independently represents an integer of 0 to 12, provided that $m3+m4\geq1$, m5 represents an integer of 1 to 3, and when any of m1 to m5 is an integer of 2 or more, a plurality of members for each of $R_1$ to $R_8$ and A may be the same or different.

Here, the alkyl group, cycloalkyl group and alkenyl group may have a fluorine atom as the substituent.

Examples of the heteroatom-containing divalent linking group of A include an oxygen atom, —CO—, —CONR—, —$SO_2NR$—, —CONRCO—, —$SO_2NRCO$—, —$SO_2NRSO_2$— and —OCONR—, wherein R represents a hydrogen atom, an alkyl group or a cycloalkyl group.

Each of $R_1$ to $R_8$ is, independently, preferably a hydrogen atom, a perfluoroalkyl group or a fluorine atom, more preferably a perfluoroalkyl group or a fluorine atom. A is preferably a single bond or an oxygen atom. $R_9$ is preferably an acyl group represented by —CORx, wherein Rx represents an alkyl group, a cycloalkyl group, an aryl group or a heteroaryl group and is preferably a cycloalkyl group or an aryl group. In formula (P1), the carbon atom adjacent to $SO_3H$ is preferably substituted by a fluorine atom or a trifluoromethyl group.

The compound capable of generating an acid having a structure represented by formula (P1) is preferably a structure represented by the following formula (1-A):

(1-A)

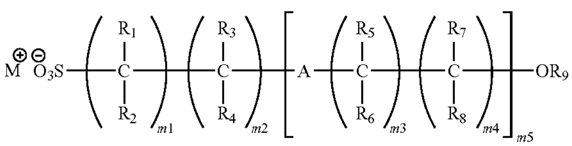

In formula (1-A), $R_1$ to $R_9$, A and m1 to m5 have the same meanings as $R_1$ to $R_9$, A and m1 to m5 in formula (P1), respectively, and $M^+$ represents an organic counter cation.

The organic counter ion represented $M^+$ is preferably an iodonium or sulfonium ion, more preferably sulfonium ion.

The acid represented by formula (P1) is more preferably a structure represented by the following formulae (1-B) to (1-D):

(1-B)

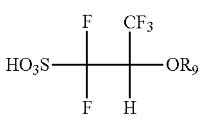

-continued (1-C)

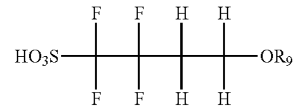

(1-D)

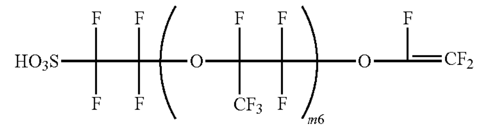

In formulae (1-B) to (1-D), $R_9$ has the same meaning as $R_9$ in formula (P1), and m6 represents an integer of 0 to 2.

The compound capable of generating an acid represented by formula (P1) is, in particular, preferably a structure represented by the following formulae (1-E) to (1-G):

(1-E)

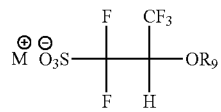

(1-F)

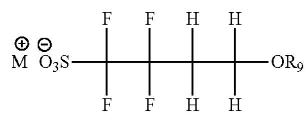

(1-G)

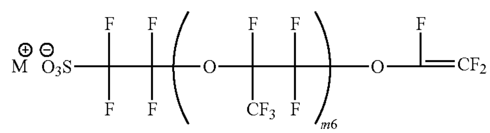

In formulae (1-E) to (1-G), $R_9$ and $M^+$ have the same meanings as $R_9$ and $M^+$ in formula (1-A), and m6 has the same meaning as m6 in formula (1-D).

Specific examples of the compound capable of generating an acid represented by formula (P1) are set forth below, but the present invention is not limited thereto.

(X1)

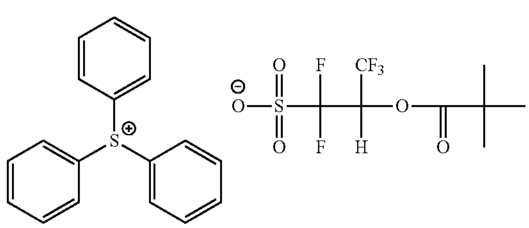

Molecular Weight: 313.22

(X2)

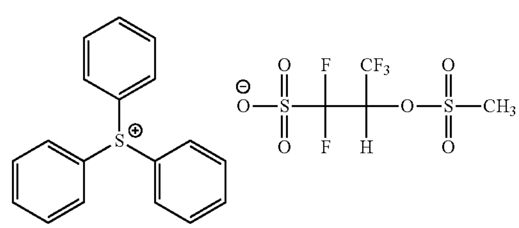

Molecular Weight: 307.19

(X3)

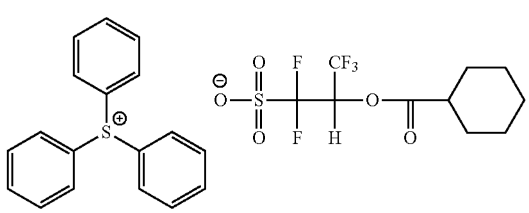

Molecular Weight: 339.26

(X4)

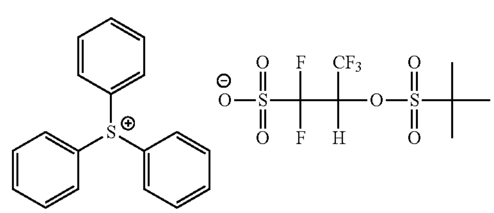

Molecular Weight: 349.27

-continued
(X5)
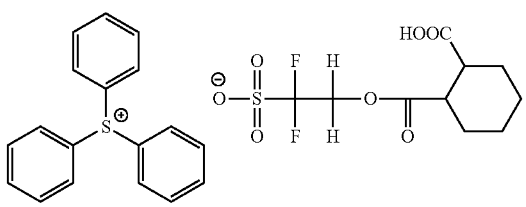
Molecular Weight: 315.27
(X6)
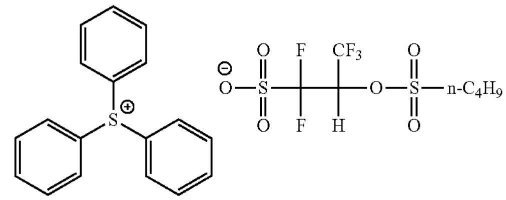
Molecular Weight: 349.27
(X7)
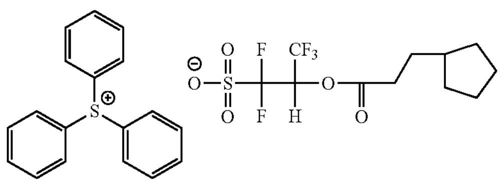
Molecular Weight: 353.28
(X8)
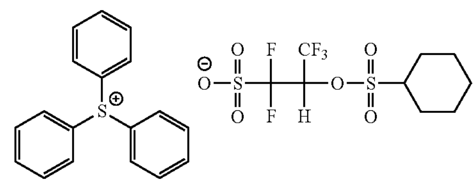
Molecular Weight: 375.31
(X9)
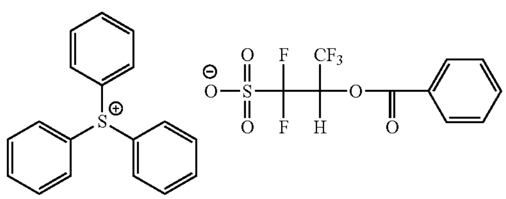
Molecular Weight: 333.21
(X10)
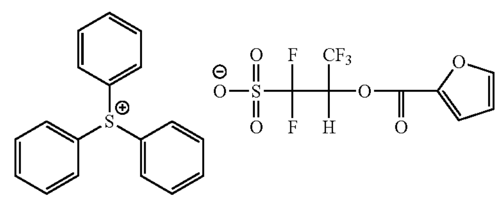
Molecular Weight: 323.17
(X11)
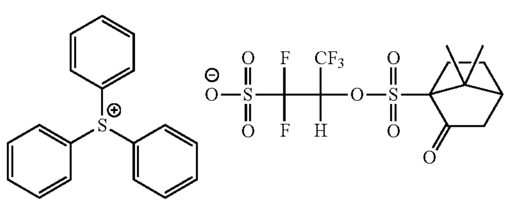
Molecular Weight: 429.36
(X12)
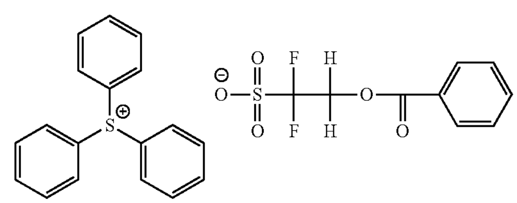
Molecular Weight: 265.21
(X13)
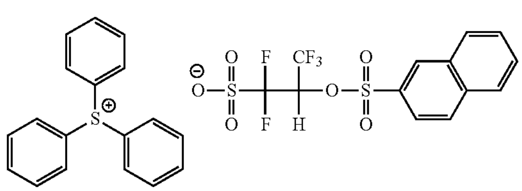
Molecular Weight: 383.27
(X14)
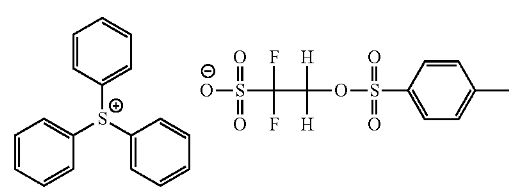
Molecular Weight: 315.29
(X15)
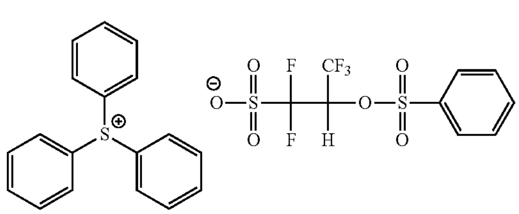
Molecular Weight: 369.26
(X16)
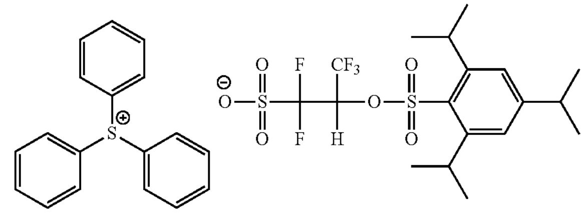
Molecular Weight: 495.50

-continued
(X17)
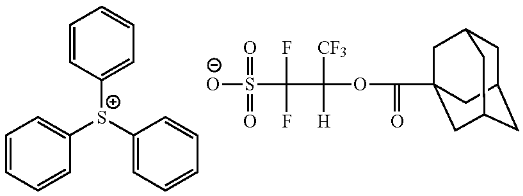
Molecular Weight: 391.33
(X18)
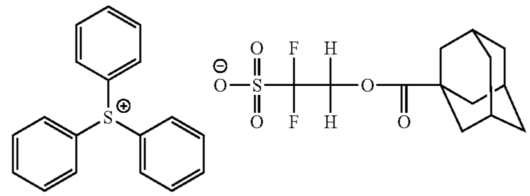
Molecular Weight: 323.33
(X19)
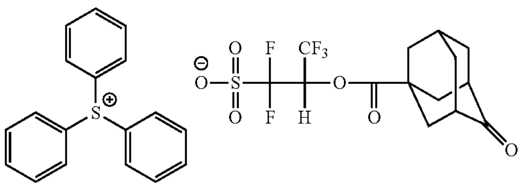
Molecular Weight: 405.31
(X20)
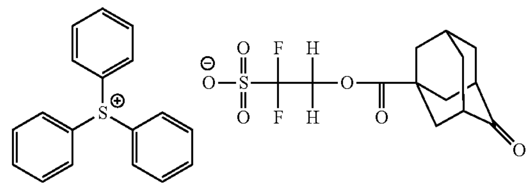
Molecular Weight: 337.32
(X21)
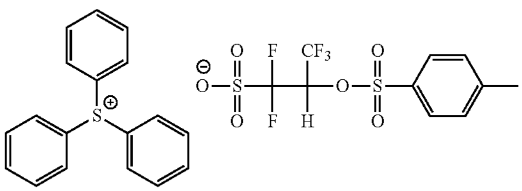
Molecular Weight: 383.29
(X22)
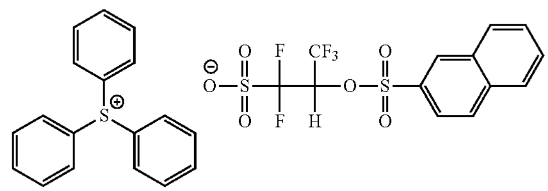
Molecular Weight: 419.32
(X23)
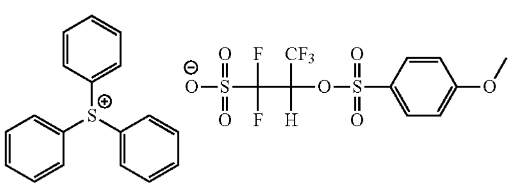
Molecular Weight: 399.29
(X24)
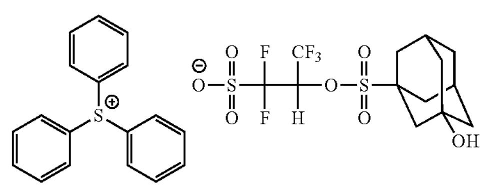
Molecular Weight: 407.33
(X25)
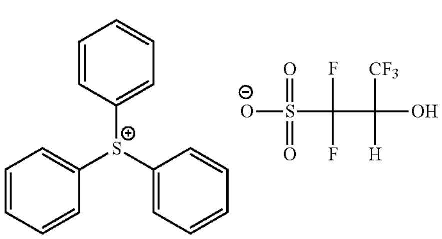
Molecular Weight: 229.10
(X26)
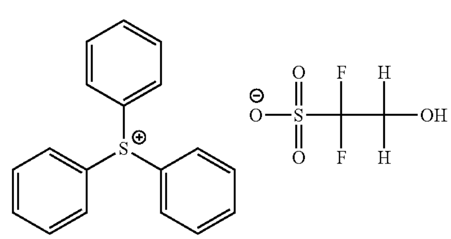
Molecular Weight: 407.33
(X27)
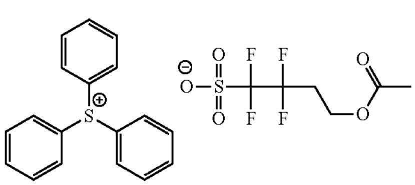
Molecular Weight: 267.18
(X28)
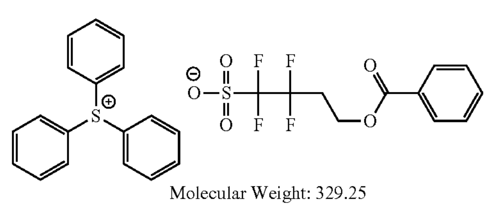
Molecular Weight: 329.25

-continued
(X29)
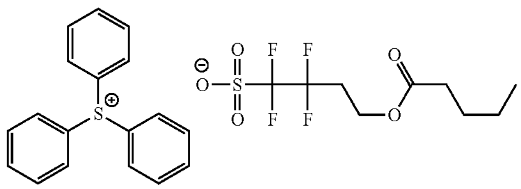
Molecular Weight: 309.26
(X30)
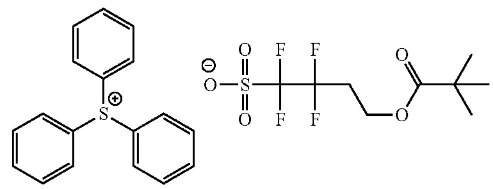
Molecular Weight: 309.26
(X31)
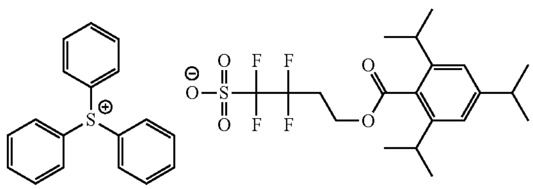
Molecular Weight: 455.48
(X32)
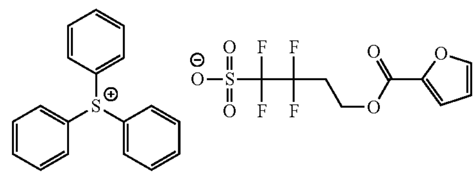
Molecular Weight: 319.21
(X33)
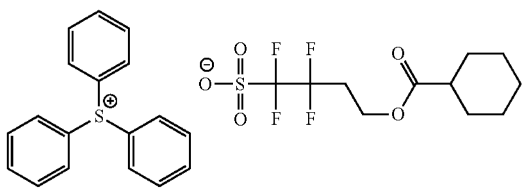
Molecular Weight: 335.29
(X34)
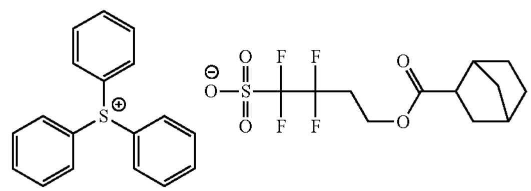
Molecular Weight: 347.30
(X35)
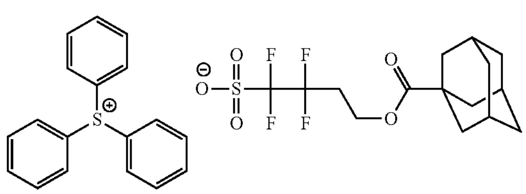
Molecular Weight: 387.37
(X36)
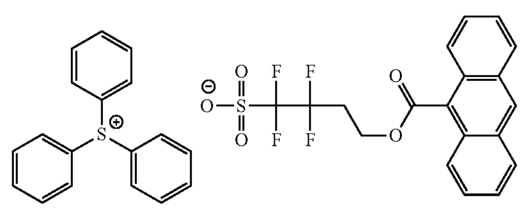
Molecular Weight: 429.36
(X37)
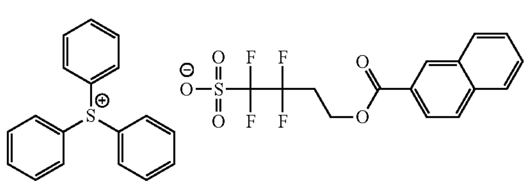
Molecular Weight: 379.30
(X38)
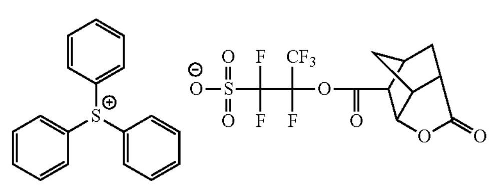
Molecular Weight: 393.26
(X39)
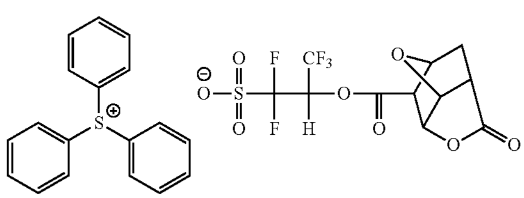
Molecular Weight: 395.23
(X40)
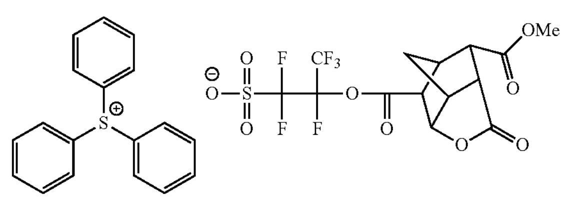
Molecular Weight: 451.30

-continued
(X41)
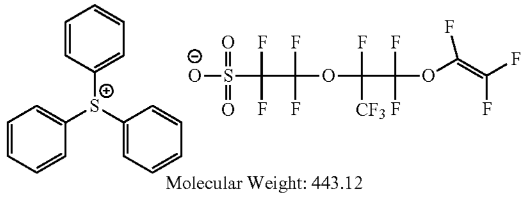
Molecular Weight: 443.12
(X42)
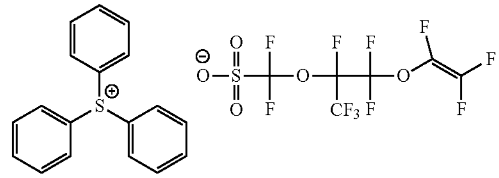
Molecular Weight: 393.11
(X43)
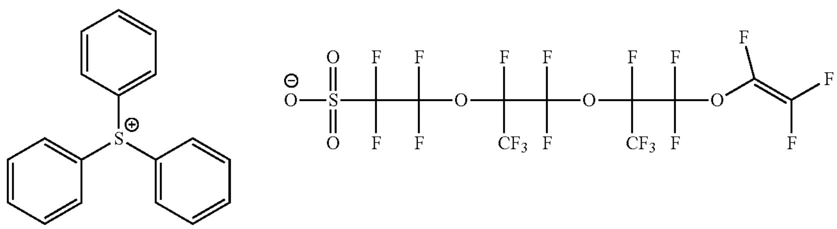
Molecular Weight: 609.14
(X44)
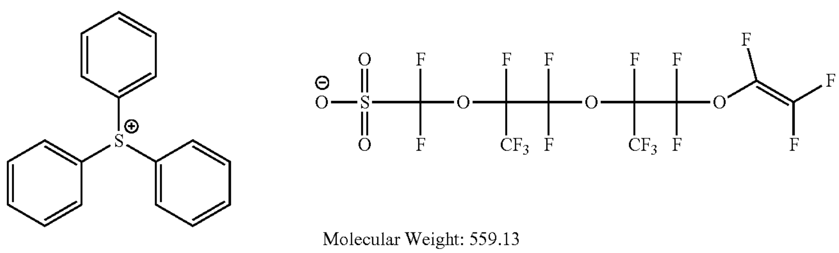
Molecular Weight: 559.13
(X45)
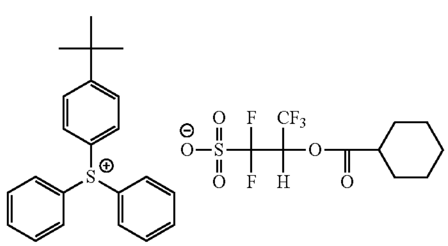
Molecular Weight: 339.26
(X46)
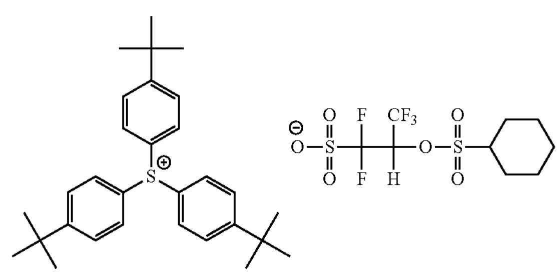
Molecular Weight: 375.31
(X47)
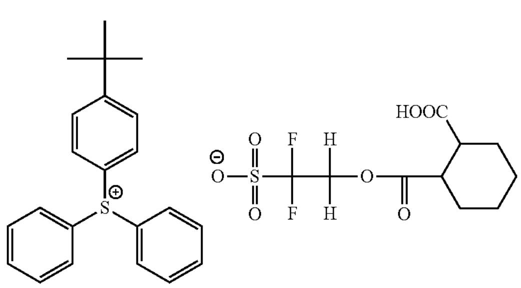
Molecular Weight: 315.27
(X48)
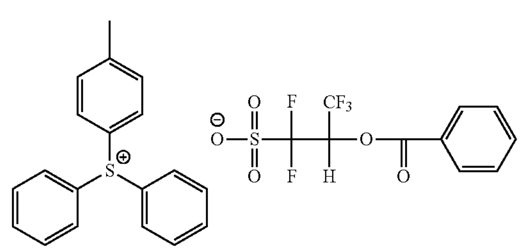
Molecular Weight: 333.21

-continued
(X49)
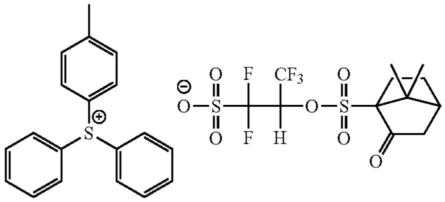
Molecular Weight: 429.36
(X50)
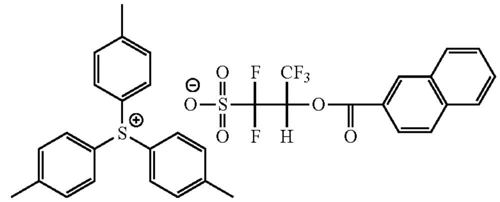
Molecular Weight: 383.27
(X51)
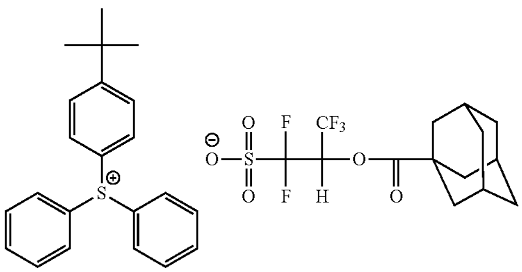
Molecular Weight: 391.33
(X52)
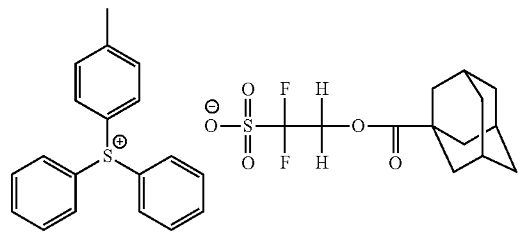
Molecular Weight: 323.33
(X53)
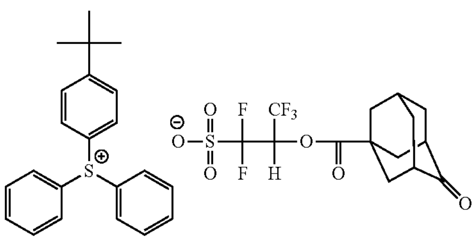
Molecular Weight: 405.31
(X54)
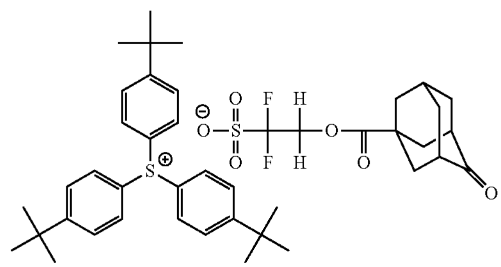
Molecular Weight: 337.32
(X55)
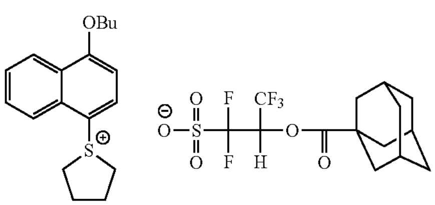
Molecular Weight: 391.33
(X56)
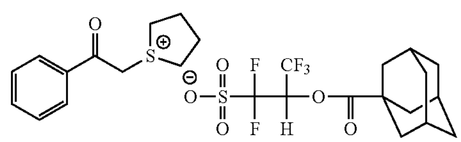
Molecular Weight: 391.33
(X57)
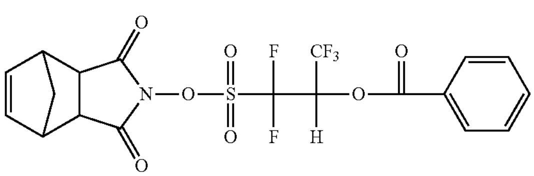
(X58)
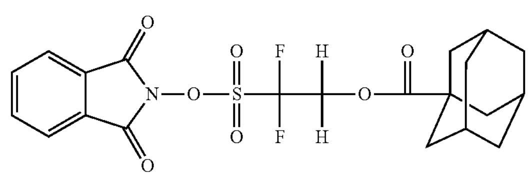
(X59)
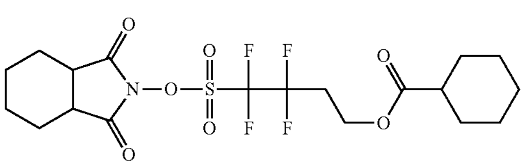
(X60)
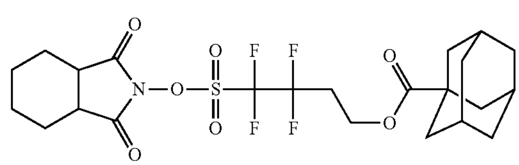

-continued (X61)

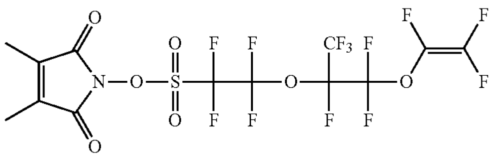

(X62)

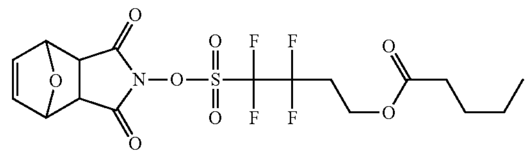

(X63)

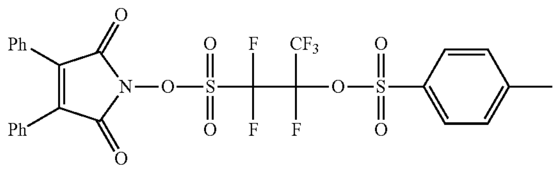

(X64)

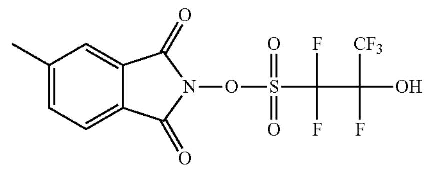

(X65)

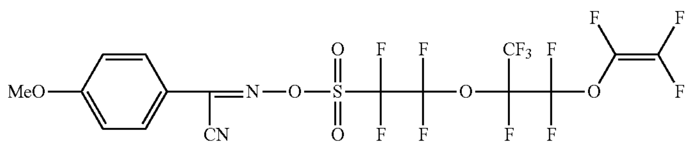

(X66)

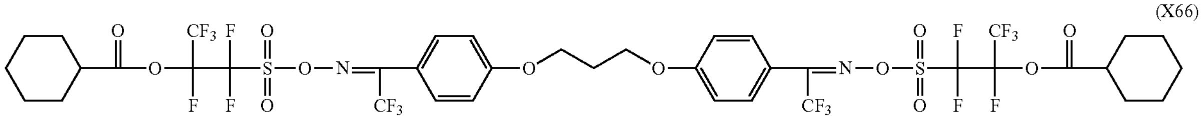

(X67)

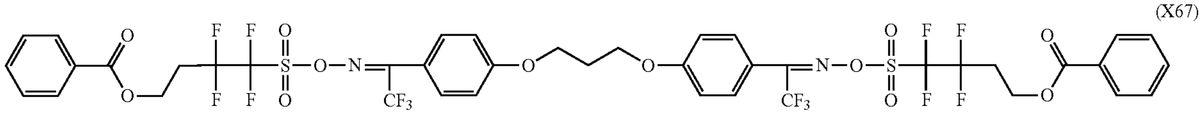

(X68)

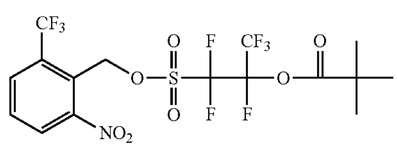

(X69)

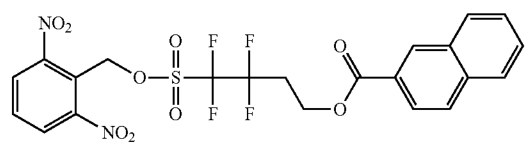

The content of the compound capable of generating an acid upon irradiation with an actinic ray or radiation, such as compound represented by formula (I) or (1-A), in the actinic ray-sensitive or radiation-sensitive resin composition is preferably from 0.1 to 20 mass %, more preferably from 0.5 to 10 mass %, still more preferably from 1 to 7 mass %, based on the entire solid content of the actinic ray-sensitive or radiation-sensitive resin composition.

[3] (C) Resin having a Repeating Unit Containing at least One Polarity Conversion Group and having at least either a Fluorine Atom or a Silicon Atom The actinic ray-sensitive or radiation-sensitive resin composition of the present invention contains (C) a resin having (c) a repeating unit that has at least one polarity conversion group and at the same time, having at least either a fluorine atom or a silicon atom. The resin (C) has hydrophobicity, and addition of the resin (C) is preferred particularly in view of reducing the development defect.

Here, the polarity conversion group is a group capable of decomposing by the action of an alkali developer to increase the solubility in an alkali developer. Examples thereof include a lactone group, a carboxylic acid ester group (—COO—), an acid anhydride group (—C(O)OC(O)—), an acid imide group (—NHCONH—), a carboxylic acid thioester group (—COS—), a carbonic acid ester group (—OC(O)O—), a sulfuric acid ester group (—$OSO_2O$—) and a sulfonic acid ester group (—$SO_2O$—).

Incidentally, an ester group directly bonded to the main chain in a repeating unit such as acrylate is poor in the function of decomposing by the action of an alkali developer to increase the solubility in an alkali developer and is not included in the polarity conversion group of the present invention.

Examples of the repeating unit (c) include a structure represented by formula (K0):

(K0)

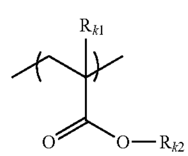

In the formula, $R_{k1}$ represents a hydrogen atom, a halogen atom, a hydroxyl group, an alkyl group, a cycloalkyl group, an aryl group or a group having a polarity conversion group, and $R_{k2}$ represents an alkyl group, a cycloalkyl group, an aryl group or a group having a polarity conversion group, provided that at least either one of $R_{k1}$ and $R_{k2}$ has a polarity conversion group.

Incidentally, as described above, the ester group directly bonded to the main chain of the repeating unit represented by formula (KO) is not included in the polarity conversion group of the present invention.

The polarity conversion group is preferably a group represented by X in a partial structure represented by formula (KA-1) or (KB-1):

(KA-1)

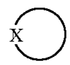

(KB-1)

$Y^1$—X—$Y^2$

In formulae (KA-1) and (KB-1), X represents a carboxylic acid ester group: —COO—, an acid anhydride group: —C(O)OC(O)—, an acid imide group: —NHCONH—, a carboxylic acid thioester group: —COS—, a carbonic acid ester group: —OC(O)O—, a sulfuric acid ester group: —$OSO_2O$—, or a sulfonic acid ester group: —$SO_2O$—).

Each of $Y^1$ and $Y^2$, which may be the same or different, represents an electron-withdrawing group.

Incidentally, the repeating unit (c) has a preferred polarity conversion group by containing a group having a partial structure represented by formula (KA-1) or (KB-1), but as in the case of the structure represented by formula (KA-1) or the structure represented by formula (KB-1) where $Y^1$ and $Y^2$ are monovalent, when the partial structure does not have a bond, the group having the partial structure is a group having a monovalent or greater valent group resulting from removal of at least one arbitrary hydrogen atom in the partial structure.

The partial structure represented by formula (KA-1) or (KB-1) is linked to the main chain of the resin (C) at an arbitrary position through a substituent.

The partial structure represented by formula (KA-1) is a structure forming a ring structure together with the group as X.

In formula (KA-1), X is preferably a carboxylic acid ester group (that is, the case of forming a lactone ring structure as KA-1), an acid anhydride group or a carbonic acid ester group, more preferably a carboxylic acid ester group.

The ring structure represented by formula (KA-1) may have a substituent and, for example, may have nka substituents $Z_{ka1}$.

$Z_{ka1}$ represents, when a plurality of $Z_{ka1}$'s are present, each independently represents, an alkyl group, a cycloalkyl group, an ether group, a hydroxyl group, an amide group, an aryl group, a lactone ring group or an electron-withdrawing group.

$Z_{ka1}$'s may combine with each other to form a ring. Examples of the ring formed by combining $Z_{ka1}$'s with each other include a cycloalkyl ring and a heterocycle (e.g., cyclic ether ring, lactone ring).

nka represents an integer of 0 to 10 and is preferably an integer of 0 to 8, more preferably an integer of 0 to 5, still more preferably an integer of 1 to 4, and most preferably an integer of 1 to 3.

The electron-withdrawing group as $Z_{ka1}$ has the same meaning as the later-described electron-withdrawing group of $Y^1$ and $Y^2$ typified by a halogen atom.

The electron-withdrawing group above may be substituted by another electron-withdrawing group.

$Z_{ka1}$ is preferably an alkyl group, a cycloalkyl group, an ether group, a hydroxyl group or an electron-withdrawing group, more preferably an alkyl group, a cycloalkyl group or an electron-withdrawing group. The ether group is preferably an ether group substituted, for example, by an alkyl group or a cycloalkyl group, that is, an alkyl ether group or the like is preferred. Preferred examples of the electron-withdrawing group are the same as those of the electron-withdrawing group of $Y^1$ and $Y^2$ described later.

Examples of the halogen atom as $Z_{ka1}$ include a fluorine atom, a chlorine atom, a bromine atom and an iodine atom, with a fluorine atom being preferred.

The alkyl group as $Z_{ka1}$ may have a substituent and may be either linear or branched. The linear alkyl group is preferably an alkyl group having a carbon number of 1 to 30, more preferably from 1 to 20, and examples thereof include a methyl group, an ethyl group, an n-propyl group, an n-butyl group, a sec-butyl group, a tert-butyl group, an n-pentyl group, an n-hexyl group, an n-heptyl group, an n-octyl group, an n-nonyl group and an n-decanyl group. The branched alkyl group is preferably an alkyl group having a carbon number of 3 to 30, more preferably from 3 to 20, and examples thereof include an i-propyl group, an i-butyl group, a tert-butyl group, an i-pentyl group, a tert-pentyl group, an i-hexyl group, a tert-hexyl group, an i-heptyl group, a tert-heptyl group, an i-octyl group, a tert-octyl group, an i-nonyl group and a tert-decenoyl group. An alkyl group having a carbon number of 1 to 4, such as methyl group, ethyl group, n-propyl group, i-propyl group, n-butyl group, i-butyl group and tert-butyl group, is preferred.

The cycloalkyl group as $Z_{ka1}$ may have a substituent, may be monocyclic or polycyclic, and may be crosslinked For example, the cycloalkyl group may have a bridged structure. The monocyclic cycloalkyl group is preferably a cycloalkyl group having a carbon number of 3 to 8, and examples thereof include a cyclopropyl group, a cyclopentyl group, a cyclohexyl group, a cyclobutyl group and a cyclooctyl group. Examples of the polycyclic cycloalkyl group include a group having a bicyclo, tricyclo or tetracyclo structure and having a carbon number of 5 or more. A cycloalkyl group having a carbon number of 6 to 20 is preferred, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group. As for the cycloalkyl group, the following structures are also preferred. Incidentally, a part of carbon atoms in the cycloalkyl group may be replaced by a heteroatom such as oxygen atom.

(1)

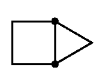

(2)

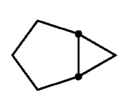

(3)

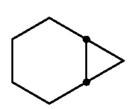

(4)

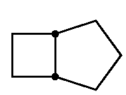

(5)

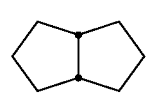

-continued
(6)
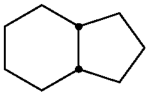
(7)
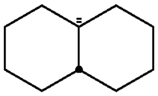
(8)
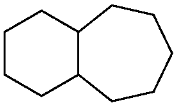
(9)
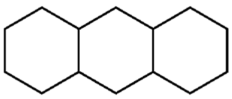
(10)
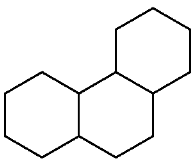
(11)
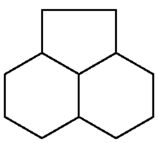
(12)
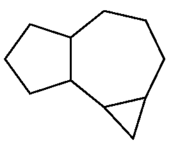
(13)
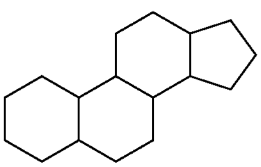
(14)
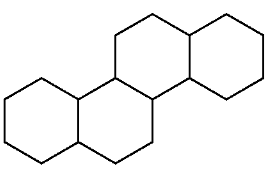
(15)
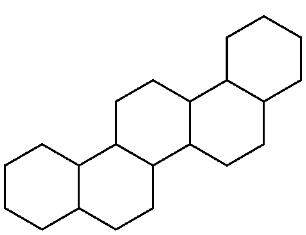
(16)
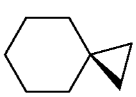
-continued
(17)
(18)
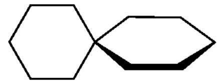
(19)
(20)
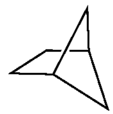
(21)
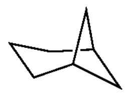
(22)
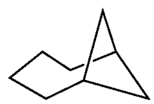
(23)
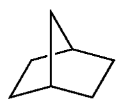
(24)
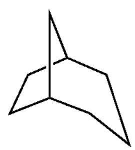
(25)
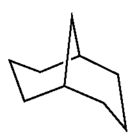
(26)
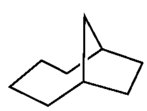
(27)
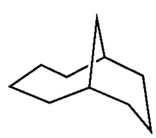
(28)
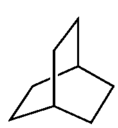
(29)
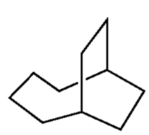

-continued (30)

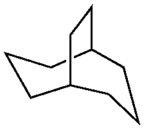

(31)

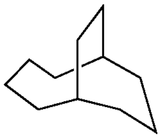

(32)

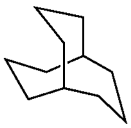

(33)

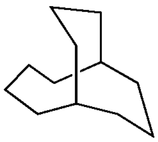

(34)

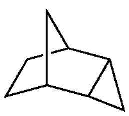

(35)

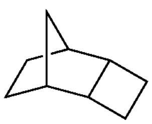

(36)

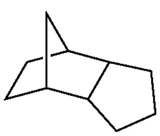

(37)

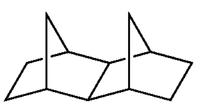

(38)

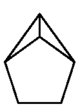

(39)

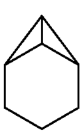

(40)

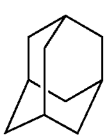

(41)

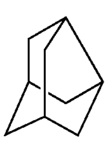

-continued (42)

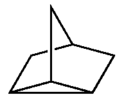

(43)

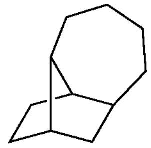

(44)

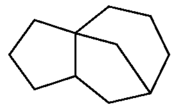

(45)

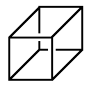

(46)

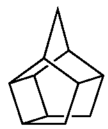

(47)

(48)

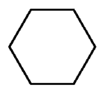

(49)

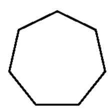

(50)

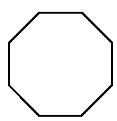

The preferred alicyclic moiety includes an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. An adamantyl group, a decalin group, a norbornyl group, a cedrol group, a cyclohexyl group, a cycloheptyl group, a cyclooctyl group, a cyclodecanyl group, a cyclododecanyl group and a tricyclodecanyl group are more preferred.

The substituent of the alicyclic structure includes an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group is preferably an alkoxy group having a carbon number of 1 to 4, such as methoxy group, ethoxy group, propoxy group and butoxy group. Examples of the substituent which the alkyl group and alkoxy group may have include a hydroxyl group, a halogen atom and an alkoxy group (preferably having a carbon number of 1 to 4).

Examples of the lactone ring group of $Z_{ka1}$ include a group resulting from removal of a hydrogen atom in the structure represented by any one of formulae (KA-1) to (KA-1-17) described later.

Examples of the aryl group of $Z_{ka1}$ include a phenyl group and a naphthyl group.

Examples of the substituent which the alkyl group, cycloalkyl group and aryl group of $Z_{ka1}$ may further have include a hydroxyl group, a halogen atom (e.g., fluorine, chlorine, bromine, iodine), a nitro group, a cyano group, the above-described alkyl group, an alkoxy group such as methoxy group, ethoxy group, hydroxyethoxy group, propoxy group, hydroxypropoxy group, n-butoxy group, isobutoxy group, sec-butoxy group and tert-butoxy group, an alkoxycarbonyl group such as methoxycarbonyl group and ethoxycarbonyl group, an aralkyl group such as benzyl group, phenethyl group and cumyl group, an aralkyloxy group, an acyl group such as formyl group, acetyl group, butyryl group, benzoyl group, cinnamyl group and valeryl group, an acyloxy group such as butyryloxy group, the above-described alkenyl group, an alkenyloxy group such as vinyloxy group, propenyloxy group, allyloxy group and butenyloxy group, the above-described aryl group, an aryloxy group such as phenoxy group, and an aryloxycarbonyl group such as benzoyloxy group.

In a preferred embodiment, X in formula (KA-1) is a carboxylic acid ester group, and the partial structure represented by formula (KA-1) is a lactone ring, preferably a 5- to 7-membered lactone ring.

Incidentally, it is preferred that as in (KA-1-1) to (KA-1-17) shown below, another ring structure is condensed to a 5- to 7-membered lactone ring as the partial structure represented by formula (KA-1) in the form of forming a bicyclo or Spiro structure.

Examples of the peripheral ring structure to which the ring structure represented by formula (KA-1) may be combined include those in (KA-1-1) to (KA-1-17) shown below and structures in accordance therewith.

The structure containing the lactone ring structure represented by formula (KA-1) is more preferably a structure represented by any one of the following (KA-1-1) to (KA-1-17). The lactone structure may be bonded directly to the main chain. Preferred structures are (KA-1-1), (KA-1-4), (KA-1-5), (KA-1-6), (KA-1-13), (KA-1-14) and (KA-1-17).

KA-1-1

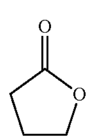

KA-1-2

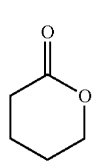

KA-1-3

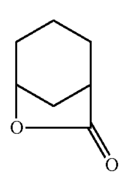

-continued

KA-1-4

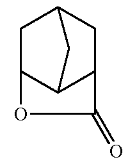

KA-1-5

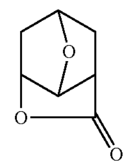

KA-1-6

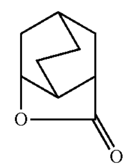

KA-1-7

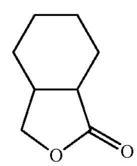

KA-1-8

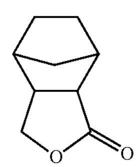

KA-1-9

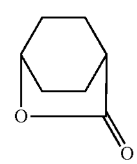

KA-1-10

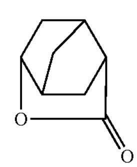

KA-1-11

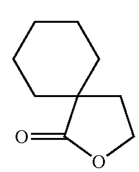

KA-1-12

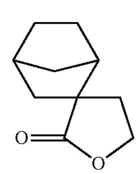

-continued

KA-1-13

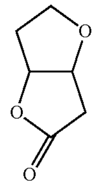

KA-1-14

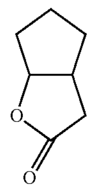

KA-1-15

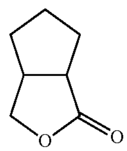

KA-1-16

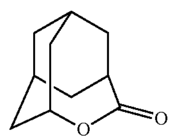

KA-1-17

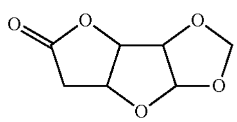

The structure containing the above-described lactone ring structure may or may not have a substituent. Preferred examples of the substituent are the same as those of the substituent which the ring structure represented by formula (KA-1) may have.

Some lactone structures have an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more, and most preferably 98% or more.

In formula (KB-1), X is preferably a carboxylic acid ester group (—COO—).

In formula (KB-1), each of $Y^1$ and $Y^2$ independently represents an electron-withdrawing group.

The electron-withdrawing group is preferably a partial structure represented by the following formula (EW). In formula (EW), * indicates a bond directly bonded to (KA-1) or a bond directly bonded to X in (KB-1).

(EW)

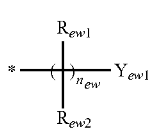

In formula (EW), $n_{ew}$ is a repetition number of the linking group represented by —$C(R_{ew1})(R_{ew2})$— and represents an integer of 0 or 1. In the case where $n_{ew}$ is 0, this indicates that the bonding is formed by a single bond and $Y_{ew1}$ is directly bonded.

$Y_{ew1}$ is a halogen atom, a cyano group, a nitrile group, a nitro group, a halo(cyclo)alkyl or haloaryl group represented by —$C(R_{f1})(R_{f2})$—$R_{f3}$ described later, an oxy group, a carbonyl group, a sulfonyl group, a sulfinyl group, or a combination thereof. The electron-withdrawing group may be, for example, a structure shown below. The term "halo(cyclo) alkyl group" indicates an alkyl or cycloalkyl group that is at least partially halogenated. Each of $R_{ew3}$ and $R_{ew4}$ independently represents an arbitrary structure. The partial structure represented by formula (EW) may have an electron-withdrawing group and combine, for example, to the main chain of the resin regardless of the structure of $R_{ew3}$ and $R_{ew4}$ but is preferably an alkyl group, a cycloalkyl group or an alkyl fluoride group.

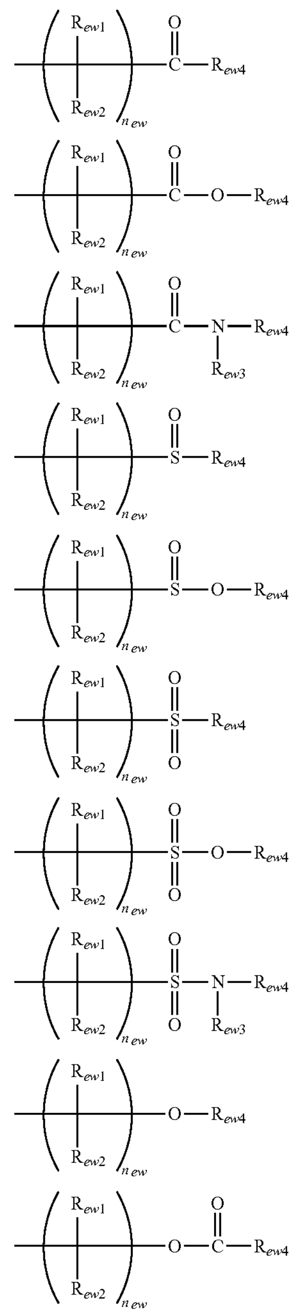

-continued

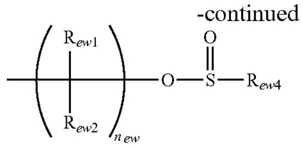

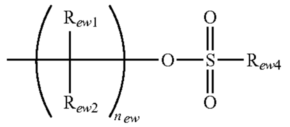

In the case where $Y_{ew1}$ is a divalent or greater valent group, the remaining bond forms bonding with an arbitrary atom or substituent. At least any one group of $Y_{ew1}$, $R_{ew1}$ and $R_{ew2}$ may combine with the main chain of the resin (C) through a further substituent.

$Y_{ew1}$ is preferably a halogen atom or a halo(cyclo)alkyl or haloaryl group represented by —$C(R_{f1})(R_{f2})$—$R_{f3}$.

Each of $R_{ew1}$ and $R_{ew2}$ independently represents an arbitrary substituent, for example, represents a hydrogen atom, an alkyl group, a cycloalkyl group or an aryl group.

At least two members out of $R_{ew1}$, $R_{ew2}$ and $Y_{ew1}$ may combine with each other to form a ring.

$R_{f1}$ represents a halogen atom, a perhaloalkyl group, a perhalocycloalkyl group or a perhaloaryl group and is preferably a fluorine atom, a perfluoroalkyl group or a perfluorocycloalkyl group, more preferably a fluorine atom or a trifluoromethyl group.

Each of $R_{f2}$ and $R_{f3}$ independently represents a hydrogen atom, a halogen atom or an organic group, and $R_{f2}$ and $R_{f3}$ may combine to form a ring. Examples of the organic group include an alkyl group, a cycloalkyl group and an alkoxy group, and these groups may be substituted by a halogen atom (preferably fluorine atom). Each of $R_{f2}$ and $R_{f3}$ is preferably a (halo)alkyl group. $R_{f2}$ is more preferably the same group as $R_{f1}$ or combines with $R_{f3}$ to form a ring.

$R_{f1}$ and $R_{f3}$ may combine to form a ring, and examples of the ring formed include a (halo)cycloalkyl ring and a (halo) aryl ring.

Examples of the (halo)alkyl group in $R_{f1}$ to $R_{f3}$ include the alkyl groups in $Z_{ka1}$ and halogenated structures thereof.

Examples of the (per)halocycloalkyl group and (per)haloaryl group in $R_{f1}$ to $R_{f3}$ or in the ring formed by combining $R_{f2}$ and $R_{f3}$ include structures resulting from halogenation of cycloalkyl groups in $Z_{ka1}$, preferably a fluorocycloalkyl group represented by —$C_{(n)}F_{(2n-2)}H$, and a perfluoroaryl group represented by —$C_{(n)}F_{(n-1)}$, wherein the carbon number n is not particularly limited but is preferably from 5 to 13, more preferably 6.

The ring which may be formed by combining at least two members of $R_{ew1}$, $R_{ew2}$ and $Y_{ew1}$ with each other is preferably a cycloalkyl group or a heterocyclic group, and the heterocyclic group is preferably a lactone ring group. Examples of the lactone ring include structures represented by formulae (KA-1) to (KA-1-17).

Incidentally, the repeating unit (c) may have a plurality of partial structures represented by formula (KA-1), a plurality of partial structures represented by formula (KB-1), or both a partial structure of formula (KA-1) and a partial structure of formula (KB-1).

Here, the partial structure of formula (KA-1) may partially or entirely serve also as the electron-withdrawing group of $Y^1$ or $Y^2$ in formula (KB-1). For example, in the case where X in formula (KA-1) is a carboxylic acid ester group, the carboxylic acid ester group may function as an electron-withdrawing group of $Y^1$ or $Y^2$ in formula (KB-1).

The repeating unit (c) may be (c') a repeating unit having at least either a fluorine atom or a silicon atom and a polarity conversion group on one side chain, (c*) a repeating unit having a polarity conversion group and having neither a fluorine atom nor a silicon atom, or (c") a repeating unit having a polarity conversion group on one side chain and at the same time, having at least either a fluorine atom or a silicon atom on a side chain different from the side chain above in the same repeating unit, but the resin (C) preferably contains a repeating unit (c') as the repeating unit (c). That is, it is preferred that the repeating unit (c) having at least one polarity conversion group has at least either a fluorine atom or a silicon atom.

In the case where the resin (C) contains a repeating unit (c*), the resin is preferably a copolymer with a repeating unit having at least either a fluorine atom or a silicon atom (a repeating unit (c1) described later). Also, in the repeating unit (c"), the side chain having a polarity conversion group and the side chain having at least either a fluorine atom or a silicon atom are preferably bonded to the same carbon atom in the main chain, that is, have a positional relationship like the following formula (K1).

In the formula, B1 represents a partial structure having a polarity conversion group, and B2 represents a partial structure having at least either a fluorine atom or a silicon atom.

(K1)

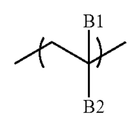

Also, in the repeating unit (c*) and the repeating unit (c"), the polarity conversion group is more preferably a partial structure represented by —COO— in the structure of formula (KA-1).

The polarity conversion group decomposes by the action of an alkali developer to effect polarity conversion, whereby the receding contact angle with water of the resin composition film after alkali development can be decreased.

The receding contact angle with water of the resin composition film after alkali development is preferably 50° or less, more preferably 40° or less, still more preferably 35° or less, and most preferably 30° or less, at the temperature during exposure, usually at room temperature 23±3° C., and a humidity of 45±5%.

The receding contact angle is a contact angle measured when a contact line recedes on the liquid droplet-substrate interface, and this is generally known to be useful in simulating the mobility of a liquid droplet in the dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called expansion/contraction method.

The hydrolysis rate of the resin (C) for an alkali developer is preferably 0.001 nm/sec or more, more preferably 0.01 nm/sec or more, still more preferably 0.1 nm/sec or more, and most preferably 1 nm/sec or more.

The hydrolysis rate of the resin (C) for an alkali developer is a rate at which the thickness of a resin film formed of the resin (C) alone decreases when treated with TMAH (an aqueous tetramethylammonium hydroxide solution) (2.38 mass %) at 23° C.

The resin (C) of the present invention is preferably (C1) a resin containing (c) a repeating unit that has at least two or more polarity conversion groups and at the same time, having at least either a fluorine atom or a silicon atom.

In the case where the repeating unit (c) has at least two polarity conversion groups, the repeating unit (c) preferably contains a partial structure having two polarity conversion groups represented by the following formula (KY-1). Incidentally, when the structure represented by formula (KY-1) does not have a bond, this is a monovalent or greater valent group resulting from removal of at least one arbitrary hydrogen atom in the structure.

(KY-1)

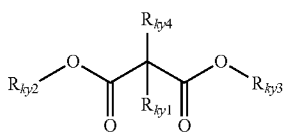

In formula (KY-1), each of $R_{ky1}$ and $R_{ky4}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group. Alternatively, $R_{ky1}$ and $R_{ky4}$ may be bonded to the same atom to form a double bond. For example, $R_{ky1}$ and $R_{ky4}$ may be bonded to the same oxygen atom to form a part (=O) of a carbonyl group.

Each of $R_{ky2}$ and $R_{ky3}$ independently represents an electron-withdrawing group, or while $R_{ky1}$ and $R_{ky2}$ combine to form a lactone ring, $R_{ky3}$ is an electron-withdrawing group. The lactone ring formed is preferably a structure of (KA-1-1) to (KA-1-17). Examples of the electron-withdrawing group is the same as those for $Y^1$ and $Y^2$ in formula (KB-1), and a halogen atom and a halo(cyclo)alkyl or haloaryl group represented by —C($R_{f1}$)($R_{f2}$)—$R_{f3}$ are preferred. In a preferred embodiment, $R_{ky3}$ is a halogen atom or a halo(cyclo)alkyl or haloaryl group represented by —C($R_{f1}$)($R_{f2}$)—$R_{f3}$ and $R_{ky2}$ combines with $R_{ky1}$ to form a lactone ring or is an electron-withdrawing group containing no halogen atom.

$R_{ky1}$, $R_{ky2}$ and $R_{ky4}$ may combine with each other to form a monocyclic or polycyclic structure.

Specific examples of $R_{ky1}$ and $R_{ky4}$ include the same groups as those for $Z_{ka1}$ in formula (KA-1).

The lactone ring formed by combining $R_{ky1}$ and $R_{ky2}$ is preferably a structure of (KA-1-1) to (KA-1-17). Examples of the electron-withdrawing group are the same as those for $Y^1$ and $Y^2$ in formula (KB-1).

The structure represented by formula (KY-1) is preferably a structure represented by the following formula (KY-2). Here, the structure represented by formula (KY-2) is a monovalent or greater valent group resulting from removal of at least one arbitrary hydrogen atom in the structure.

(KY-2)

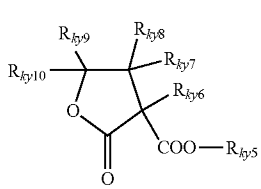

In formula (KY-2), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxyl group, a cyano group, an amide group or an aryl group.

Two or more members of $R_{ky6}$ to $R_{ky10}$ may combine with each other to form a monocyclic or polycyclic structure.

$R_{ky5}$ represents an electron-withdrawing group. Examples of the electron-withdrawing group are the same as those for $Y^1$ and $Y^2$, and a halogen atom and a halo(cyclo)alkyl or haloaryl group represented by —C($R_{f1}$)($R_{f2}$)—$R_{f3}$ are preferred.

Specific examples of $R_{ky5}$ to $R_{ky10}$ include the same groups as those for $Z_{ka1}$ in formula (KA-1).

The structure represented by formula (KY-2) is preferably a partial structure represented by the following formula (KY-3).

(KY-3)

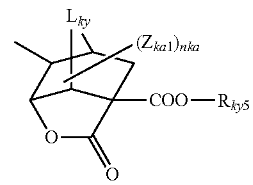

In formula (KY-3), $Z_{ka1}$ and nka have the same meanings as in formula (KA-1). $R_{ky5}$ has the same meaning as in formula (KY-2).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, more preferably a methylene group.

The repeating unit (c) is not limited as long as it is a repeating unit obtained by polymerization such as addition polymerization, condensation polymerization and addition condensation, but a repeating unit obtained by addition polymerization of a carbon-carbon double bond is preferred. Examples thereof include an acrylate-based repeating unit (including a system having a substituent at the α- or β-position), a styrene-based repeating unit (including a system having a substituent at the α- or β-position), a vinyl ether-based repeating unit, a norbornene-based repeating unit, and a maleic acid derivative (e.g., maleic anhydride or a derivative thereof, maleimide) repeating unit. An acrylate-based repeating unit, a styrene-based repeating unit, a vinyl ether-based repeating unit and a norbornene-based repeating unit are preferred, an acrylate-based repeating unit, a vinyl ether-based repeating unit and a norbornene-based repeating unit are more preferred, and an acrylate-based repeating unit is most preferred.

As for the more specific structure of the repeating unit (c), a repeating unit having a partial structure shown below is preferred.

The repeating unit (c) may be a repeating unit having a partial structure shown below.

(cc)

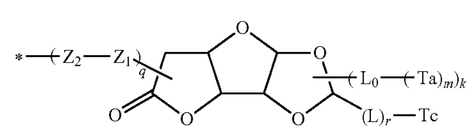

In formula (cc), $Z_1$ represents, when a plurality of $Z_1$'s are present, each independently represents, a single bond, an ether bond, an ester bond, an amide bond, a urethane bond or a urea bond and is preferably an ester bond.

$Z_2$ represents, when a plurality of $Z_2$'s are present, each independently represents, a chain or cyclic alkylene group and is preferably an alkylene group having a carbon number of 1 or 2 or a cycloalkylene group having a carbon number of 5 to 10.

Each Ta independently represents an alkyl group, a cycloalkyl group, an alkoxy group, a nitrile group, a hydroxyl group, an amide group, an aryl group or an electron-withdrawing group (having the same meaning as the electron-withdrawing group of $Y^1$ and $Y^2$ in formula (KB-1)) and is preferably an alkyl group, a cycloalkyl group or an electron-withdrawing group, more preferably an electron-withdrawing group. When a plurality of Ta's are present, Ta's may combine with each other to form a ring.

$L_0$ represents a single bond or an (m+1)-valent hydrocarbon group (preferably having a carbon number of 20 or less) and is preferably a single bond. The single bond as $L_0$ is formed when m is 1. The (m+1)-valent hydrocarbon group as $L_0$ represents an (m+1)-valent hydrocarbon group formed by removing m−1 arbitrary hydrogen atoms from, for example, an alkylene group, a cycloalkylene group, a phenylene group or a combination thereof.

Each L independently represents a carbonyl group, a carbonyloxy group or an ether group.

Tc represents a hydrogen atom, an alkyl group, a cycloalkyl group, a nitrile group, a hydroxyl group, an amide group, an aryl group or an electron-withdrawing group (having the same meaning as the electron-withdrawing group of $Y^1$ and $Y^2$ in formula (KB-1)).

* represents a bond to the main or side chain of the resin. That is, a partial structure represented by formula (cc) may be directly bonded to the main chain, or a partial structure represented by formula (cc) may be bonded to the side chain of the resin. Incidentally, the bond to the main chain is a bond to an atom present in the bonding forming the main chain, and the bond to the side chain is a bond to an atom present in the portion except for the bonding constituting the main chain.

m represents an integer of 1 to 28 and is preferably an integer of 1 to 3, more preferably 1.

k represents an integer of 0 to 2 and is preferably 1.

q is a repetition number of the group ($Z_2$—$Z_1$) and represents an integer of 0 to 5, preferably from 0 to 2.

r represents an integer of 0 to 5.

In place of $-(L)_r$-Tc, the above-described $-L_0-(Ta)_m$ may be substituted.

It is also preferred to have a fluorine atom at the terminal of sugar lactone or have a fluorine atom on a side chain different from the side chain on the sugar lactone side within the same repeating unit (repeating unit (c")).

The carbon number of the chain alkylene group as $Z_2$ is, in the case of a linear alkylene group, preferably from 1 to 30, more preferably from 1 to 20, and in the case of a branched alkylene group, preferably from 3 to 30, more preferably from 3 to 20. Specific examples of the chain alkylene group as $R_2$ include groups resulting from removal of one arbitrary hydrogen atom in specific examples of the alkyl group as $Z_{ka1}$ above.

The cyclic alkylene group as $Z_2$ is preferably a cyclic alkylene group having a 3 to 8, and specific examples thereof include groups resulting from removal of one arbitrary hydrogen atom in the cycloalkyl group as $Z_{ka1}$ above.

The preferred carbon numbers and specific examples of the alkyl group and cycloalkyl group as Ta and Tc are the same as those described above for the alkyl group and cycloalkyl group as $Z_{ka1}$.

The alkoxy group as Ta is preferably an alkoxy group having a carbon number of 1 to 8, and examples thereof include a methoxy group, an ethoxy group, a propoxy group and a butoxy group.

The aryl group as Ta and Tc is preferably an aryl group having a carbon number of 6 to 12, and examples thereof include a phenyl group and a naphthyl group.

The preferred carbon numbers and specific examples of the alkylene group and cycloalkylene group as $L_0$ are the same as those described above for the chain alkylene group and cyclic alkylene group as $Z_2$.

As for the more specific structure of the repeating unit (c), a repeating unit having a partial structure shown below is preferred.

(ca-2)

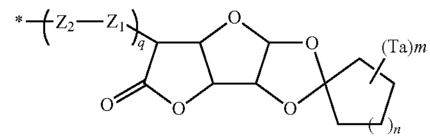

(cb-2)

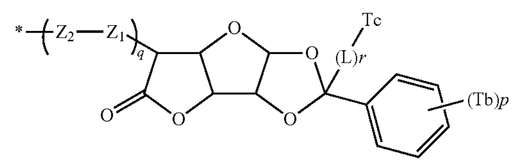

In formulae (ca-2) and (cb-2), n represents an integer of 0 to 11 and is preferably an integer of 0 to 5, more preferably 1 or 2.

p represents an integer of 0 to 5 and is preferably an integer of 0 to 3, more preferably 1 or 2.

Each Tb independently represents an alkyl group, a cycloalkyl group, an alkoxy group, a nitrile group, a hydroxyl group, an amide group, an aryl group or an electron-withdrawing group (having the same meaning as the electron-withdrawing group of $Y^1$ and $Y^2$ in formula (KB-1)) and is preferably an alkyl group, a cycloalkyl group or an electron-withdrawing group. When a plurality of Tb's are present, Tb's may combine with each other to form a ring.

* represents a bond to the main or side chain of the resin. That is, a partial structure represented by formula (ca-2) or (cb-2) may be directly bonded to the main chain, or a partial structure represented by formula (ca-2) or (cb-2) may be bonded to the side chain of the resin.

$Z_1$, $Z_2$, Ta, Tc, L, *, m, q and r have the same meanings as those in formula (cc) and preferred embodiments are also the same.

(KY-4)

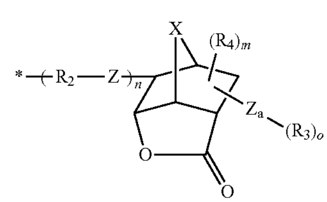

In formula (KY-4), $R_2$ represents a chain or cyclic alkylene group and when a plurality of $R_2$'s are present, each $R_2$ may be the same as or different from every other $R_2$.

$R_3$ represents a linear, branched or cyclic hydrocarbon group where a part or all of hydrogen atoms on the constituent carbons are replaced by a fluorine atom.

$R_4$ represents a halogen atom, a cyano group, a hydroxy group, an amide group, an alkyl group, a cycloalkyl group, an alkoxy group, a phenyl group, an acyl group, an alkoxycarbonyl group or a group represented by R—C(═O)— or R—C(═O)O— (wherein R represents an alkyl group or a cycloalkyl group). When a plurality of $R_4$'s are present, each $R_4$ may be the same as or different from every other $R_4$, and two or more $R_4$'s may combine to form a ring.

X represents an alkylene group, an oxygen atom or a sulfur atom.

Each of Z and Za represents, when a plurality of Z's or Za's are present, each Z or Za independently represents, a single bond, an ether bond, an ester bond, an amide bond, a urethane bond or a urea bond and when a plurality of Z's or Za's are present, each Z or Za may be the same as or different from every other Z or Za.

* represents a bond to the main or side chain of the resin.

o is the number of substituents and represents an integer of 1 to 7.

m is the number of substituents and represents an integer of 0 to 7.

n is a repetition number and represents an integer of 0 to 5.

The structure of —$R_2$—Z— is preferably a structure represented by —$(CH_2)_l$—COO— (wherein l represents an integer of 1 to 5).

The preferred carbon number range and specific examples of the chain or cyclic alkylene group as $R_2$ are the same as those described for the chain alkylene group and cyclic alkylene group in $Z_2$ of formula (cc).

The carbon number of the linear, branched or cyclic hydrocarbon group as $R_3$ is, in the case of a linear hydrocarbon group, preferably from 1 to 30, more preferably from 1 to 20; in the case of a branched hydrocarbon group, preferably from 3 to 30, more preferably from 3 to 20; and in the case of a cyclic hydrocarbon group, from 6 to 20. Specific examples of $R_3$ include specific examples of the alkyl group and cycloalkyl group as $Z_{ka1}$ above.

The preferred carbon numbers and specific examples of the alkyl group and cycloalkyl group as $R_4$ and R are the same as those described above for the alkyl group and cycloalkyl group as $Z_{ka1}$.

The acyl group as $R_4$ is preferably an acyl group having a carbon number of 1 to 6, and examples thereof include a formyl group, an acetyl group, a propionyl group, a butyryl group, an isobutyryl group, a valeryl group and a pivaloyl group.

Examples of the alkyl moiety in the alkoxy group and alkoxycarbonyl group as $R_4$ include a linear, branched or cyclic alkyl moiety, and the preferred carbon number and specific examples of the alkyl moiety are the same as those described above for the alkyl group and cycloalkyl group as $Z_{ka1}$.

Examples of the alkylene group as X include a chain or cyclic alkylene group, and the preferred carbon number and specific examples thereof are the same as those described for the chain alkylene group and cyclic alkylene group as $R_2$.

A repeating unit having a partial structure represented by formula (KY-5) is more preferred.

(KY-5)

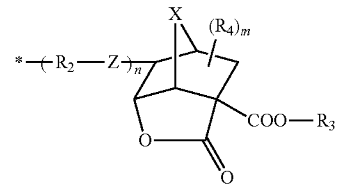

In formula (KY-5), $R_2$ represents a chain or cyclic alkylene group and when a plurality of $R_2$'s are present, each $R_2$ may be the same as or different from every other $R_2$.

$R_3$ represents a linear, branched or cyclic hydrocarbon group where a part or all of hydrogen atoms on the constituent carbons are replaced by a fluorine atom.

$R_4$ represents a halogen atom, a cyano group, a hydroxy group, an amide group, an alkyl group, a cycloalkyl group, an alkoxy group, a phenyl group, an acyl group, an alkoxycarbonyl group or a group represented by R—C(═O)— or R—C(═O)O— (wherein R represents an alkyl group or a cycloalkyl group). When a plurality of $R_4$'s are present, each $R_4$ may be the same as or different from every other $R_4$, and two or more $R_4$'s may combine to form a ring.

X represents an alkylene group, an oxygen atom or a sulfur atom.

Z represents a single bond, an ether bond, an ester bond, an amide bond, a urethane bond or a urea bond and when a plurality of Z's are present, each Z may be the same as or different from every other Z.

* represents a bond to the main or side chain of the resin.

n is a repetition number and represents an integer of 0 to 5.

m is the number of substituents and represents an integer of 0 to 7.

The preferred carbon number ranges and specific examples in $R_2$ to $R_4$ and X are the same as those described in formula (KY-4).

The structure of —$R_2$—Z— is preferably a structure represented by —$(CH_2)_l$—COO— (wherein l represents an integer of 1 to 5).

(rf-1)

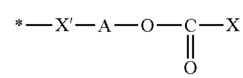

(rf-2)

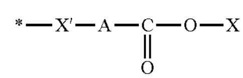

In formulae (rf-1) and (rf-2), X' represents an electron-withdrawing substituent and is preferably a carbonyloxy group, an oxycarbonyl group, a fluorine atom-substituted alkylene group or a fluorine atom-substituted cycloalkylene group.

A represents a single bond or a divalent linking group represented by —C(Rx)(Ry)—, wherein each of Rx and Ry independently represents a hydrogen atom, a fluorine atom, an alkyl group (the carbon number of which is preferably 1 to 6, and which may be substituted by a fluorine atom or the like) or a cycloalkyl group (the carbon number of which is preferably 5 to 12, and which may be substituted by a fluorine atom or the like). Each of Rx and Ry is preferably a hydrogen atom, an alkyl group, or a fluorine atom-substituted alkyl group.

X represents an electron-withdrawing group and is preferably an alkyl fluoride group, a cycloalkyl fluoride group, an aryl group substituted by fluorine or an alkyl fluoride group, or an aralkyl group substituted by fluorine or an alkyl fluoride group.

* represents a bond to the main or side chain of the resin, that is, a bond bonded to the main chain of the resin through a single bond or a linking group.

When X' is a carbonyloxy group or an oxycarbonyl group, A is not a single bond.

The carbon number of the alkylene group in the fluorine atom-substituted alkylene group as X' is, in the case of a linear alkylene group, preferably from 1 to 30, more preferably from 1 to 20, and in the case of a branched alkylene group, preferably from 3 to 30, more preferably from 3 to 20. Specific examples of the alkylene group include groups resulting from removal of one arbitrary hydrogen atom in specific examples of the alkyl group as $Z_{ka1}$ above. The fluorine atom-substituted alkylene group is preferably a perfluoroalkylene group.

The cycloalkylene group in the fluorine atom-substituted cycloalkylene group as X' is preferably a cycloalkylene group having a carbon number of 3 to 8, and specific examples thereof include groups resulting from removal of one arbitrary hydrogen atom in specific examples of the cycloalkyl group as $Z_{ka1}$ above. The fluorine atom-substituted cycloalkylene group is preferably a perfluorocycloalkylene group.

The carbon number of the alkyl group in the alkyl fluoride group as X is, in the case of a linear alkyl group, preferably from 1 to 30, more preferably from 1 to 20, and in the case of a branched alkyl group, preferably from 3 to 30, more preferably from 3 to 20. Specific examples of the alkyl group include specific examples of the alkyl group as $Z_{ka1}$ above. The alkyl fluoride is preferably a perfluoroalkyl group.

The cycloalkyl group in the cycloalkyl fluoride group as X is preferably a cycloalkyl group having a carbon number of 3 to 8, and specific examples thereof include specific examples of the cycloalkyl group as $Z_{ka1}$ above. The cycloalkyl fluoride group is preferably a perfluorocycloalkyl group.

The aryl group in the aryl group substituted by fluorine or an alkyl fluoride group as X is preferably an aryl group having a carbon number of 6 to 12, and examples thereof include a phenyl group and a naphthyl group. Specific examples of the alkyl fluoride group in the aryl group substituted by an alkyl fluoride group are the same as those described above for the alkyl fluoride group as X.

The alkyl group in the aralkyl group substituted by fluorine or an alkyl fluoride group as X is preferably an aralkyl group having a carbon number of 6 to 12, and examples thereof include a benzyl group, a phenethyl group, a naphthylmethyl group, a naphthylethyl group and a naphthylbutyl group. Specific examples of the alkyl fluoride group in the aralkyl group substituted by an alkyl fluoride group are the same as those described for the alkyl fluoride group as X.

Specific examples of the repeating unit (c) having a polarity conversion group are set forth below, but the present invention is not limited thereto.

Ra represents a hydrogen atom, a fluorine atom, a methyl group or a trifluoromethyl group.

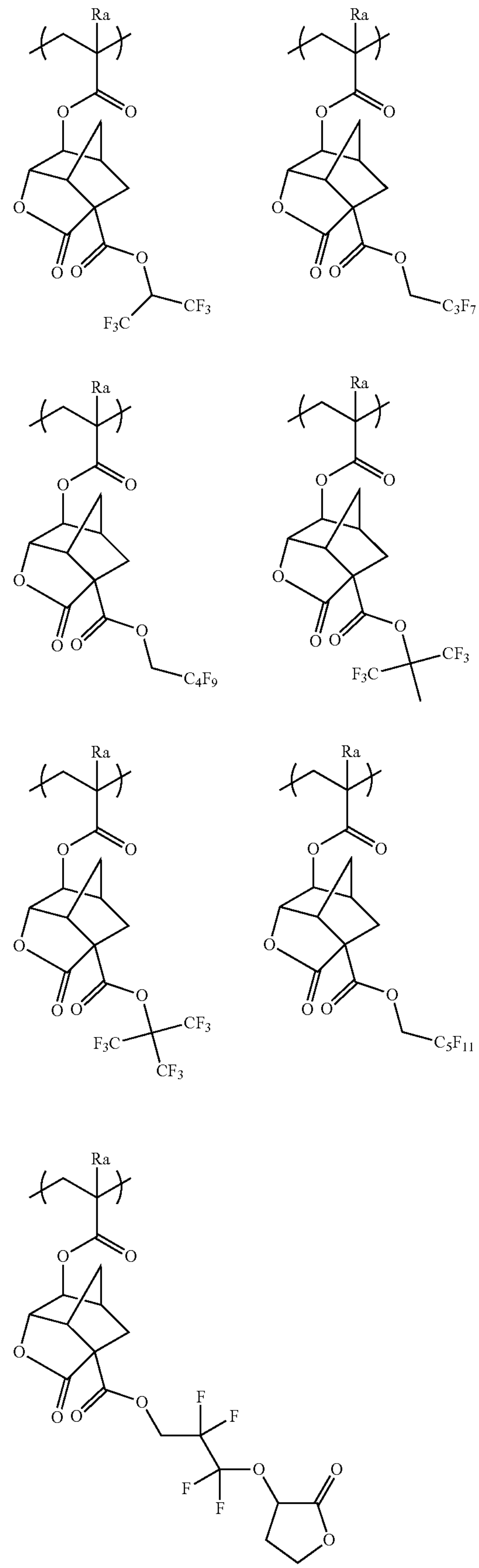

-continued
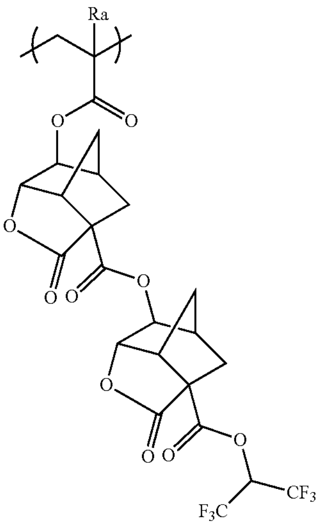
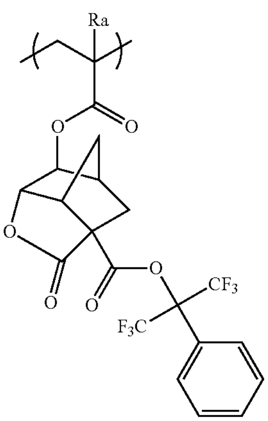
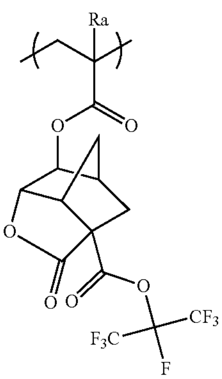
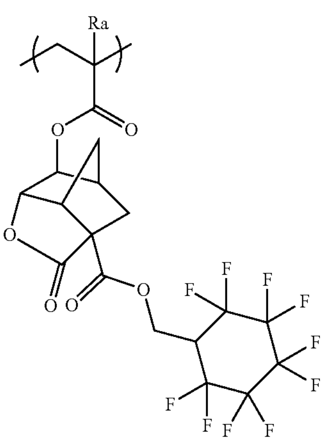
-continued
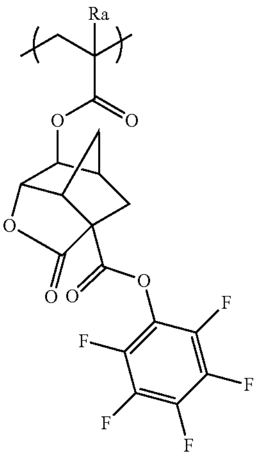
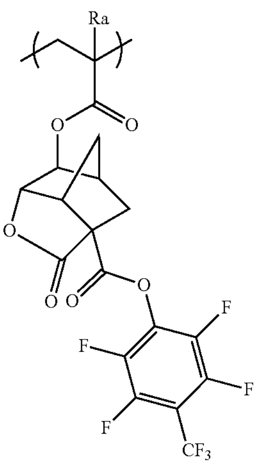
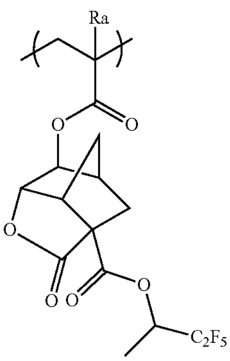
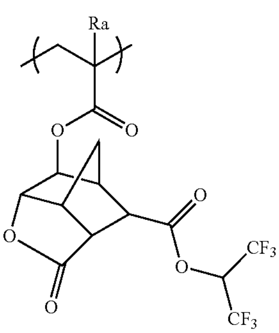
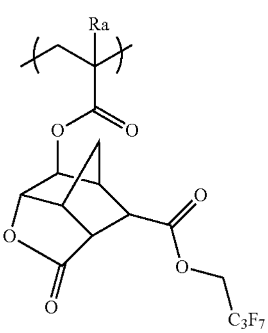

-continued
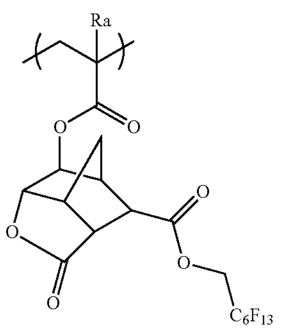
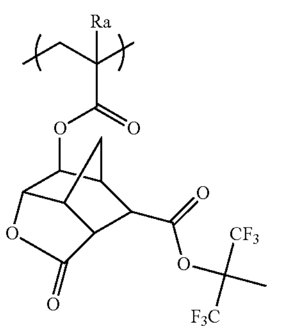
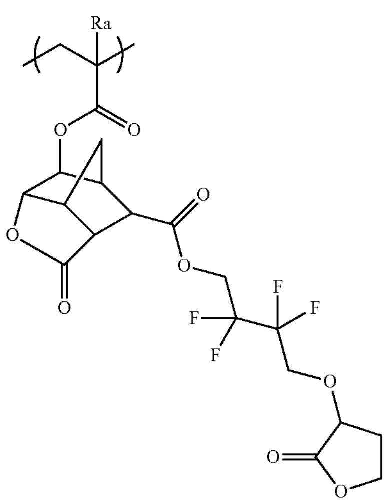
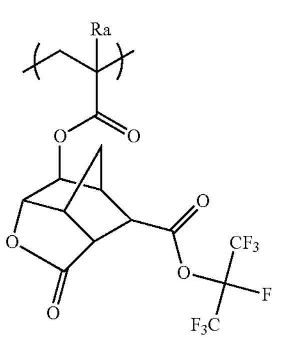
-continued
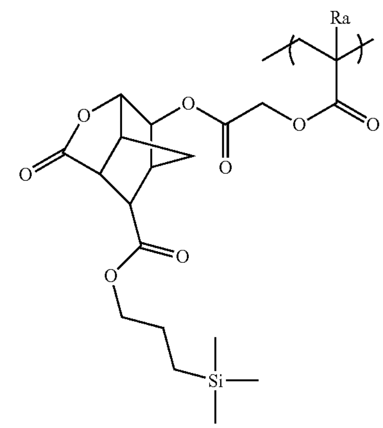
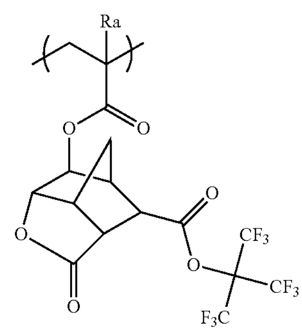
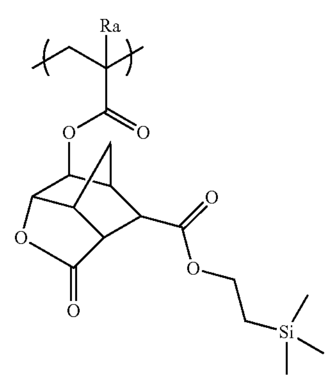
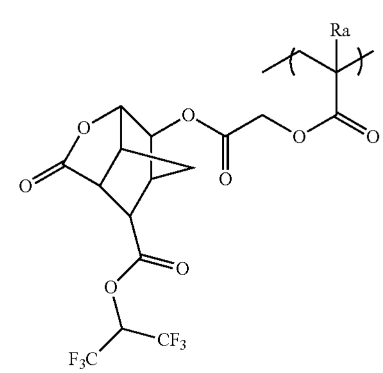

-continued
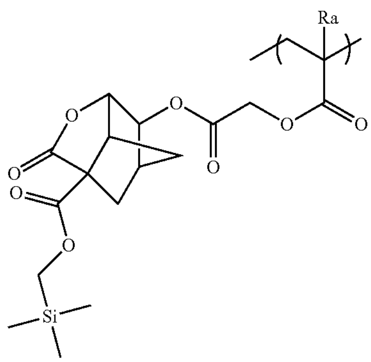
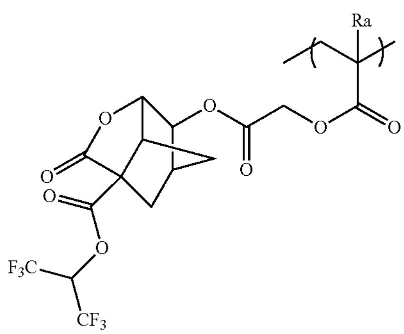
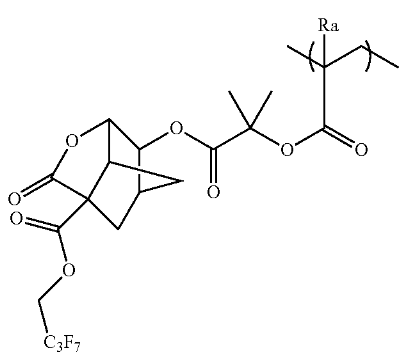
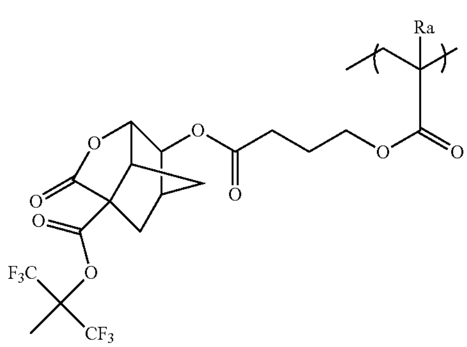
-continued
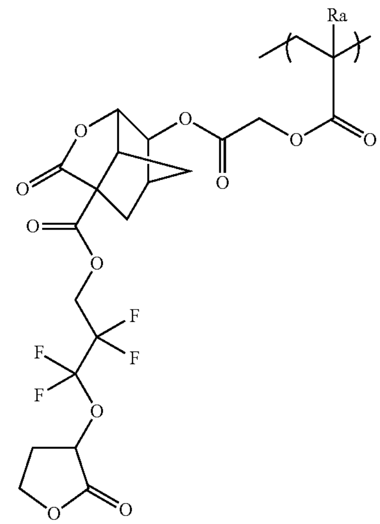
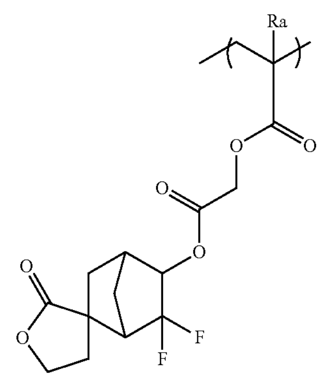
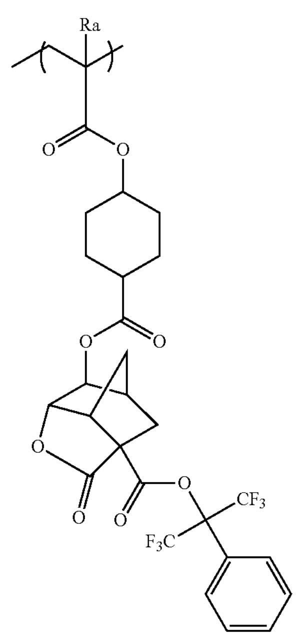

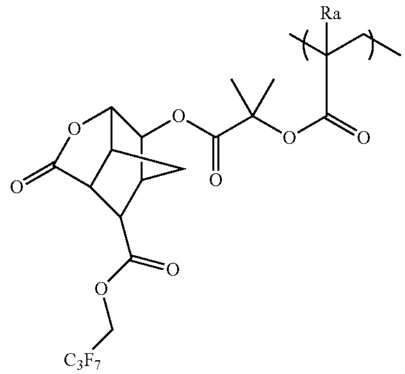
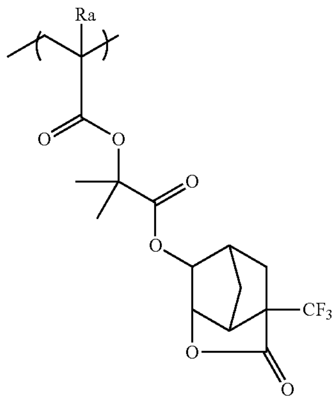
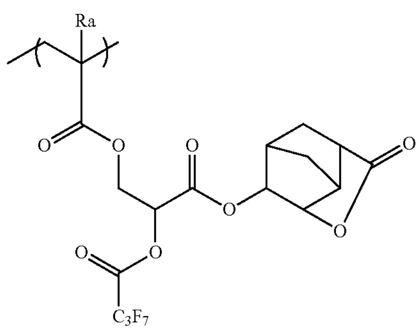
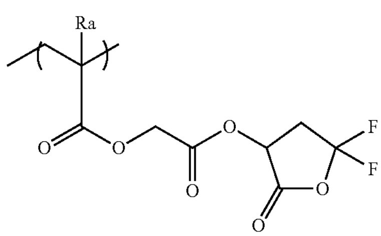
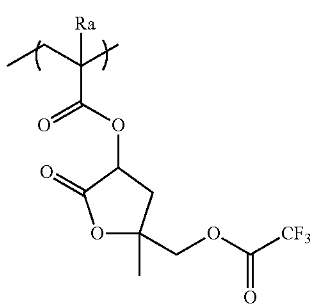
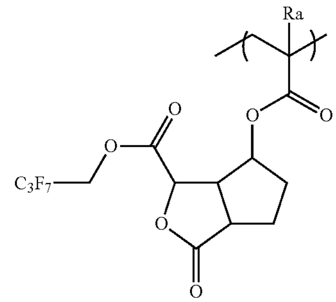
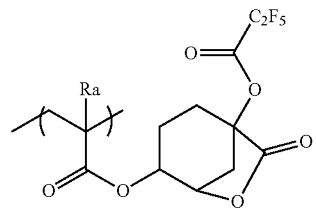
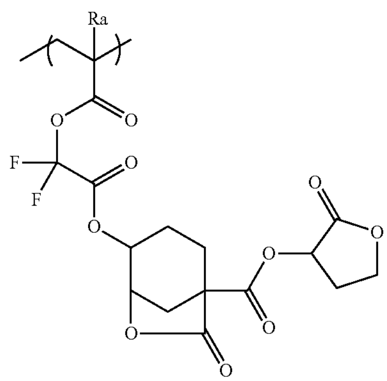
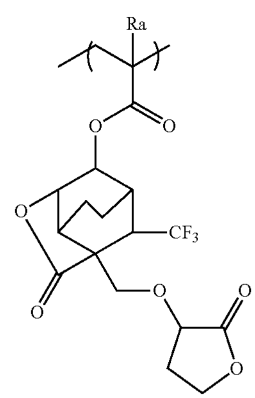

-continued
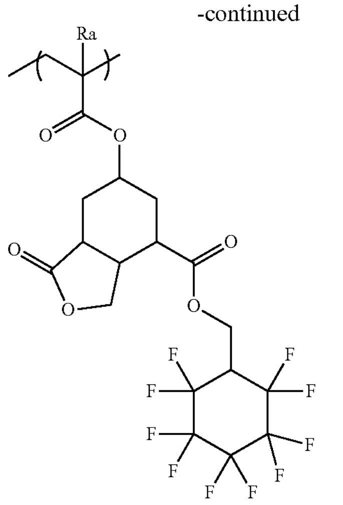
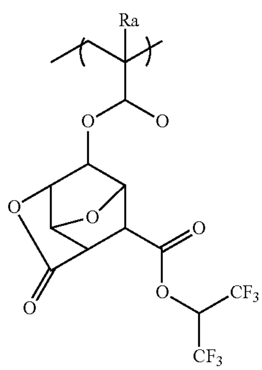
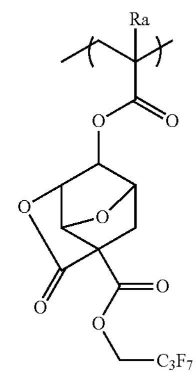
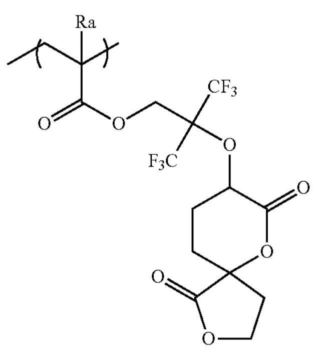
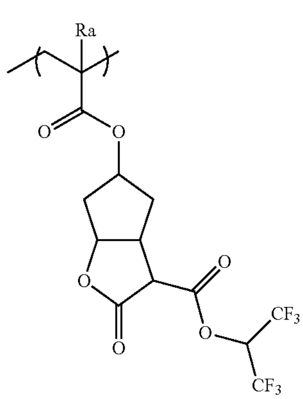
-continued
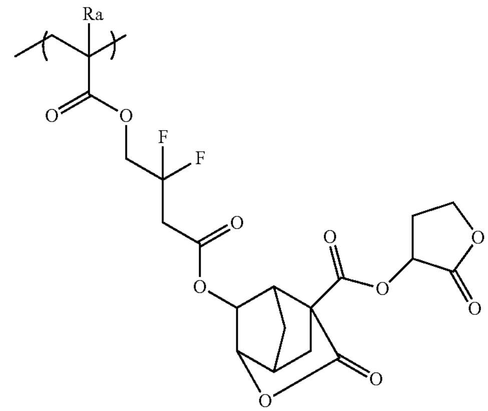
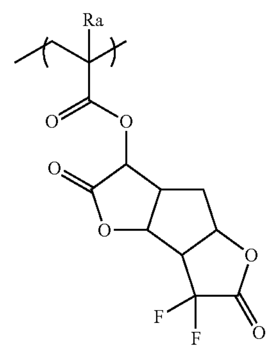
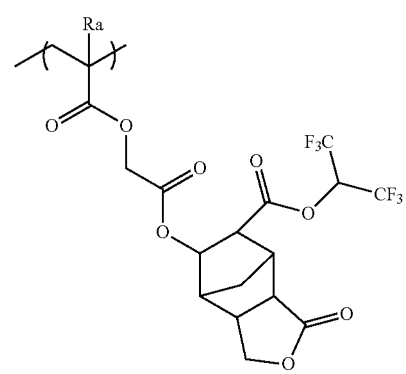
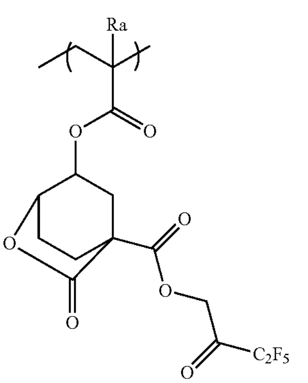

-continued
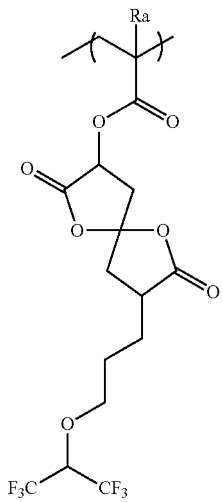
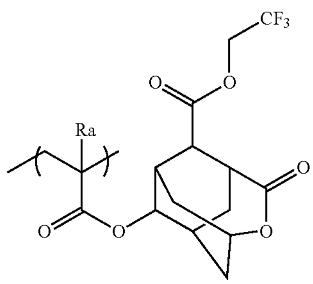
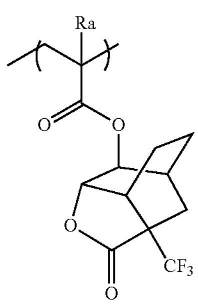
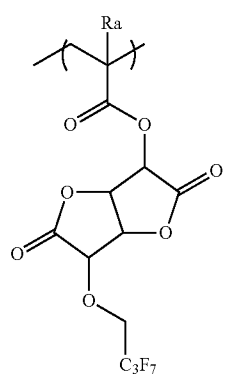
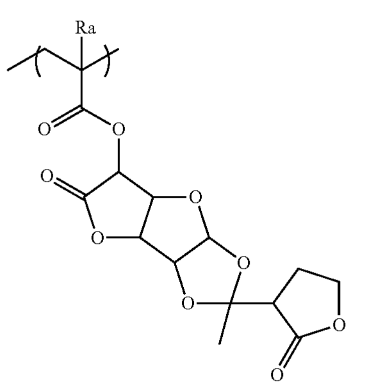
-continued
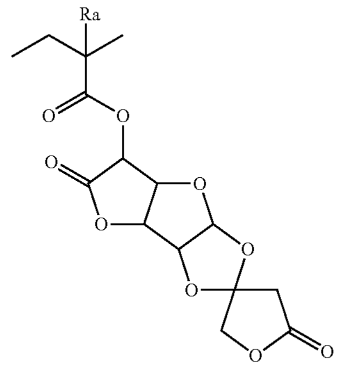
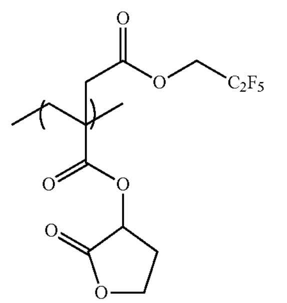
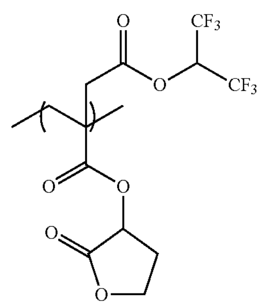
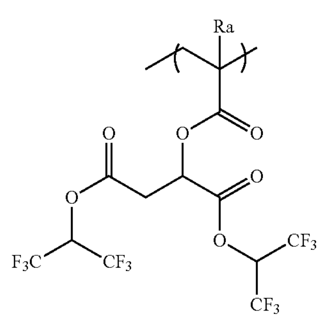
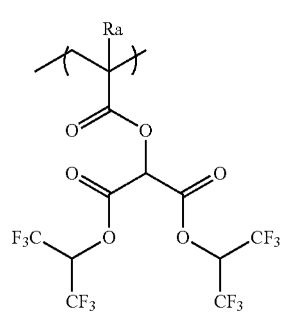

-continued
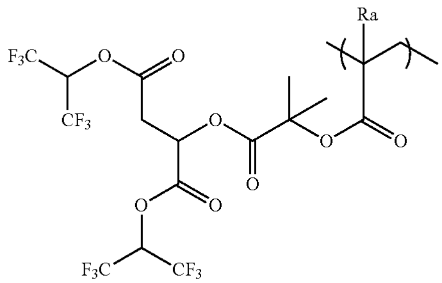
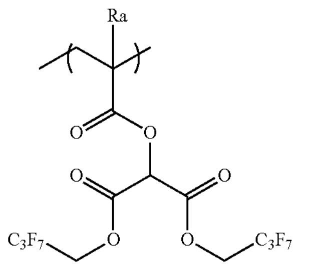
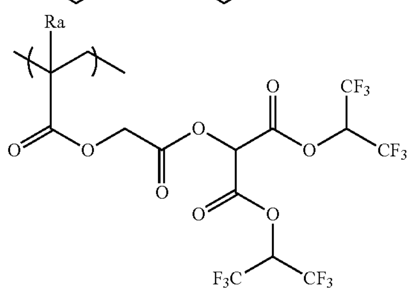
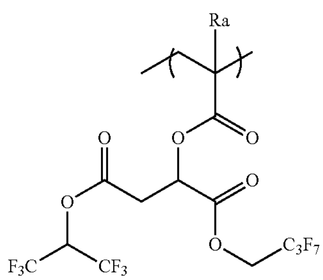
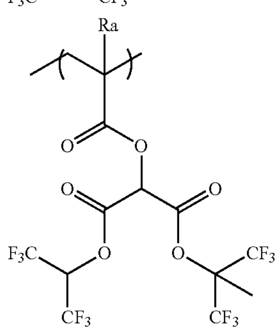
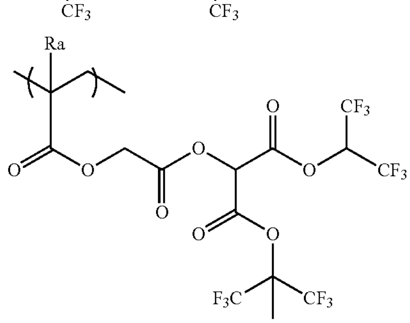
-continued
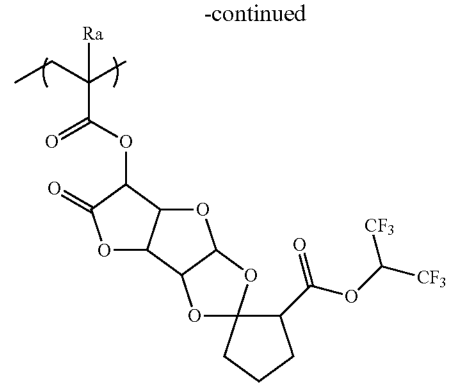
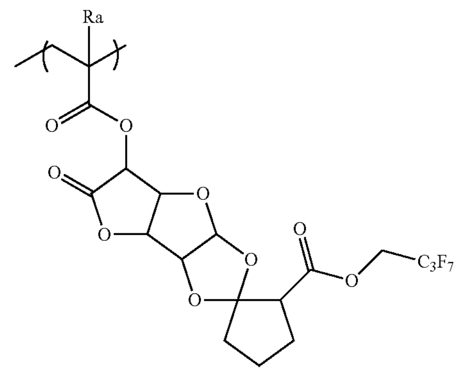
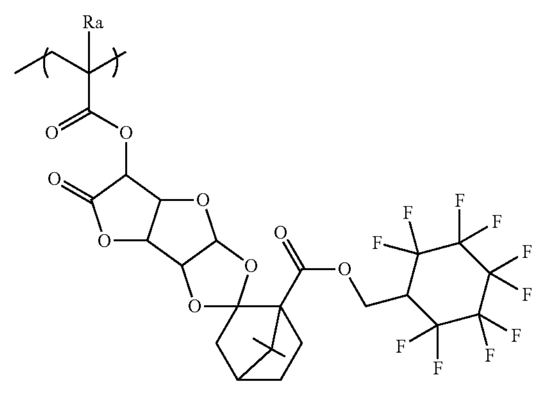
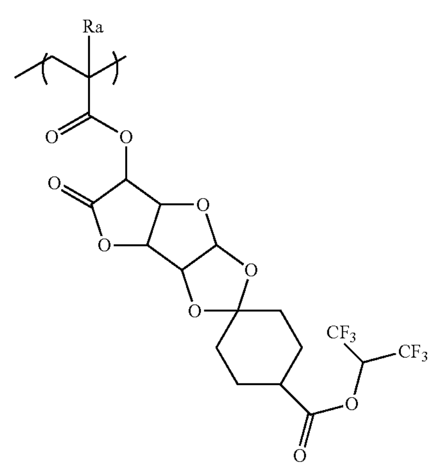

-continued
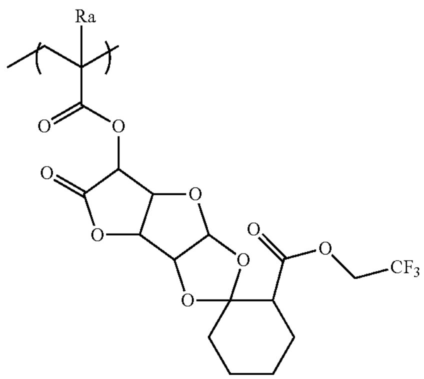
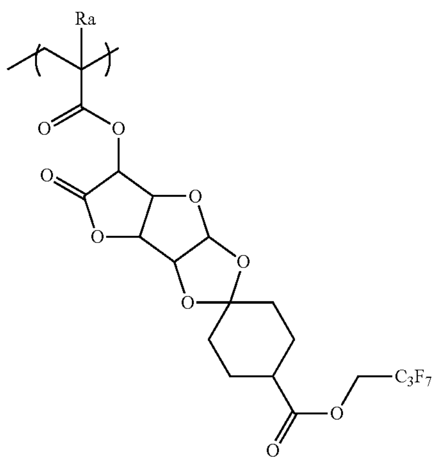
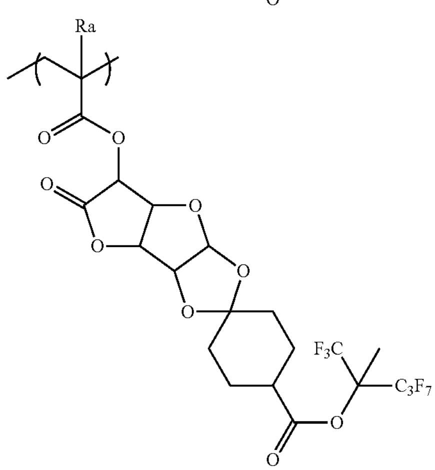
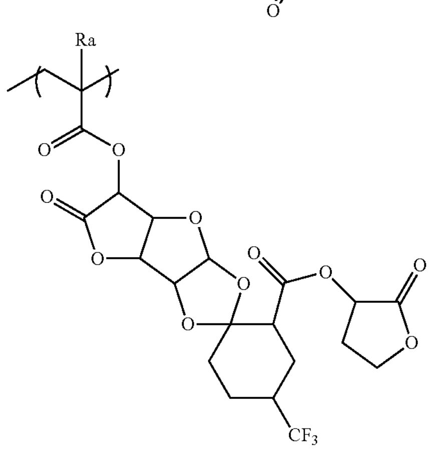
-continued
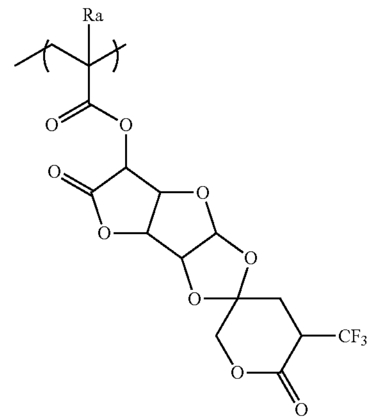
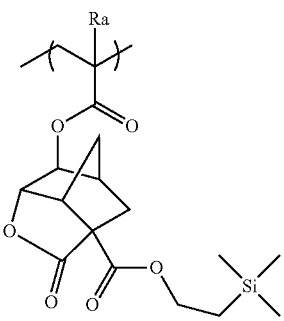
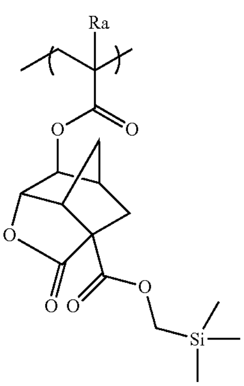
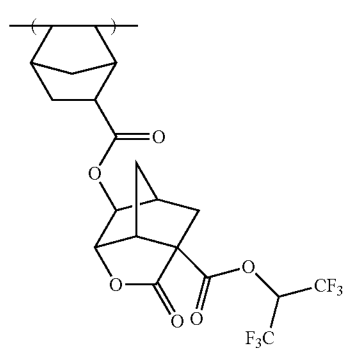

-continued
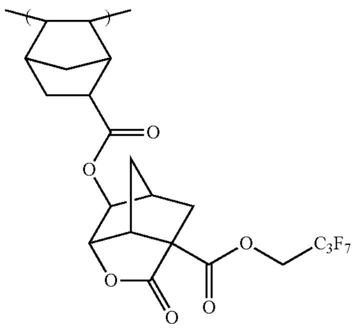
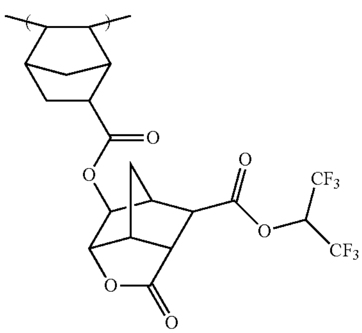
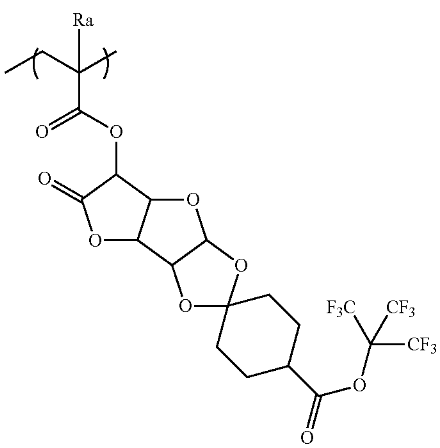
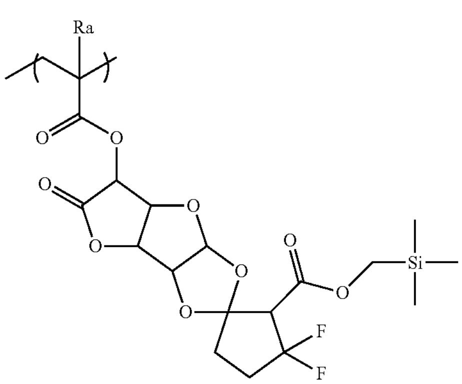
-continued
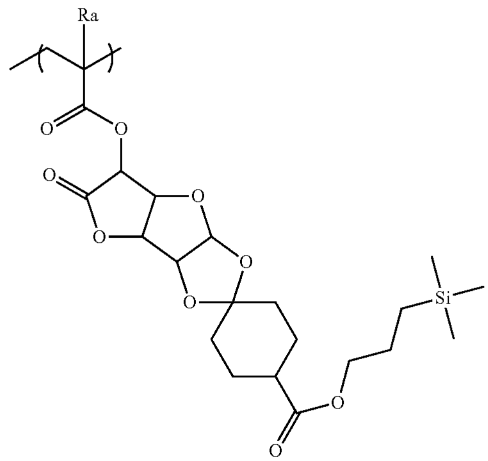
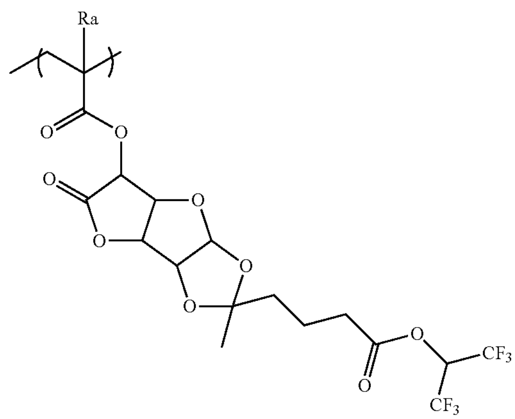
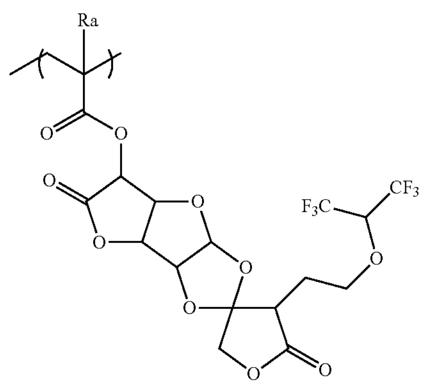
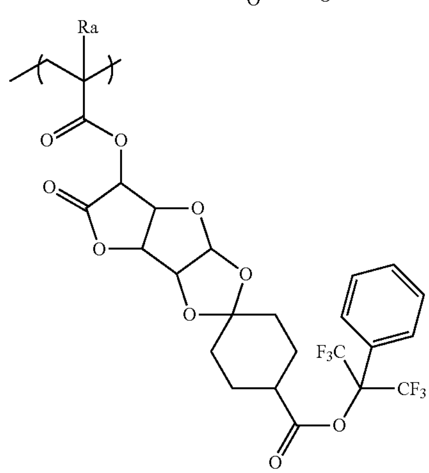

-continued
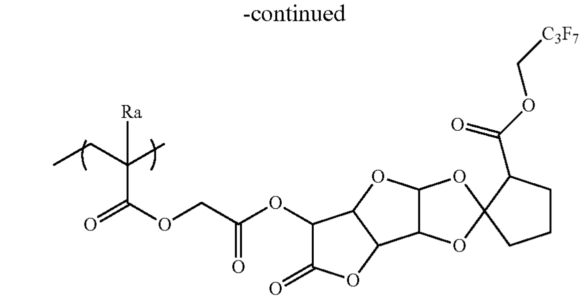
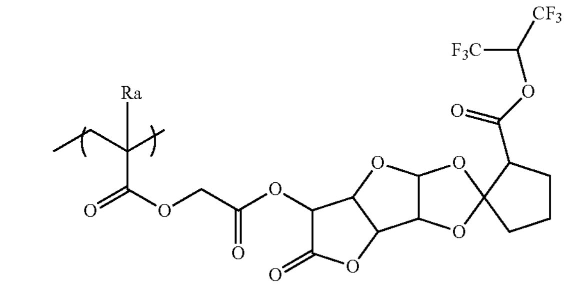
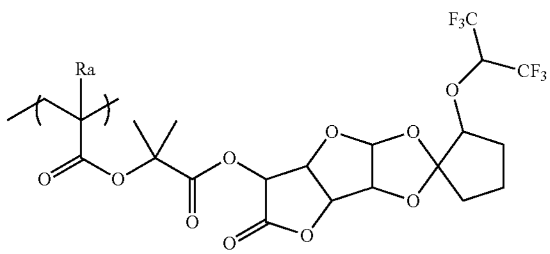
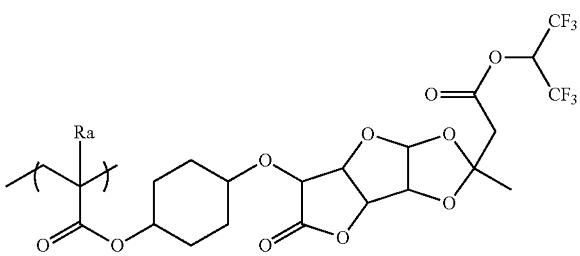
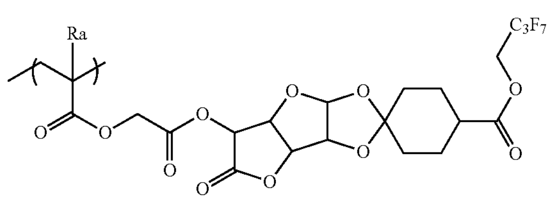
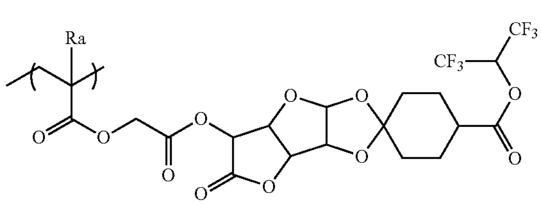
-continued
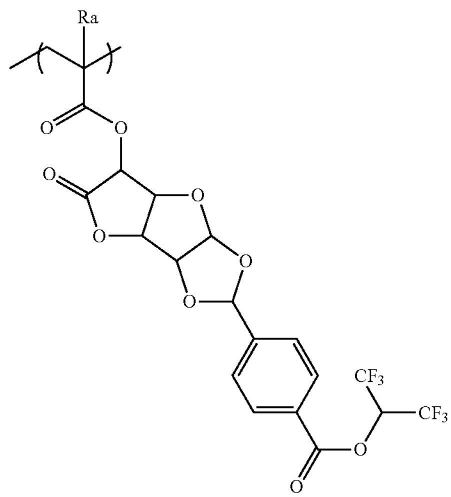
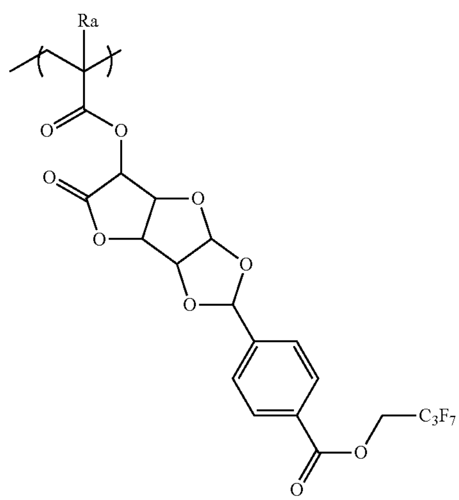
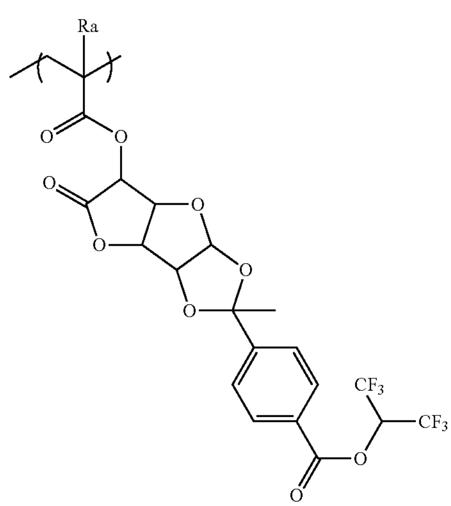

-continued
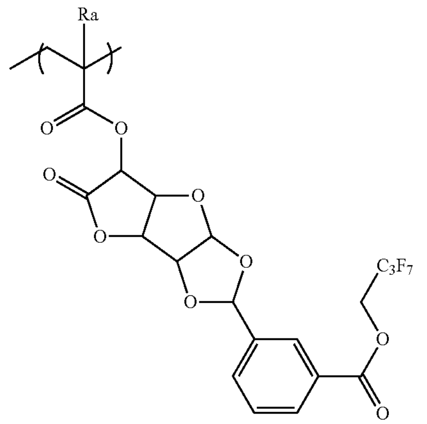
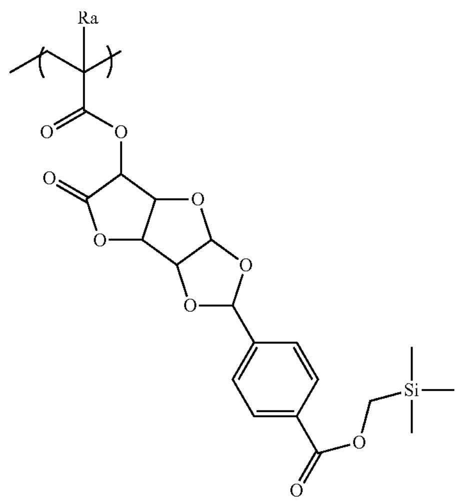
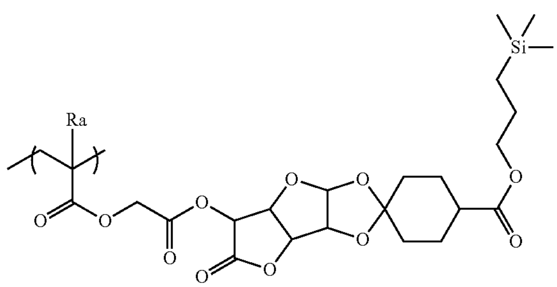
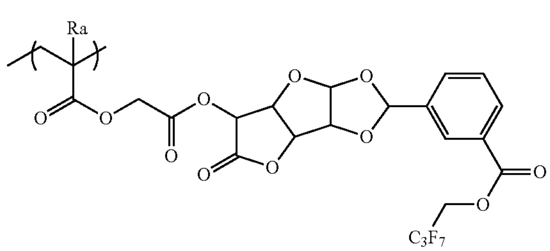
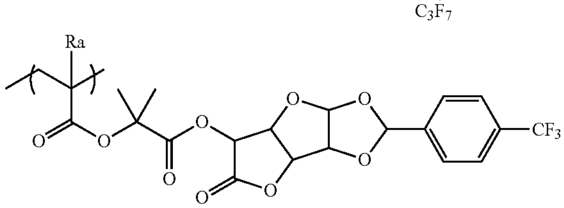
-continued
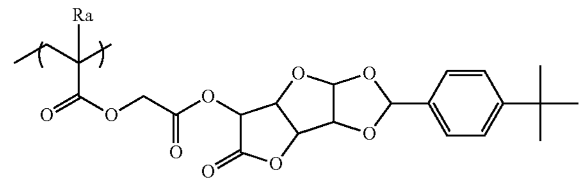
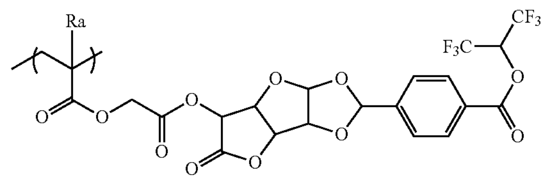
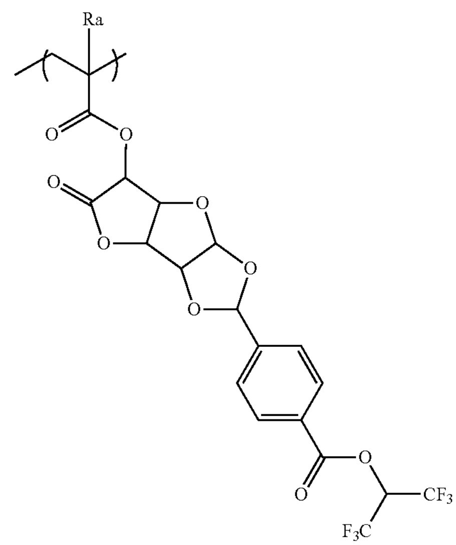
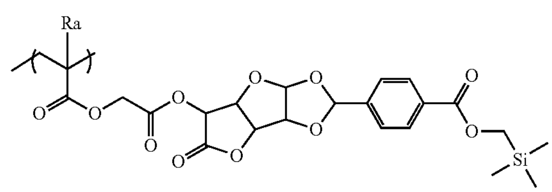
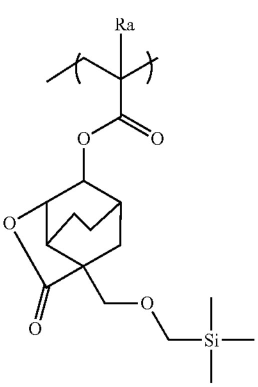

-continued
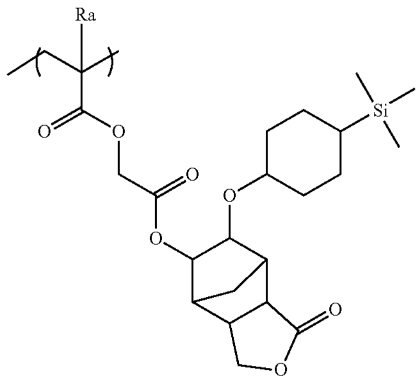
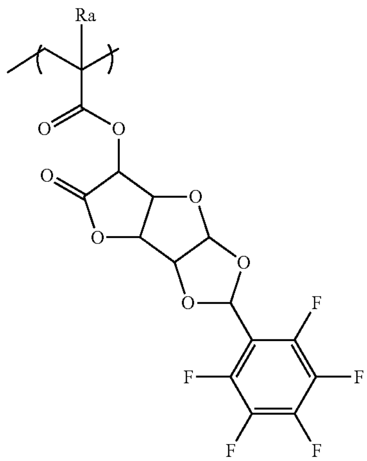
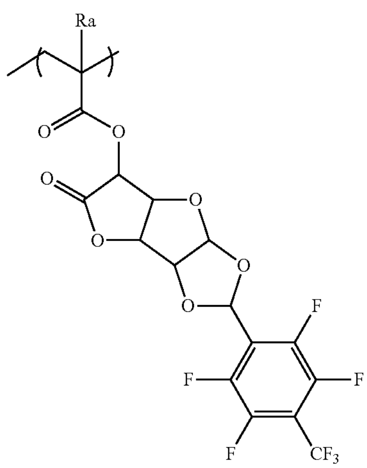
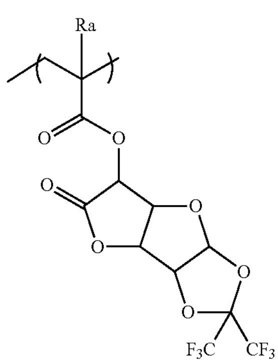
-continued
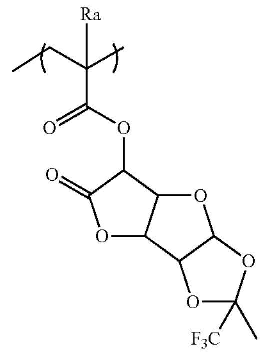
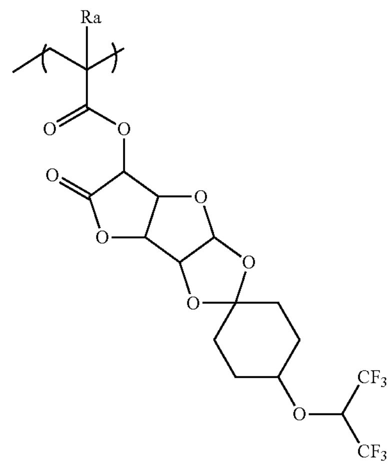
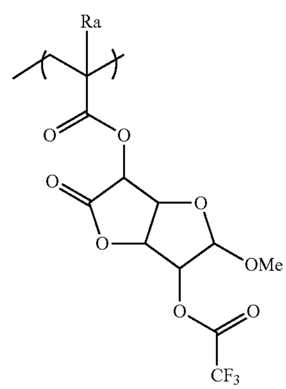
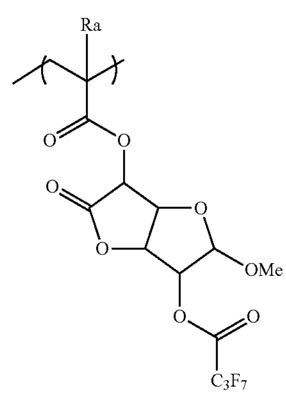

-continued
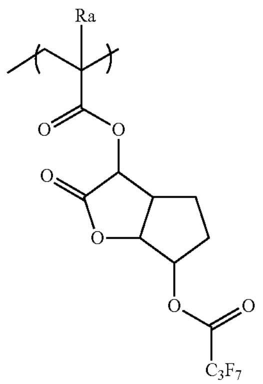
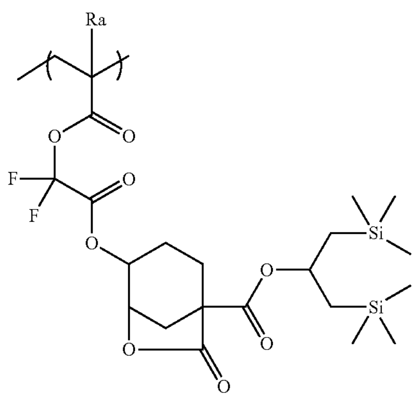
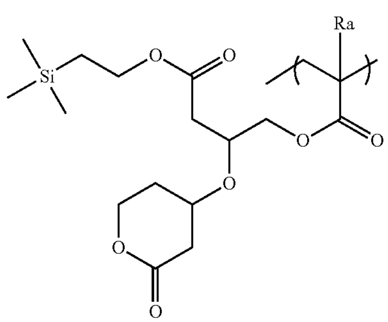
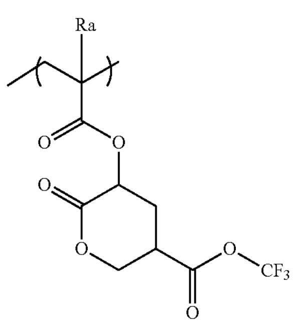
-continued
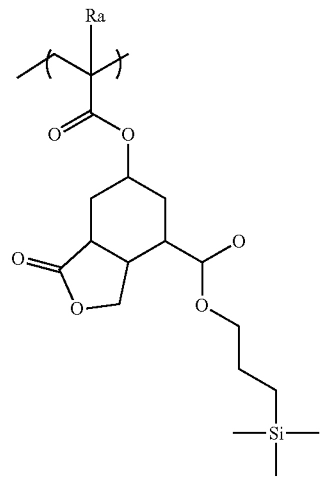
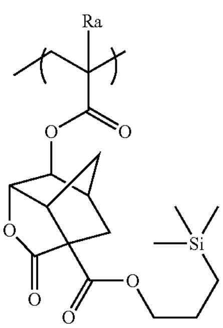
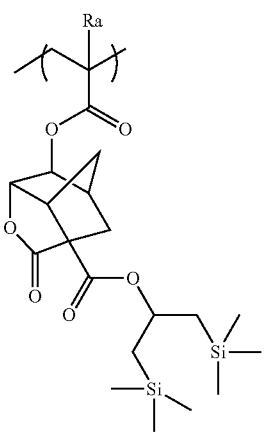
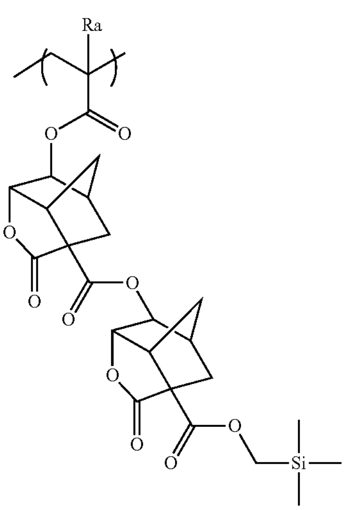

-continued
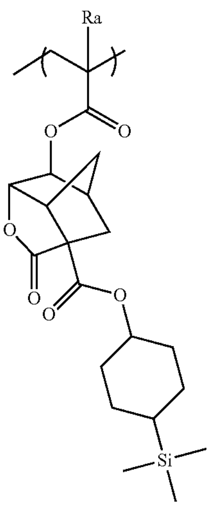
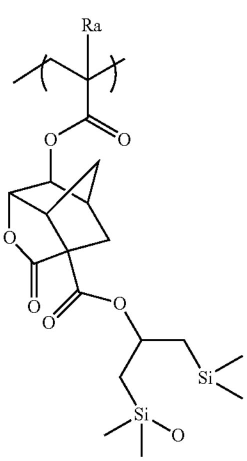
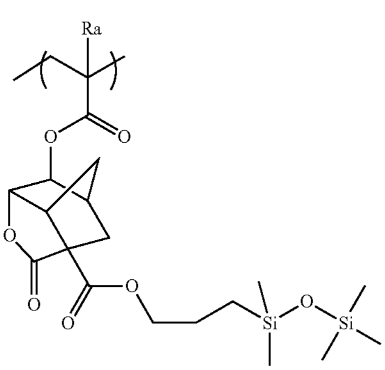
-continued
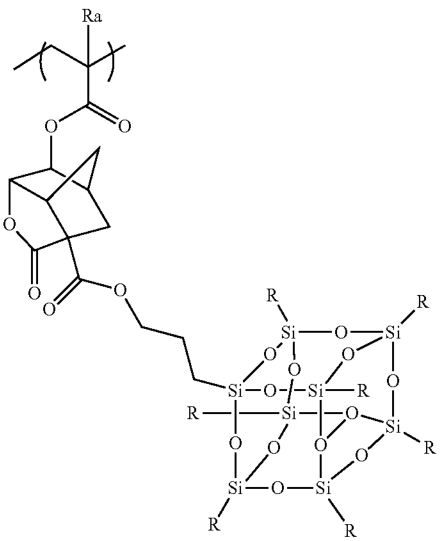
R = $CH_3$, $C_2H_5$, $C_3H_7$, $C_4H_9$
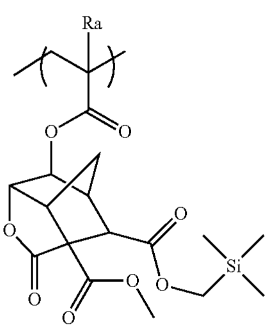
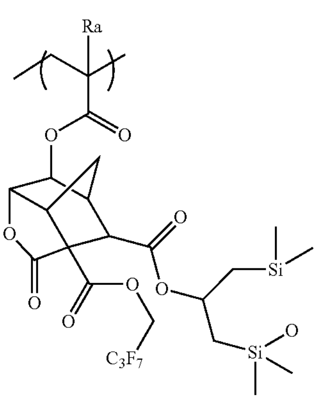
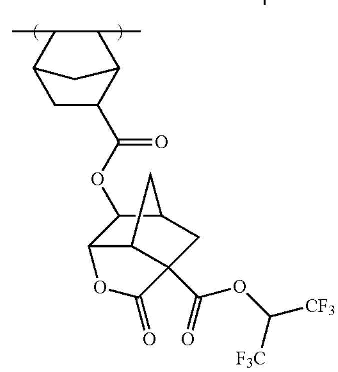

-continued
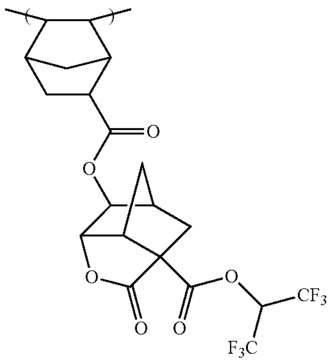
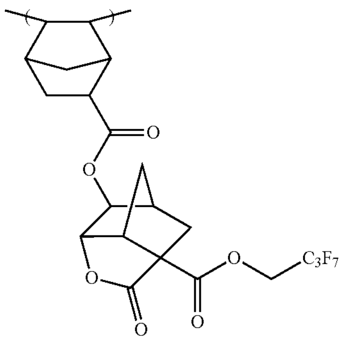
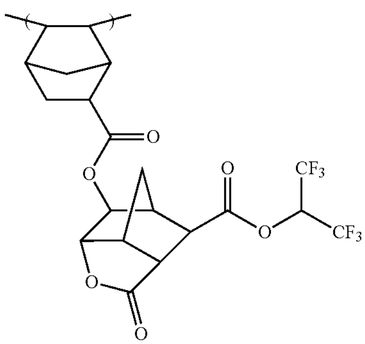
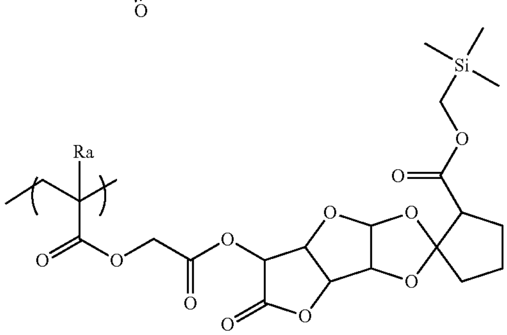
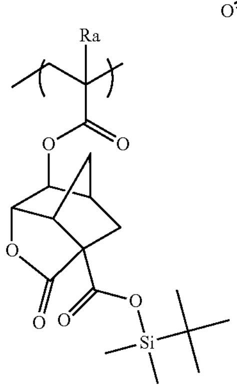
-continued
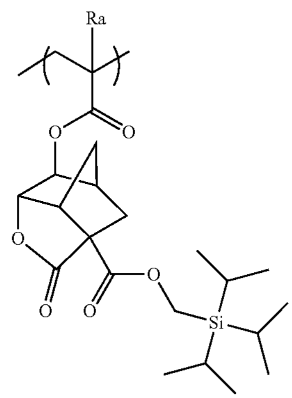
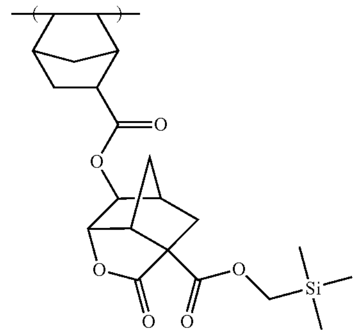
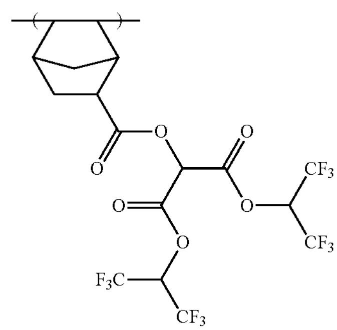
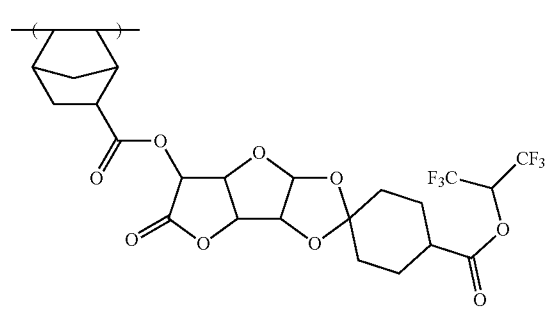
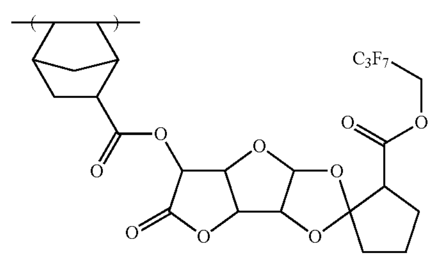

-continued
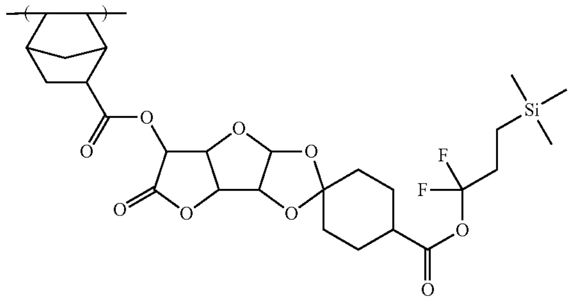
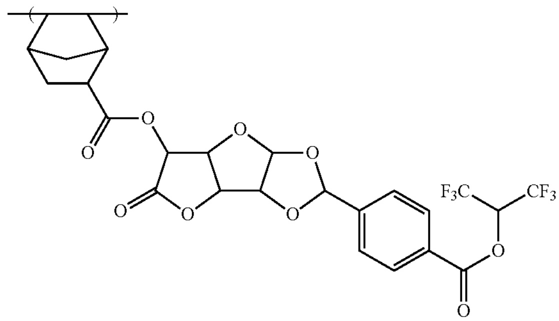
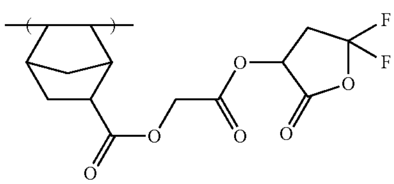
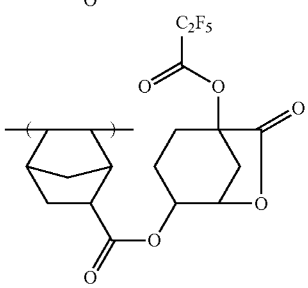
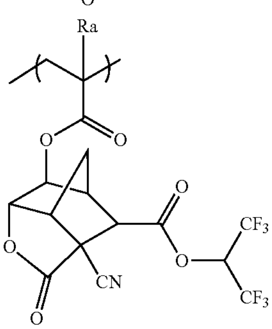
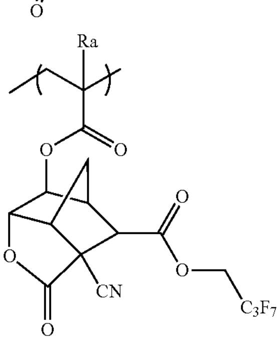
-continued
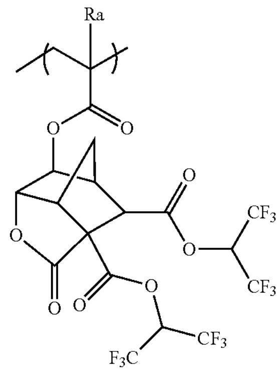
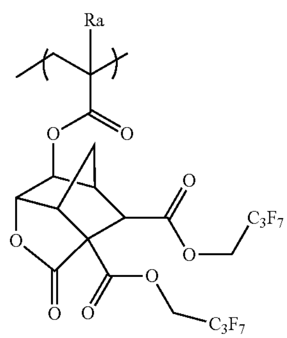
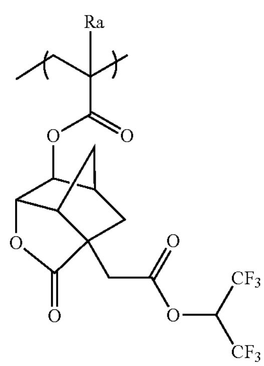
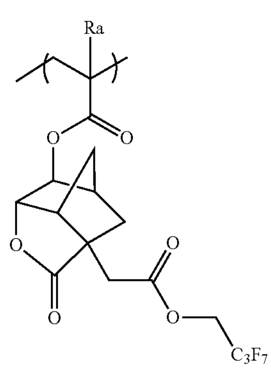

-continued
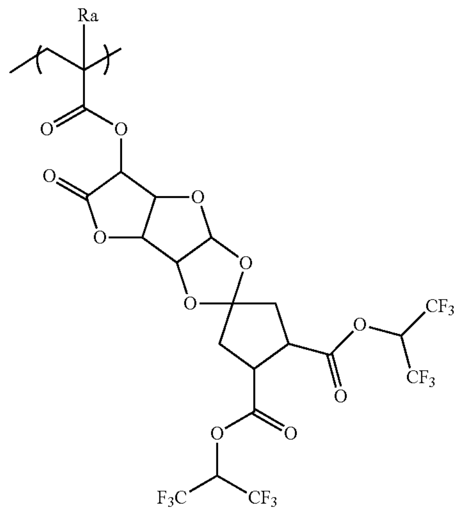
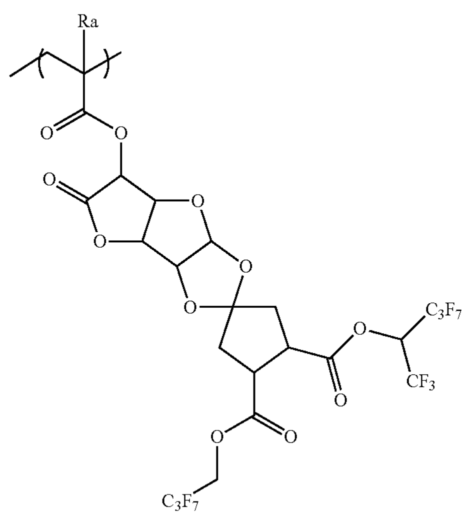
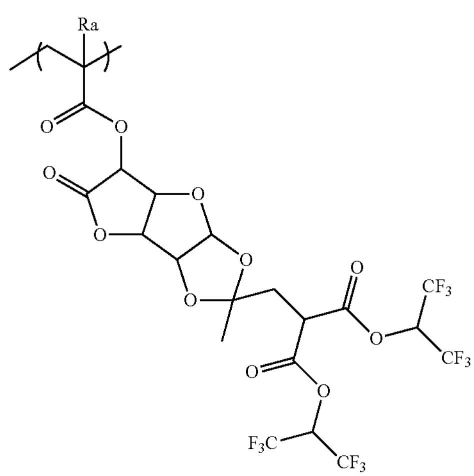
-continued
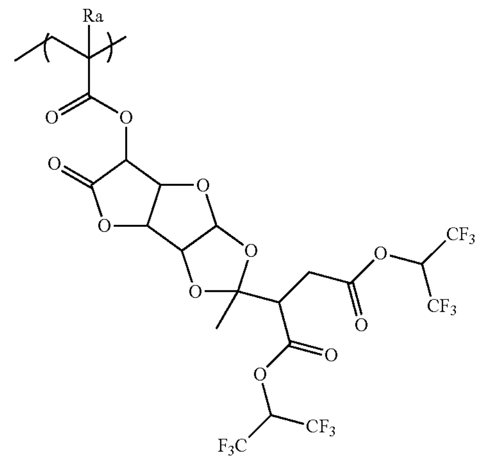
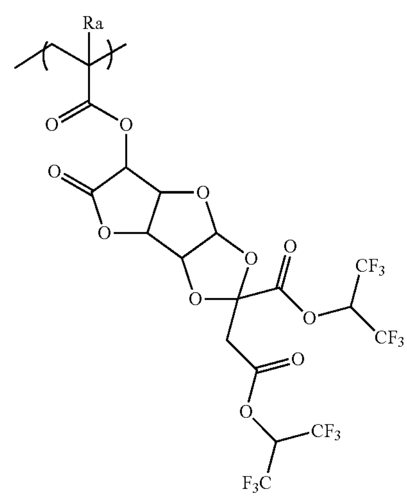
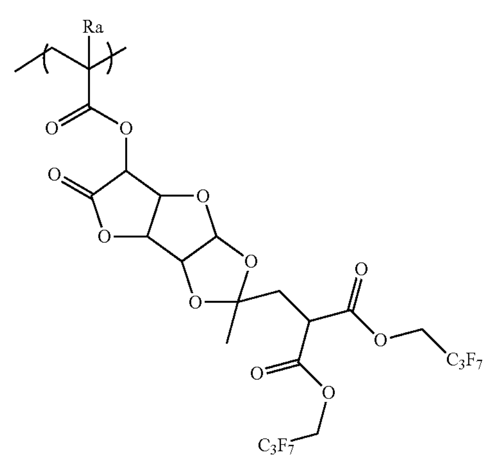

-continued

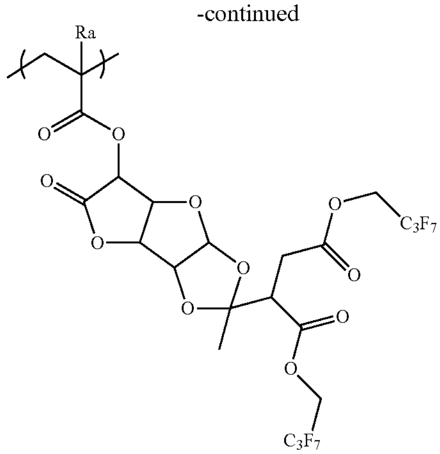

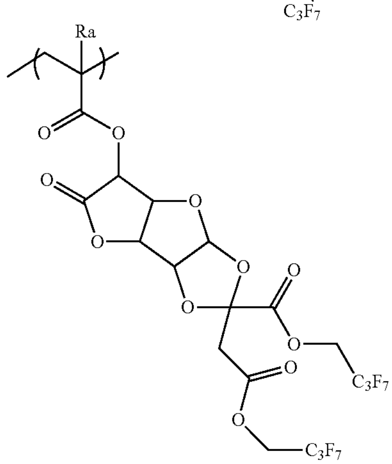

The resin (C) contains a repeating unit having at least either a fluorine atom or a silicon atom.

Thanks to this repeating unit, the resin (C) is unevenly distributed to the surface layer of a film formed from the actinic ray-sensitive or radiation-sensitive resin composition and when the immersion medium is water, the receding contact angle for water on the film surface as well as flowability of the immersion liquid can be enhanced.

The receding contact angle of the film is preferably from 60 to 90°, more preferably 65° or more, still more preferably 70° or more, yet still more preferably 75° or more, at the temperature during exposure, usually at room temperature 23±3° C., and a humidity of 45±5%.

The resin (C) is, as described above, unevenly distributed to the interface but unlike a surfactant, need not have necessarily a hydrophilic group in the molecule and may not contribute to uniform mixing of polar/nonpolar substances.

In the immersion exposure step, the immersion liquid needs to move on a wafer following the movement of an exposure head that is scanning the wafer at a high speed and forming an exposure pattern. Therefore, the contact angle of the immersion liquid with the resist film in a dynamic state is important, and the resist is required to have a performance of allowing a liquid droplet to follow the high-speed scanning of an exposure head with no remaining.

The resin (C) has at least either a fluorine atom or a silicon atom, whereby the hydrophobicity (water flowability) on the resist surface is enhanced and the development residue (scum) is reduced.

A repeating unit having, as the partial structure of the fluorine atom-containing repeating unit, a fluorine atom-containing alkyl group, a fluorine atom-containing cycloalkyl group or a fluorine atom-containing aryl group is preferred.

The fluorine atom-containing alkyl group is a linear or branched alkyl group preferably having a carbon number of 1 to 10, more preferably from 1 to 4, with at least one hydrogen atom being replaced by a fluorine atom and may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

The fluorine atom-containing alkyl group, fluorine atom-containing cycloalkyl group and fluorine atom-containing aryl group are preferably a group represented by any one of the following formulae (F2) to (F4), but the present invention is not limited thereto.

(F2)

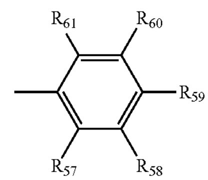

(F3)

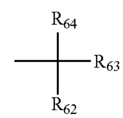

(F4)

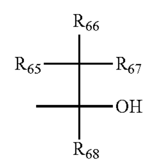

In formulae (F2) to (F4), each of $R_{57}$ to $R_{68}$ independently represents a hydrogen atom, a fluorine atom or an alkyl group (linear or branched), provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom.

It is preferred that $R_{57}$ to $R_{61}$ and $R_{65}$ to $R_{67}$ all are a fluorine atom. Each of $R_{62}$, $R_{63}$ and $R_{68}$ is preferably a fluoroalkyl group (preferably having a carbon number of 1 to 4), more preferably a perfluoroalkyl group having a carbon number of 1 to 4. $R_{62}$ and $R_{63}$ may combine with each other to form a ring. $R_{64}$ is preferably a hydrogen atom.

Specific examples of the group represented by formula (F2) include a p-fluorophenyl group, a pentafluorophenyl group and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group and a perfluorocyclohexyl group. Among these, a hexafluoroisopropyl group, a heptafluoroisopropyl group, a hexafluoro(2-methyl)isopropyl group, an octafluoroisobutyl group, a nonafluoro-tertbutyl group and a perfluoroisopentyl group are preferred, and a hexafluoroisopropyl group and a heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

The fluorine-containing partial structure may be bonded directly to the main chain or may be bonded to the main chain through a sole group or a combination of two or more groups selected from the group consisting of an alkylene group, a phenylene group, an ether group, a thioether group, a carbonyl group, an ester group, an amide group, a urethane group and a ureylene group.

As for the repeating unit having a fluorine atom, those shown below are preferred.

(C-Ia)

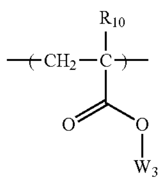

(C-Ib)

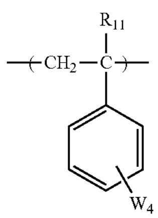

(C-Ic)

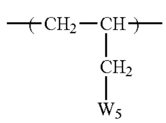

(C-Id)

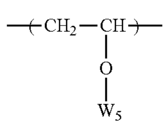

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and examples thereof include, particularly, a fluorinated alkyl group.

Each of $W_3$ to $W_6$ independently represents an organic group having at least one or more fluorine atoms. Specific examples thereof include the atomic groups of (F2) to (F4).

Other than these repeating units, the resin (C) may contain the following unit as the repeating unit having a fluorine atom.

(C-II)

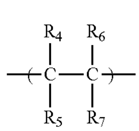

-continued (C-III)

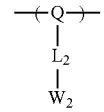

In the formulae, each of $R_4$ to $R_7$ independently represents a hydrogen atom, a fluorine atom or an alkyl group and is preferably a linear or branched alkyl group having a carbon number of 1 to 4, and the alkyl group may have a substituent. Examples thereof include, particularly, a fluorinated alkyl group. However, at least one of $R_4$ to $R_7$ represents a fluorine atom. $R_4$ and $R_5$, or $R_6$ and $R_7$ may form a ring.

$W_2$ represents an organic group containing at least one fluorine atom. Specific examples thereof includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —$SO_2$—, —CO—, —N(R)— (wherein R represents a hydrogen atom or an alkyl group), —$NHSO_2$—, or a divalent linking group formed by combining a plurality of these groups.

Q represents an alicyclic structure. The alicyclic structure may have a substituent, may be monocyclic or polycyclic and may be crosslinked. The monocyclic alicyclic structure is preferably a cycloalkyl group having a carbon number of 3 to 8, and examples thereof include a cyclopentyl group, a cyclohexyl group, a cyclobutyl group and a cyclooctyl group. Examples of the polycyclic alicyclic structure include a group having a bicyclo, tricyclo or tetracyclo structure and having a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. Incidentally, a part of carbon atoms in the cycloalkyl group may be replaced by a heteroatom such as oxygen atom.

The repeating unit containing a silicon atom is described below.

The repeating unit containing a silicon atom preferably contains, as the silicon atom-containing partial structure, an alkylsilyl structure (preferably a trialkylsilyl group) or a cyclic siloxane structure.

Specific examples of the alkylsilyl structure and cyclic siloxane structure include the groups represented by the following formulae (CS-1) to (CS-3):

(CS-1)

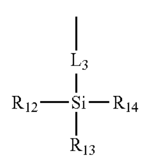

(CS-2)

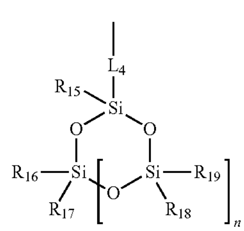

-continued (CS-3)

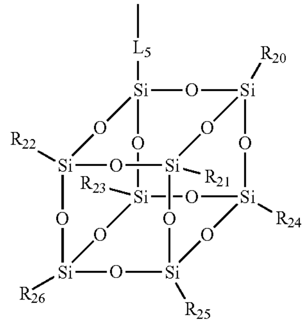

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups selected from the group consisting of an alkylene group, a phenylene group, an ether group, a thioether group, a carbonyl group, an ester group, an amide group, a urethane group and a ureylene group.

n represents an integer of 1 to 5. n is preferably an integer of 2 to 4.

In the resin (C), the content of the repeating unit (c) is preferably from 10 to 100 mol %, more preferably from 20 to 100 mol %, still more preferably from 30 to 100 mol %, and most preferably from 40 to 100 mol %, based on all repeating units in the resin (C).

The content of the repeating unit (c') is preferably from 10 to 100 mol %, more preferably from 20 to 100 mol %, still more preferably from 30 to 100 mol %, and most preferably from 40 to 100 mol %, based on all repeating units in the resin (C).

The content of the repeating unit (c*) is preferably from 5 to 70 mol %, more preferably from 5 to 60 mol %, still more preferably from 10 to 50 mol %, and most preferably from 10 to 40 mol %, based on all repeating units in the resin (C). The content of the repeating unit having at least either a fluorine atom or a silicon atom, which is used together with the repeating unit (c*), is preferably from 10 to 95 mol %, more preferably from 15 to 85 mol %, still more preferably from 20 to 80 mol %, and most preferably from 25 to 75 mol %, based on all repeating units in the resin (C).

The content of the repeating unit (c") is preferably from 10 to 100 mol %, more preferably from 20 to 100 mol %, still more preferably from 30 to 100 mol %, and most preferably from 40 to 100 mol %, based on all repeating units in the resin (C).

The fluorine atom or silicon atom in the resin (C) may be present in the main chain of the resin or may be substituted on the side chain.

The resin (C) may further contain (c 1) a repeating unit having at least either a fluorine atom or a silicon atom, which is different from the repeating units (c') and (c").

Examples of the fluorine atom-containing partial structure in the repeating unit (c1) are the same as those described above, and the groups represented by formula (F2) to (F4) are preferred.

Examples of the silicon atom-containing partial structure in the repeating unit (c1) are the same as those described above, and the groups represented by formulae (CS-1) to (CS-3) are preferred.

The repeating unit (c1) having at least either a fluorine atom or a silicon atom is preferably a (meth)acrylate-based repeating unit.

Specific examples of the repeating unit (c1) are set forth below, but the present invention is not limited thereto. In specific examples, $X_1$ represents a hydrogen atom, —$CH_3$, —F or —$CF_3$, and $X_2$ represents —F or —$CF_3$.

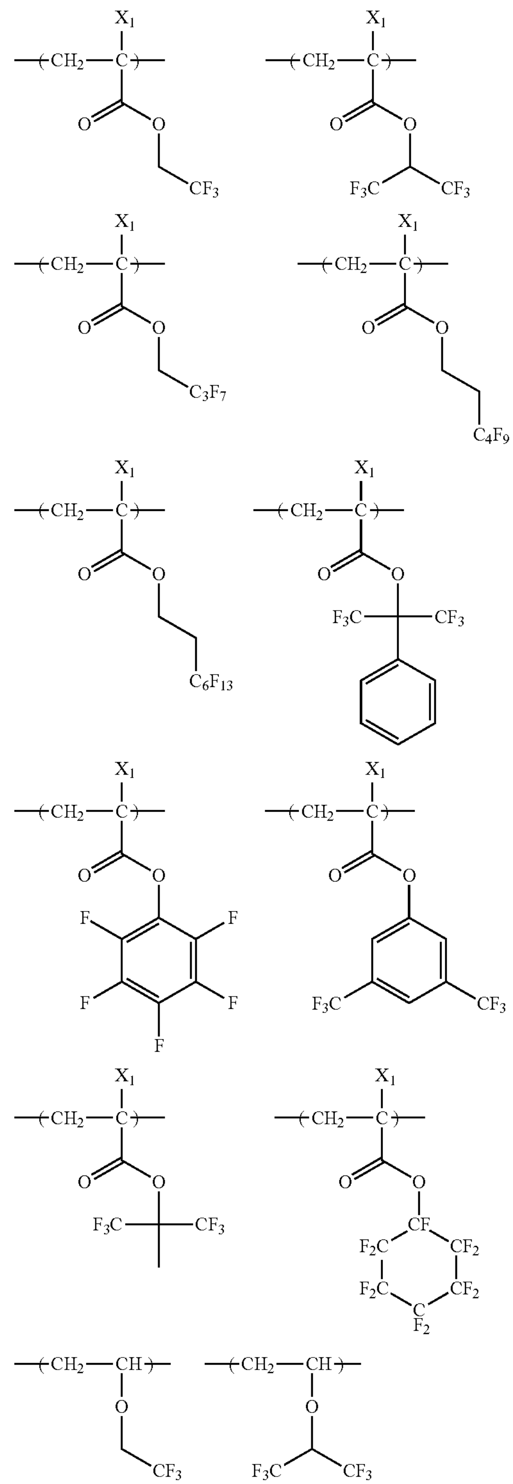

-continued
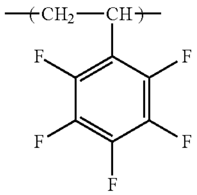
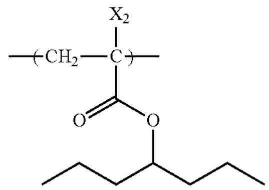
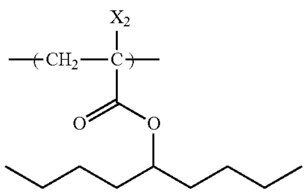
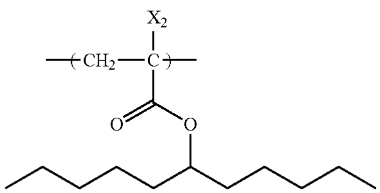
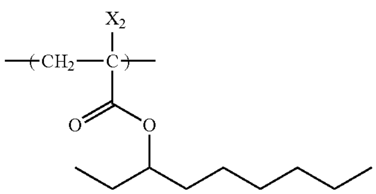
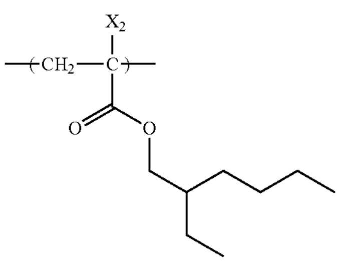
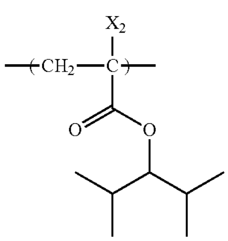
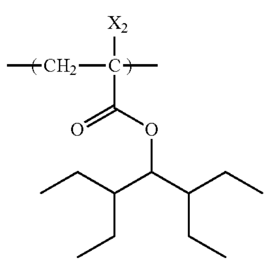
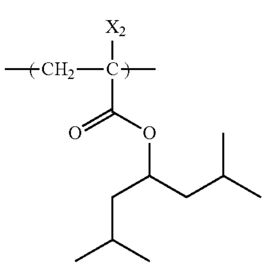
-continued
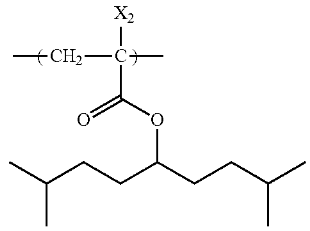
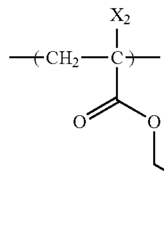
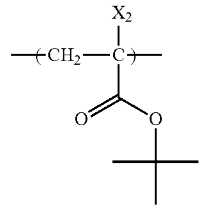
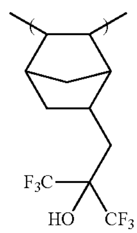
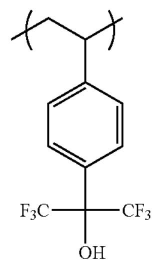
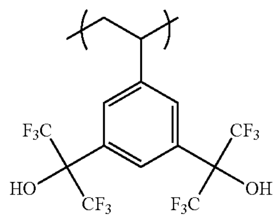
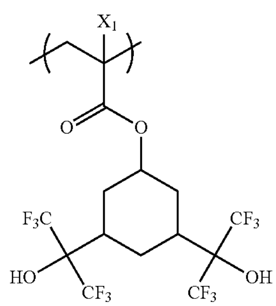
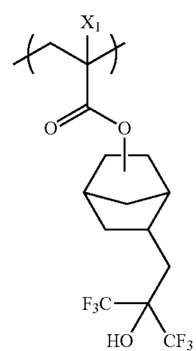
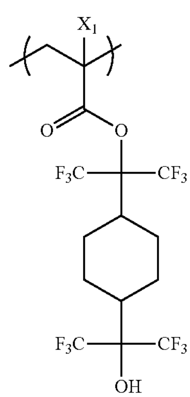
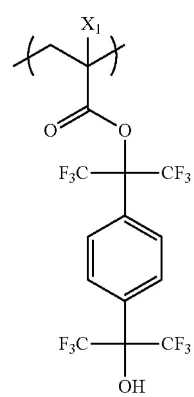

-continued
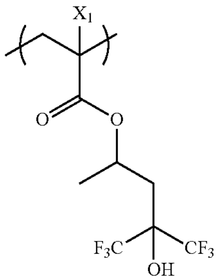
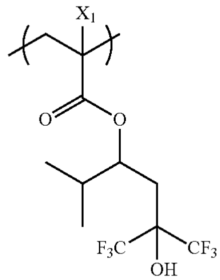
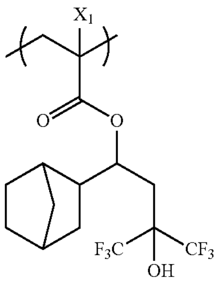
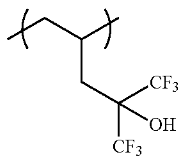
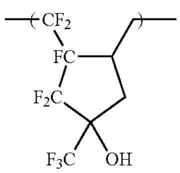
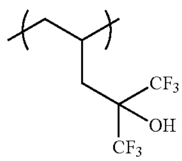
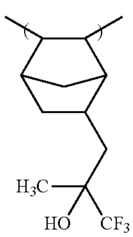
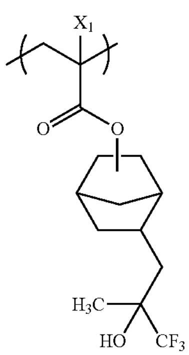
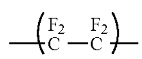
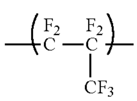
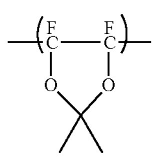
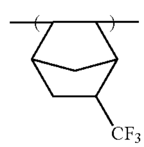
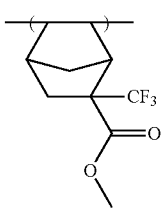
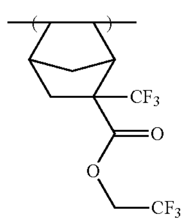
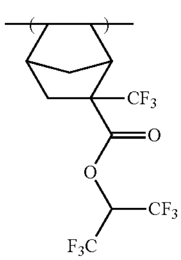
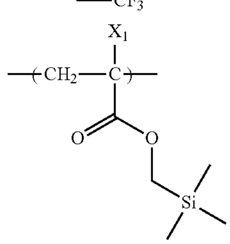
-continued
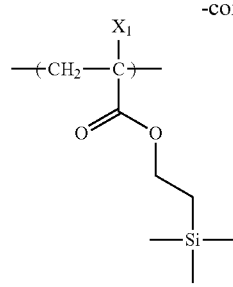
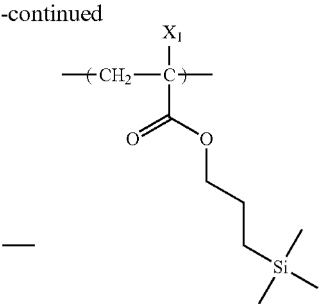
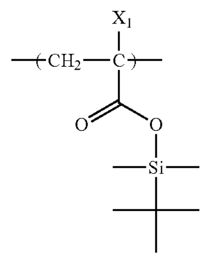
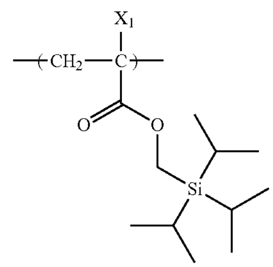
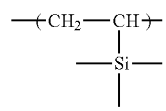
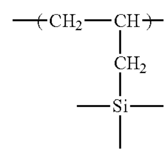
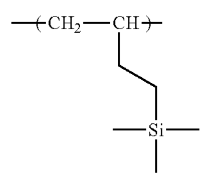
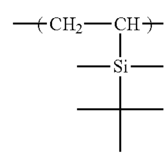
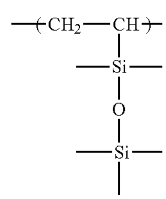
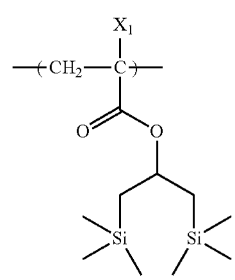
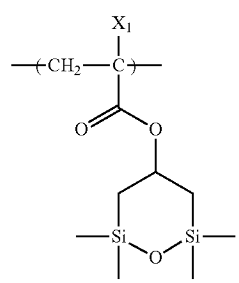

-continued

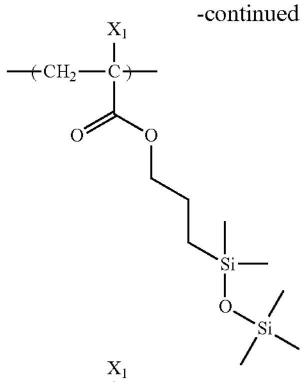
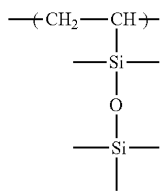
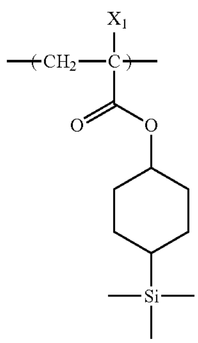
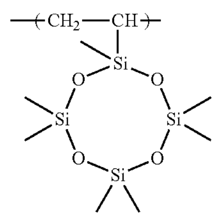
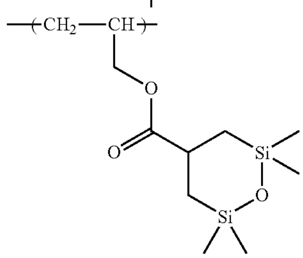
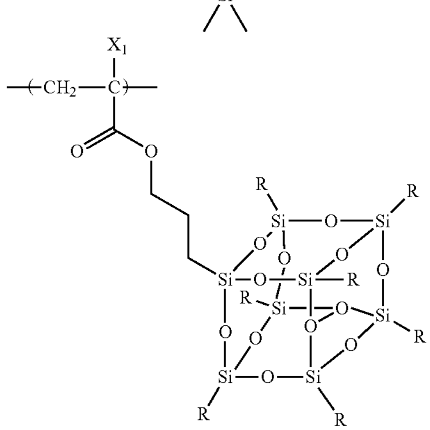

R = $CH_3$, $C_2H_5$, $C_3H_7$, $C_4H_9$

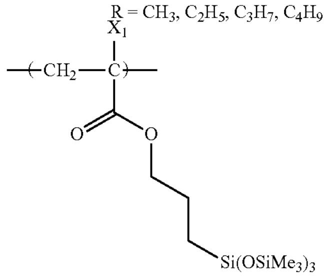

The resin (C) may further contain at least one group selected from the following groups (x) and (z):

(x) an alkali-soluble group, and (z) a group capable of decomposing by the action of an acid.

Examples of the alkali-soluble group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups are a fluorinated alcohol group (preferably hexafluoroisopropanol), a sulfonimide group and a bis(carbonyl)methylene group.

The repeating unit having (x) an alkali-soluble group includes a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, and these repeating units all are preferred.

The content of the repeating unit having (x) an alkali-soluble group is preferably from 1 to 50 mol %, more preferably from 3 to 35 mol %, still more preferably from 5 to 30 mol %, based on all repeating units in the resin (C).

Specific examples of the repeating unit having (x) an alkali-soluble group are set forth below, but the present invention is not limited thereto. In specific examples, Rx represents H, $CH_3$, $CH_2OH$ or $CF_3$.

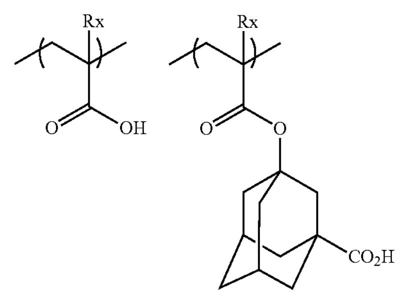
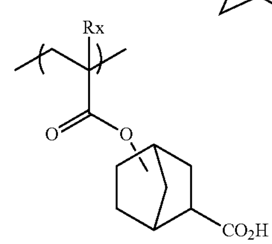
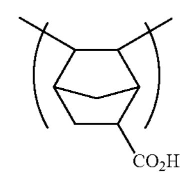
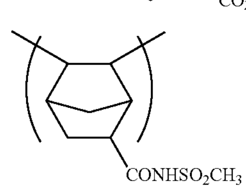
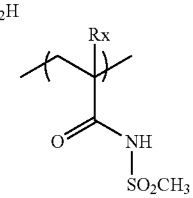
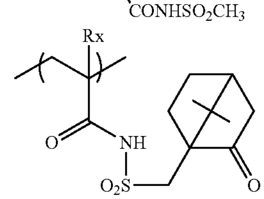
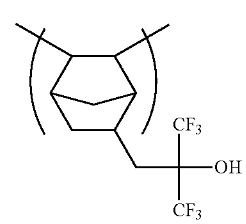

-continued

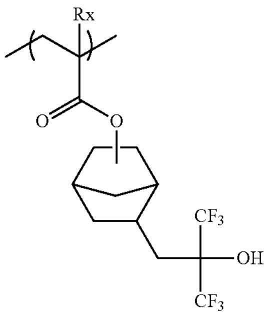
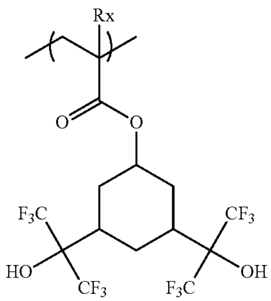
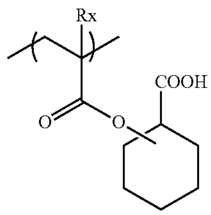
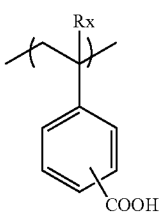
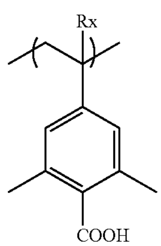
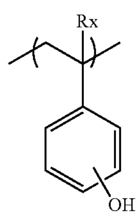
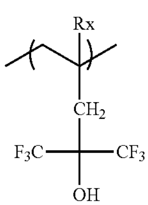
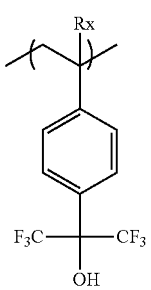
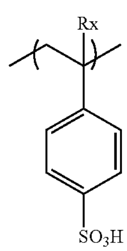
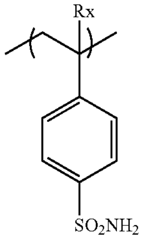
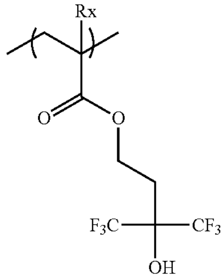

-continued

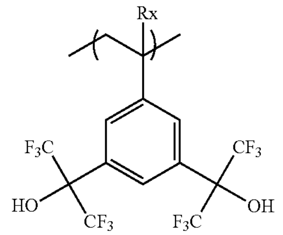
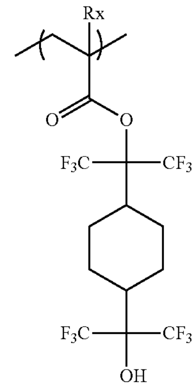
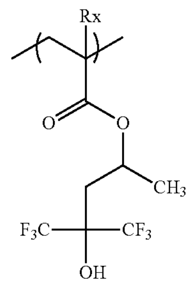
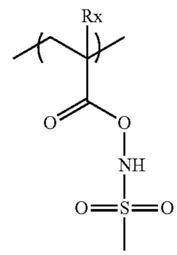
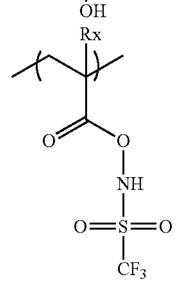
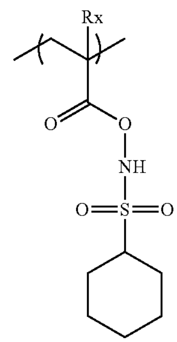
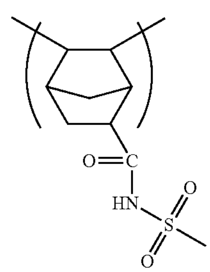
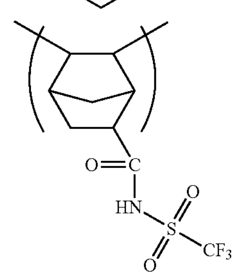
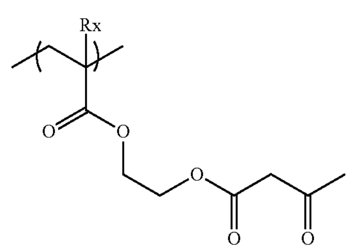
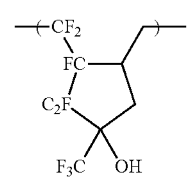

Examples of the repeating unit having (z) a group capable of decomposing by the action of an acid, contained in the resin (C), are the same as those of the repeating unit having an acid-decomposable group described for the resin (A). The acid-decomposable group is preferably a cumyl ester group, an enol ester group, an acetal ester group, a tertiary alkyl ester group or the like, more preferably a tertiary alkyl ester group.

The repeating unit having an acid-decomposable group is preferably a repeating unit represented by the following formula (CAI):

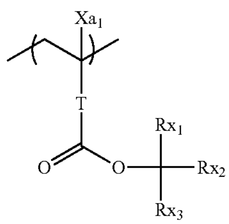

(CAI)

In formula (CAI), $Xa_1$ represents a hydrogen atom, a methyl group or a group represented by —$CH_2$—$R_9$. $R_9$ represents a hydroxyl group or a monovalent organic group, and examples thereof include an alkyl group having a carbon number of 5 or less and an acyl group. The monovalent organic group is preferably an alkyl group having a carbon number of 3 or less, more preferably a methyl group. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine to form a cycloalkyl group (monocyclic or polycyclic).

Examples of the divalent linking group of T include an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

An embodiment where $Rx_1$ is a methyl group or an ethyl group and $Rx_2$ and $Rx_3$ are combined to form the above-described cycloalkyl group is preferred.

Each of these groups may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number of the substituent is preferably 8 or less.

In the resin (C), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (C). By virtue of having (z) a group capable of decomposing by the action of an acid, LWR can be improved.

The resin (C) may further contain other repeating units. Preferred embodiments of other repeating units include the followings:

(cy1) a repeating unit having a fluorine atom and/or a silicon atom and being stable to an acid and sparingly soluble or insoluble in an alkali developer;

(cy2) a repeating unit having no fluorine atom and no silicon atom and being stable to an acid and sparingly soluble or insoluble in an alkali developer;

(cy3) a repeating unit having a fluorine atom and/or a silicon atom and having a polar group except for (x) and (z) above; and (cy4) a repeating unit having no fluorine atom and no silicon atom and having a polar group except for (x) and (z) above.

The expression "sparingly soluble or insoluble in an alkali developer" in the repeating units of (cy1) and (cy2) means that (cy1) and (cy2) do not contain an alkali-soluble group or a group capable of producing an alkali-soluble group by the action of an acid or an alkali developer (for example, an acid-decomposable group or a polarity conversion group).

The repeating units (cy1) and (cy2) preferably have an alicyclic hydrocarbon structure containing no polar group.

Preferred embodiments of the repeating units (cy1) to (cy4) are described below.

The repeating units (cy1) and (cy2) are preferably a repeating unit represented by the following formula (CIII):

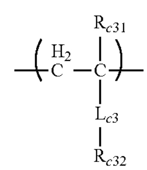

(CIII)

In formula (CIII), $R_{c31}$ represents a hydrogen atom, an alkyl group which may be substituted by fluorine, a cyano group or a —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents an alkyl group, a cycloalkyl group, an alkenyl group, a cycloalkenyl group or an aryl group. Each of these groups may be substituted, for example, by a group containing a silicon atom, or a fluorine atom.

$L_{c3}$ represents a single bond or a divalent linking group.

In formula (CIII), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, such as phenyl group or naphthyl group, and these groups may have a substituent.

$R_{c32}$ is preferably an unsubstituted alkyl group or a fluorine atom-substituted alkyl group. The divalent linking group of $L_{c3}$ is preferably an alkylene group (preferably having a carbon number of 1 to 5), an oxy group, a phenylene group or an ester bond (a group represented by —COO—).

The repeating units (cy1) and (cy2) are preferably a repeating unit represented by the following formula (C4) or (C5):

(C4)

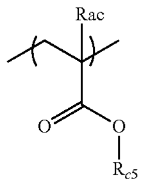

(C5)

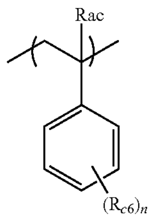

In formulae (C4) and (C5), $R_{c5}$ represents a hydrocarbon group having at least one cyclic structure and having neither a hydroxyl group nor a cyano group.

Rac represents a hydrogen atom, an alkyl group which may be substituted by fluorine, a cyano group or a —$CH_2$—O-$Rac_2$ group, wherein $Rac_2$ represents a hydrogen atom, an alkyl group or an acyl group. Rac is preferably a hydrogen atom, a methyl group, a hydroxymethyl group or a trifluoromethyl group, more preferably a hydrogen atom or a methyl group.

The cyclic structure possessed by $R_{c5}$ includes a monocyclic hydrocarbon group and a polycyclic hydrocarbon group. Examples of the monocyclic hydrocarbon group include a cycloalkyl group having a carbon number of 3 to 12, and a cycloalkenyl group having a carbon number of 3 to 12. The monocyclic hydrocarbon group is preferably a monocyclic hydrocarbon group having a carbon number of 3 to 7.

The polycyclic hydrocarbon group includes a ring gathered hydrocarbon group and a crosslinked cyclic hydrocarbon group. Examples of the crosslinked cyclic hydrocarbon ring include a bicyclic hydrocarbon ring, a tricyclic hydrocarbon ring and a tetracyclic hydrocarbon ring. The crosslinked hydrocarbon ring also includes a condensed cyclic hydrocarbon ring (for example, a condensed ring formed by condensing a plurality of 5- to 8-membered cycloalkane rings). Preferred examples of the crosslinked cyclic hydrocarbon ring include a norbornyl group and an adamantyl group.

Such an alicyclic hydrocarbon group may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 2 to 4.

The alkyl group of $R_{c6}$ is a cycloalkyl group, an alkenyl group, a cycloalkenyl group, an alkoxycarbonyl group or an alkylcarbonyloxy group. These groups may be substituted by a fluorine atom or a silicon atom.

The alkyl group of $R_{c6}$ is preferably a linear or branched alkyl group having a carbon number of 1 to 20, and the cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The alkoxycarbonyl group is preferably an alkoxycarbonyl group having a carbon number of 2 to 20.

The alkoxycarbonyloxy group is preferably an alkoxycarbonyloxy group having a carbon number of 2 to 20.

n represents an integer of 0 to 5. When n is an integer of 2 or more, each $R_{c6}$ may be the same as or different from every other $R_{c6}$.

$R_{c6}$ is preferably an unsubstituted alkyl group or an alkyl group substituted by a fluorine atom, more preferably a trifluoromethyl group or a tert-butyl group.

The repeating units (cy1) and (cy2) are also preferably a repeating unit represented by the following formula (CII-AB):

(CII-AB)

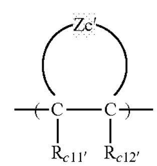

In formula (CII-AB), each of $R_{c11}$' and $R_{c12}$' independently represents a hydrogen atom, a cyano group, a halogen atom or an alkyl group.

$Z_c$' represents an atomic group for forming an alicyclic structure containing two bonded carbon atoms (C—C).

Formula (CII-AB) is more preferably the following formula (CII-AB1) or (CII-AB2):

CII-AB1

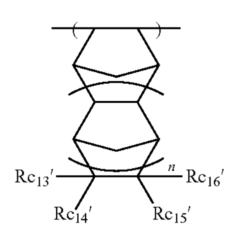

-continued

CII-AB2

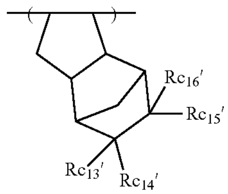

In formulae (CII-AB1) and (CII-AB2), each of $R_{c13}$' to $R_{c16}$ independently represents a hydrogen atom, a halogen atom, an alkyl group or a cycloalkyl group.

At least two members out of $R_{c13}$' to $R_{c16}$' may combine to form a ring.

n represents 0 or 1.

Specific examples of (cy1) and (cy2) are set forth below, but the present invention is not limited thereto. In the formulae, Ra represents H, $CH_3$, $CH_2OH$, $CF_3$ or CN.

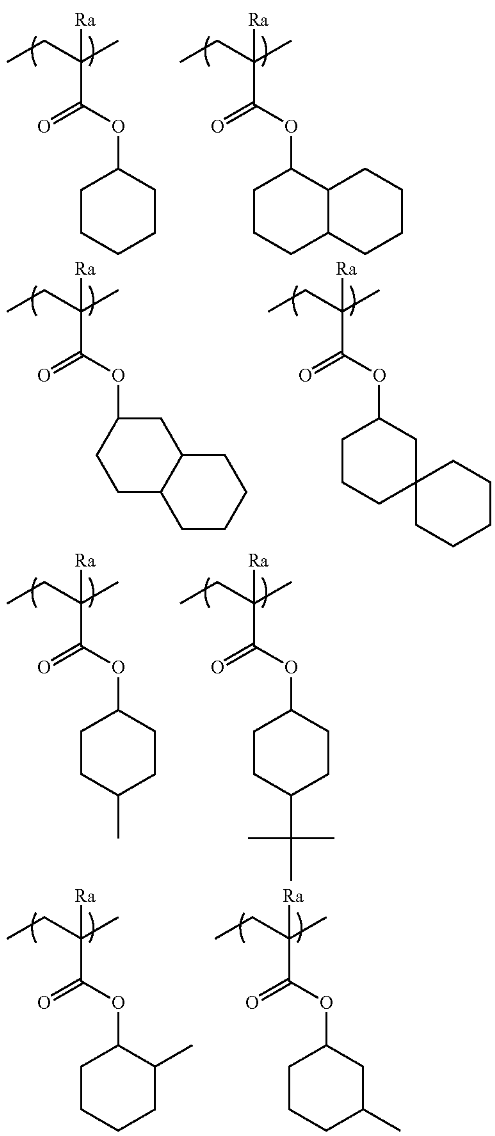

-continued

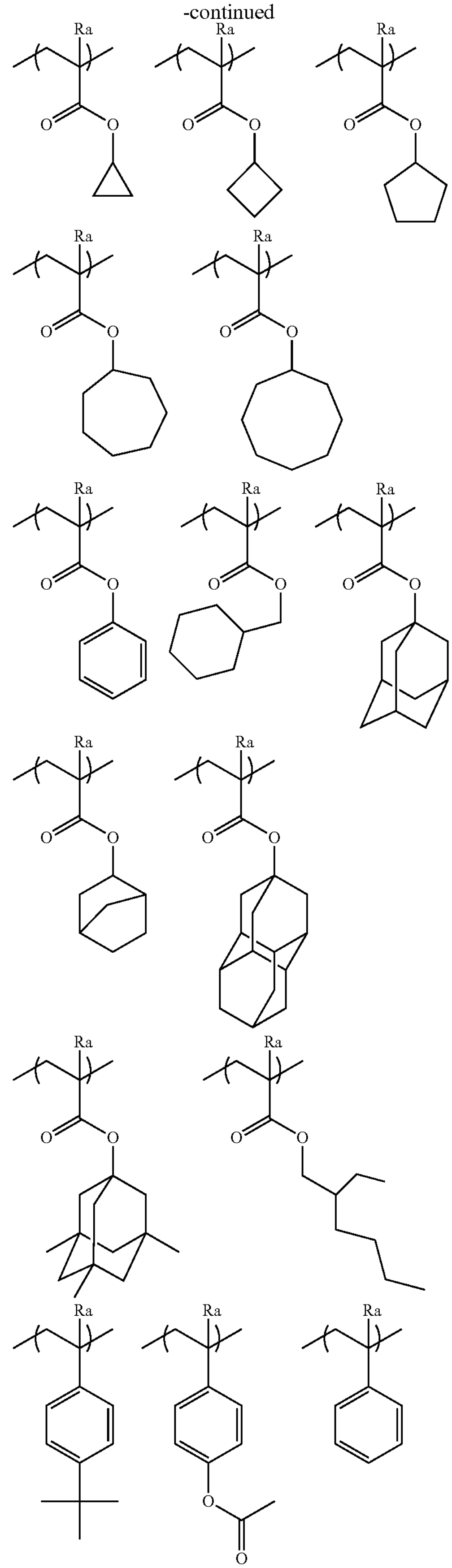

-continued

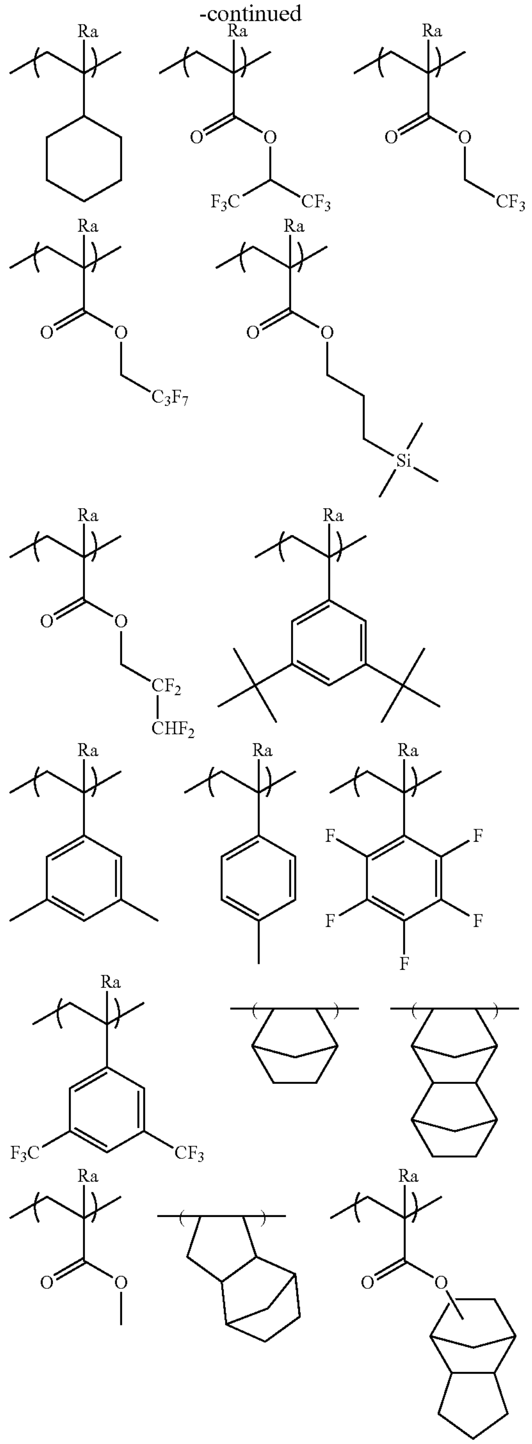

The repeating units (cy3) and (cy4) are preferably a repeating unit having a hydroxyl group or a cyano group as the polar group. Thanks to this repeating unit, the affinity for developer is enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornyl group. Preferred examples of the alicyclic hydrocarbon structure substituted by a hydroxyl group or a cyano group include a monohydroxyadamantyl group, a dihydroxyadamantyl group, a monohydroxydiamantyl group, a dihydroxyadamantyl group and a norbornyl group substituted by a cyano group.

The repeating unit having such an atomic group includes repeating units represented by the following formulae (CAIIa) to (CAIId):

(CAIIa)

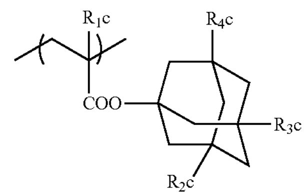

(CAIIb)

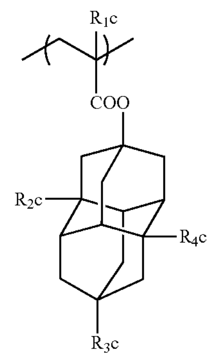

(CAIIc)

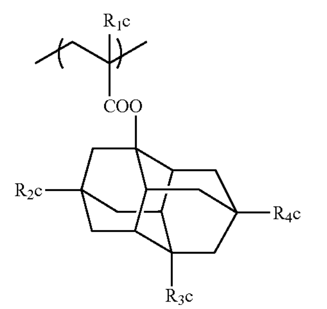

(CAIId)

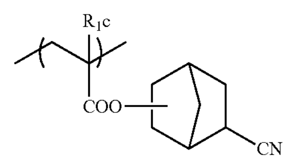

In formulae (CAIIa) to (CAIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (CAIIa), it is more preferred that two members out of $R_2c$ to $R_4c$ are a hydroxyl group and the remaining is a hydrogen atom.

Specific examples of the repeating units (cy3) and (cy4) are set forth below, but the present invention is not limited thereto.

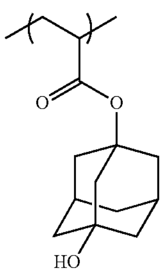
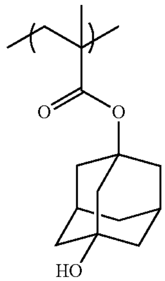
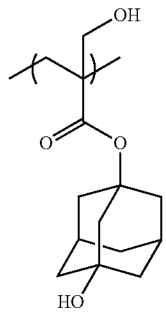
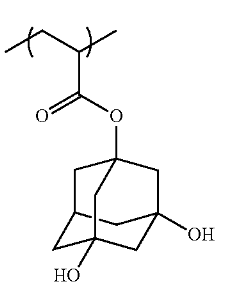
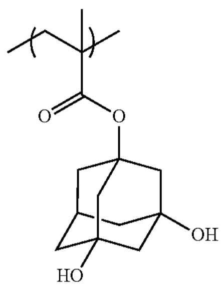
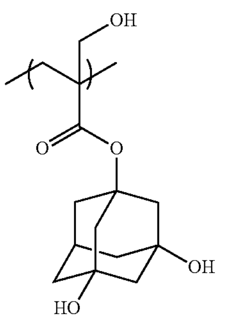
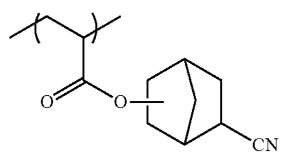
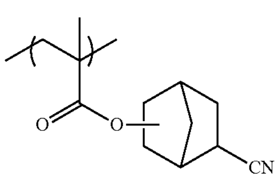
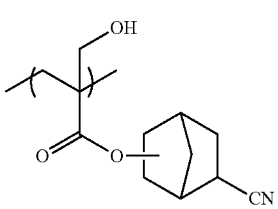
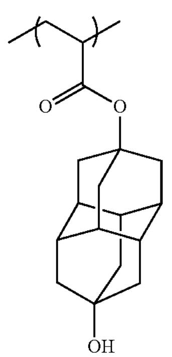

-continued

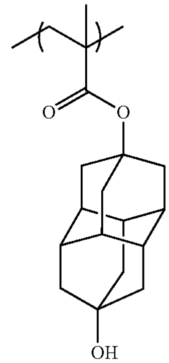
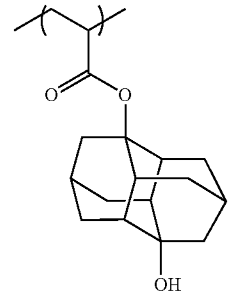
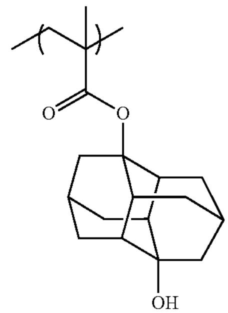

The content of the repeating unit of (cy1) to (cy4) is preferably from 5 to 40 mol %, more preferably from 5 to 30 mol %, still more preferably from 10 to 25 mol %, based on all repeating units in the resin (C).

The resin (C) may have a plurality of repeating units of (cy1) to (cy4).

In the case where the resin (C) contains a fluorine atom, the fluorine atom content is preferably from 5 to 80 mass %, more preferably from 10 to 80 mass %, based on the molecular weight of the resin (C). Also, the fluorine atom-containing repeating unit preferably occupies from 10 to 100 mass %, more preferably from 30 to 100 mass %, based on all repeating units in the resin (C).

In the case where the resin (C) contains a silicon atom, the silicon atom content is preferably from 2 to 50 mass %, more preferably from 2 to 30 mass %, based on the molecular weight of the resin (C). Also, the silicon atom-containing repeating unit preferably occupies from 10 to 90 mass %, more preferably from 20 to 80 mass %, based on all repeating units in the resin (C).

The standard polystyrene-equivalent weight average molecular of the resin (C) is preferably from 1,000 to 100,000, more preferably from 1,000 to 50,000, still more preferably from 2,000 to 15,000.

The resin (C) in the actinic ray-sensitive or radiation-sensitive resin composition may be used by appropriately adjusting its content to give an actinic ray-sensitive or radiation-sensitive resin film having a receding contact angle in the range above, but the content is preferably from 0.01 to 10 mass %, more preferably from 0.1 to 10 mass %, still more preferably from 0.1 to 9 mass %, yet still more preferably from 0.5 to 8 mass %, based on the entire solid content of the actinic ray-sensitive or radiation-sensitive resin composition.

Similarly to the resin as the resin (A), in the resin (C), it is of course preferred that the content of impurities such as metal is small, but also, the content of residual monomers or oligomer components is preferably from 0 to 10 mass %, more preferably from 0 to 5 mass %, still more preferably from 0 to 1 mass %. When these conditions are satisfied, a resist free of extraneous substances in the liquid or change with aging of sensitivity or the like can be obtained. Also, in view of resolution, resist profile, side wall of resist pattern, roughness and the like, the molecular weight distribution (Mw/Mn, sometimes referred to as "polydispersity") is preferably from 1 to 3, more preferably from 1 to 2, still more preferably from 1 to 1.8, and most preferably from 1 to 1.5.

As for the resin (C), various commercially available products may be used or the resin may be synthesized by an ordinary method (for example, radical polymerization), similarly to the resin (A).

Specific examples of the resin (C) are set forth below. Also, the molar ratio of repeating units (corresponding to repeating units starting from the left), weight average molecular weight (Mw) and polydispersity (Mw/Mn) of each resin are shown in the Table 1 later.

(C-1)

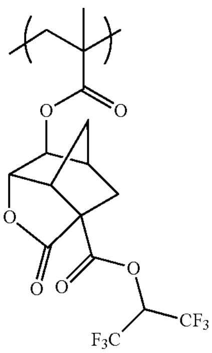

(C-2)

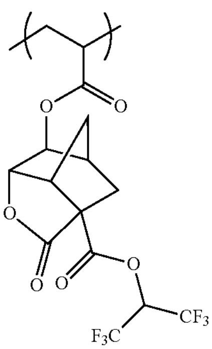

(C-3)

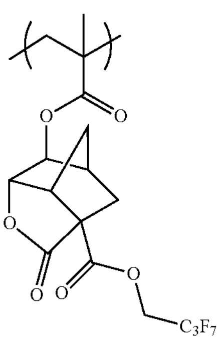

(C-4)

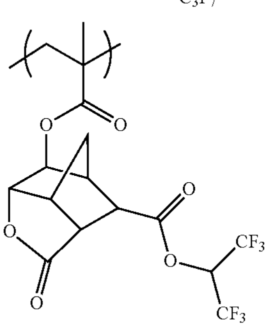

-continued (C-5)

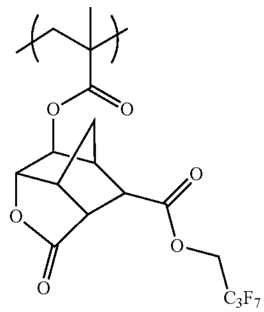

(C-6)

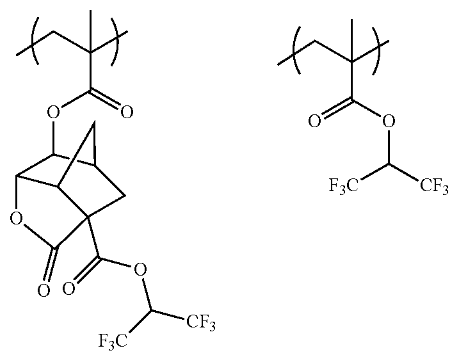

(C-7)

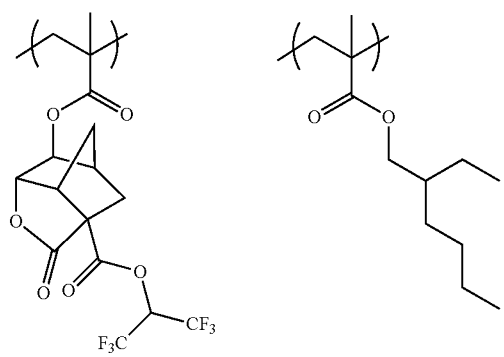

(C-8)

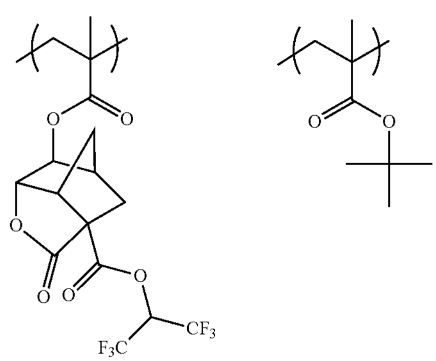

-continued
(C-9)
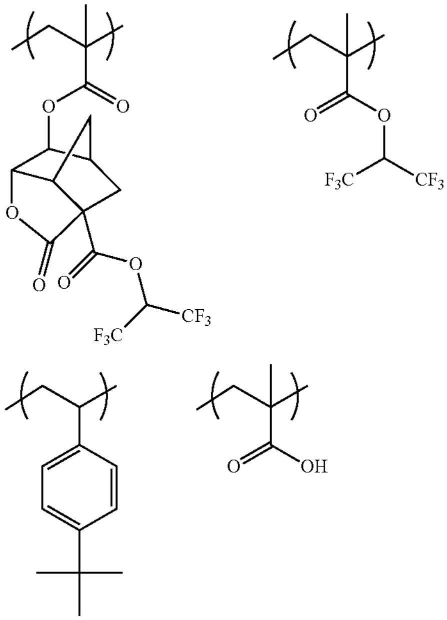
(C-10)
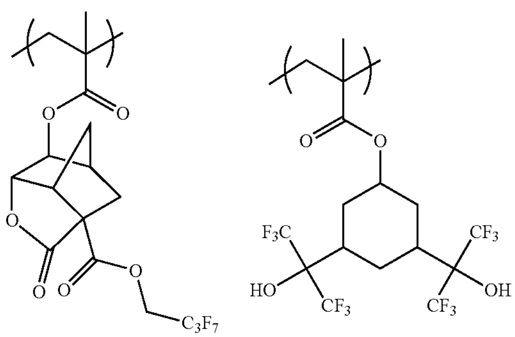
(C-11)
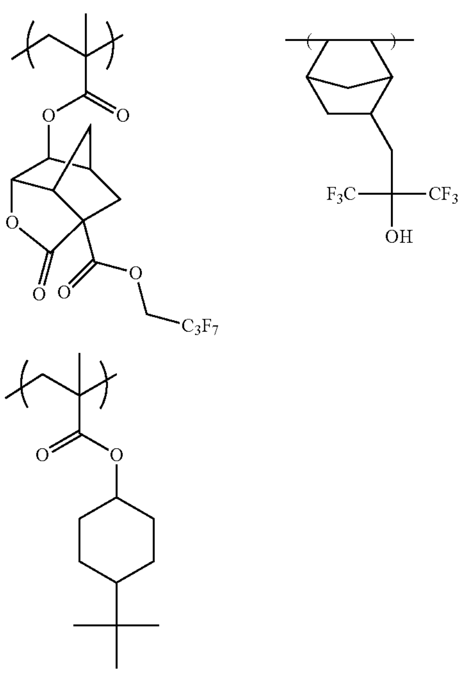
-continued
(C-12)
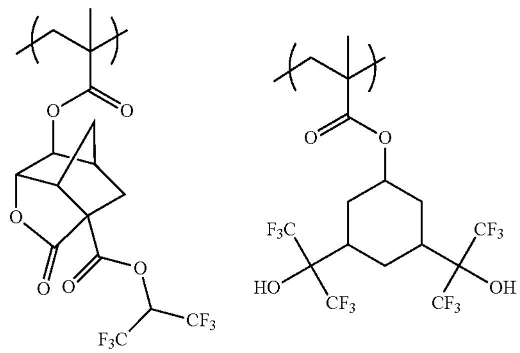
(C-13)
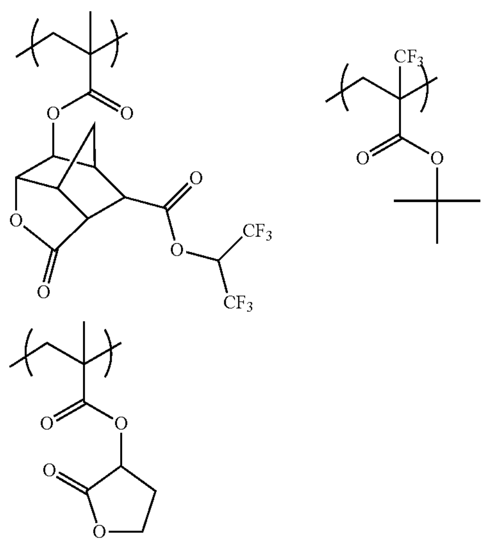
(C-14)
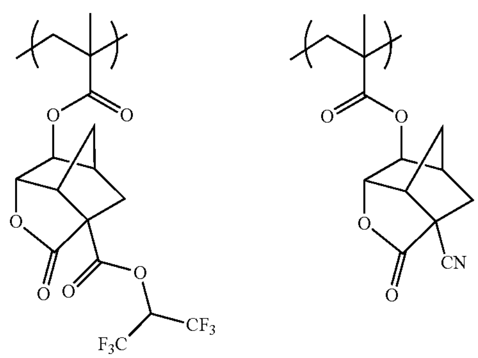
(C-15)
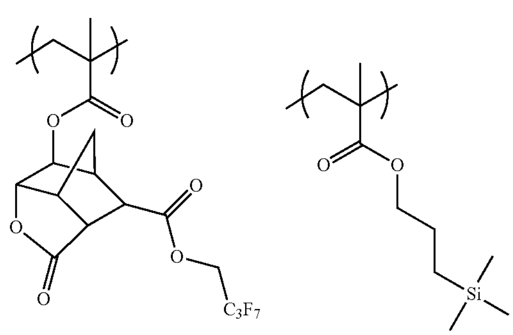

-continued
(C-16)
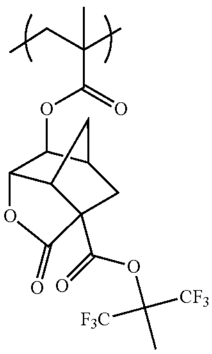
(C-17)
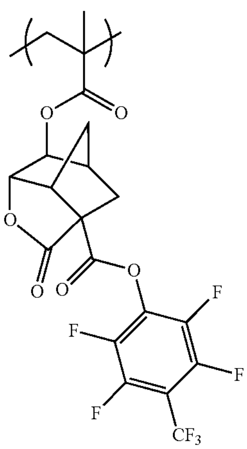
(C-18)
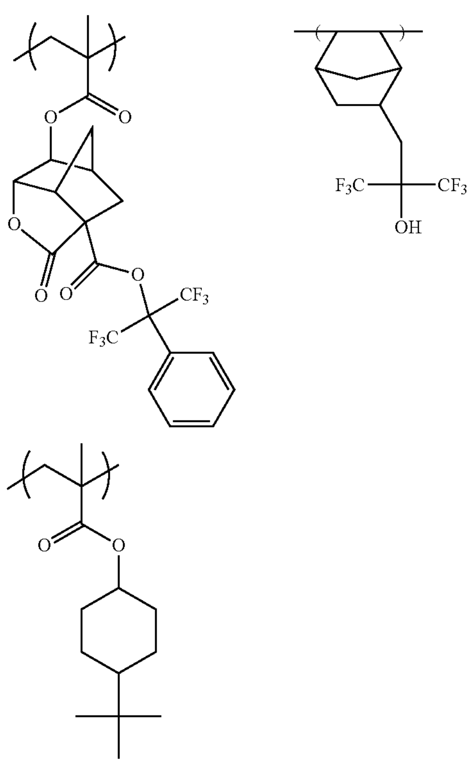
-continued
(C-19)
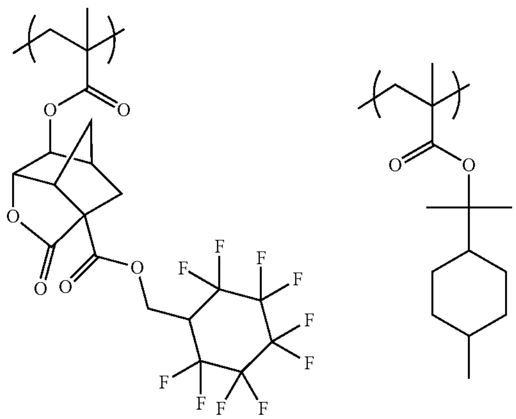
(C-20)
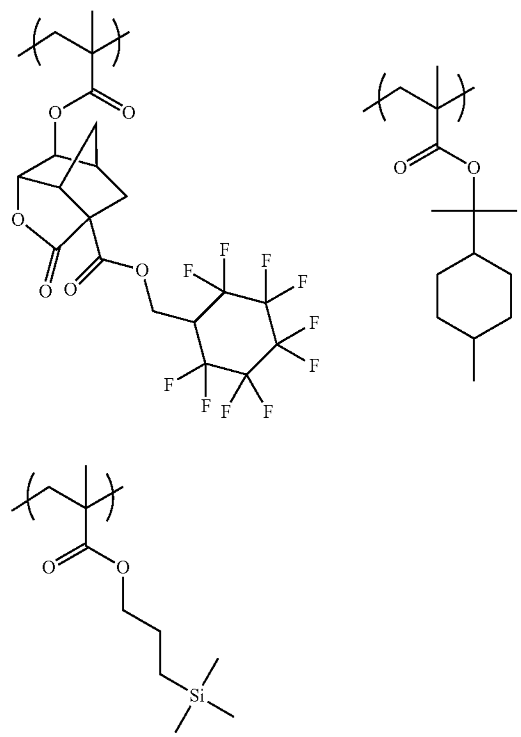
(C-21)
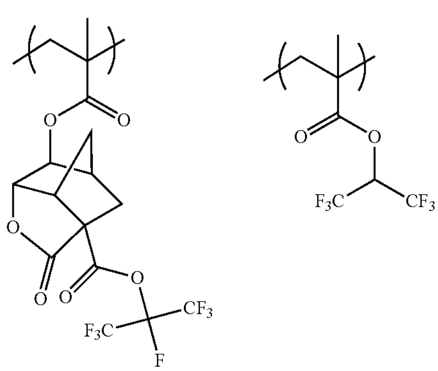

-continued
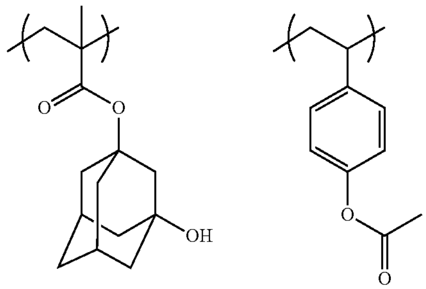
(C-22)
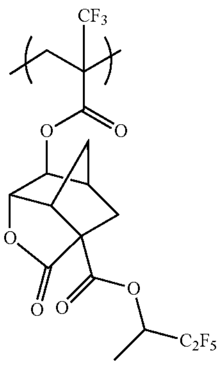
(C-23)
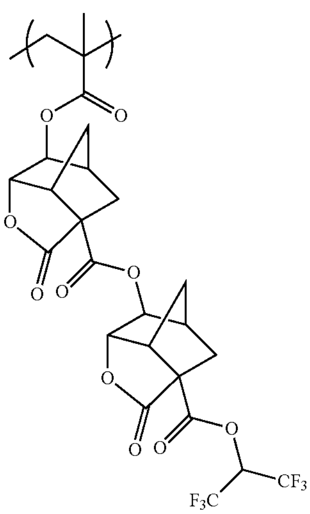
(C-24)
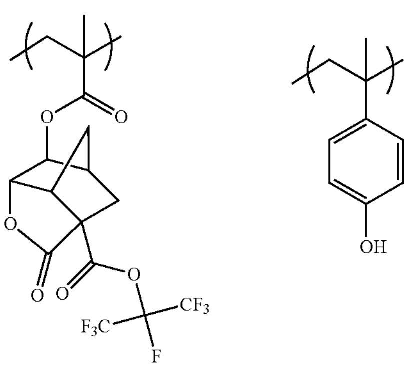
-continued
(C-25)
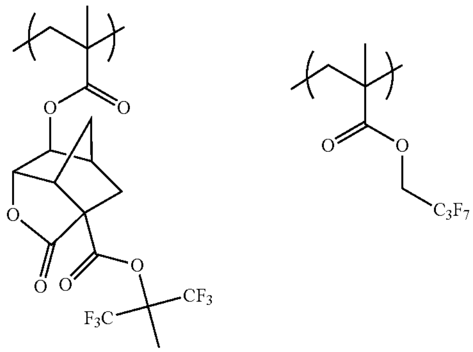
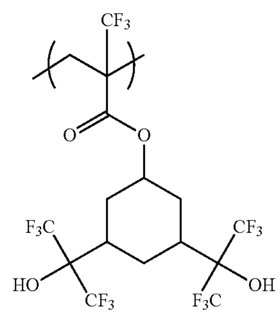
(C-26)
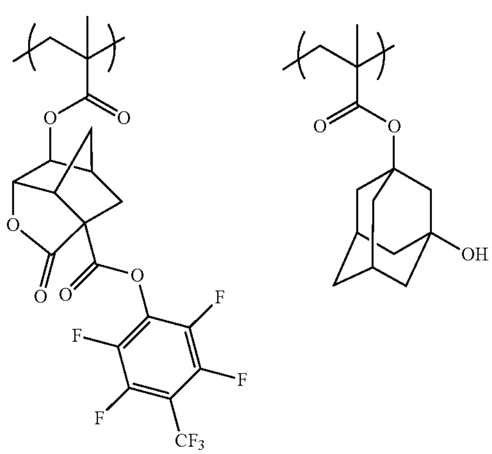
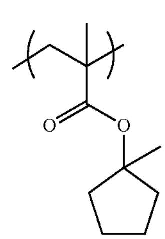

-continued
(C-27)
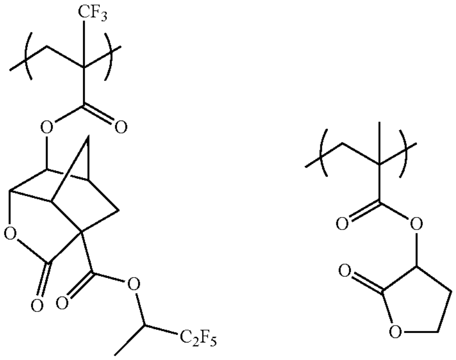
(C-28)
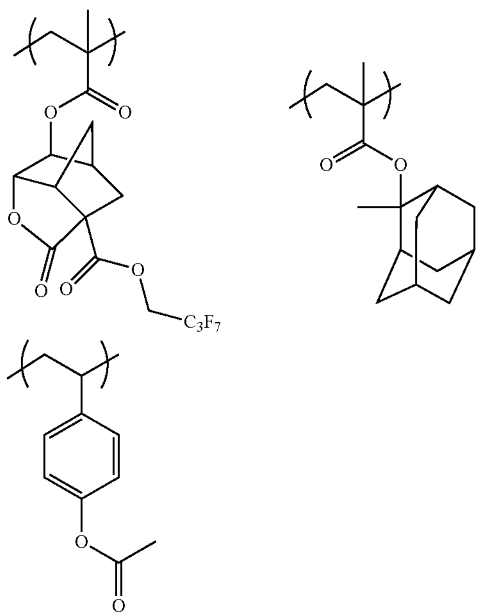
(C-29)
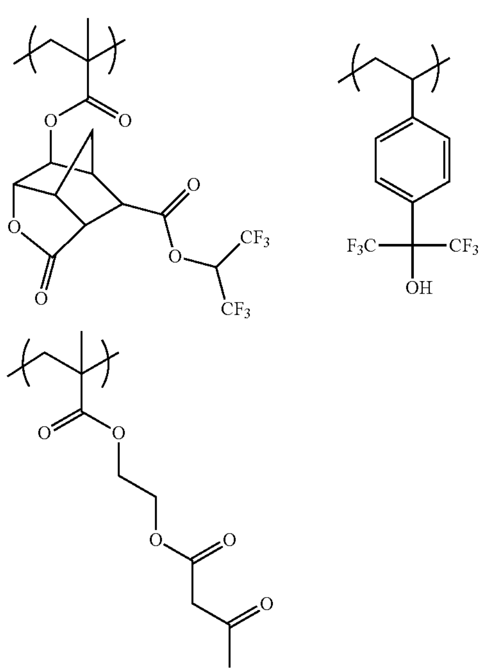
-continued
(C-30)
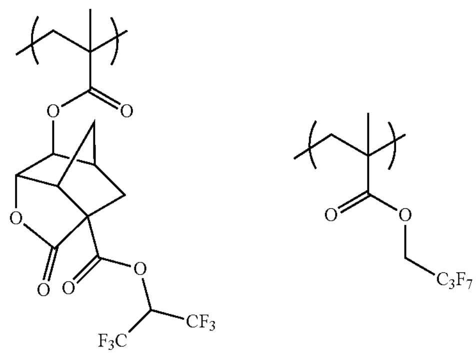
(C-31)
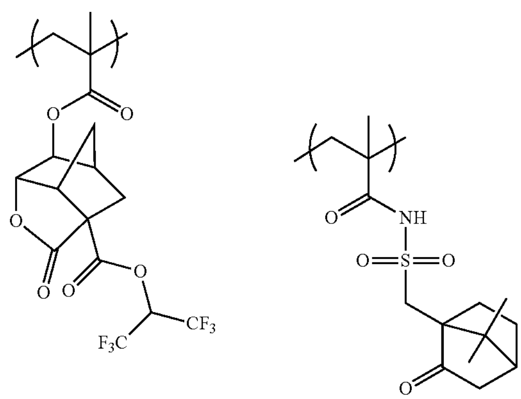
(C-32)
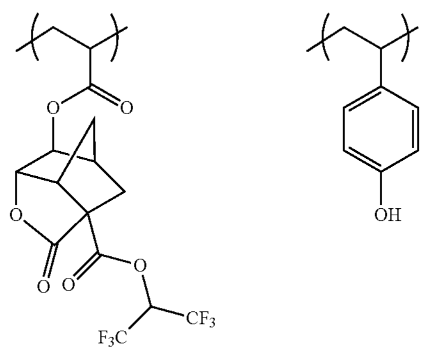
(C-33)
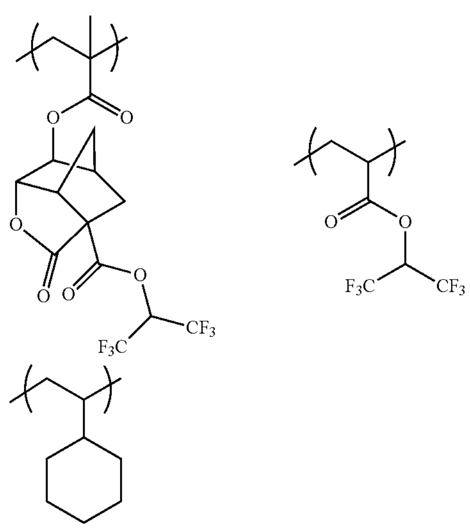

-continued
(C-34)
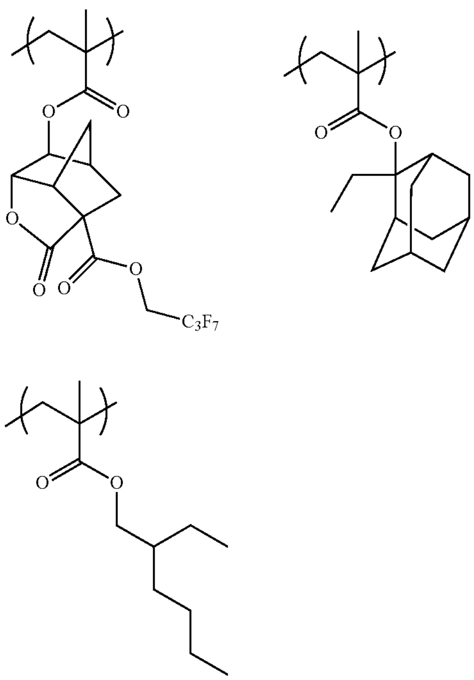
(C-35)
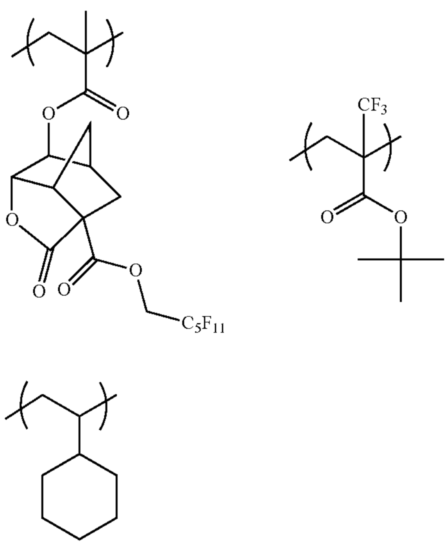
(C-36)
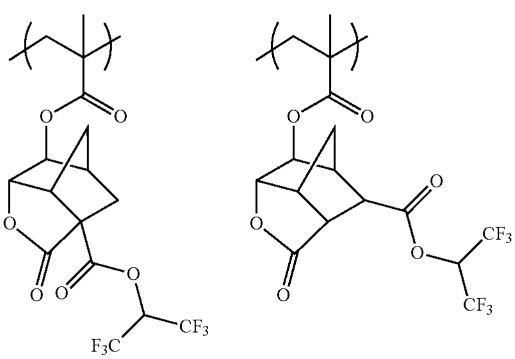
-continued
(C-37)
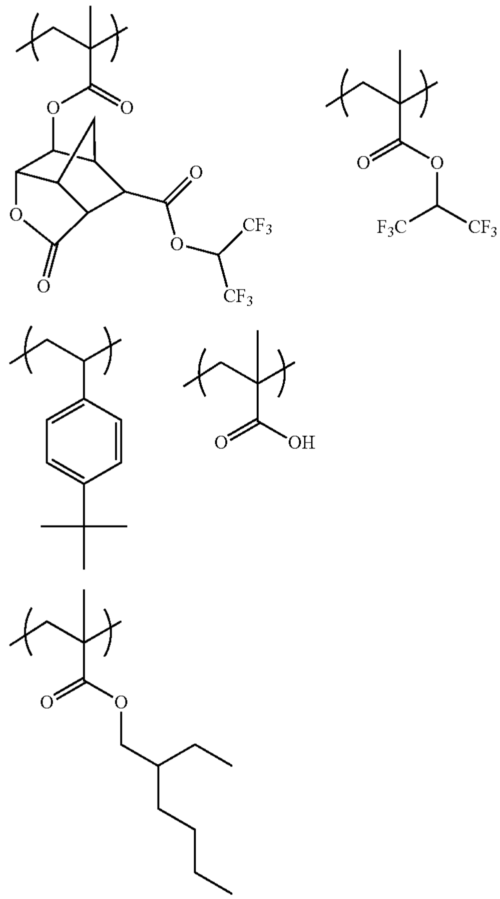
(C-38)
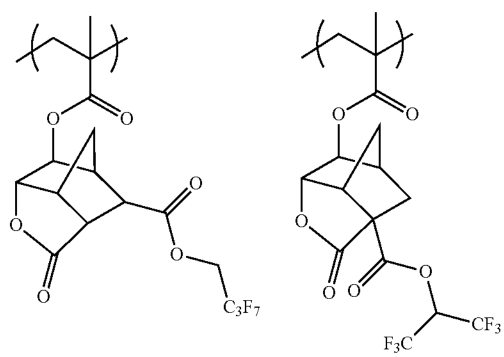
(C-39)
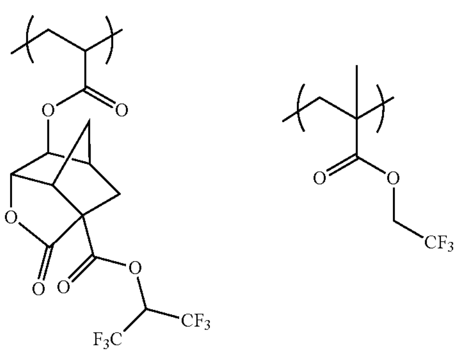

-continued
(C-40)
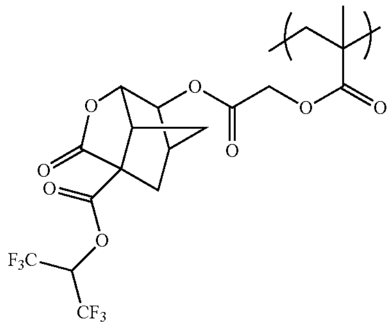
(C-41)
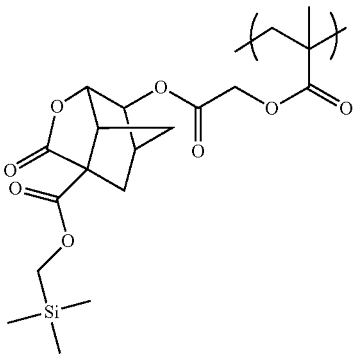
(C-42)
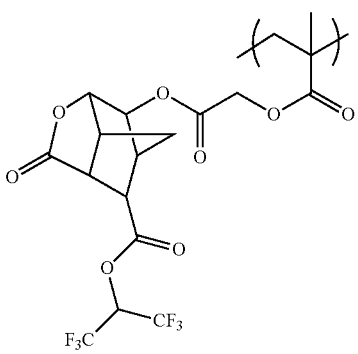
(C-43)
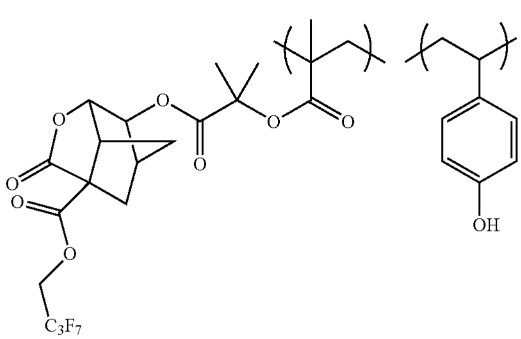
-continued
(C-44)
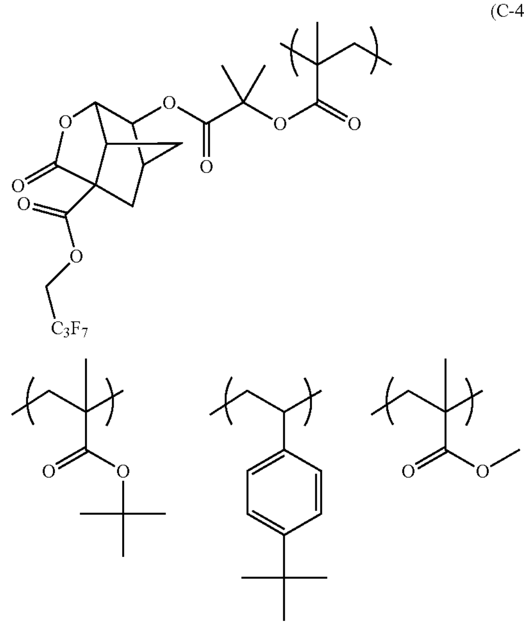
(C-45)
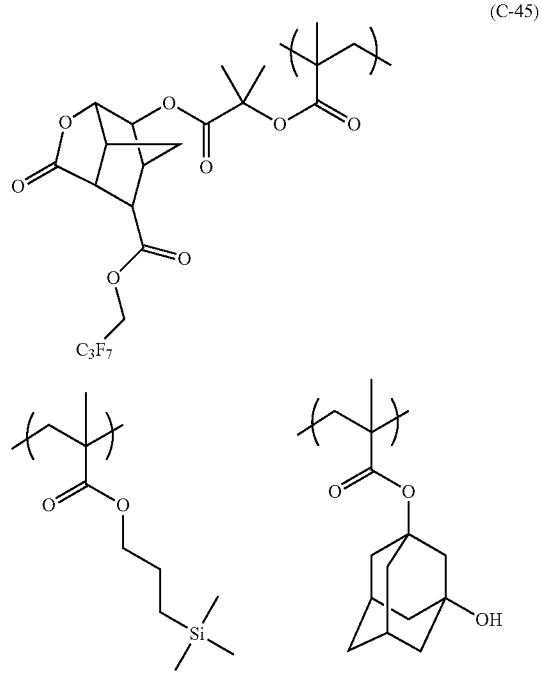
(C-46)
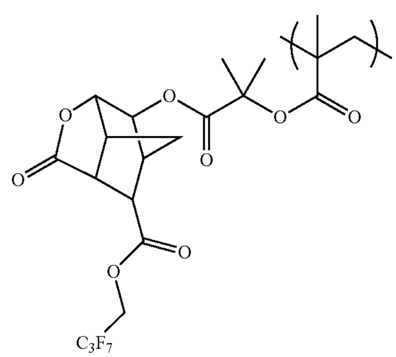

-continued
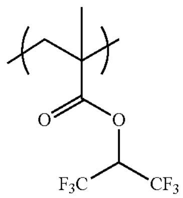
(C-47)
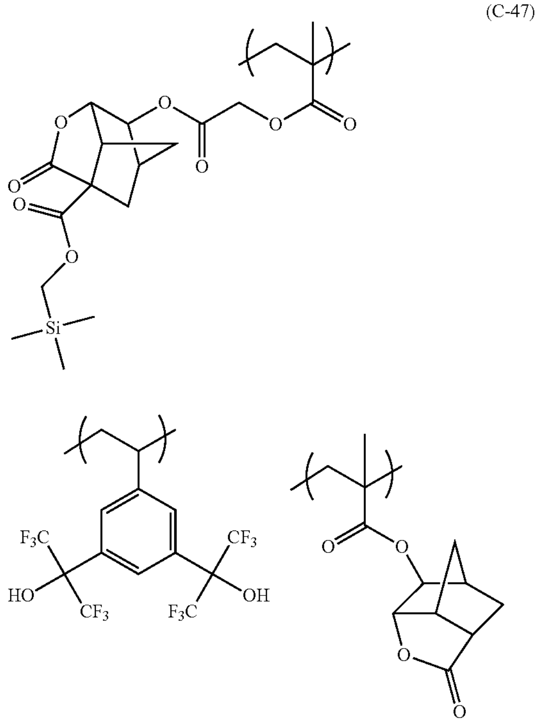
(C-48)
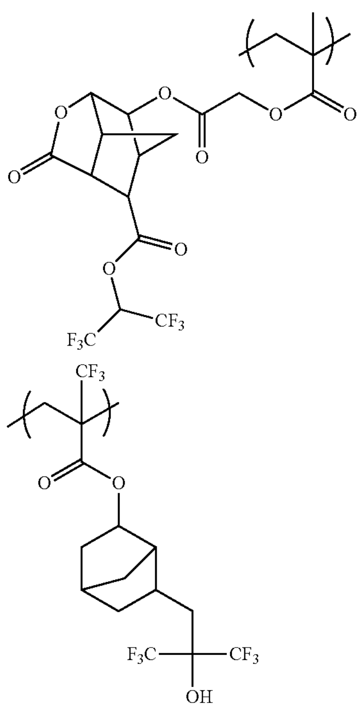
-continued
(C-49)
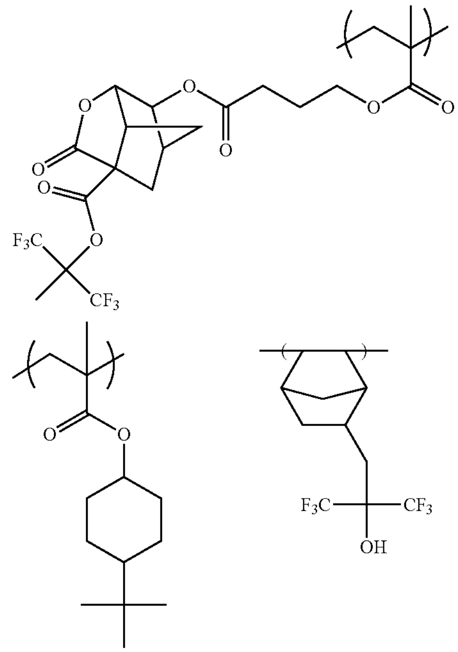
(C-50)
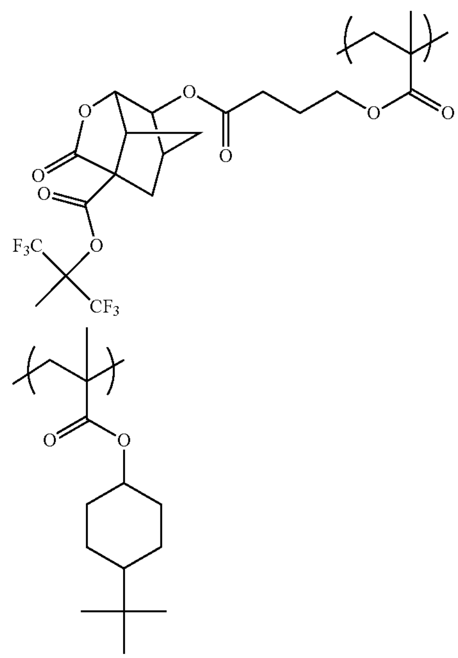
(C-51)
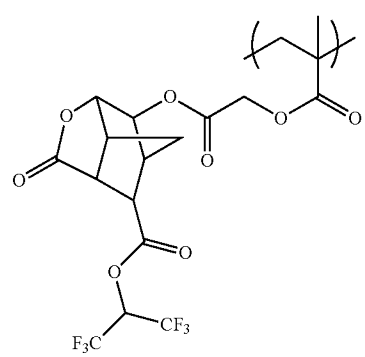

-continued
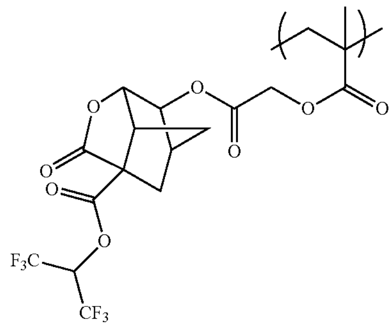
(C-52)
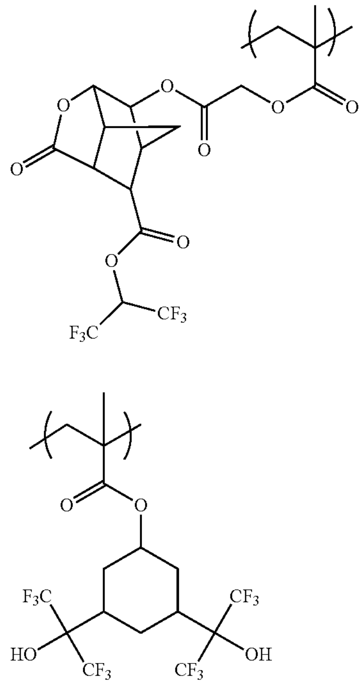
(C-53)
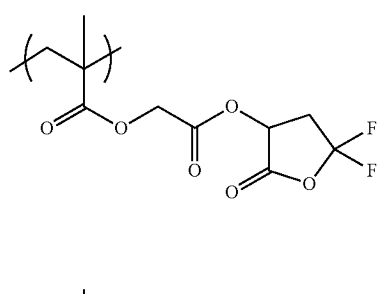
(C-54)
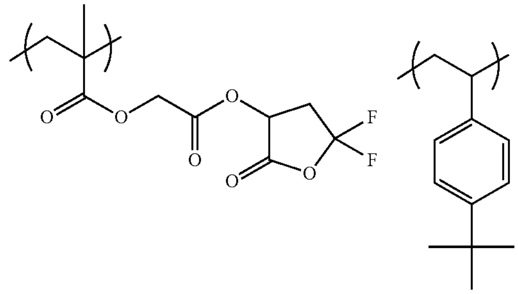
-continued
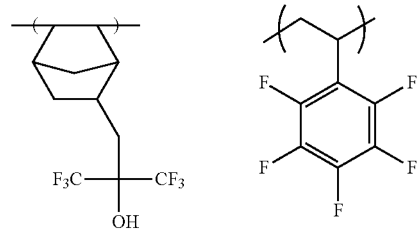
(C-55)
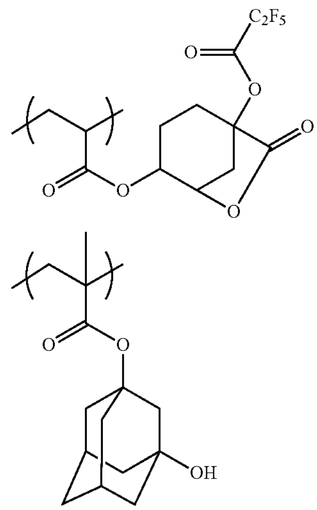
(C-56)
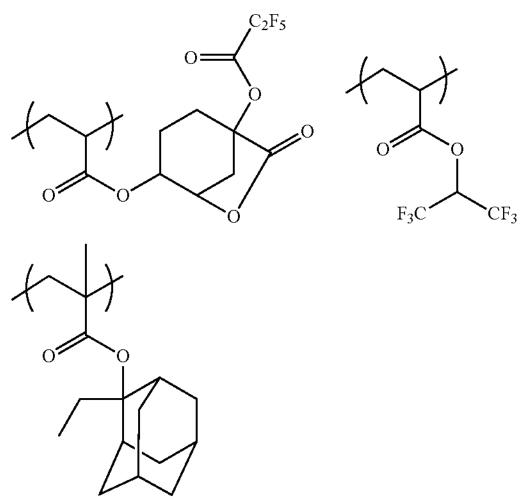
(C-57)
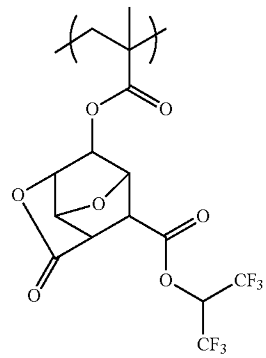

-continued
(C-58)
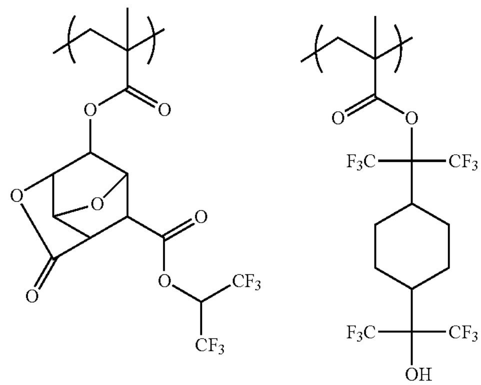
(C-59)
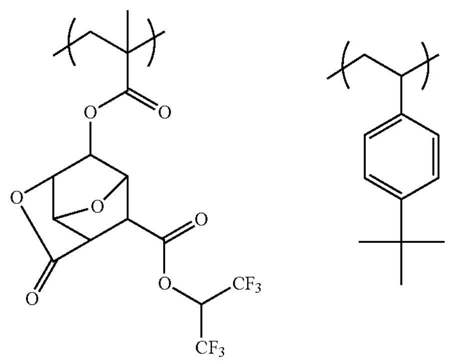
(C-60)
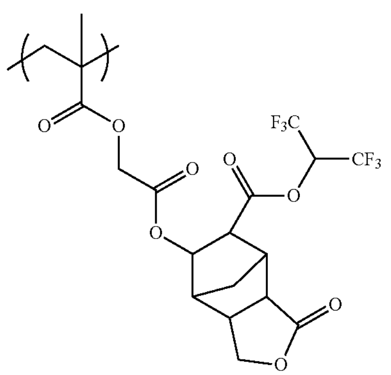
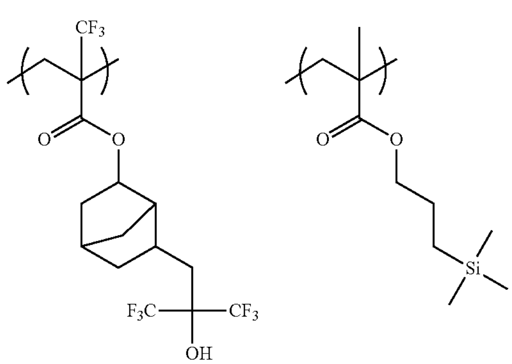
-continued
(C-61)
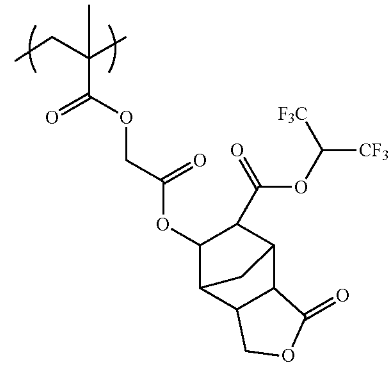
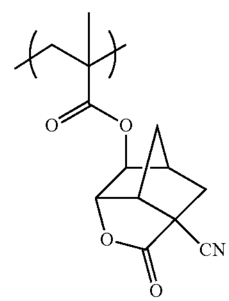
(C-62)
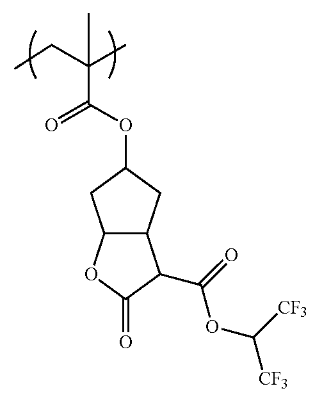
(C-63)
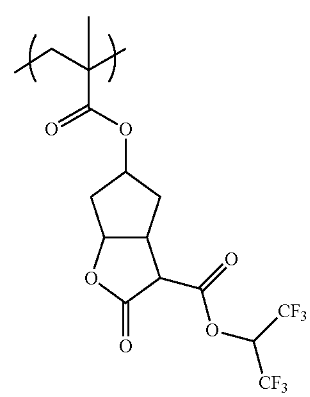

-continued
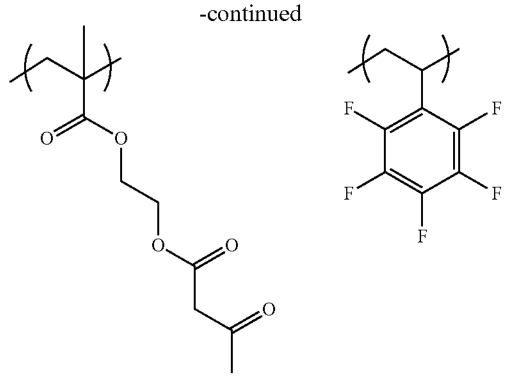
(C-64)
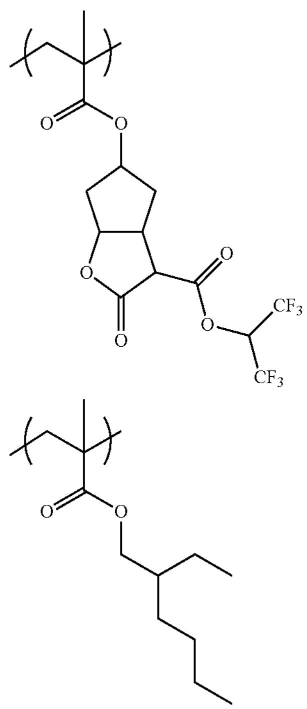
(C-65)
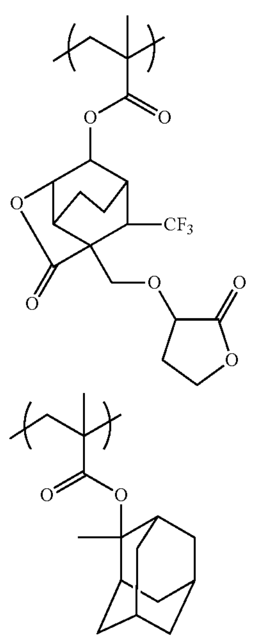
-continued
(C-66)
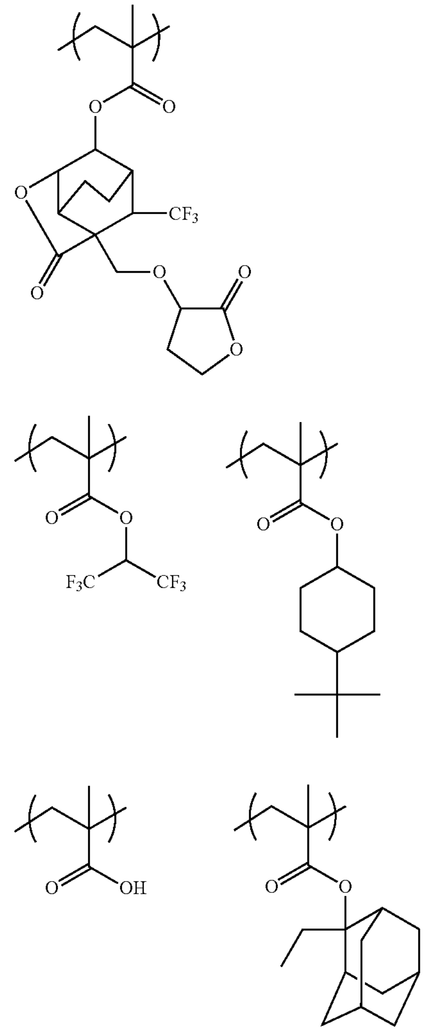
(C-67)
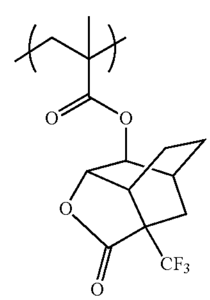
(C-68)
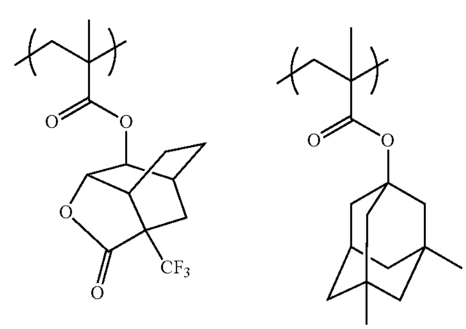

-continued
(C-69)
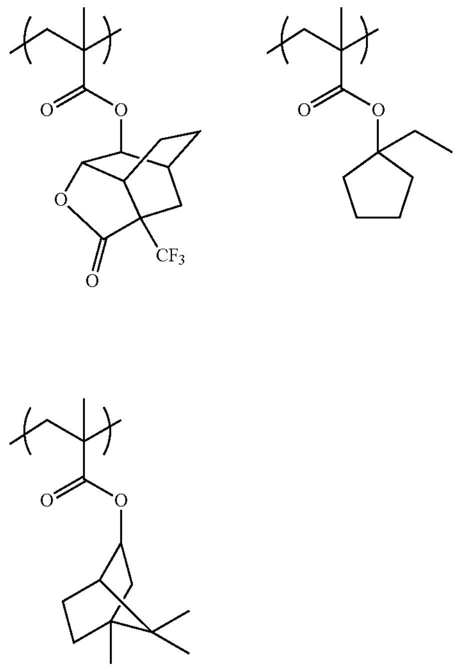
(C-70)
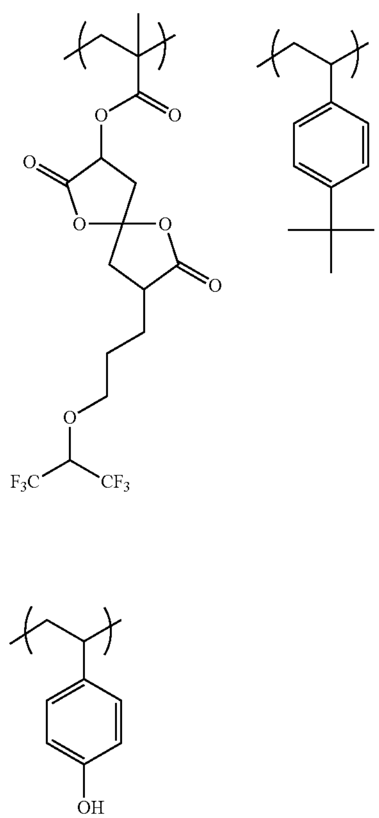
-continued
(C-71)
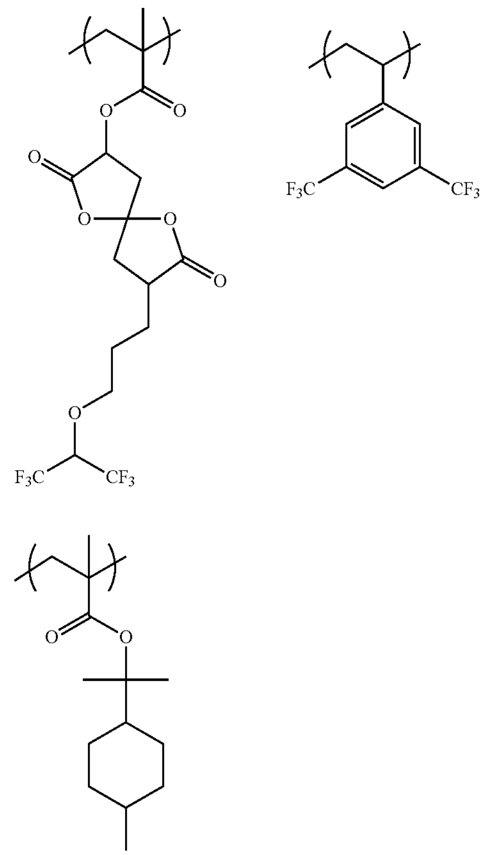
(C-72)
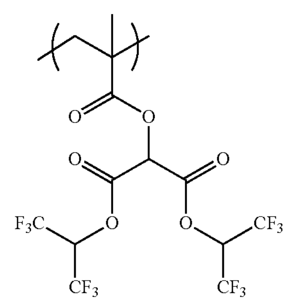
(C-73)
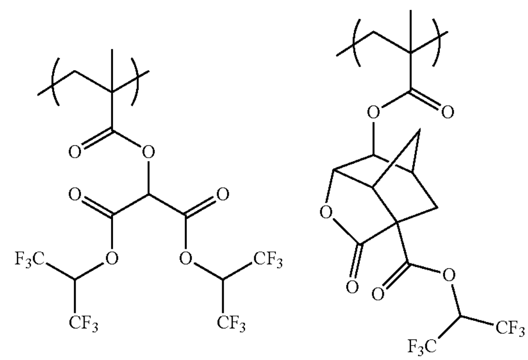

(C-74)
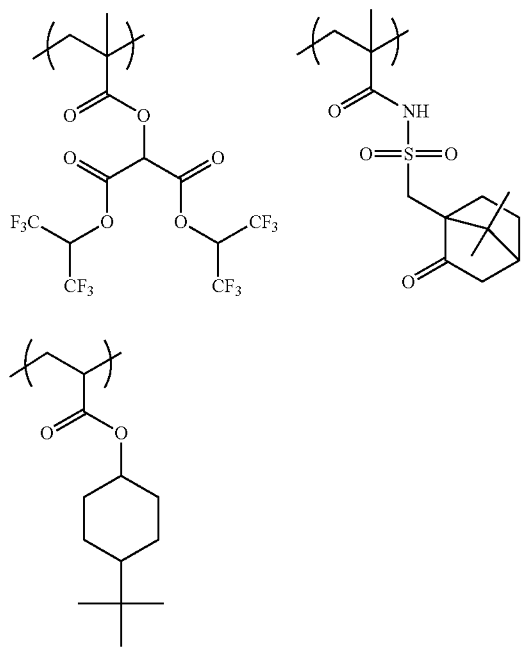
(C-75)
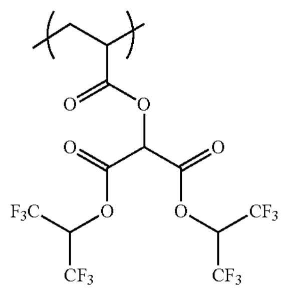
(C-76)
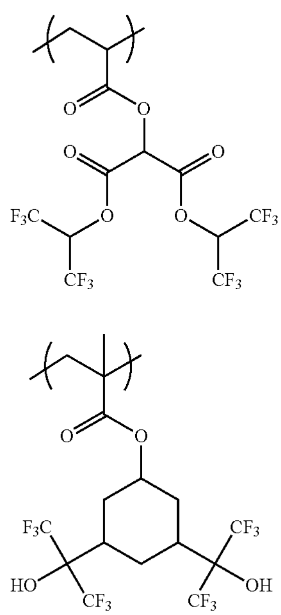
(C-77)
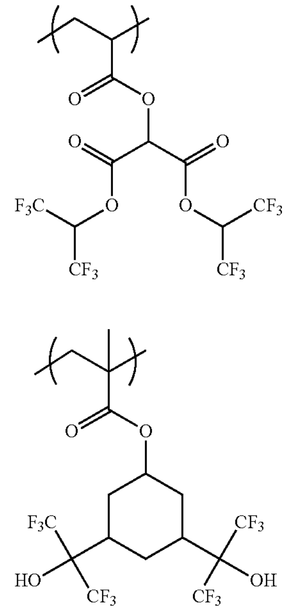
(C-78)
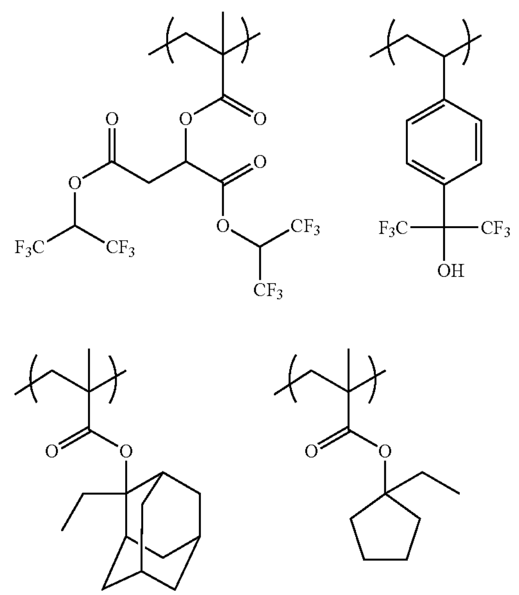
(C-79)
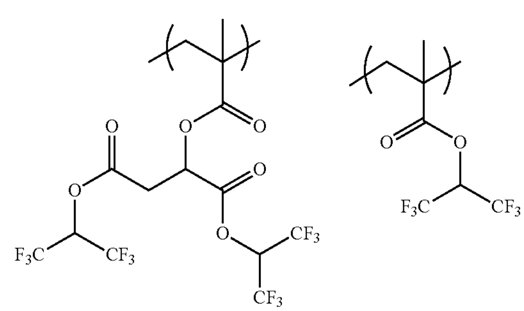

-continued
(C-80)
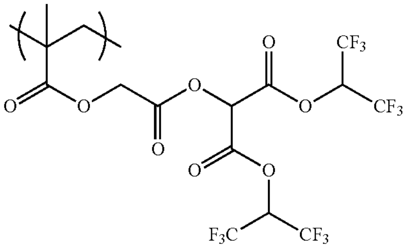
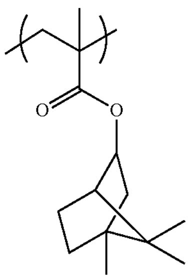
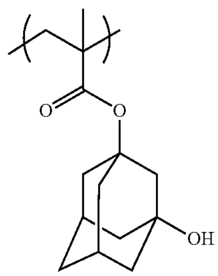
(C-81)
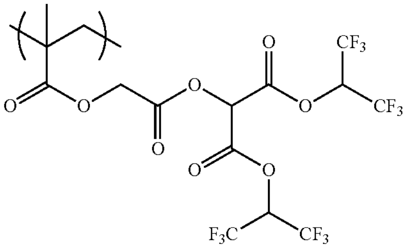
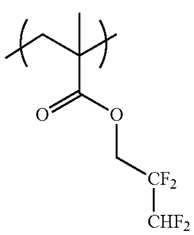
(C-82)
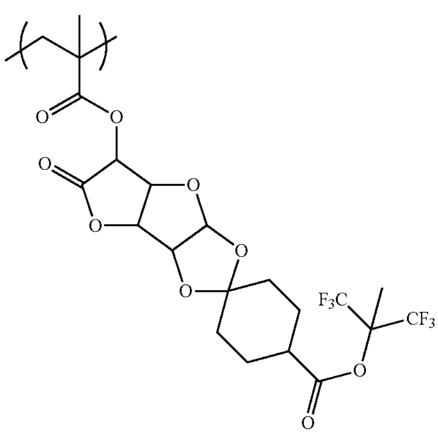
-continued
(C-83)
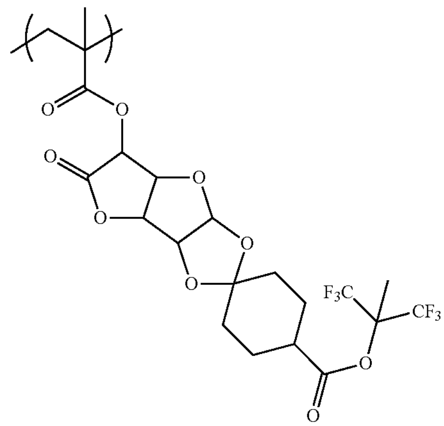
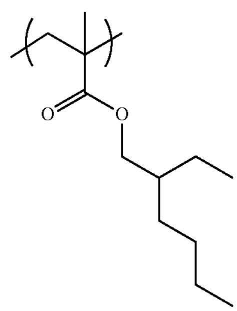
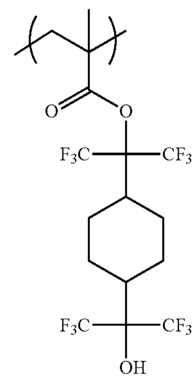
(C-84)
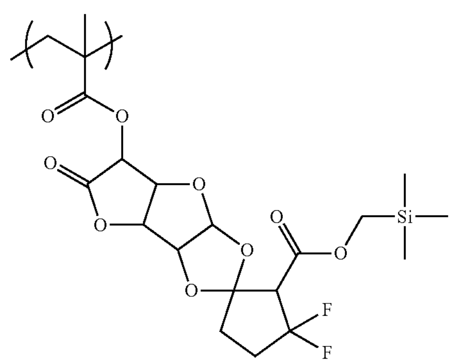
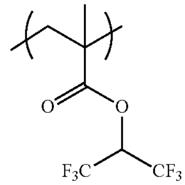

-continued
(C-85)
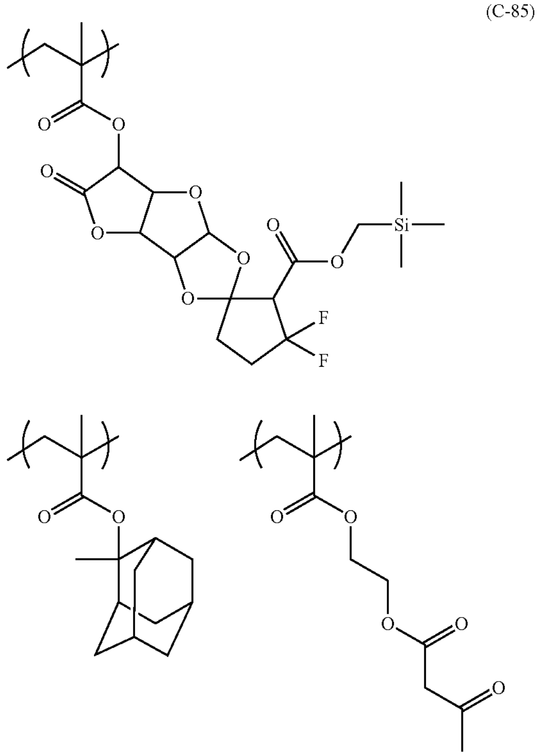
(C-86)
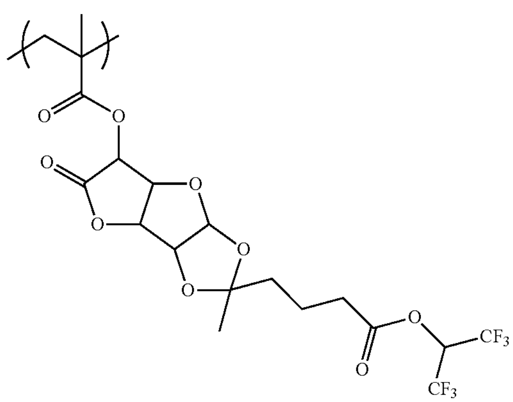
(C-87)
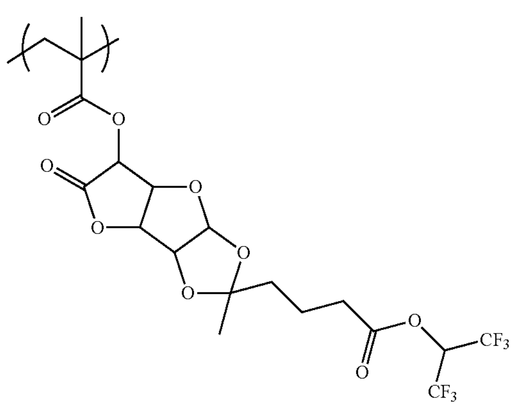
-continued
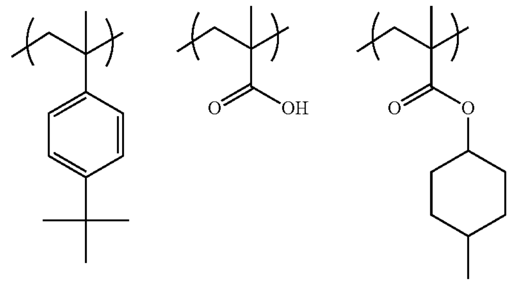
(C-88)
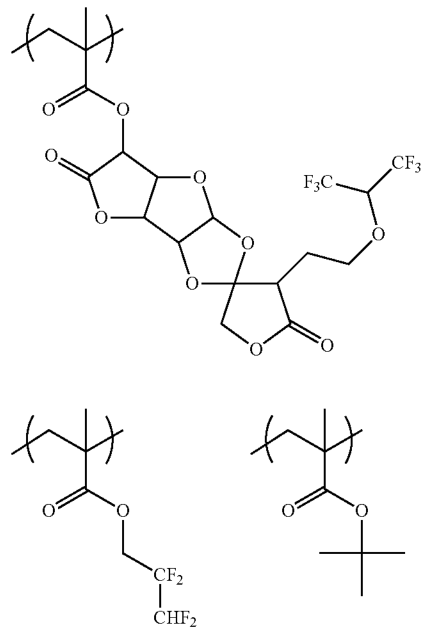
(C-89)
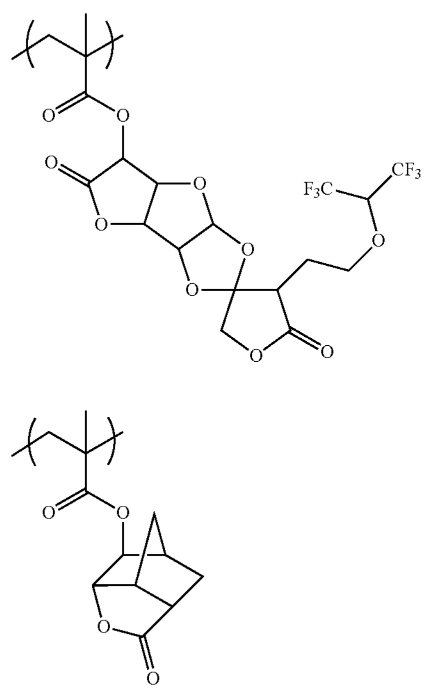

-continued
(C-90)
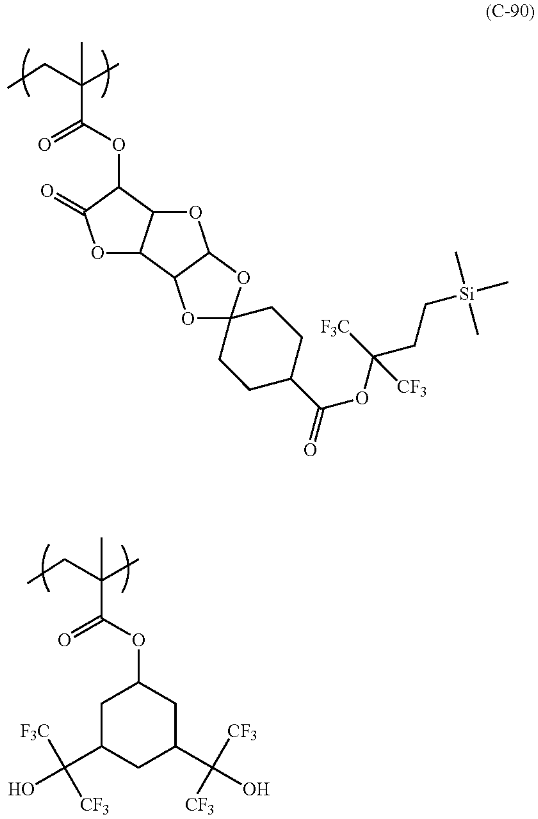
(C-91)
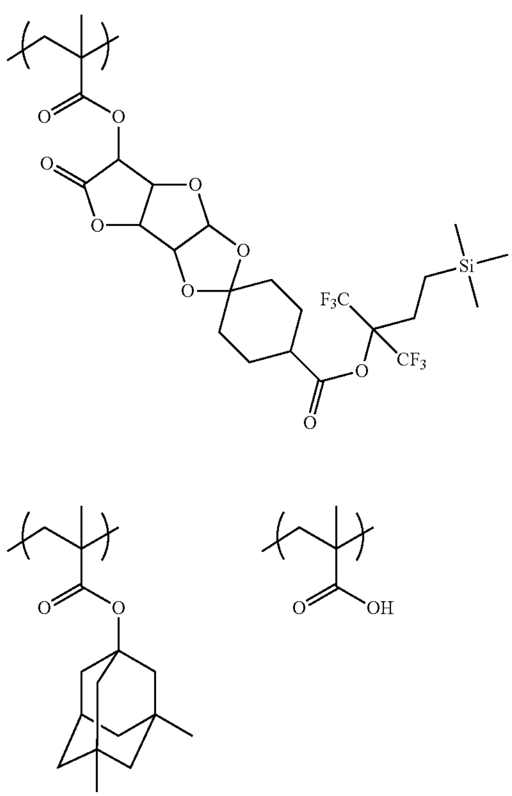
-continued
(C-92)
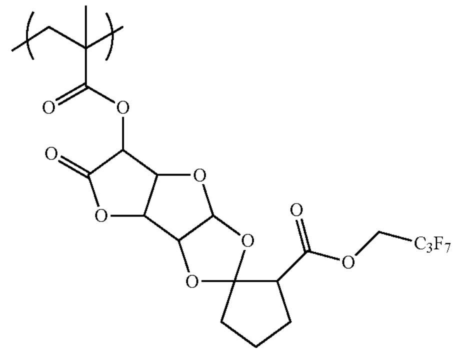
(C-93)
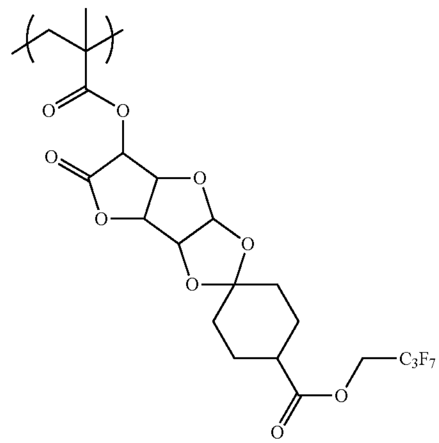
(C-94)
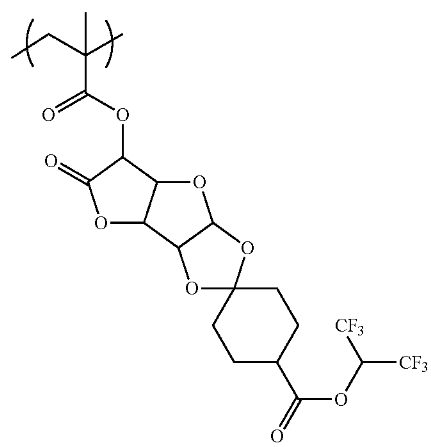
(C-95)
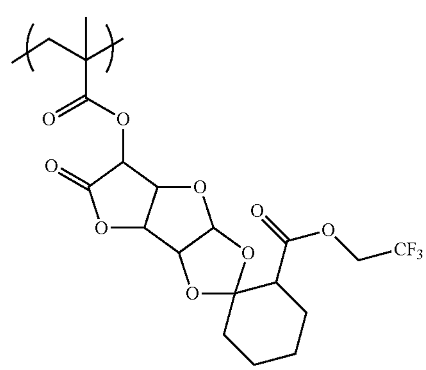

-continued
(C-96)
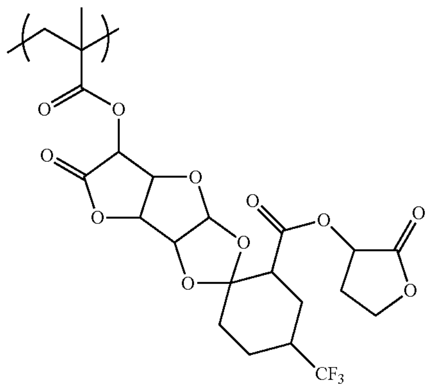
(C-97)
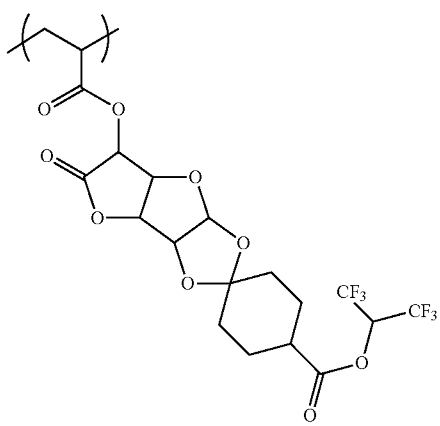
(C-98)
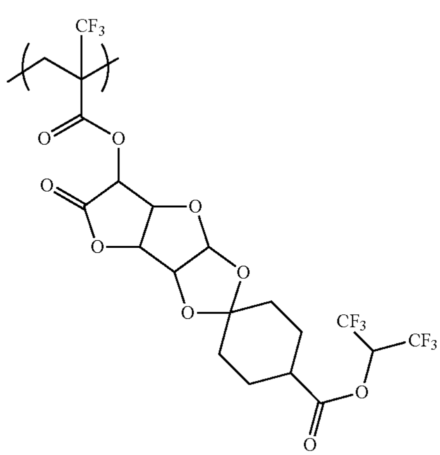
-continued
(C-99)
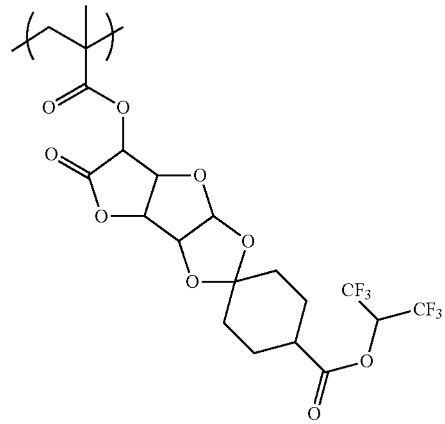
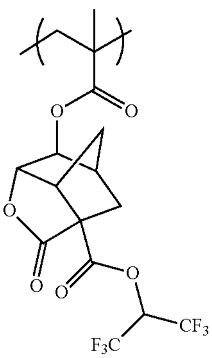
(C-100)
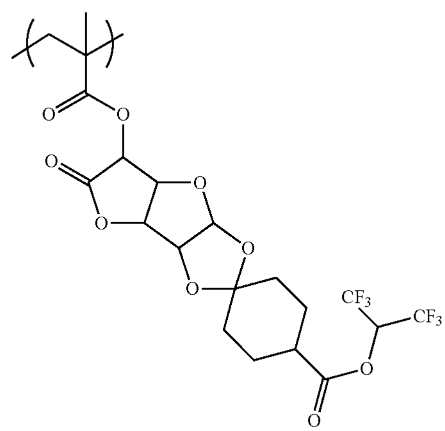
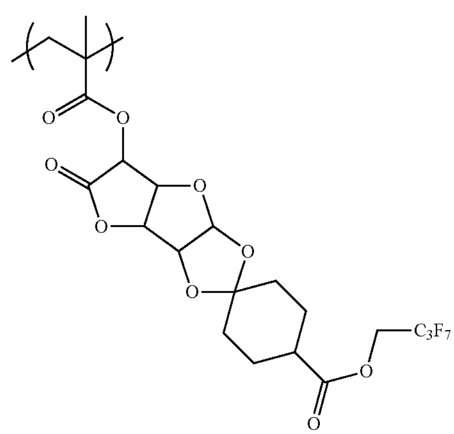

-continued
(C-101)
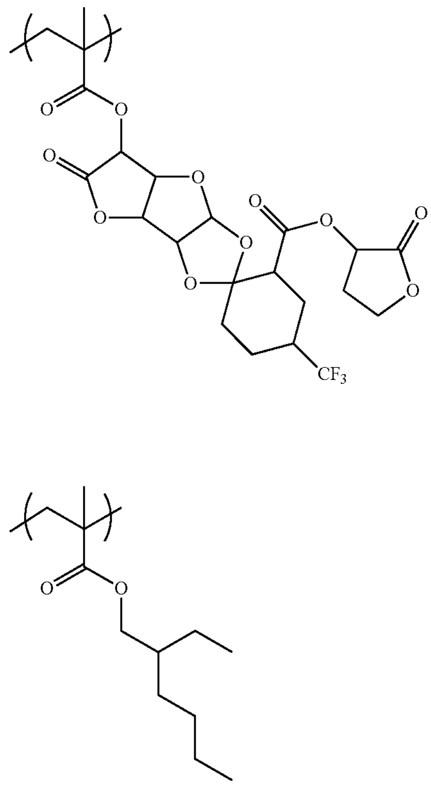
(C-102)
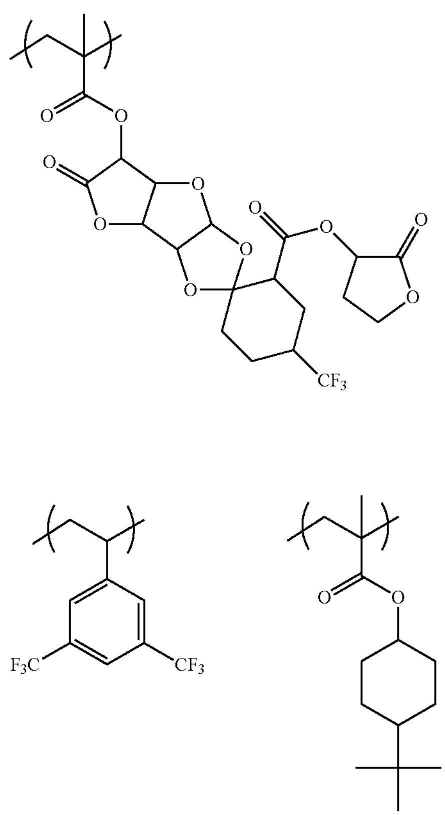
-continued
(C-103)
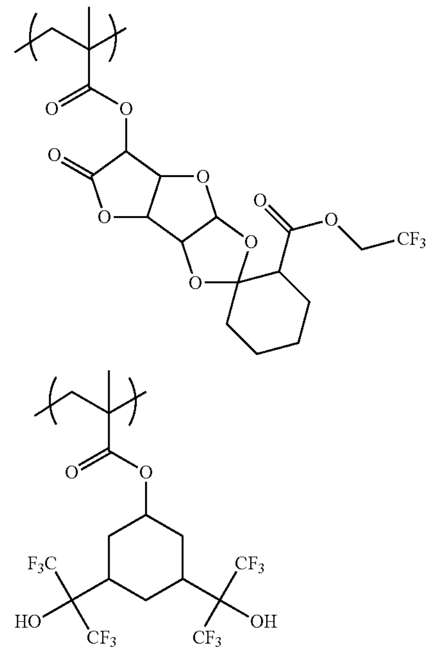
(C-104)
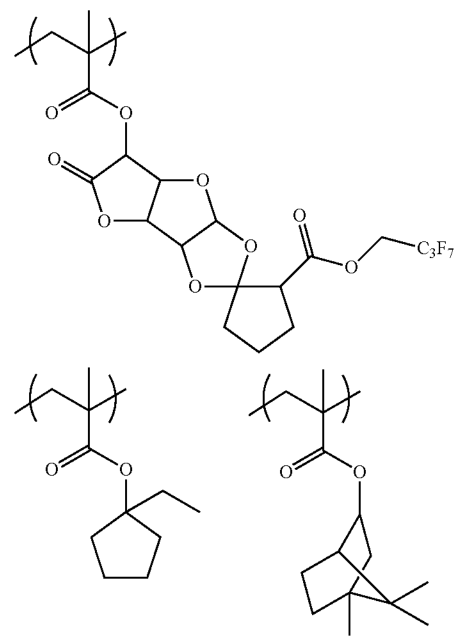
(C-105)
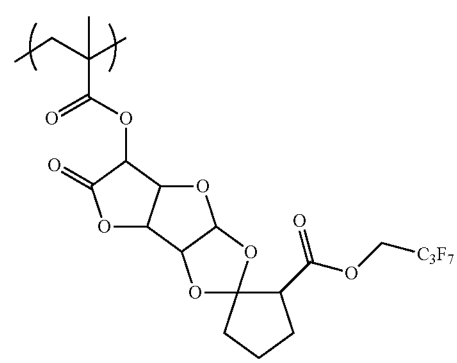

-continued
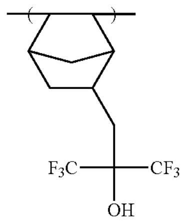
(C-106)
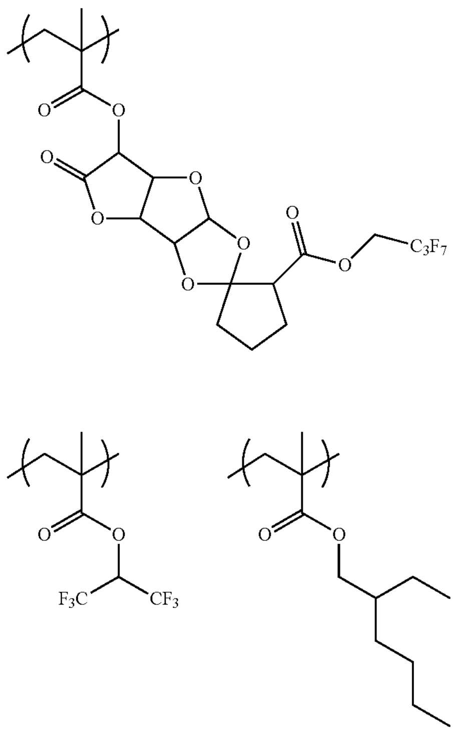
(C-107)
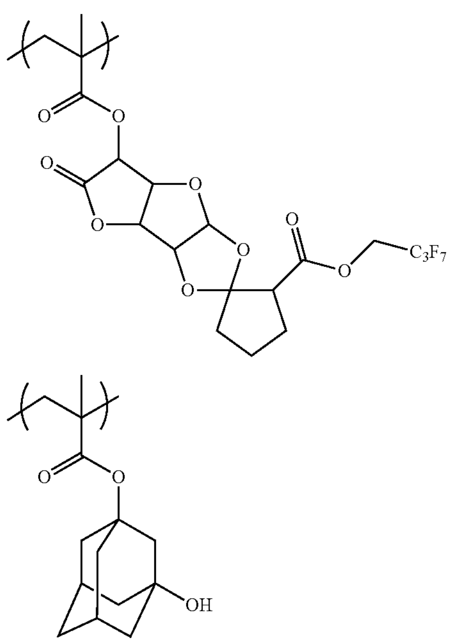
-continued
(C-108)
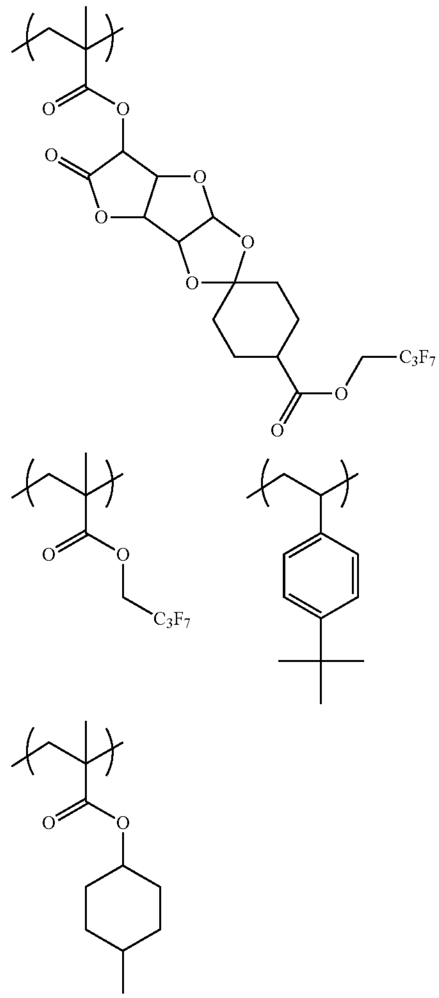
(C-109)
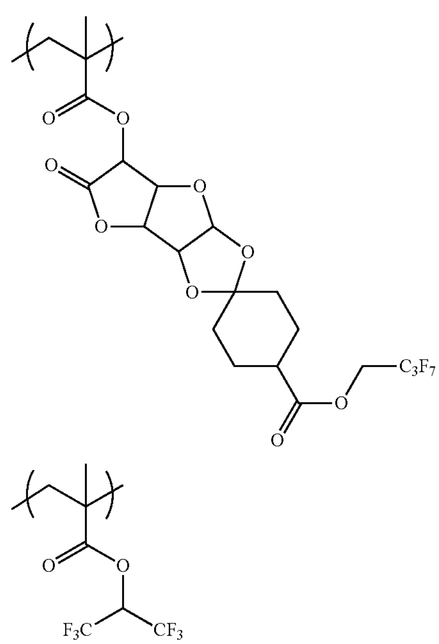

-continued
(C-110)
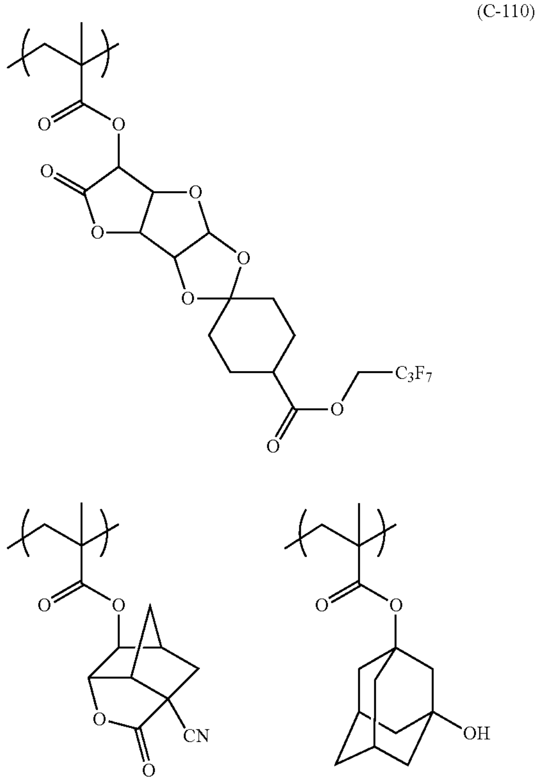
(C-111)
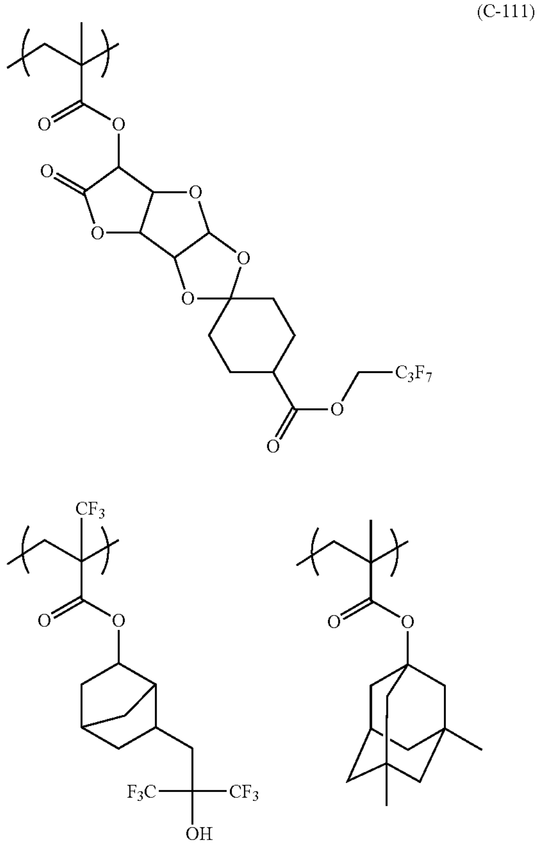
-continued
(C-112)
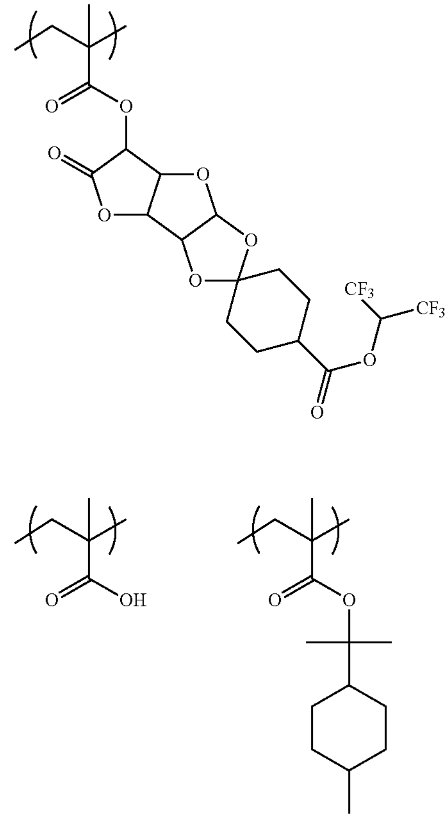
(C-113)
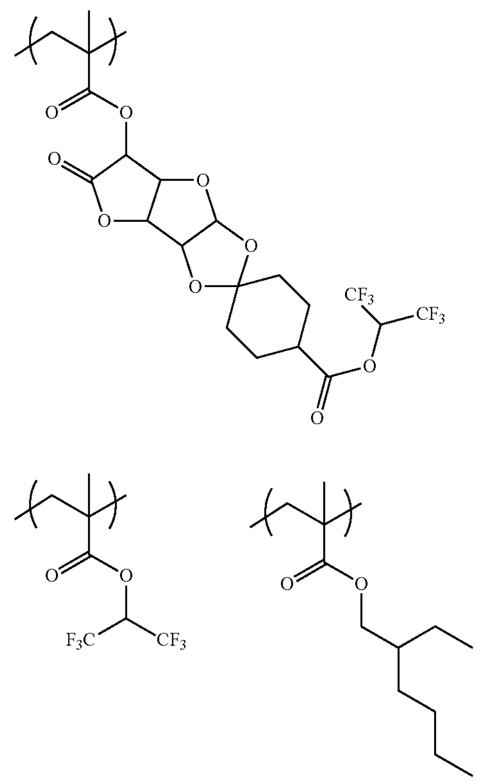

-continued
(C-114)
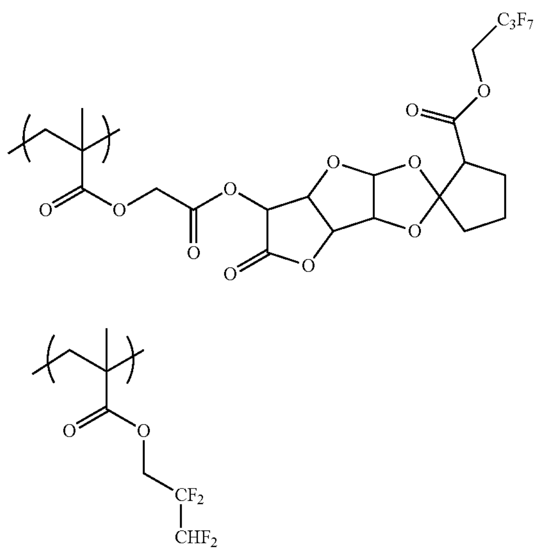
(C-115)
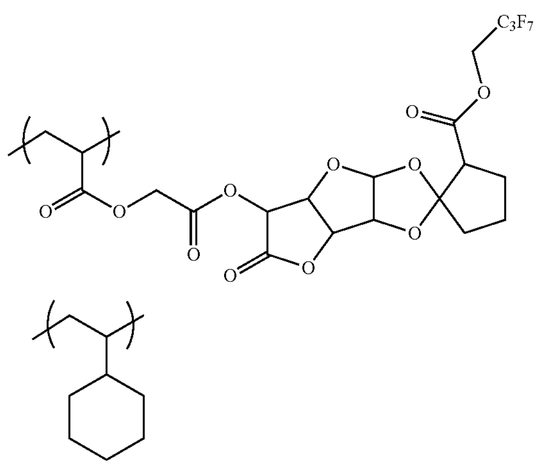
(C-116)
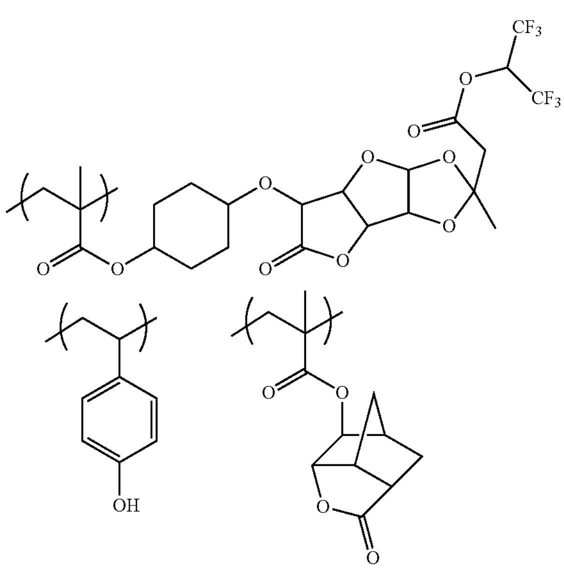
-continued
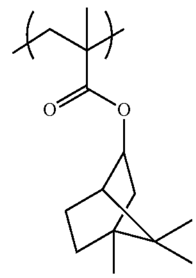
(C-117)
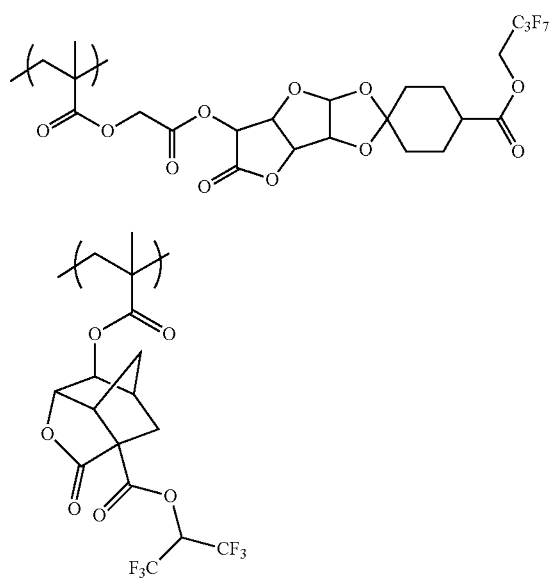
(C-118)
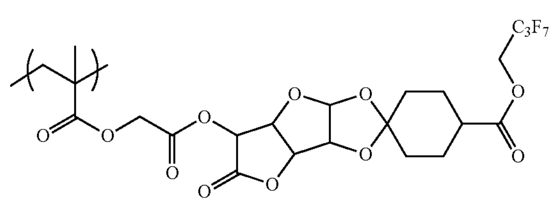
(C-119)
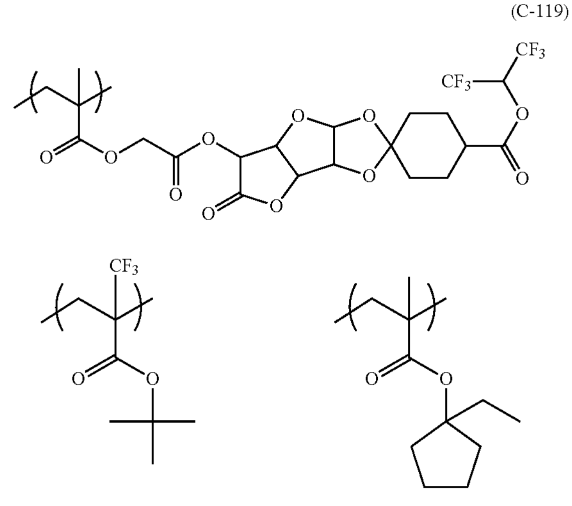

-continued
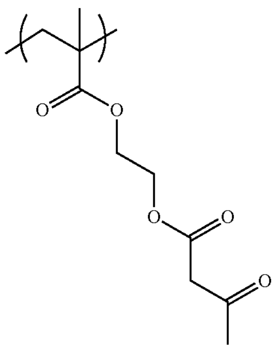
(C-120)
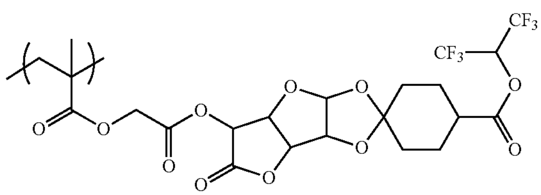
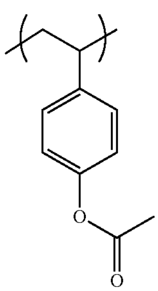
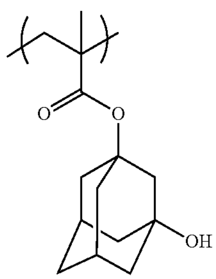
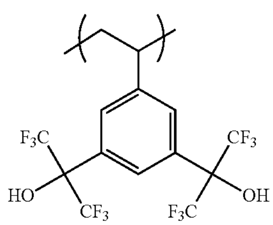
(C-121)
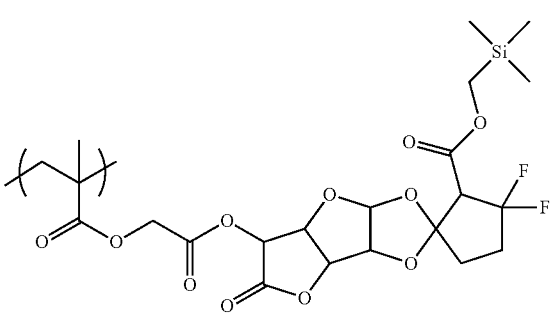
-continued
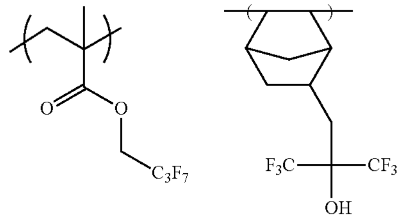
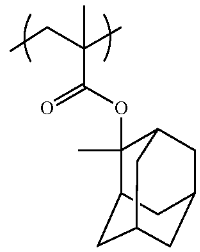
(C-122)
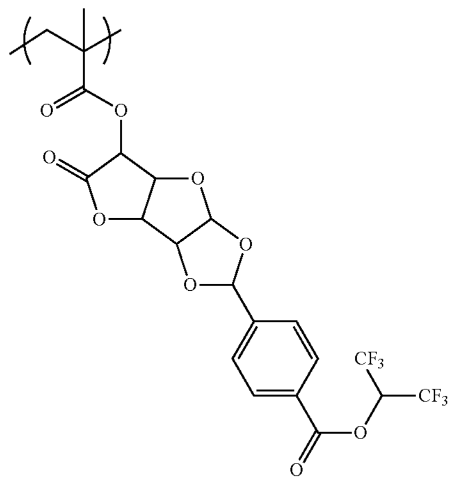
(C-123)
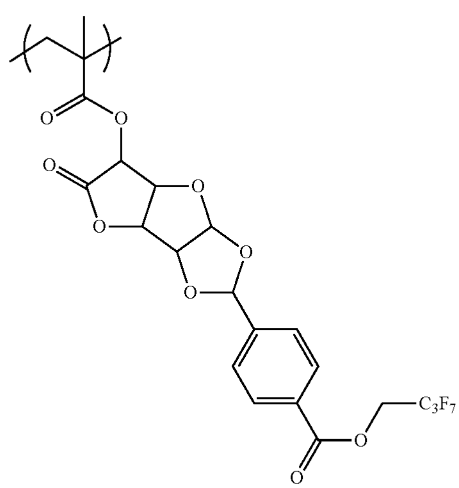

-continued
(C-124)
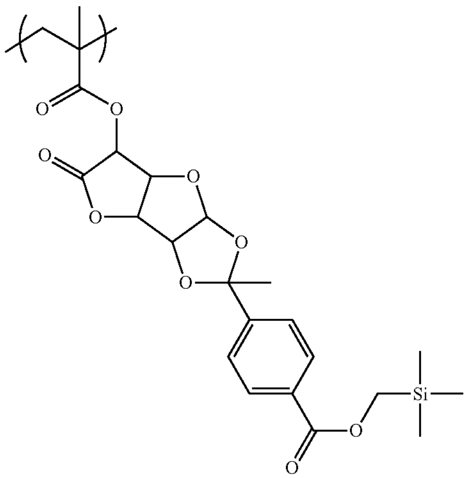
(C-125)
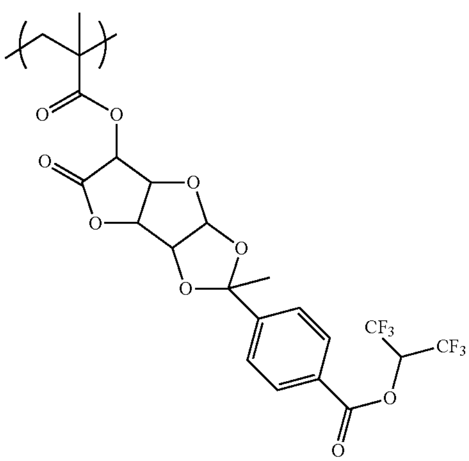
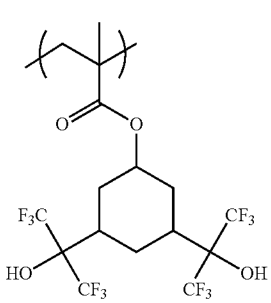
-continued
(C-126)
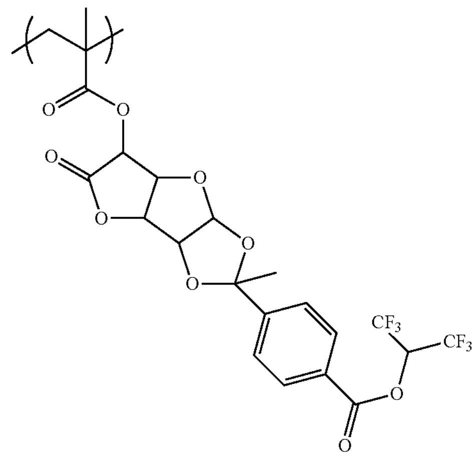
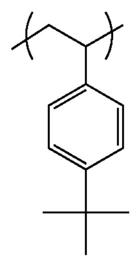
(C-127)
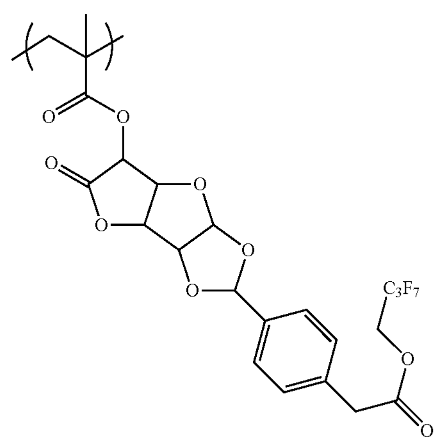
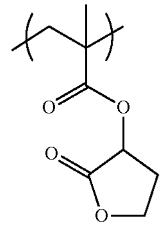

(C-128)
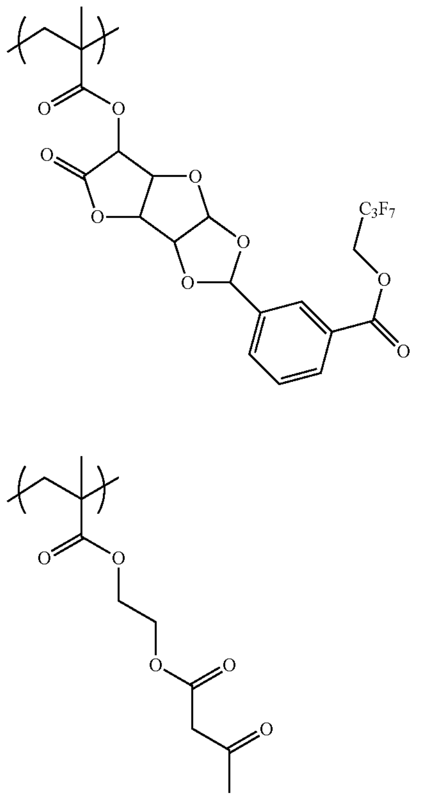
(C-129)
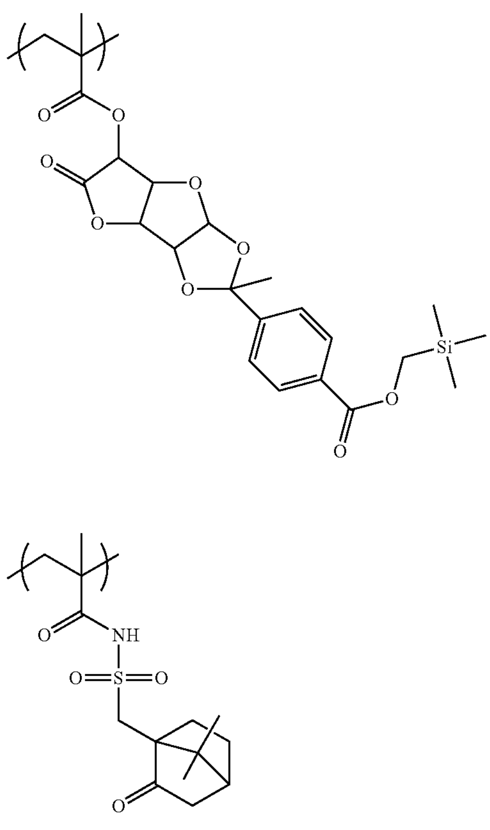
(C-130)
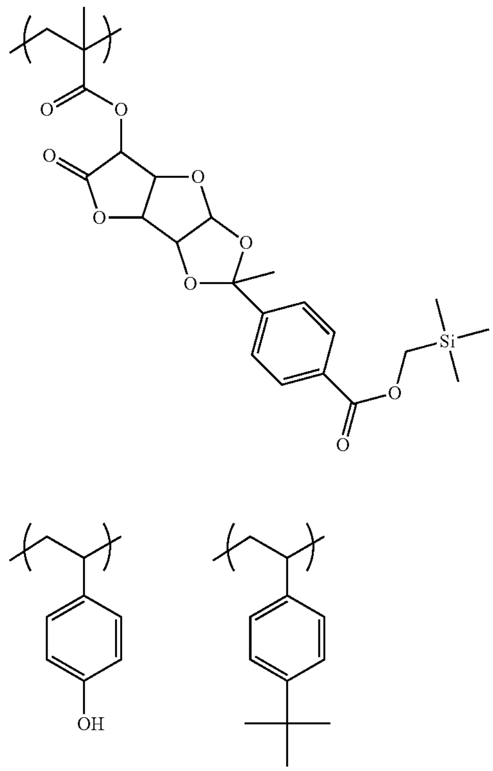
(C-131)
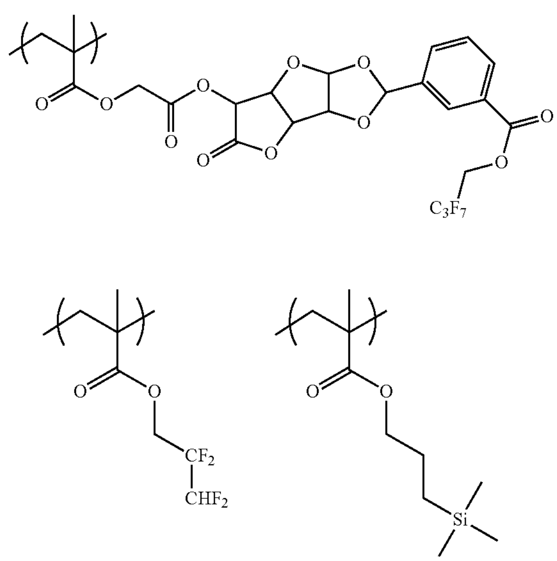
(C-132)
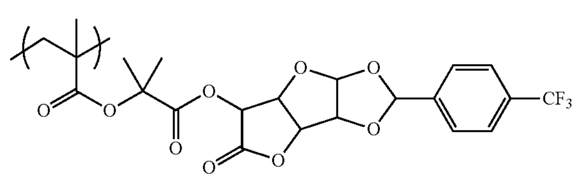

-continued
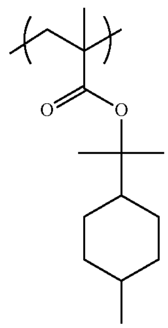
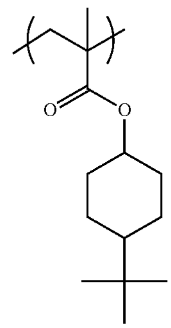
(C-133)
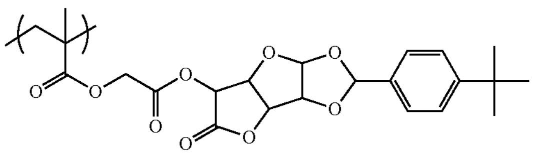
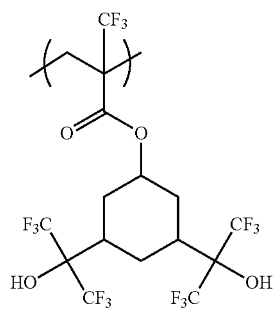
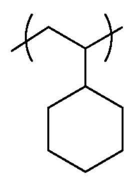
(C-134)
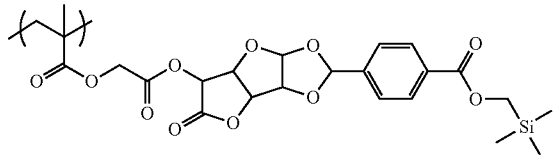
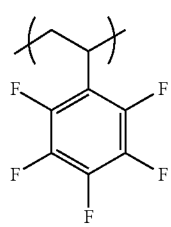
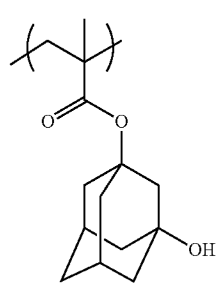
(C-135)
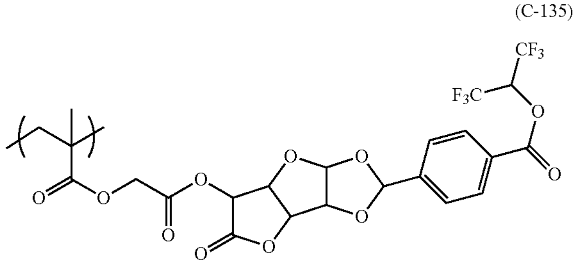
-continued
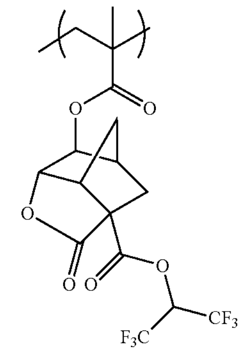
(C-136)
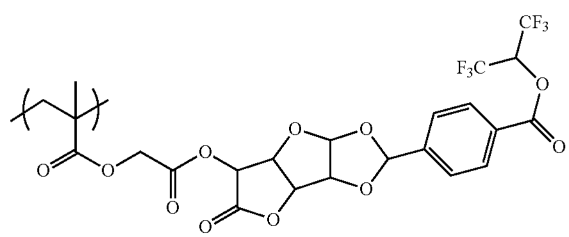
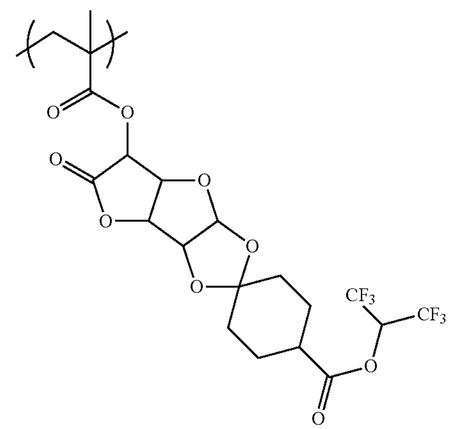
(C-137)
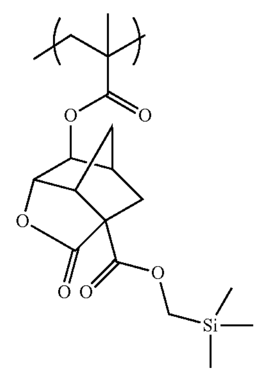
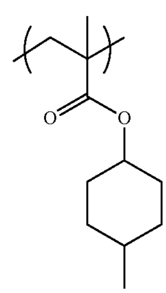
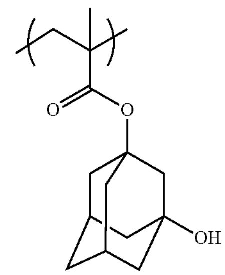

-continued
(C-138)
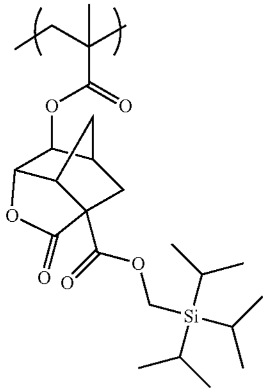
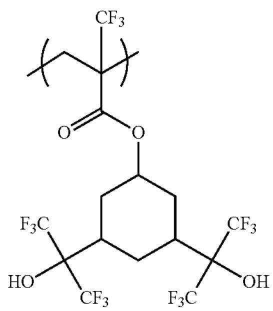
(C-139)
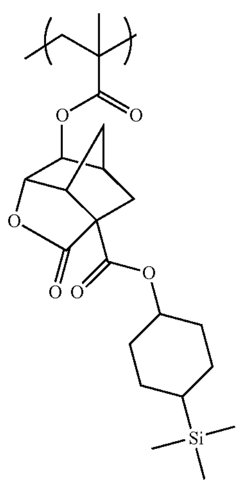
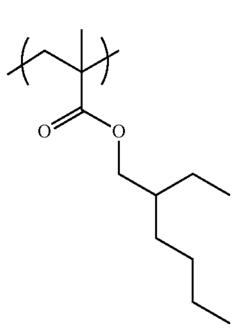
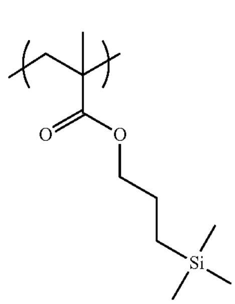
-continued
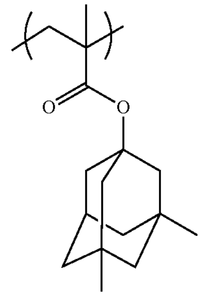
(C-140)
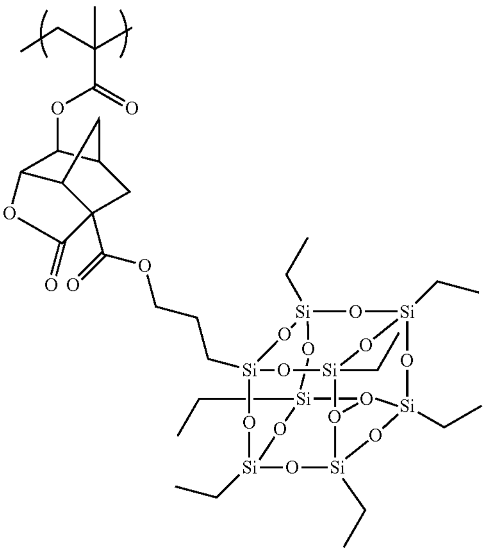
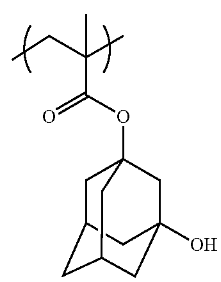
(C-141)
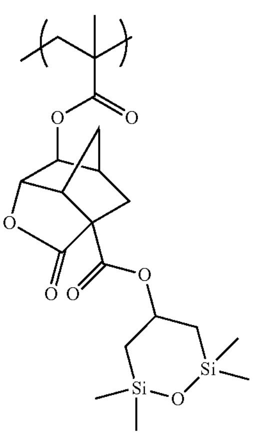
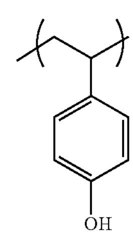

-continued
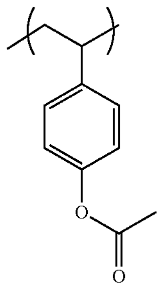
(C-142)
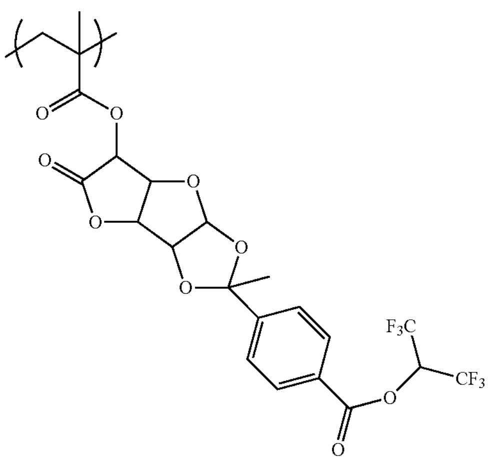
(C-143)
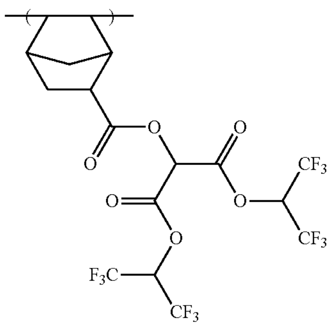
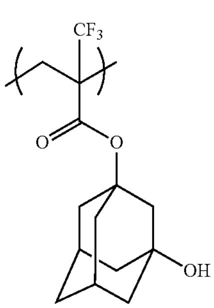
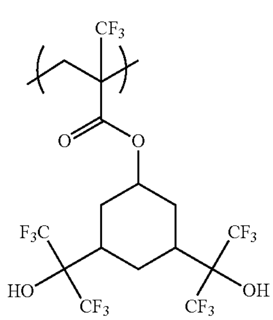
-continued
(C-144)
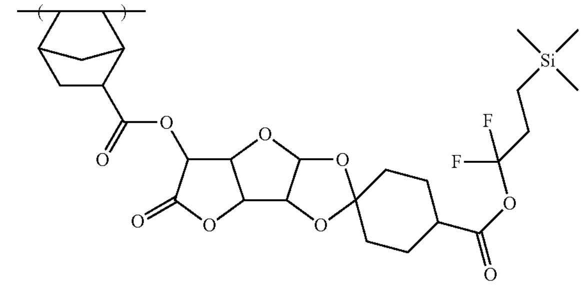
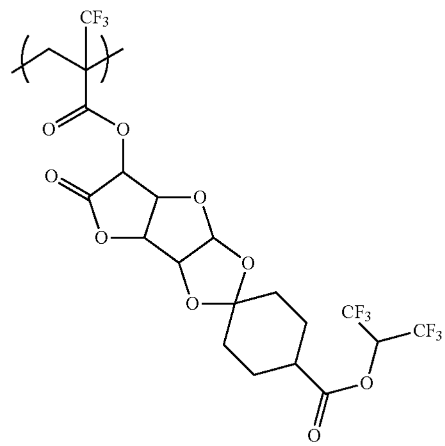
(C-145)
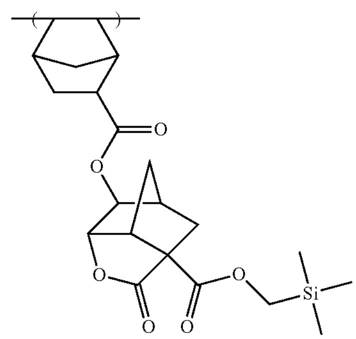
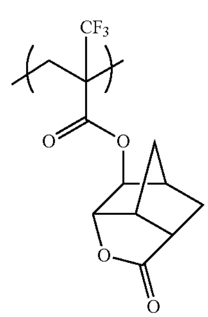
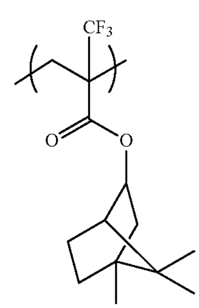

-continued
(C-146)
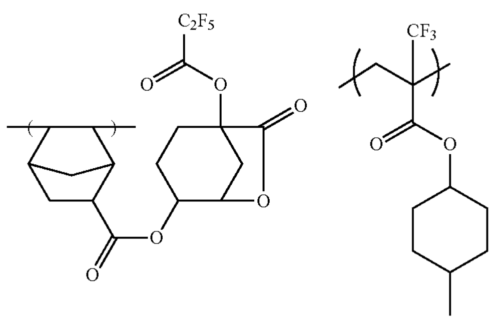
(C-147)
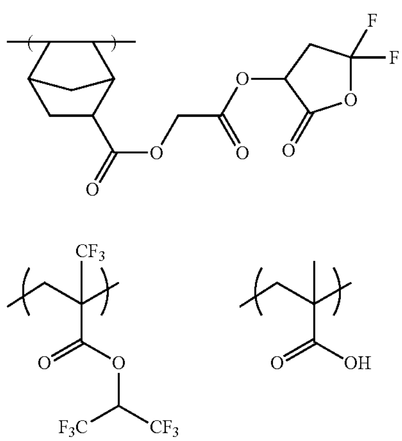
(C-148)
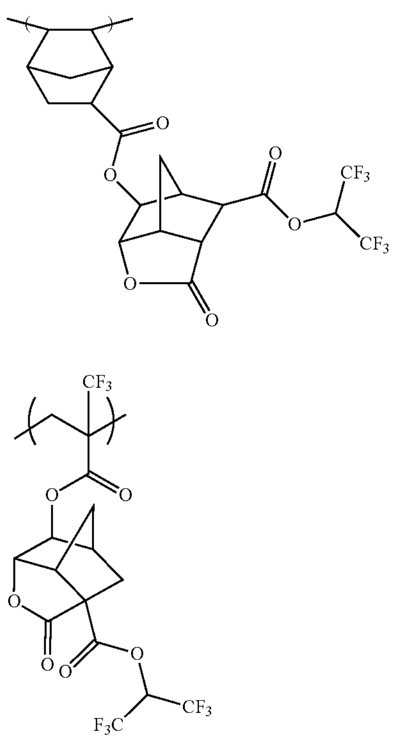
-continued
(C-149)
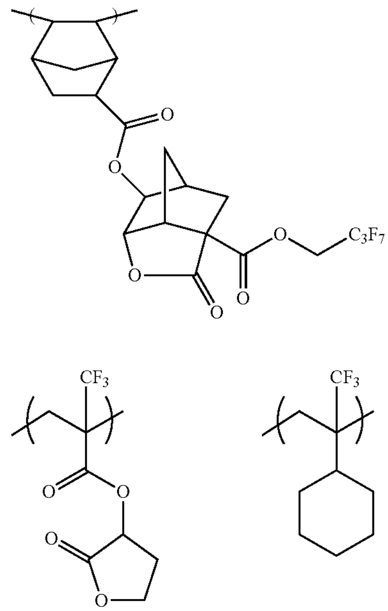
(C-150)
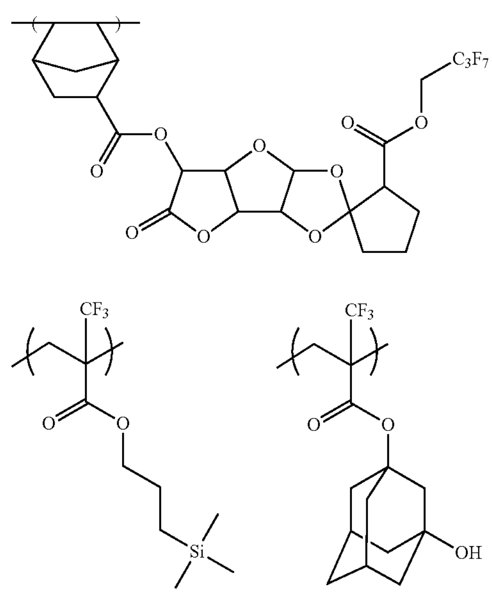
(C-151)
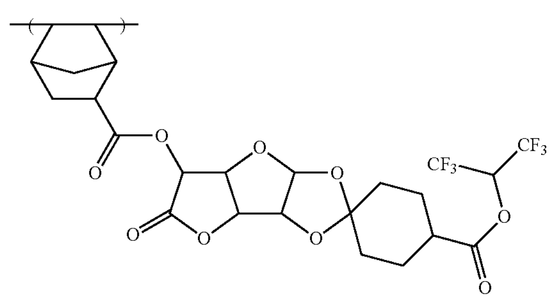

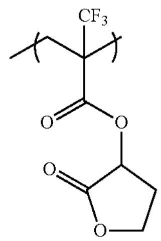
(C-152)
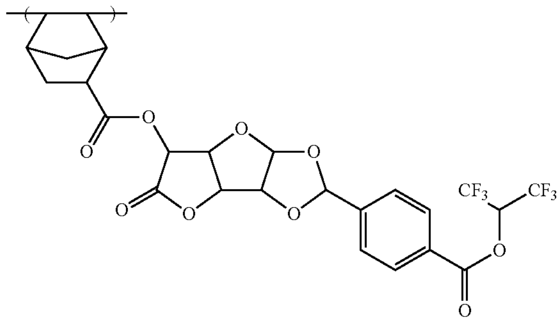
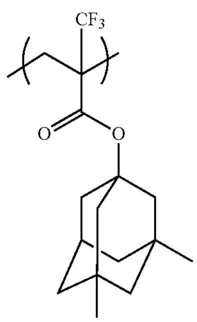
(C-153)
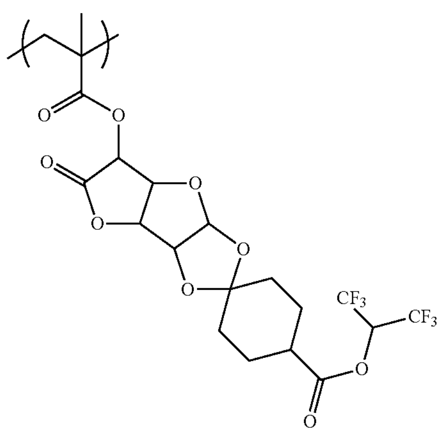
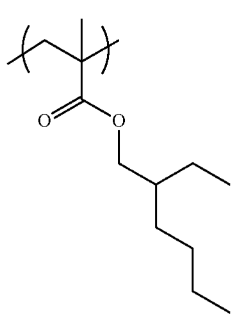
(C-154)
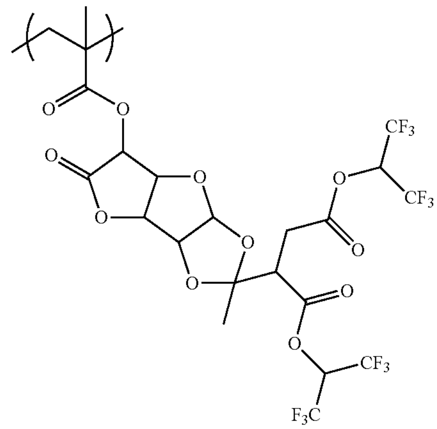
(C-155)
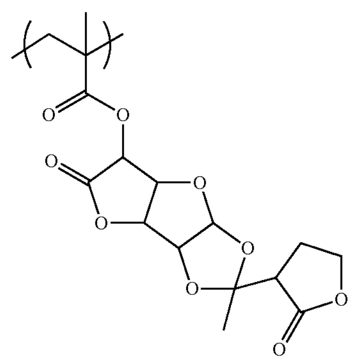
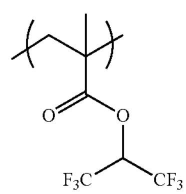
(C-156)
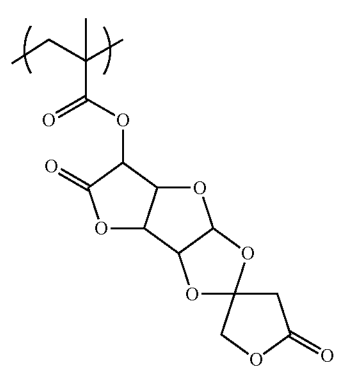
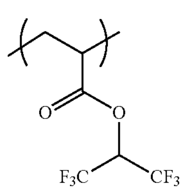

-continued
(C-157)
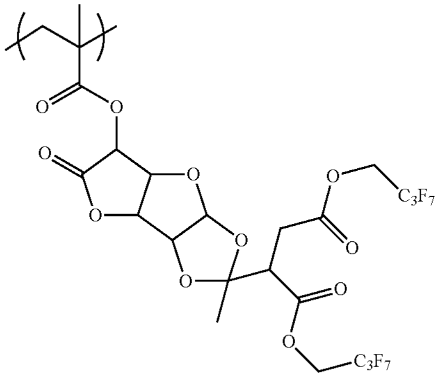
(C-158)
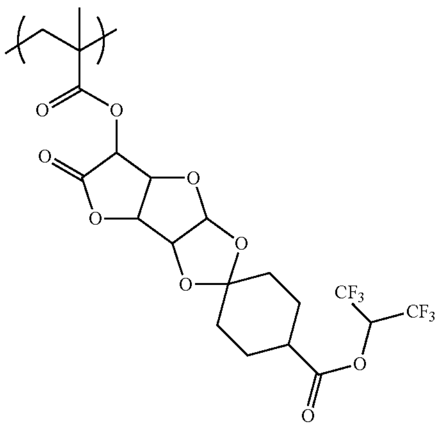
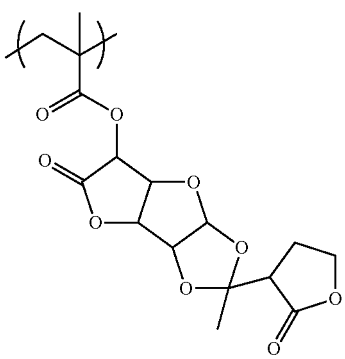
(C-159)
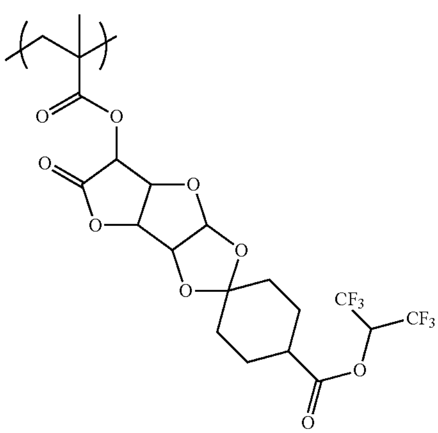
-continued
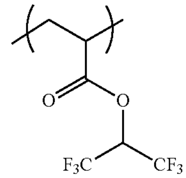
(C-160)
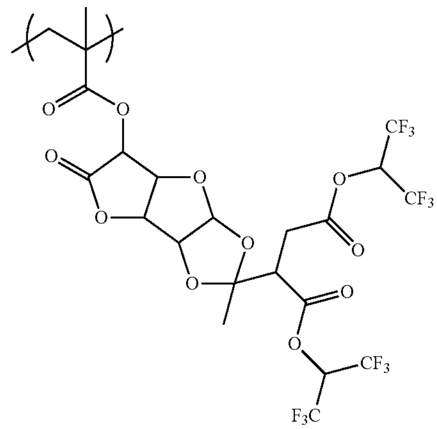
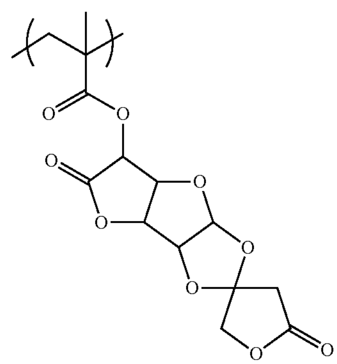
(C-161)
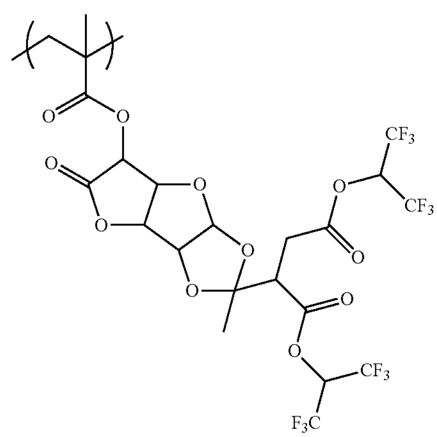

-continued
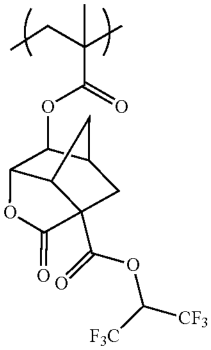
(C-162)
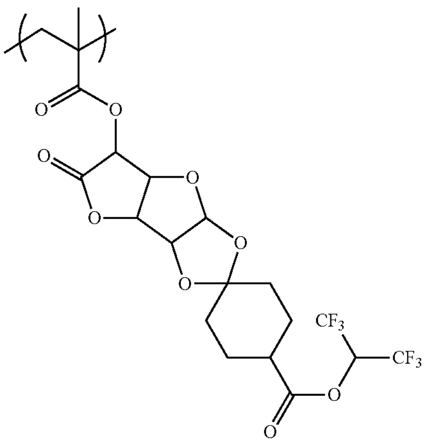
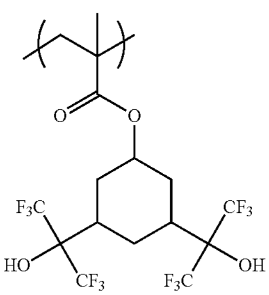
(C-163)
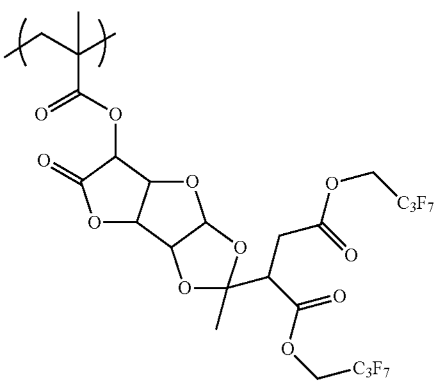
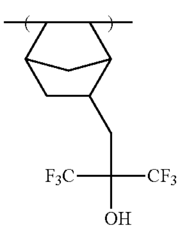
-continued
(C-164)
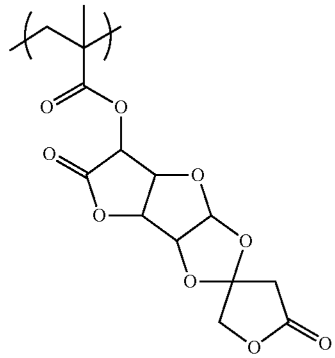
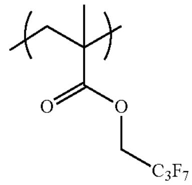
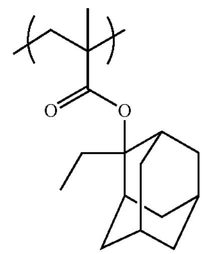
(C-165)
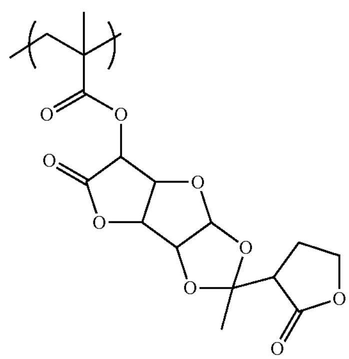
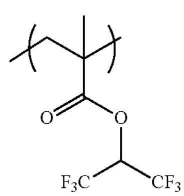
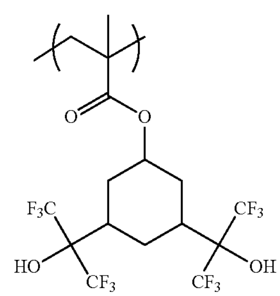
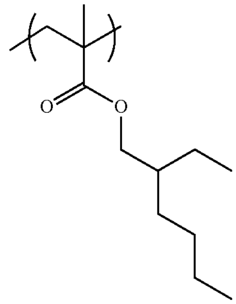

-continued
(C-166)
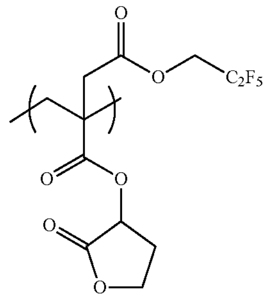
(C-167)
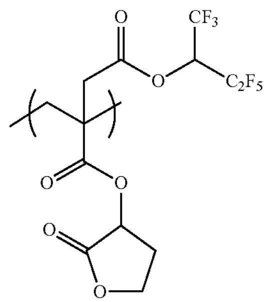
(C-168)
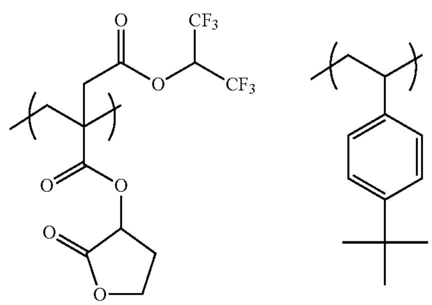
(C-169)
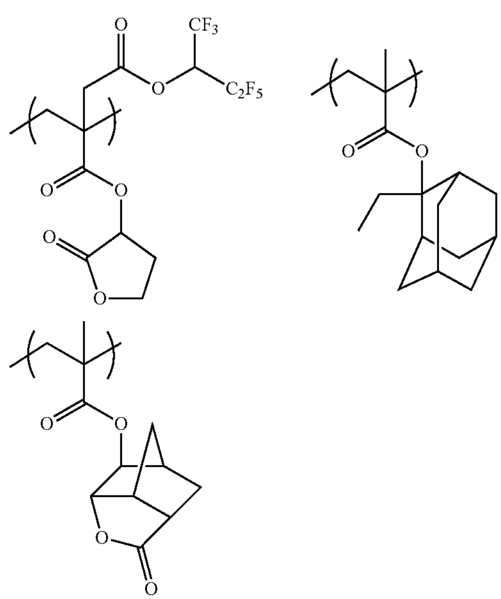
-continued
(C-170)
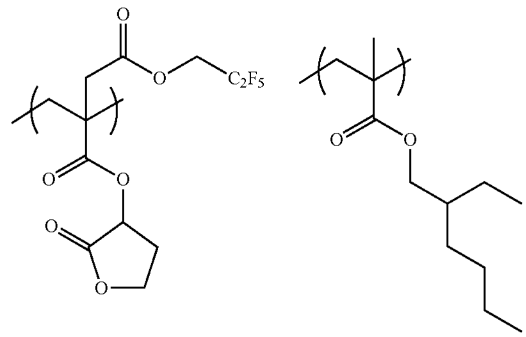
(C-171)
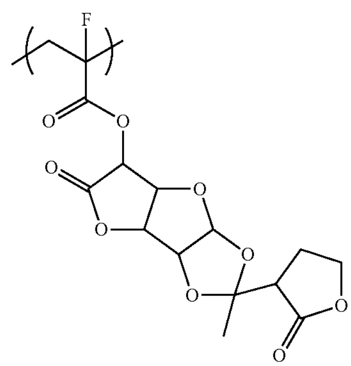
(C-172)
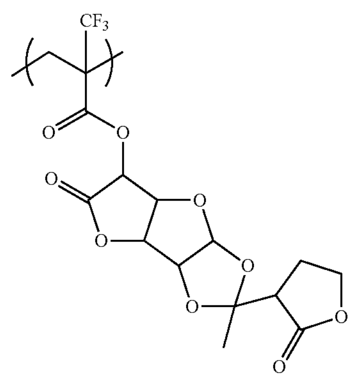
(C-173)
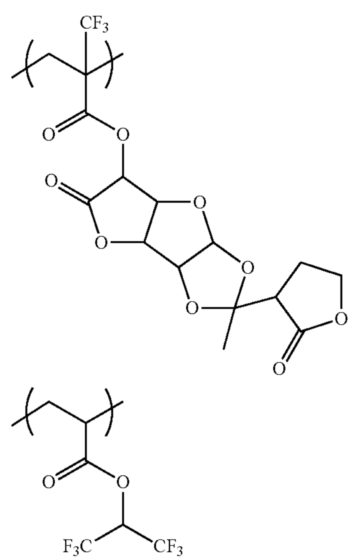

-continued
(C-174)
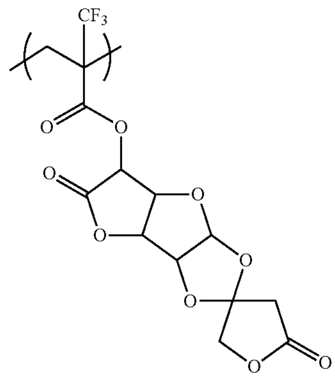
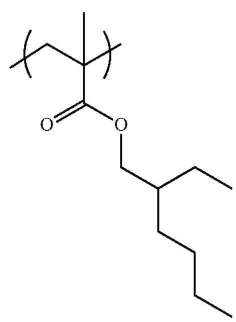
(C-175)
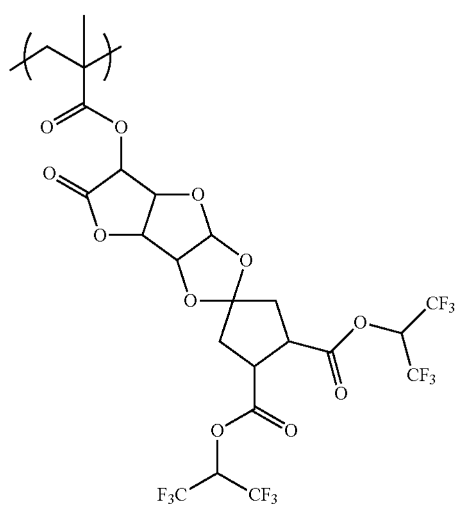
-continued
(C-176)
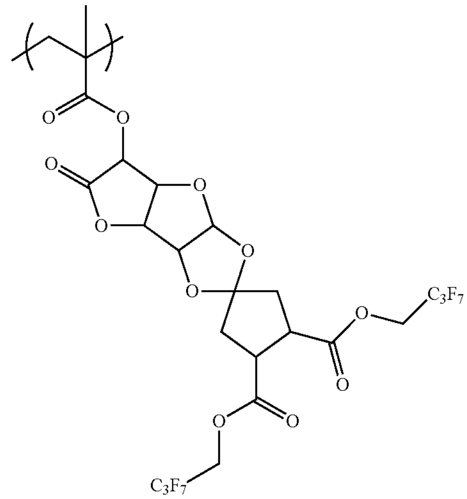
(C-177)
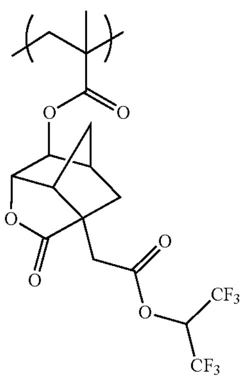
(C-178)
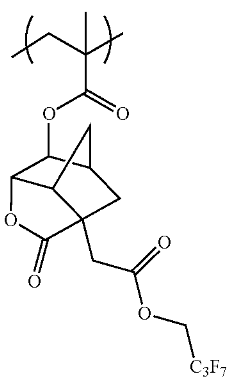
(C-179)
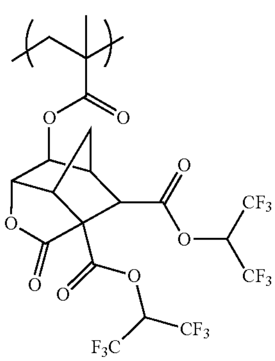

-continued
(C-180)
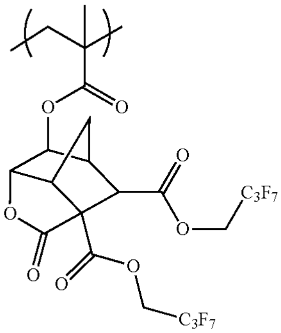
(C-181)
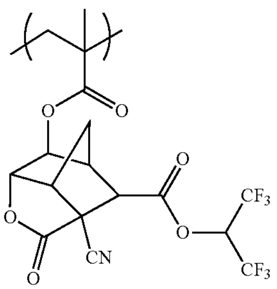
(C-182)
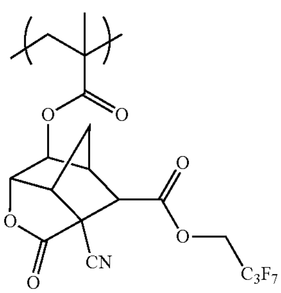
(C-183)
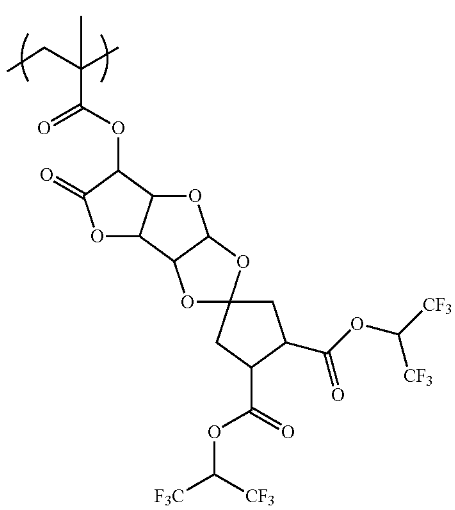
-continued
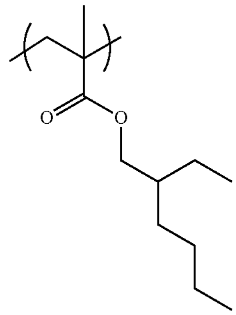
(C-184)
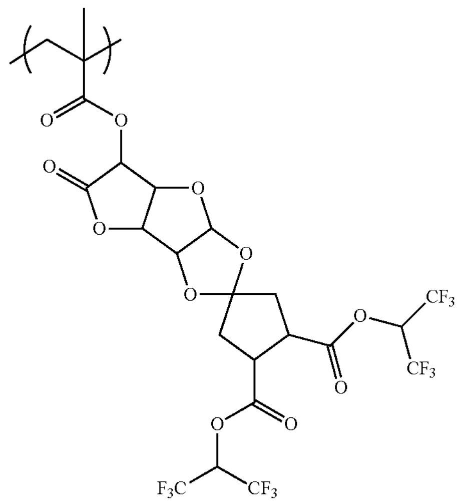
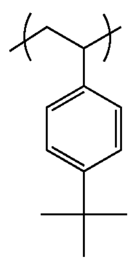
(C-185)
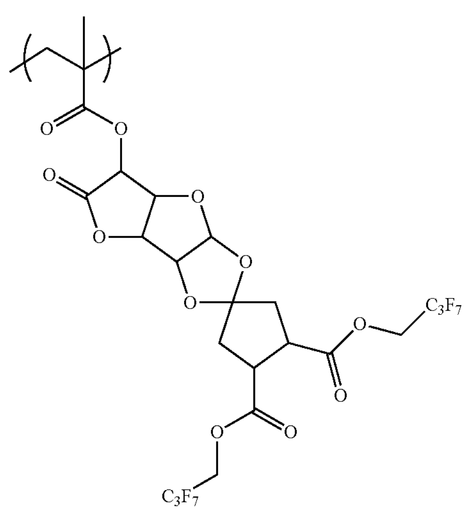

-continued
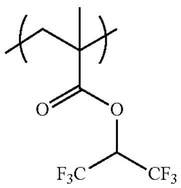
(C-186)
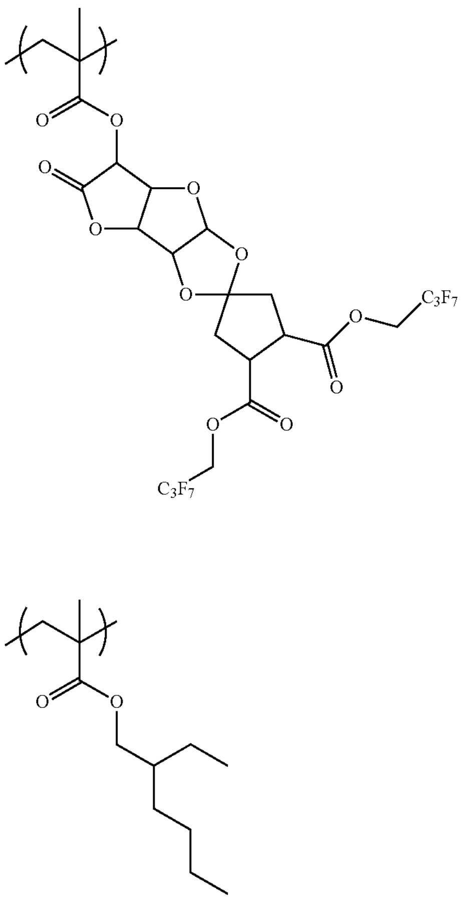
(C-187)
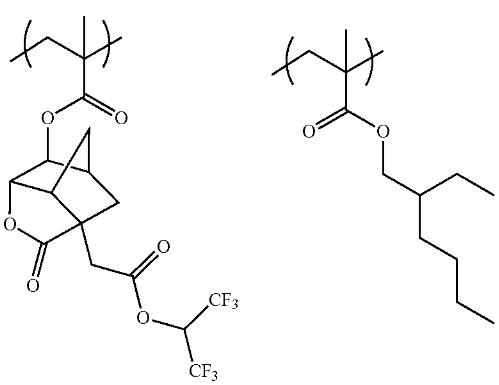
-continued
(C-188)
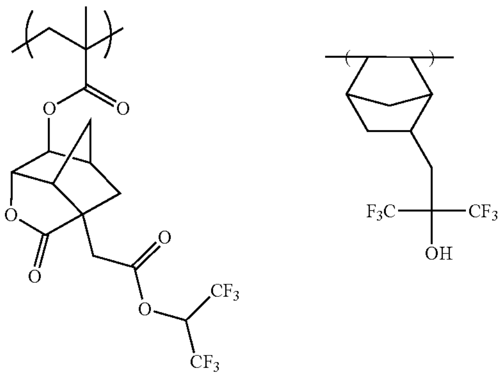
(C-189)
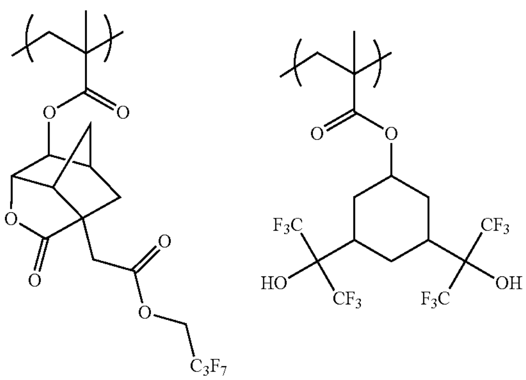
(C-190)
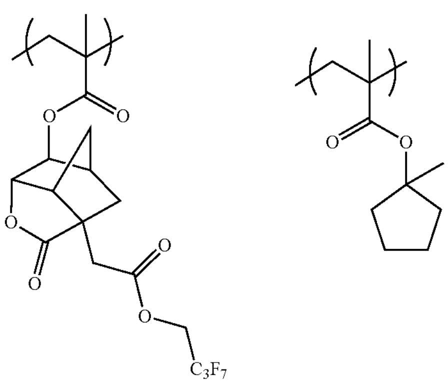
(C-191)
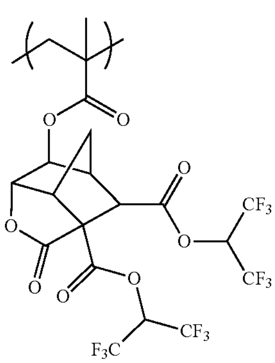

-continued
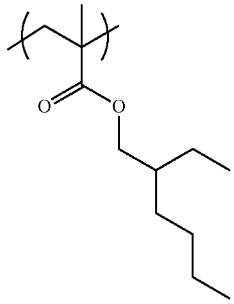
(C-192)
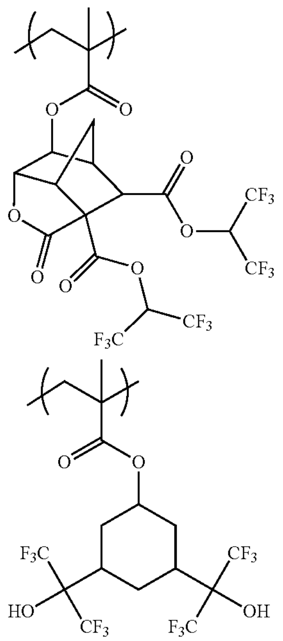
(C-193)
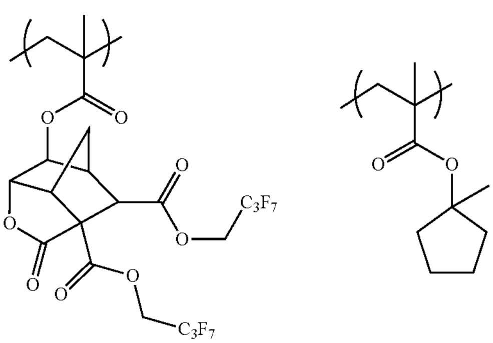
(C-194)
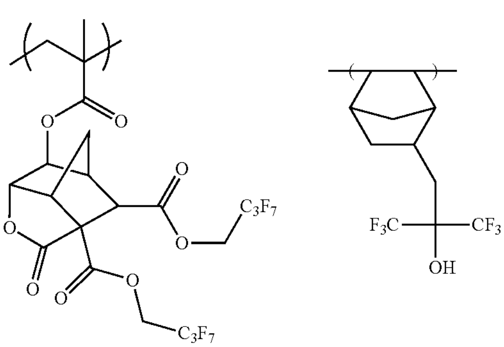
-continued
(C-195)
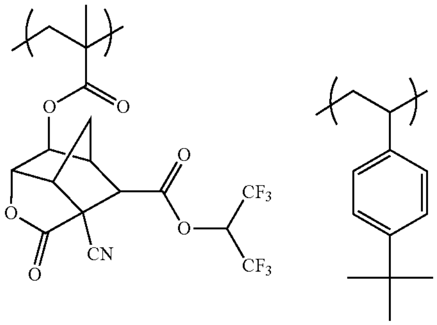
(C-196)
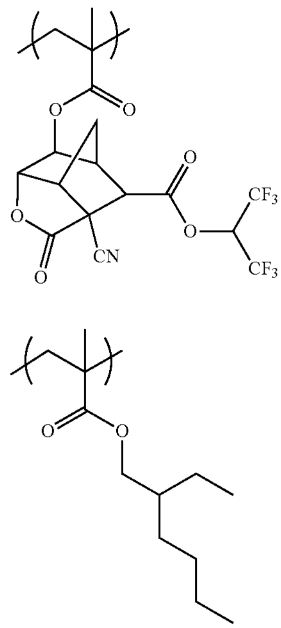
(C-197)
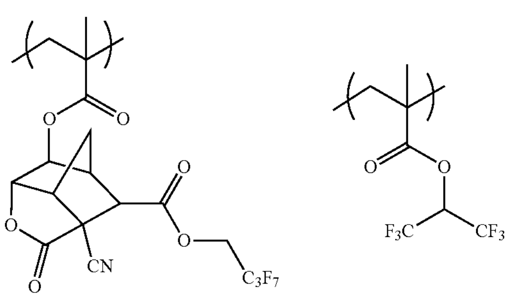
(C-198)
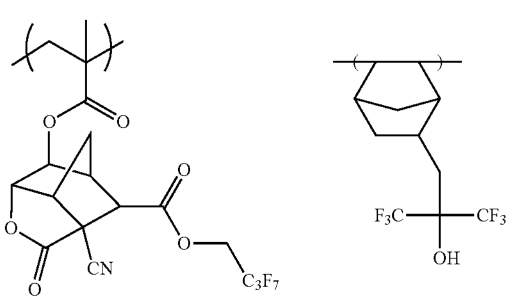

-continued
(C-199)
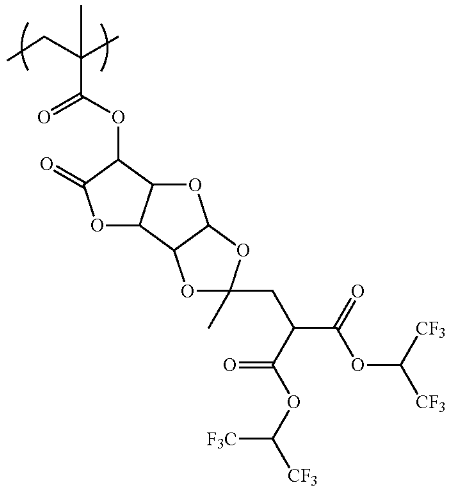
(C-200)
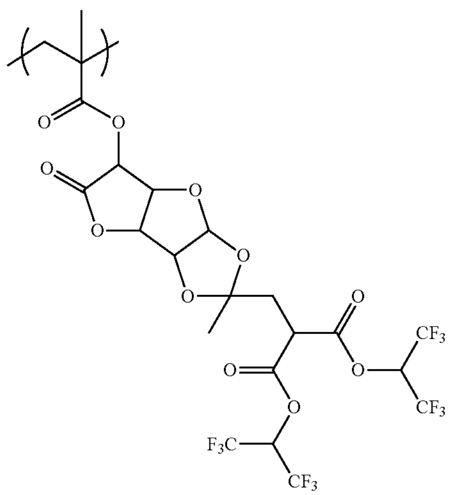
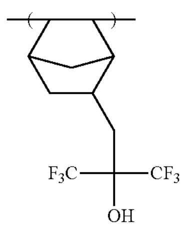
(C-201)
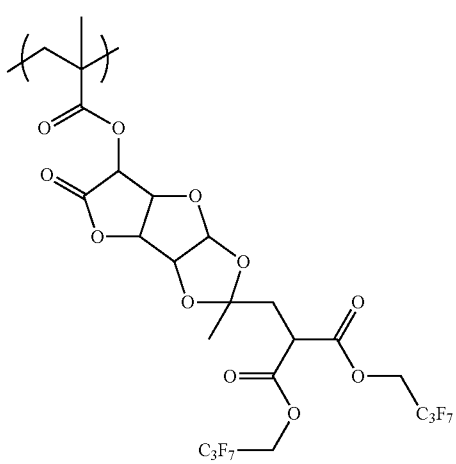
-continued
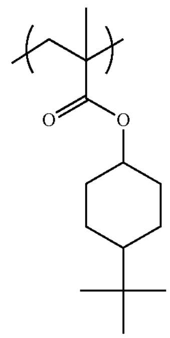
(C-202)
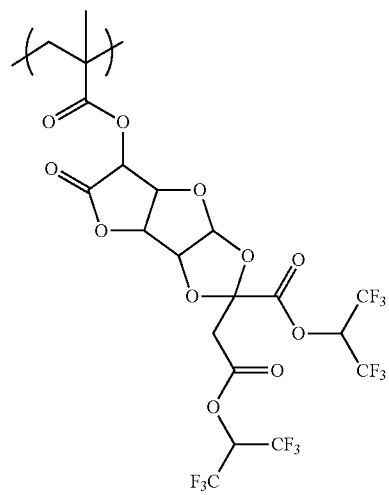
(C-203)
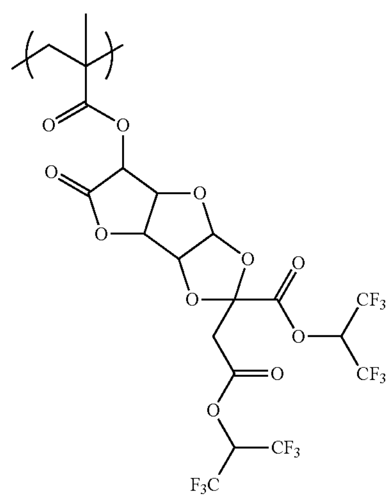
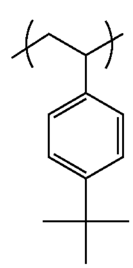

-continued
(C-204)
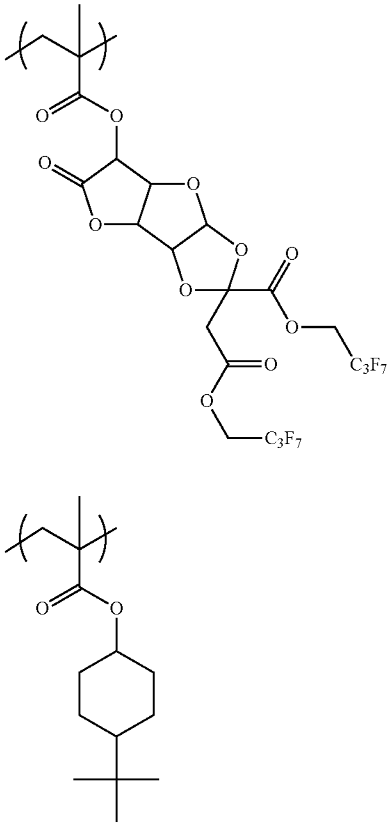
(C-205)
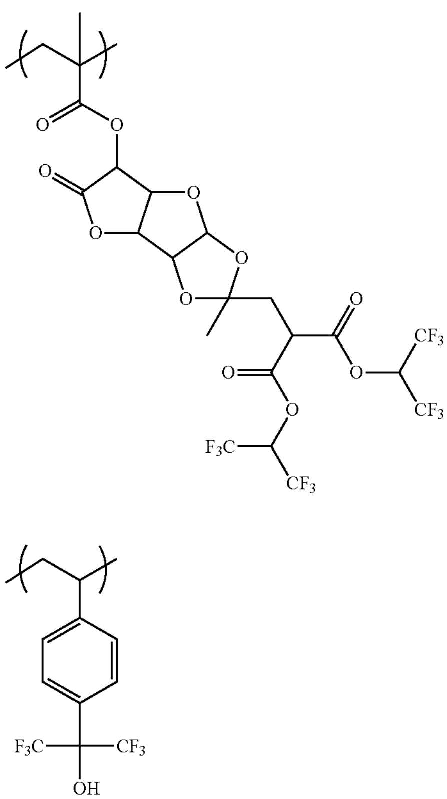
-continued
(C-206)
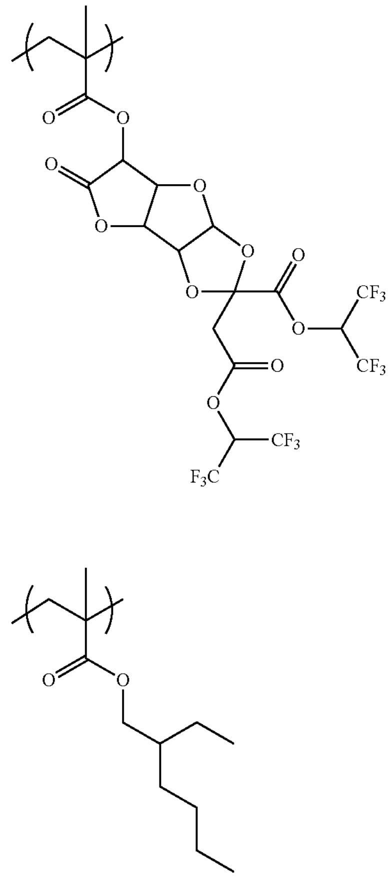
(C-207)
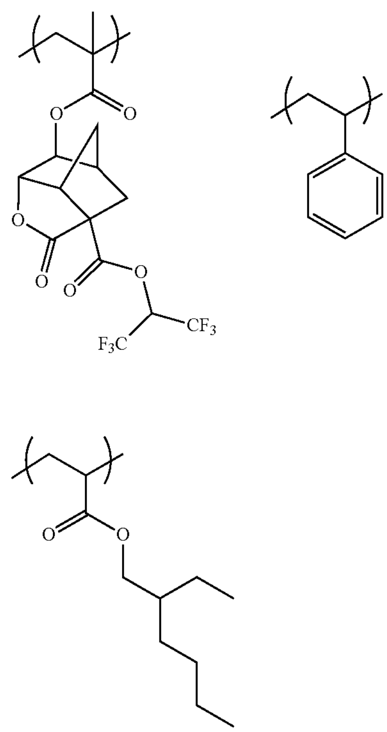

(C-208)
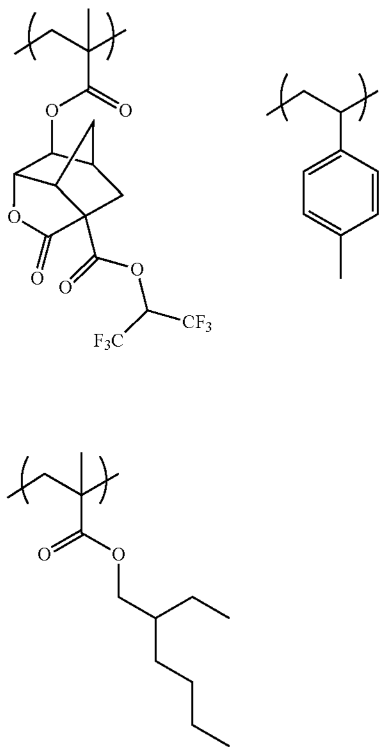
(C-209)
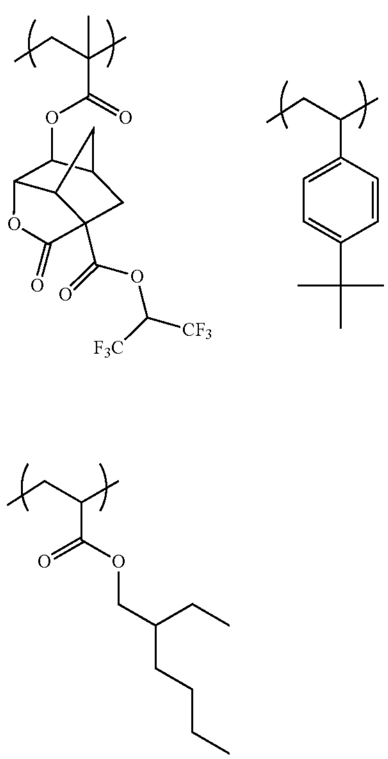
(C-210)
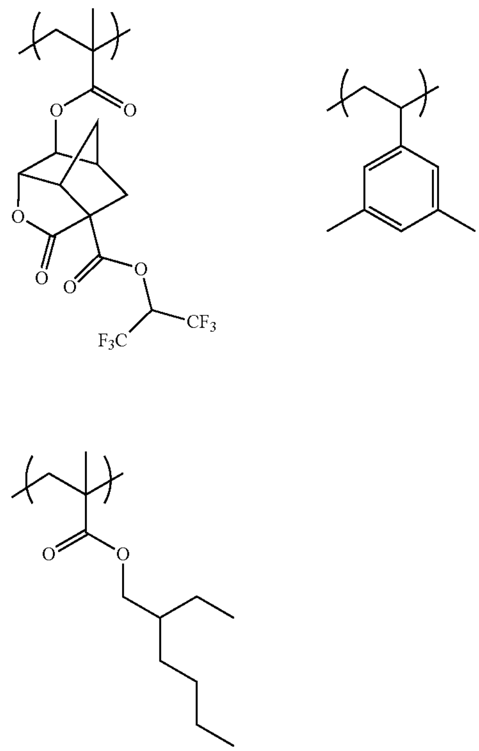
(C-211)
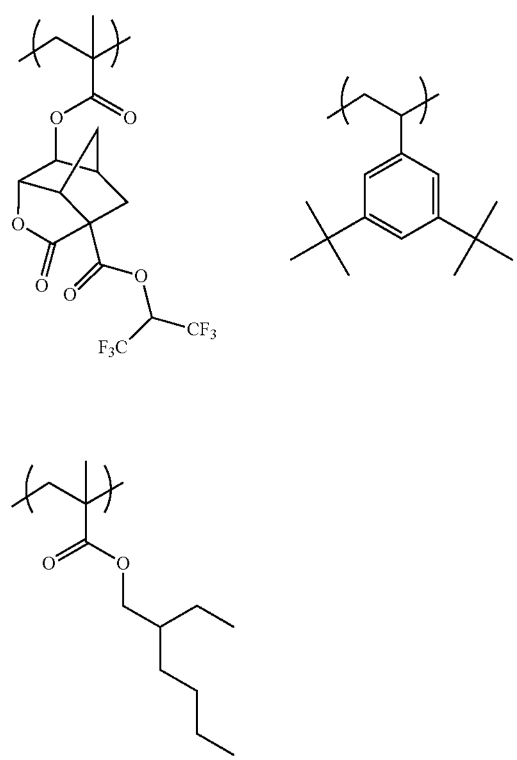

-continued
(C-212)
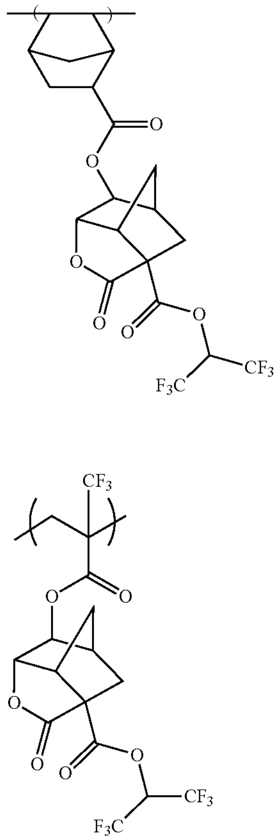
(C-213)
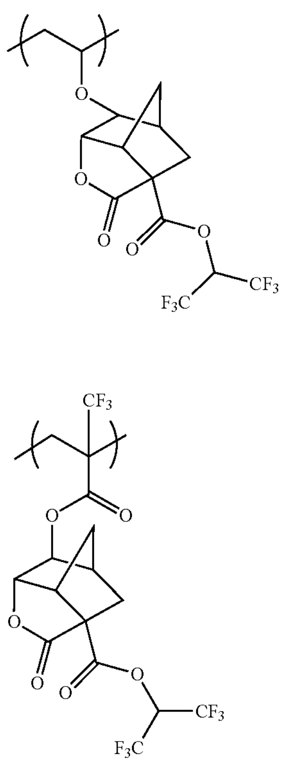
-continued
(C-214)
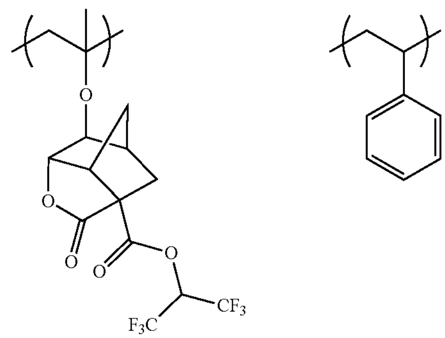
(C-215)
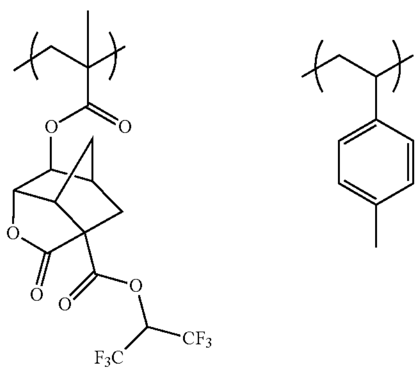
(C-216)
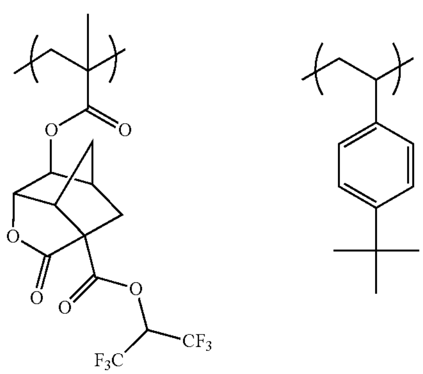
(C-217)
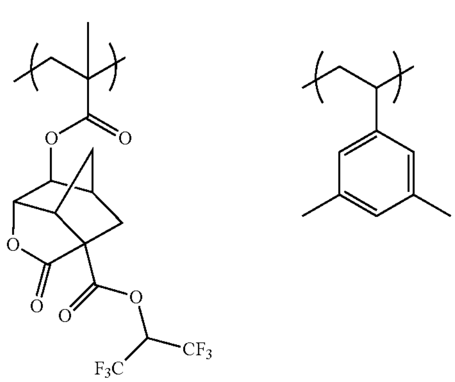

-continued
(C-218)
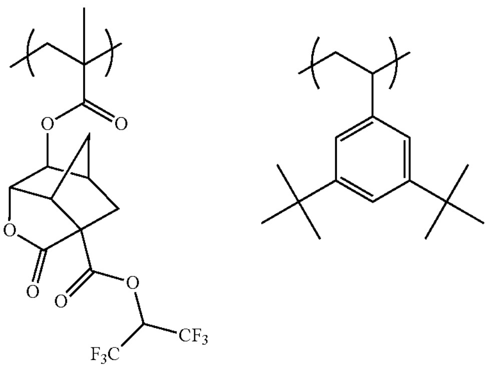
(C-219)
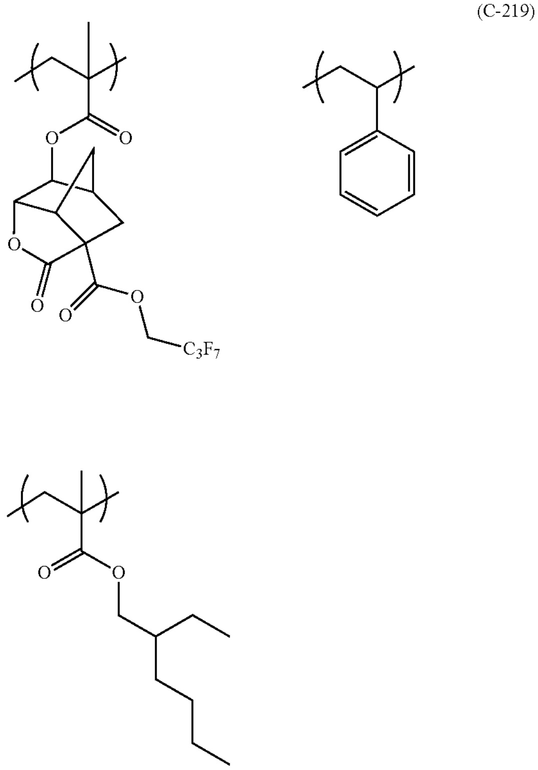
(C-220)
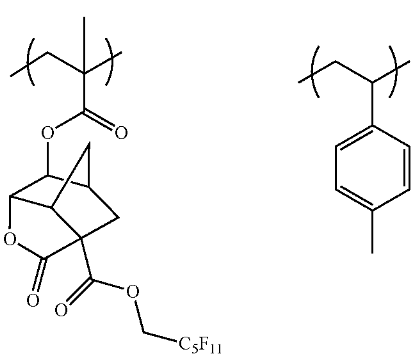
-continued
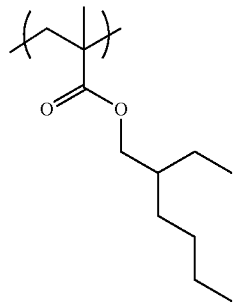
(C-221)
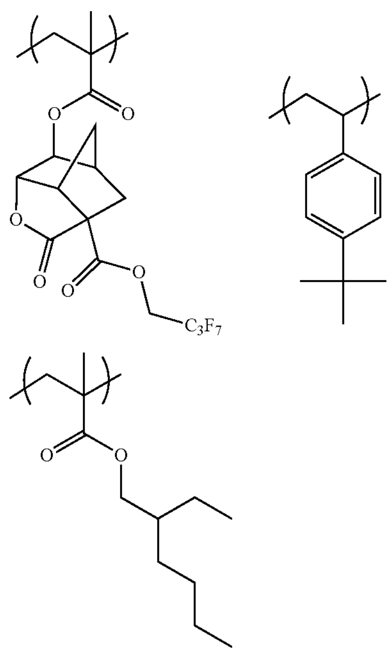
(C-222)
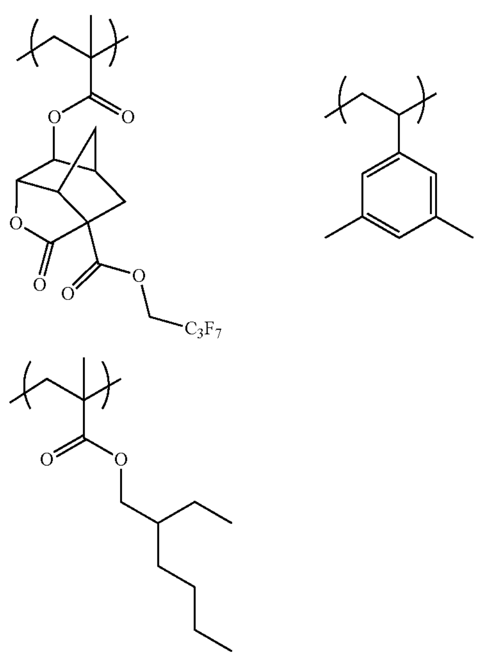

(C-223)
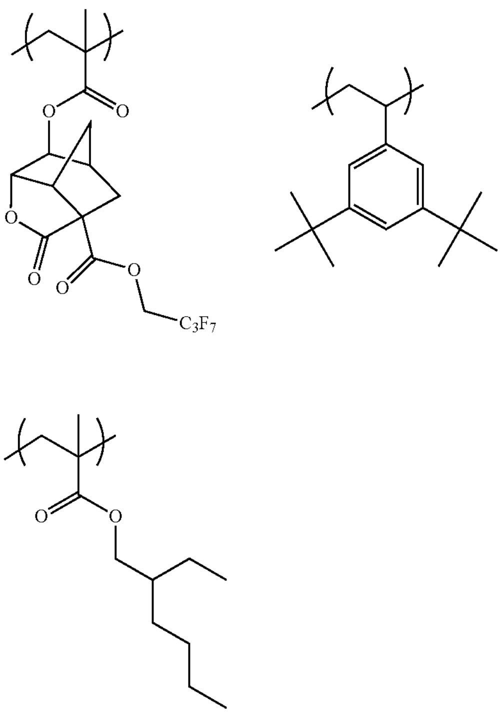
(C-224)
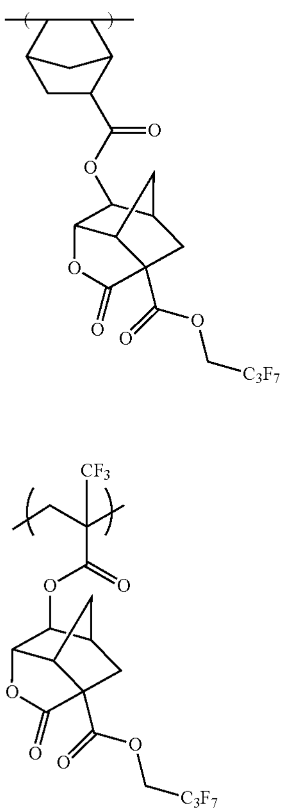
(C-225)
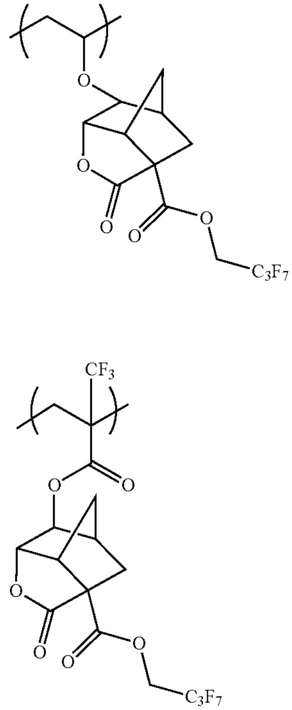
(C-226)
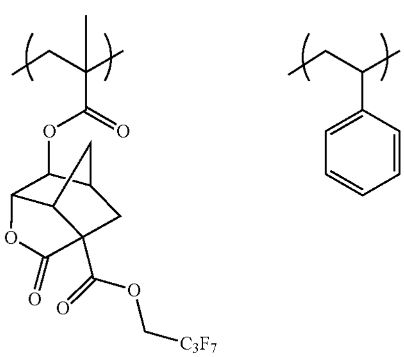
(C-227)
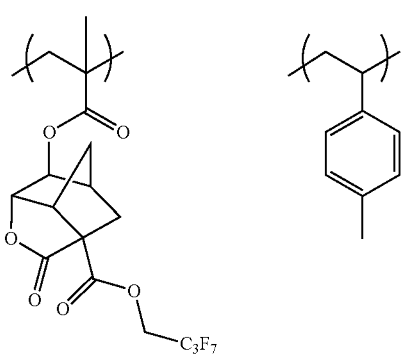

-continued
(C-228)
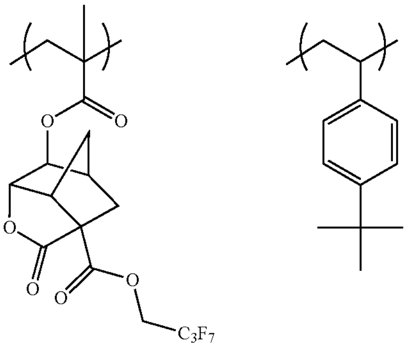
(C-229)
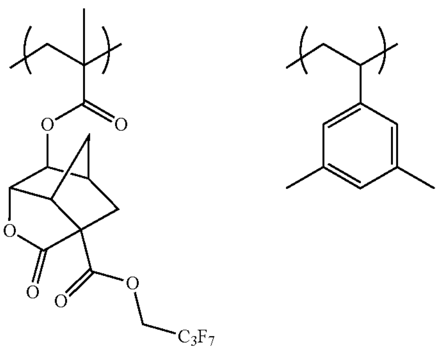
(C-230)
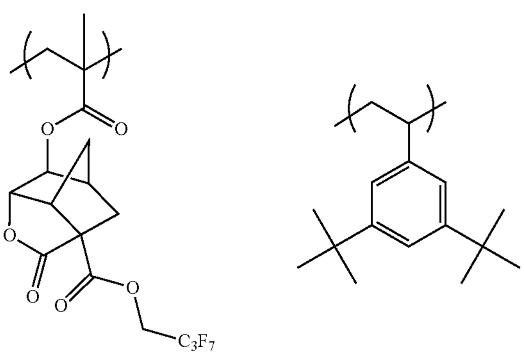
(C-231)
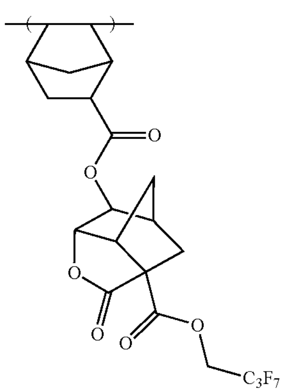
-continued
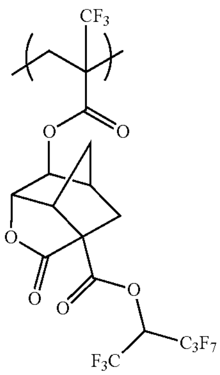
(C-232)
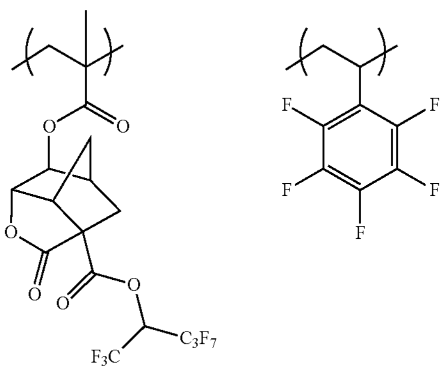
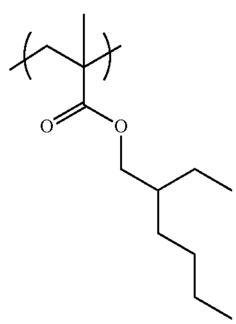
(C-233)
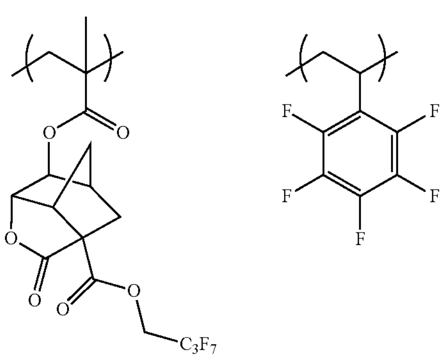

-continued
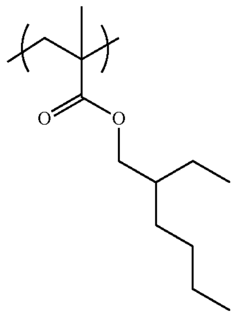
(C-234)
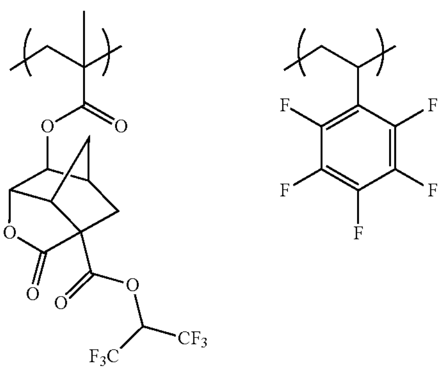
(C-235)
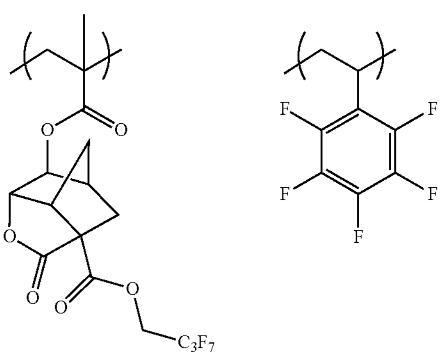
(C-236)
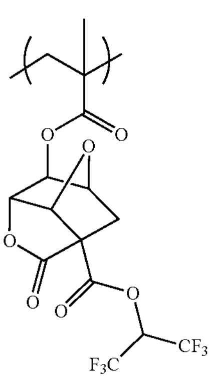
-continued
(C-237)
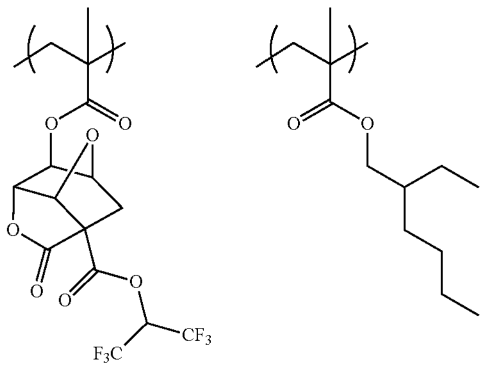
(C-238)
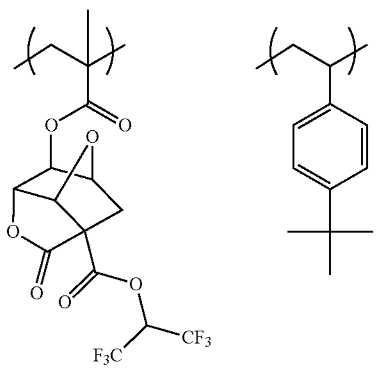
(C-239)
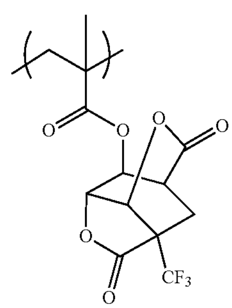
(C-240)
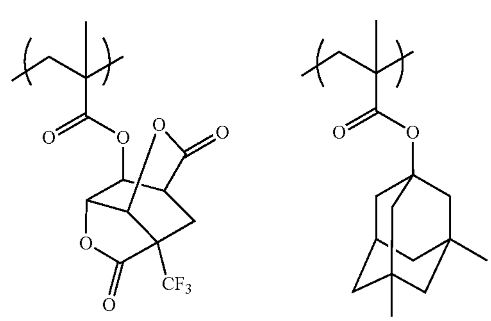

(C-241)
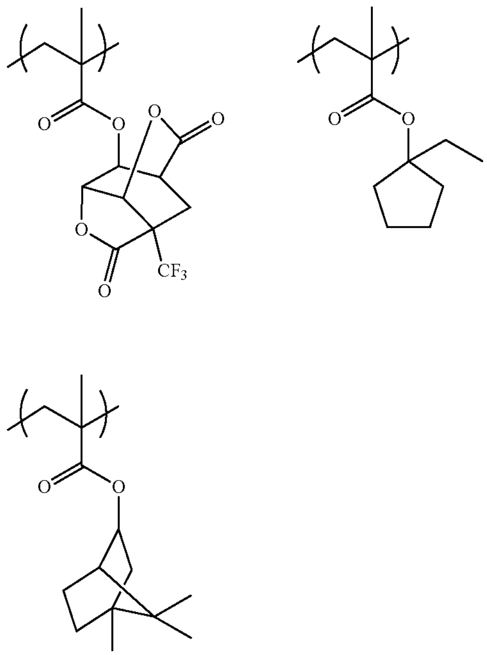
(C-242)
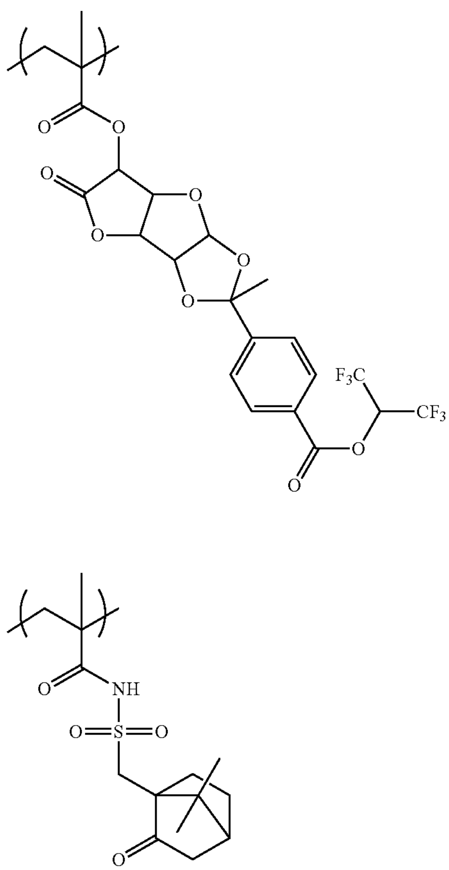
(C-243)
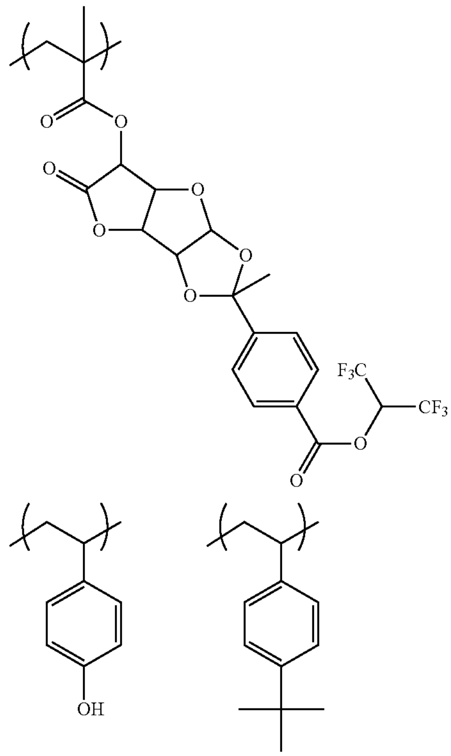
(C-244)
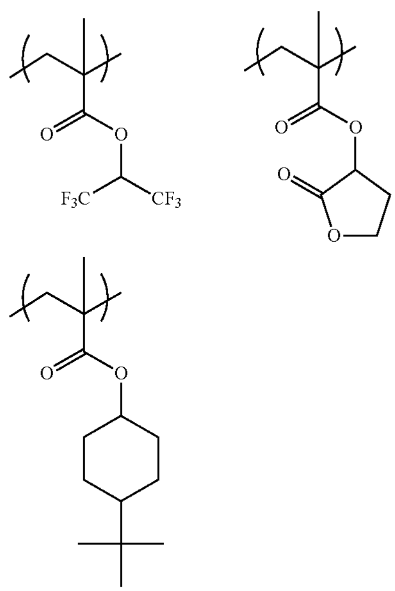
(C-245)
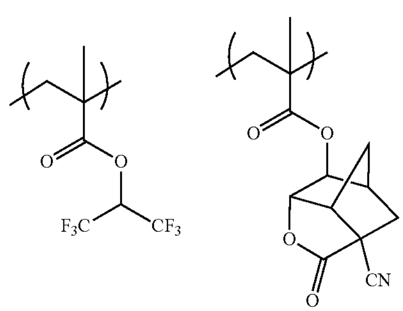

-continued
(C-246)
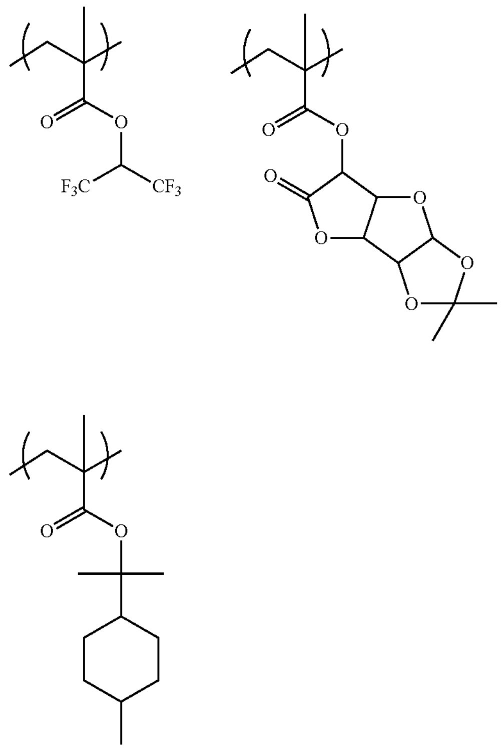
(C-247)
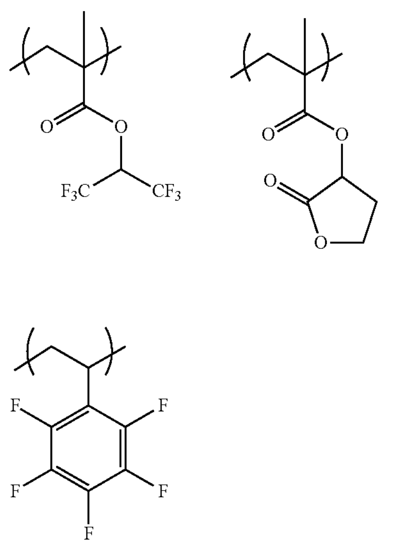
(C-248)
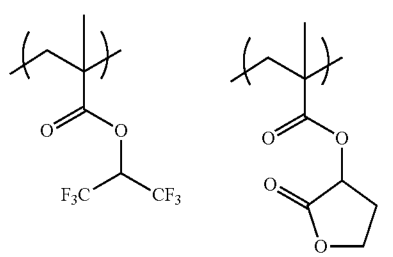
-continued
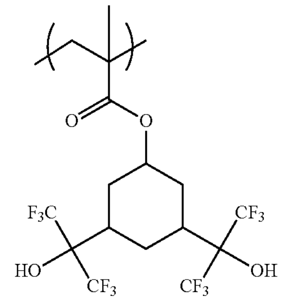
(C-249)
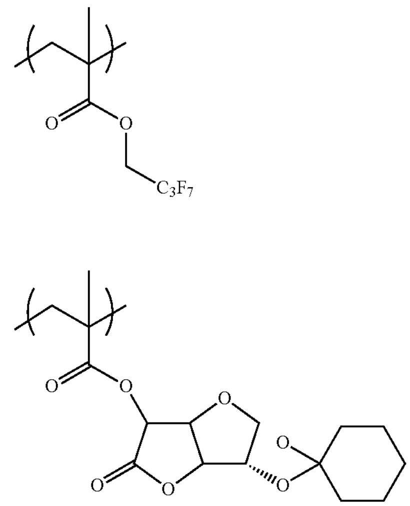
(C-250)
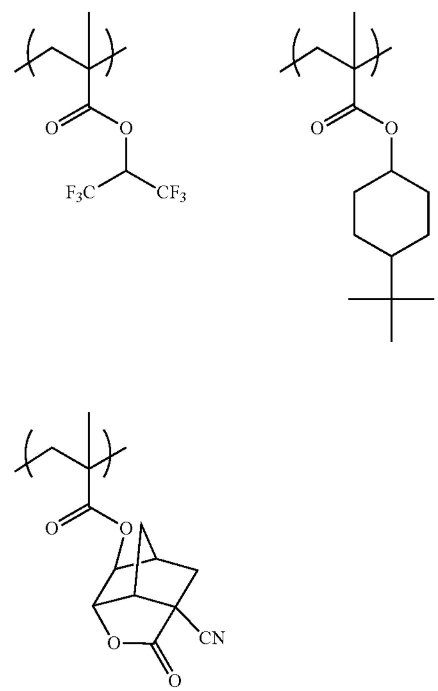

-continued
(C-251)
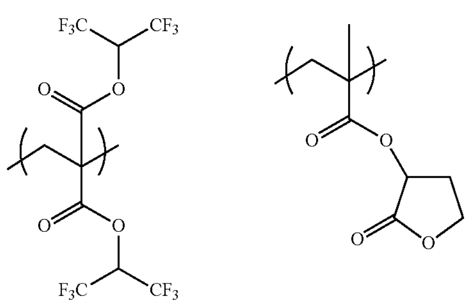
(C-252)
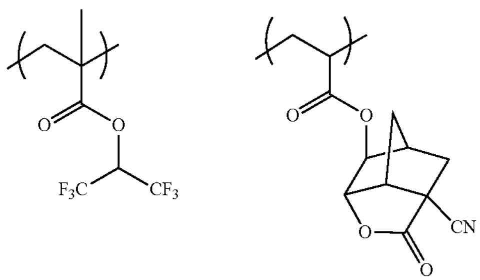
(C-253)
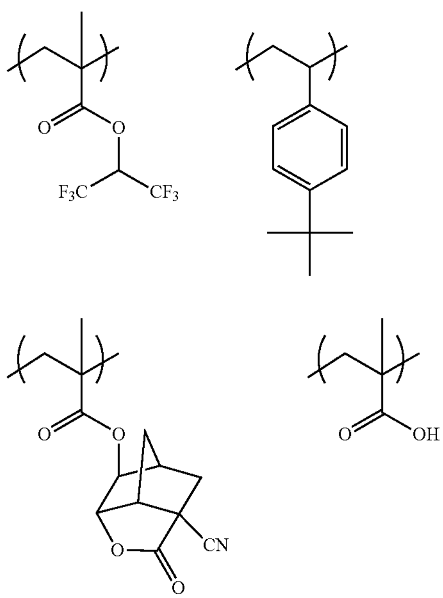
(C-254)
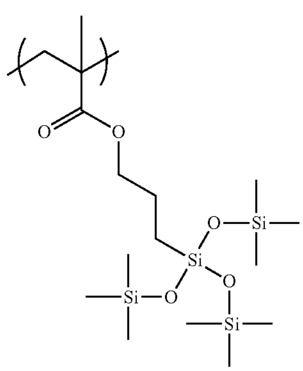
-continued
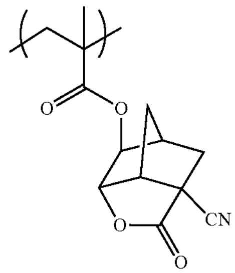
(C-255)
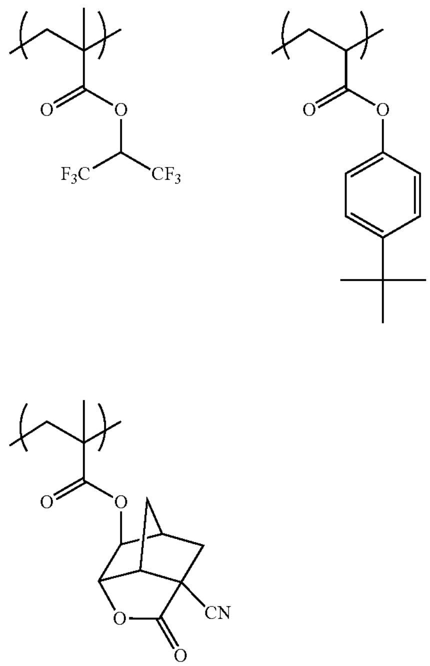
(C-256)
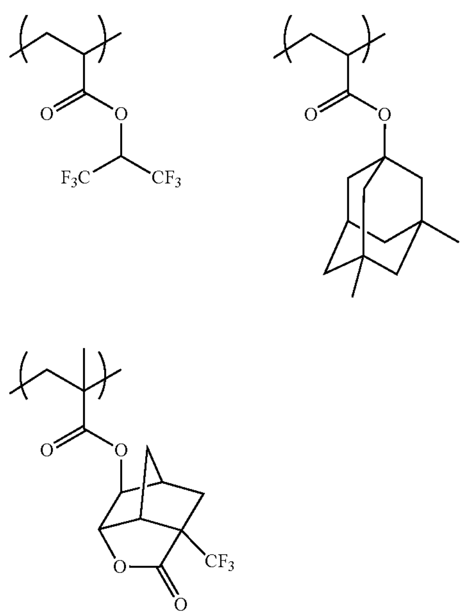

-continued
(C-257)
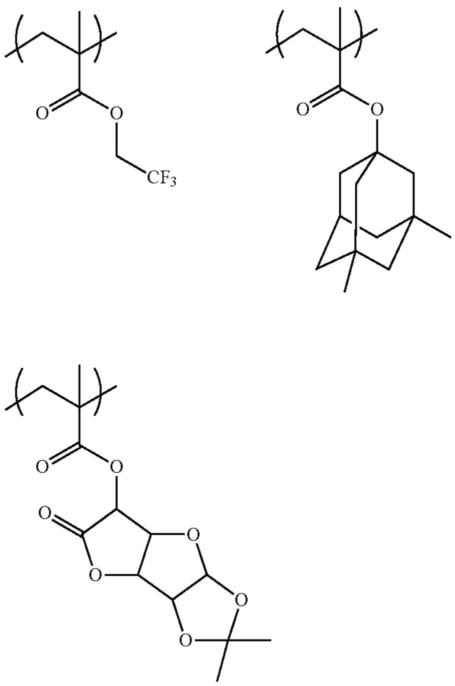
(C-258)
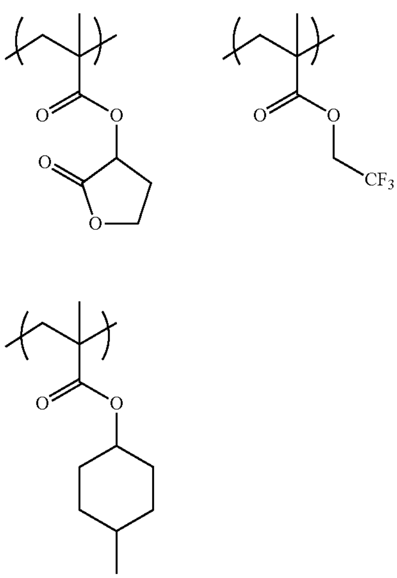
(C-259)
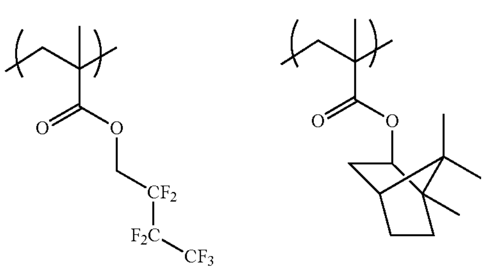
-continued
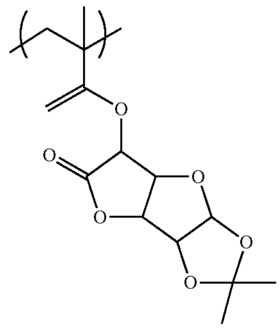
(C-260)
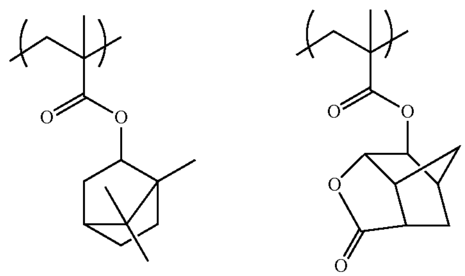
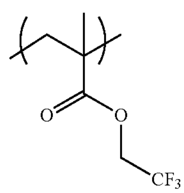
(C-261)
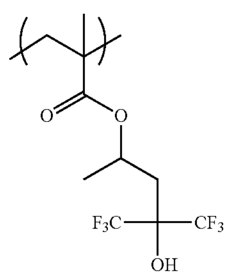
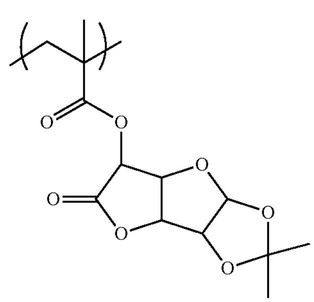

-continued
(C-262)
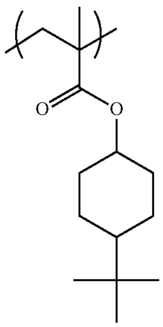
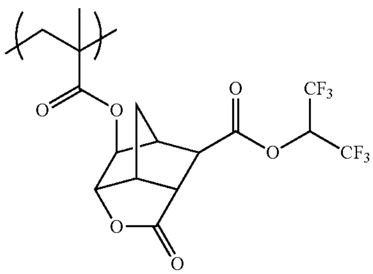
(C-263)
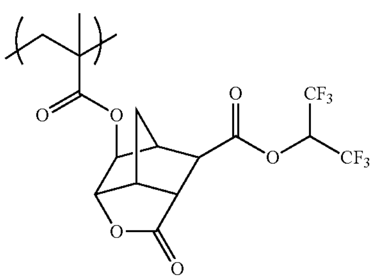
(C-264)
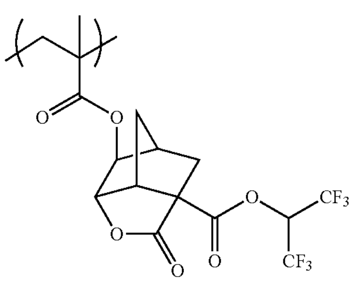
(C-265)
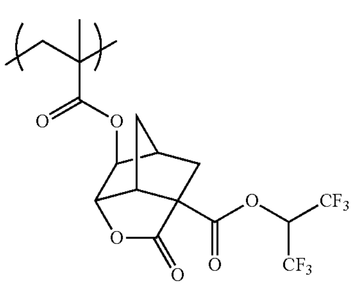
-continued
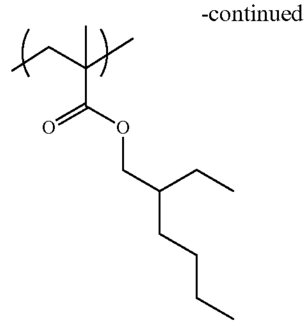
(C-266)
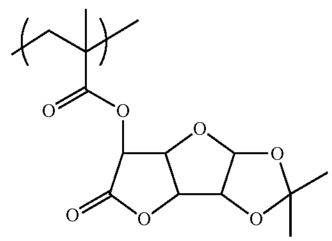
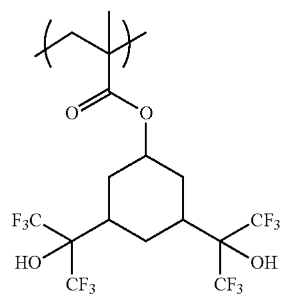
(C-267)
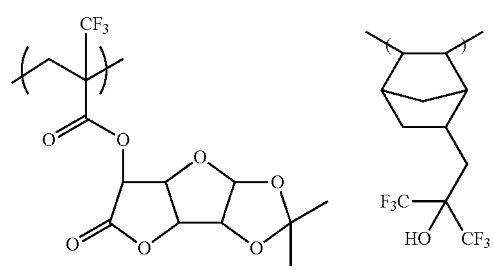
(C-268)
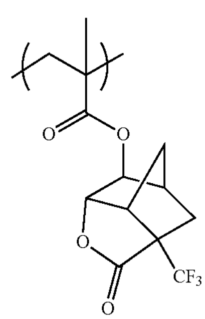

-continued
(C-269)
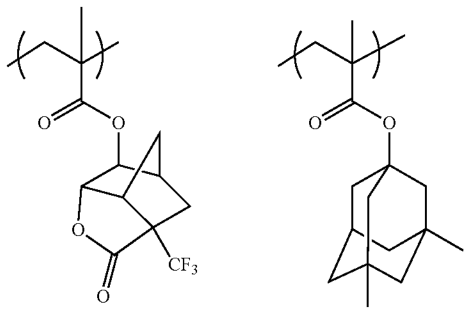
(C-270)
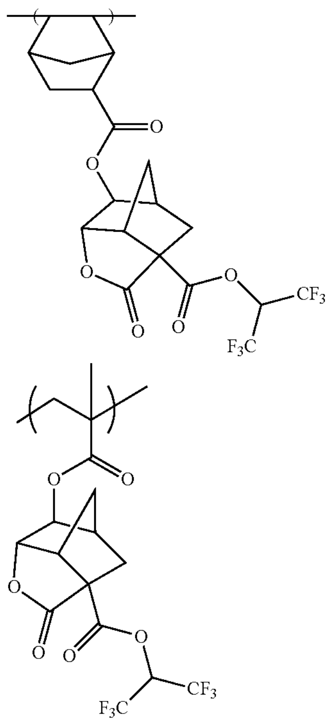
(C-271)
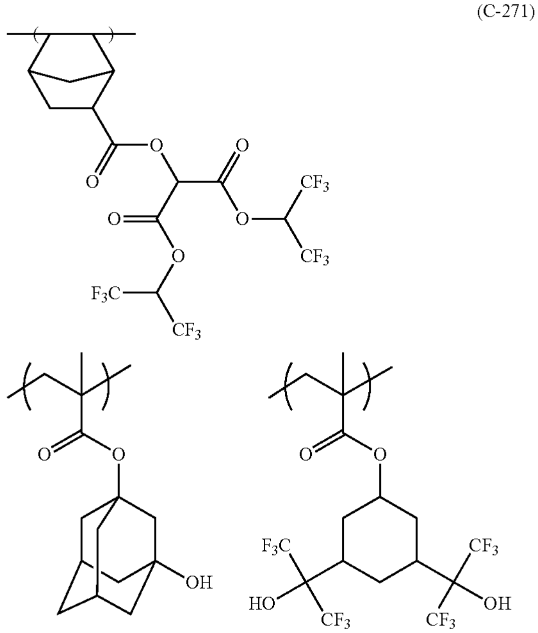
-continued
(C-272)
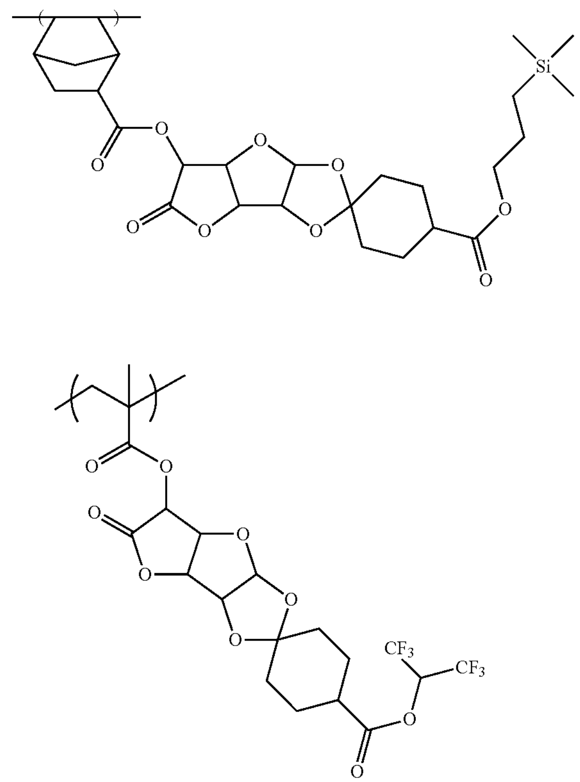
(C-273)
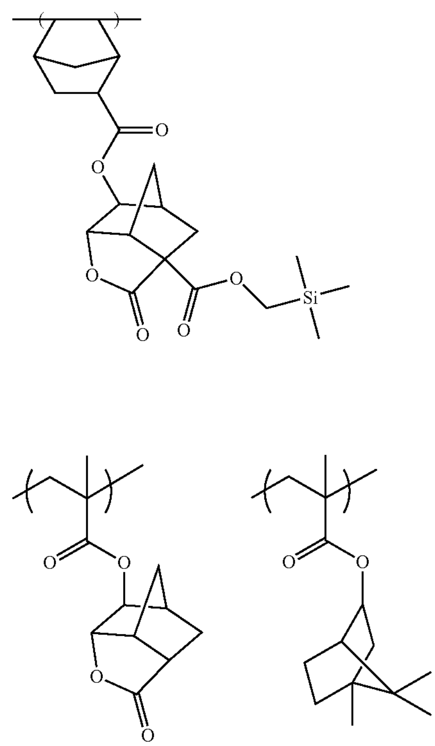

-continued
(C-274)
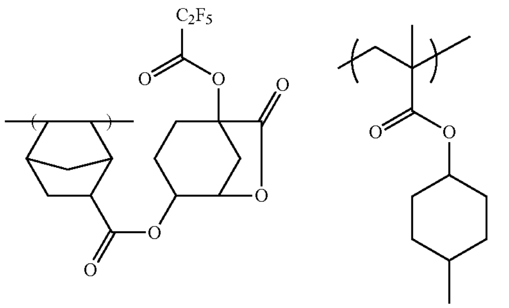
(C-275)
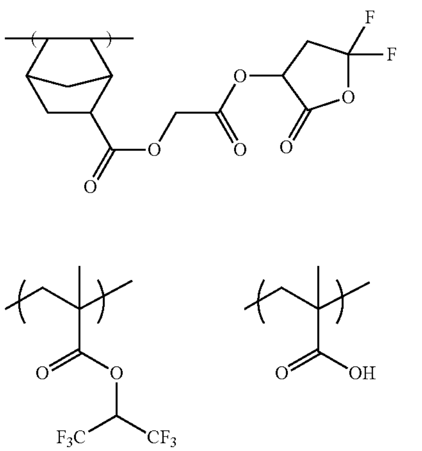
(C-276)
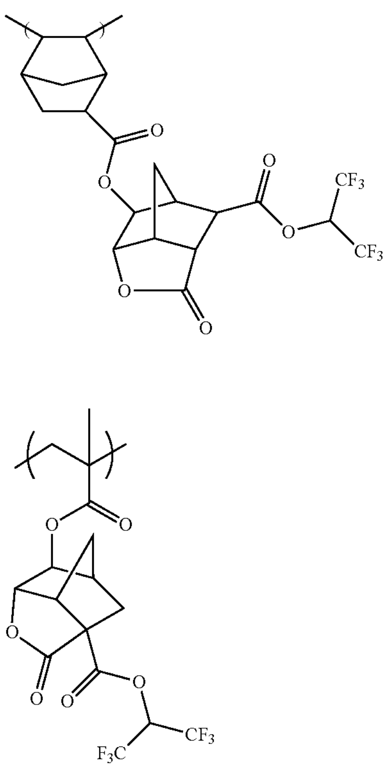
-continued
(C-277)
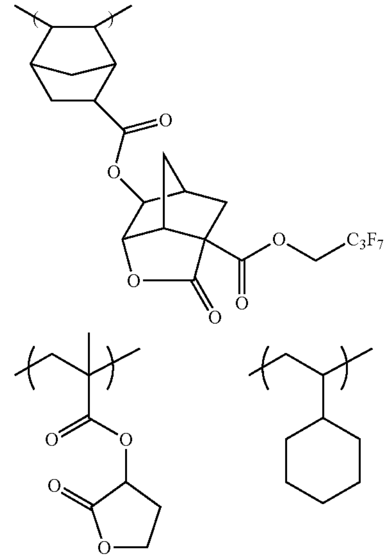
(C-278)
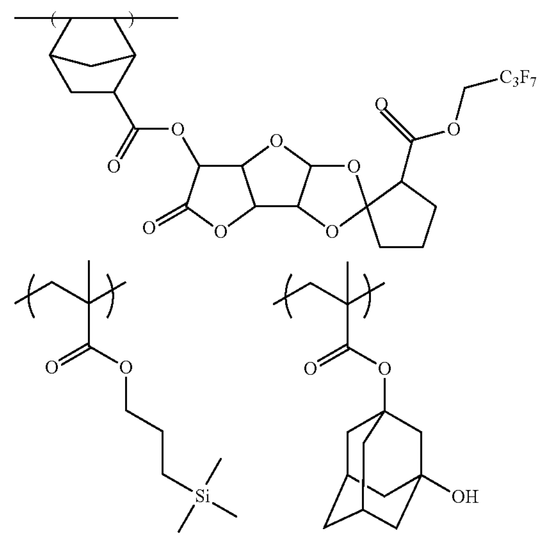
(C-279)
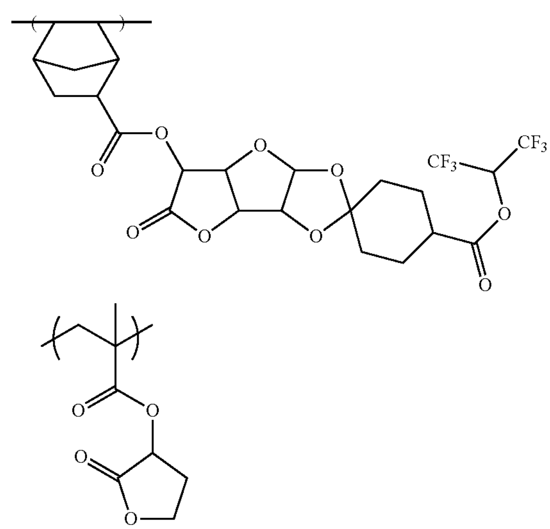

-continued
(C-280)
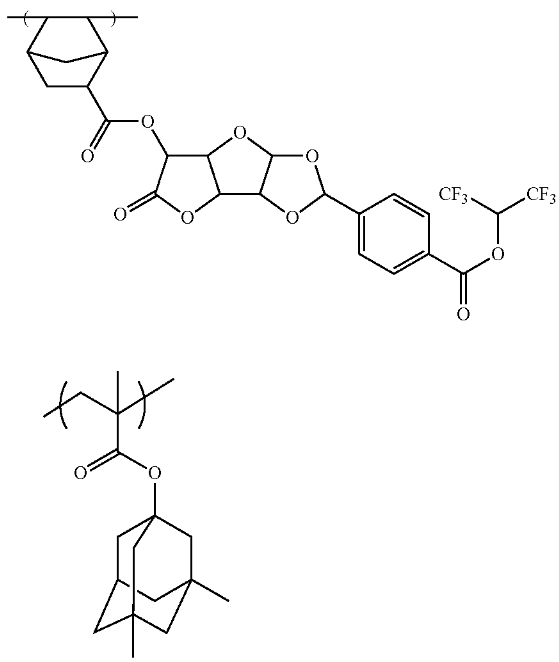
(C-281)
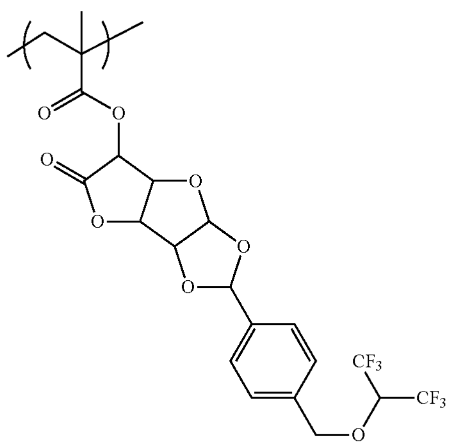
(C-282)
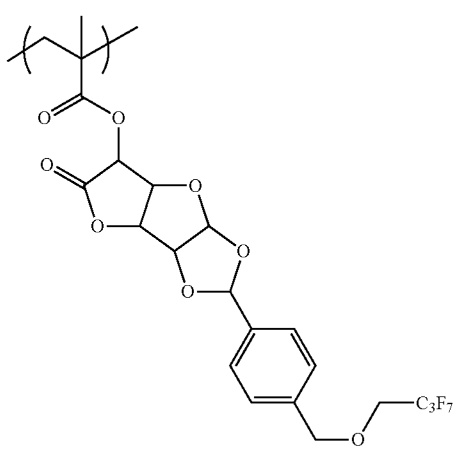
-continued
(C-283)
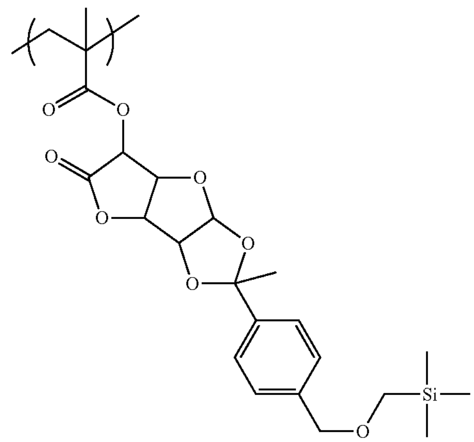
(C-284)
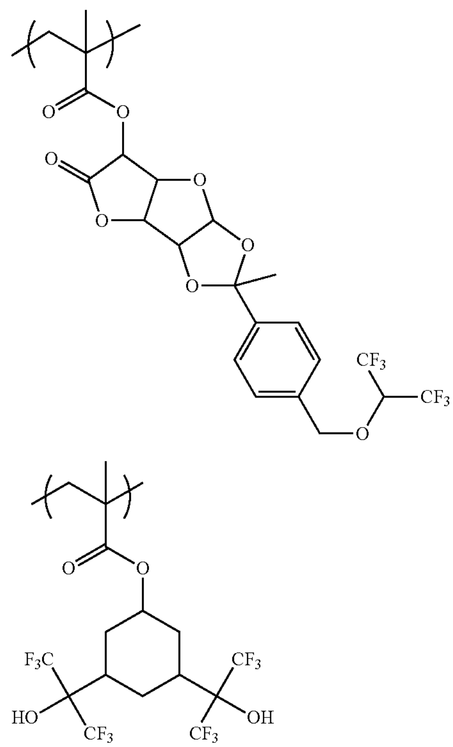
(C-285)
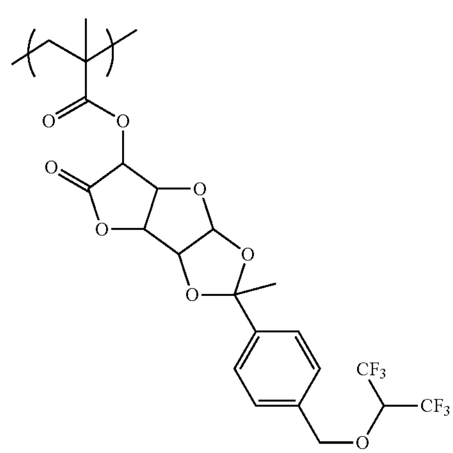

-continued
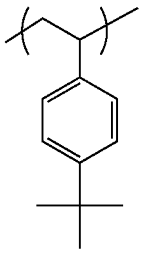
(C-286)
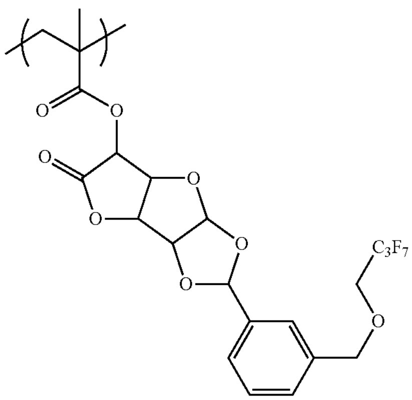
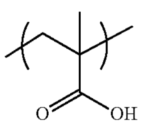
(C-287)
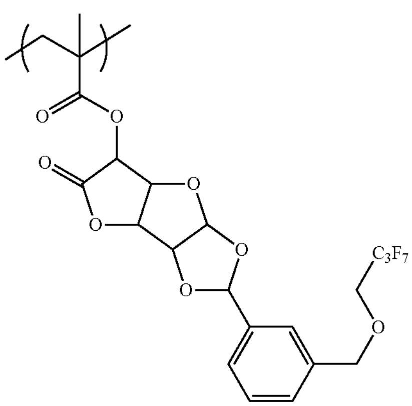
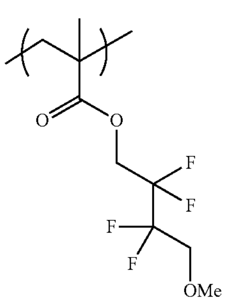
-continued
(C-288)
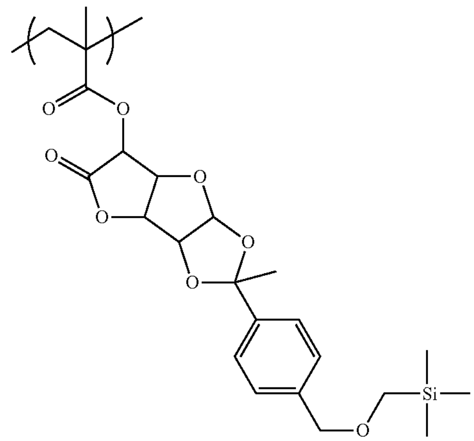
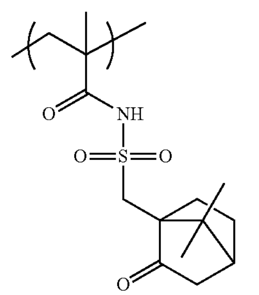
(C-289)
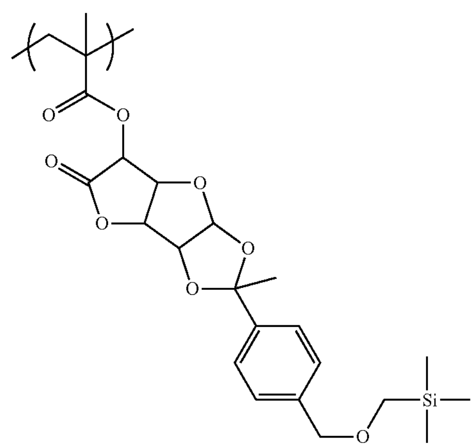
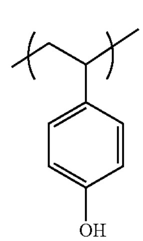
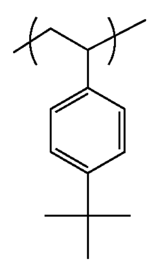

-continued
(C-290)
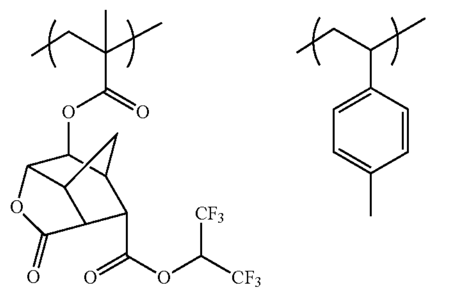
(C-291)
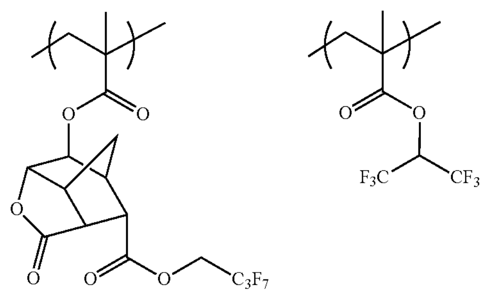
(C-292)
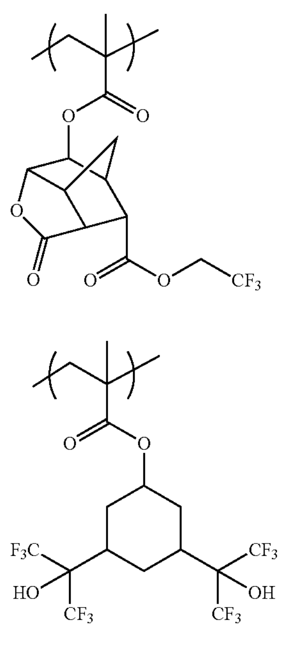
(C-293)
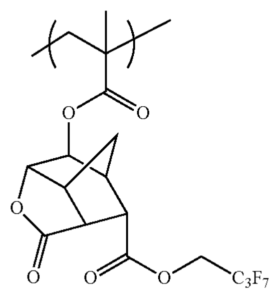
-continued
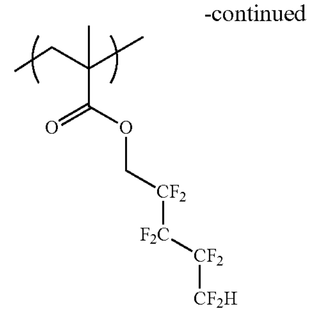
(C-294)
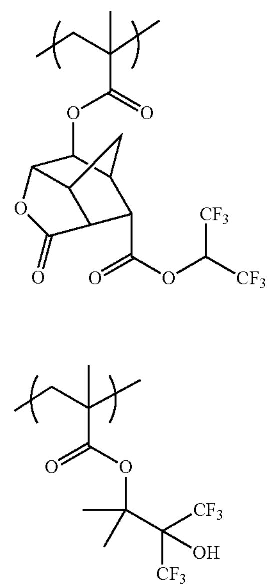
(C-295)
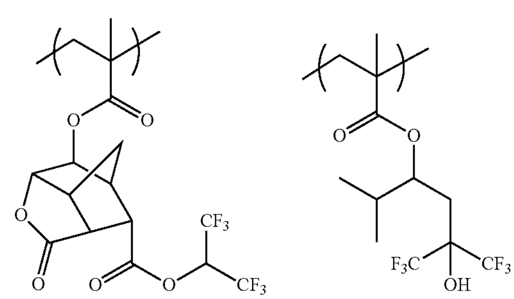
(C-296)
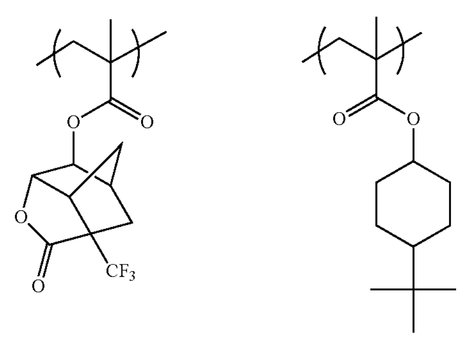

(C-297)
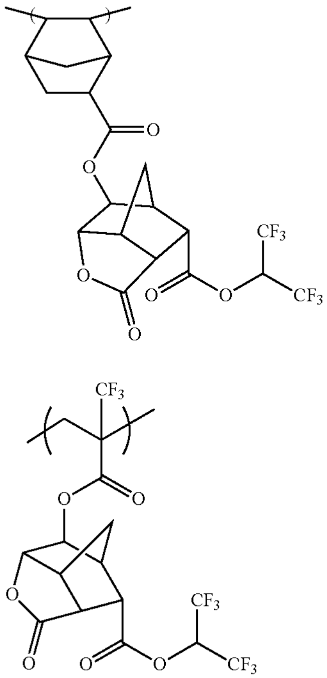
(C-298)
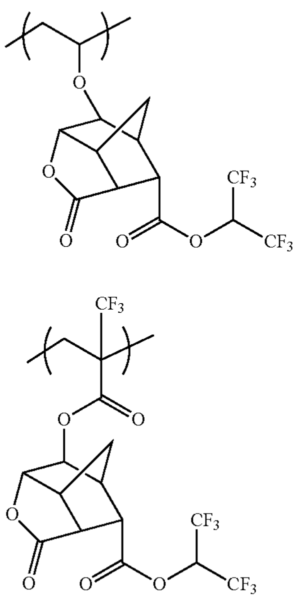
(C-299)
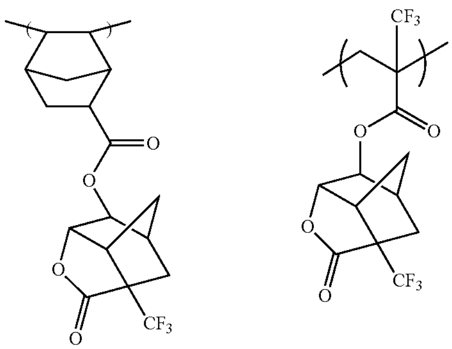
(C-300)
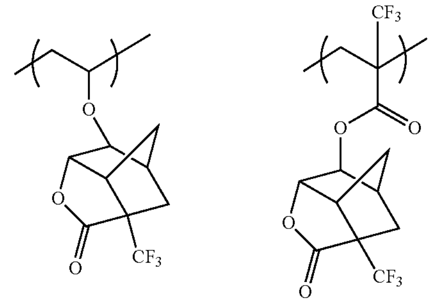
(C-301)
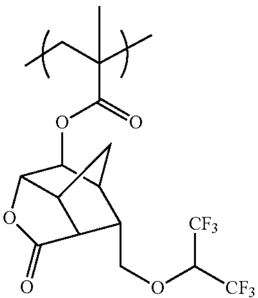
(C-302)
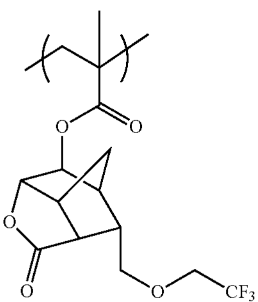
(C-303)
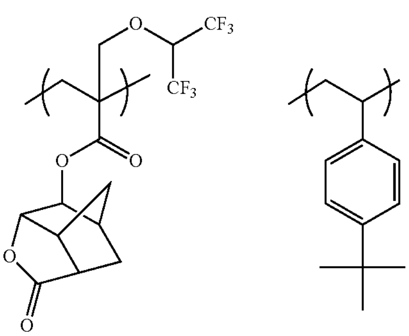
(C-304)
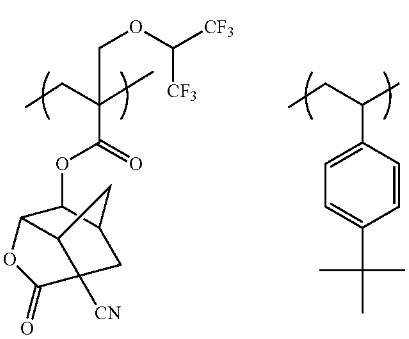

-continued
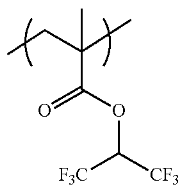
(C-305)
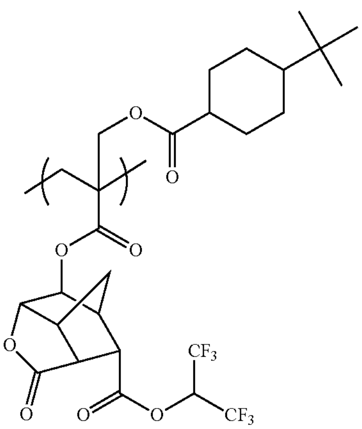
(C-306)
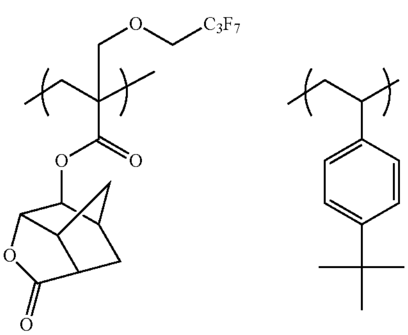
(C-307)
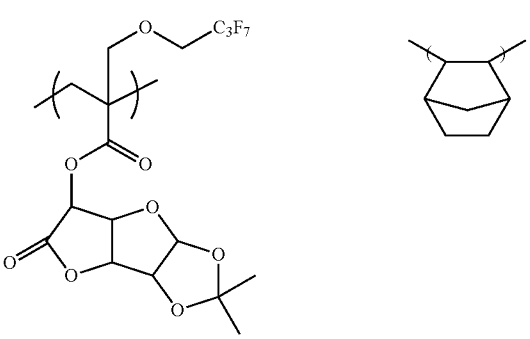
-continued
(C-308)
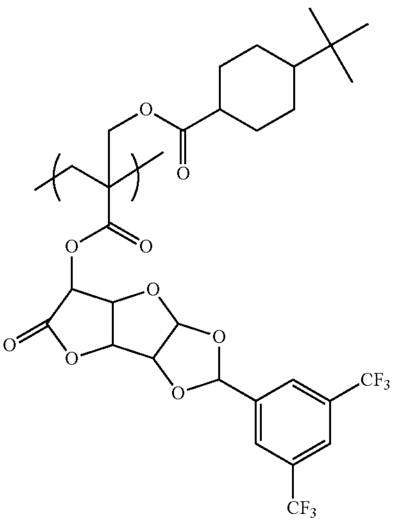
(C-309)
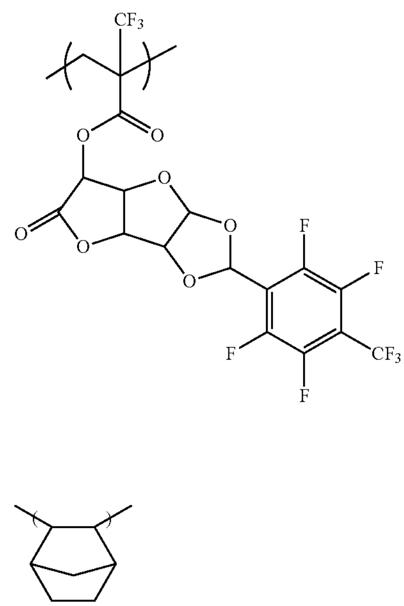
(C-310)
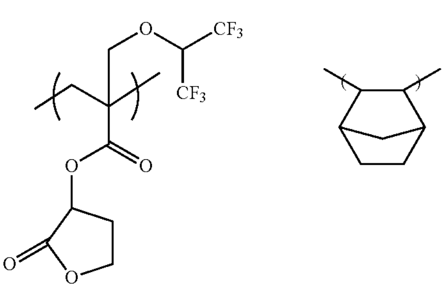

-continued
(C-311)
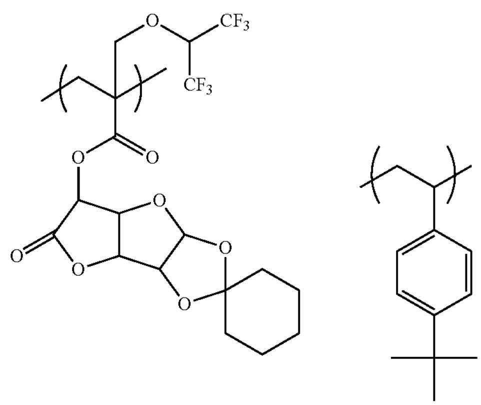
(C-312)
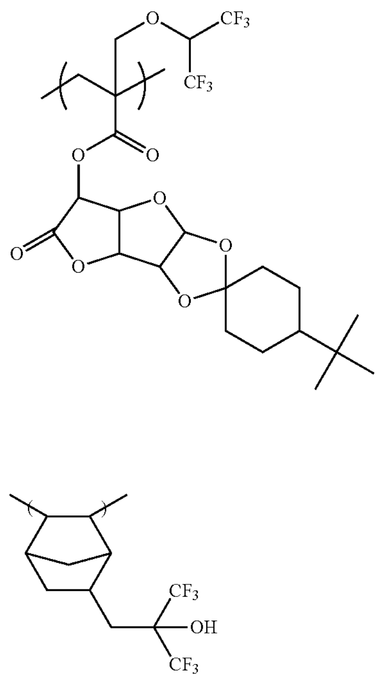
(C-313)
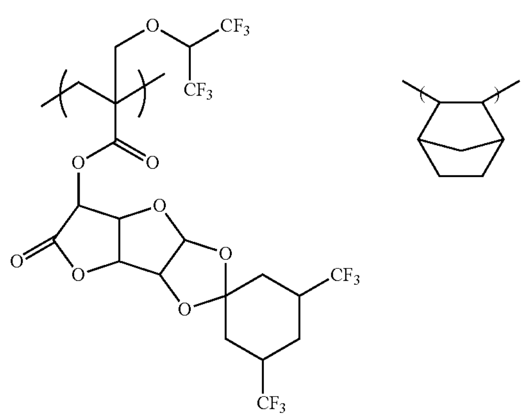
-continued
(C-314)
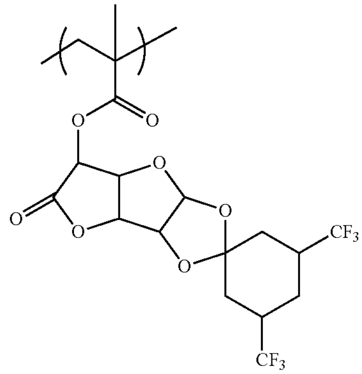
TABLE 1
| Resin | Composition | Mw | Mw/Mn |
|---|---|---|---|
| C-1 | 100 | 6000 | 1.5 |
| C-2 | 100 | 7500 | 1.4 |
| C-3 | 100 | 6000 | 1.4 |
| C-4 | 100 | 9000 | 1.5 |
| C-5 | 100 | 6000 | 1.4 |
| C-6 | 50/50 | 6500 | 1.4 |
| C-7 | 90/10 | 8000 | 1.4 |
| C-8 | 60/40 | 8000 | 1.3 |
| C-9 | 30/30/30/10 | 9500 | 1.4 |
| C-10 | 70/30 | 7000 | 1.4 |
| C-11 | 50/10/40 | 9000 | 1.6 |
| C-12 | 80/20 | 6000 | 1.4 |
| C-13 | 40/30/30 | 9500 | 1.4 |
| C-14 | 50/50 | 8000 | 1.4 |
| C-15 | 70/30 | 7000 | 1.4 |
| C-16 | 100 | 6000 | 1.4 |
| C-17 | 100 | 8000 | 1.4 |
| C-18 | 40/20/40 | 6000 | 1.4 |
| C-19 | 40/60 | 5000 | 1.5 |
| C-20 | 30/40/30 | 7000 | 1.4 |
| C-21 | 40/40/10/10 | 6000 | 1.4 |
| C-22 | 100 | 5500 | 1.4 |
| C-23 | 100 | 9500 | 1.5 |
| C-24 | 70/30 | 8500 | 1.4 |
| C-25 | 50/30/20 | 5000 | 1.4 |
| C-26 | 50/20/30 | 5500 | 1.4 |
| C-27 | 50/50 | 9000 | 1.5 |
| C-28 | 50/40/10 | 9000 | 1.4 |
| C-29 | 60/20/20 | 6500 | 1.4 |
| C-30 | 70/30 | 6500 | 1.4 |
| C-31 | 70/30 | 9000 | 1.5 |
| C-32 | 90/10 | 9000 | 1.5 |
| C-33 | 70/20/10 | 7000 | 1.4 |
| C-34 | 80/10/10 | 8500 | 1.5 |
| C-35 | 60/30/10 | 7500 | 1.4 |
| C-36 | 50/50 | 5000 | 1.5 |
| C-37 | 30/30/30/5/5 | 6000 | 1.5 |
| C-38 | 50/50 | 4500 | 1.4 |
| C-39 | 80/20 | 5000 | 1.4 |
| C-40 | 100 | 5000 | 1.4 |
| C-41 | 100 | 9000 | 1.5 |
| C-42 | 100 | 10000 | 1.5 |
| C-43 | 90/10 | 8500 | 1.4 |
| C-44 | 30/30/30/10 | 5500 | 1.4 |
| C-45 | 60/30/10 | 6500 | 1.4 |
| C-46 | 70/30 | 6500 | 1.4 |
| C-47 | 30/20/50 | 7000 | 1.4 |
| C-48 | 80/20 | 8000 | 1.5 |
| C-49 | 60/30/10 | 6000 | 1.4 |
| C-50 | 60/40 | 8000 | 1.5 |
| C-51 | 50/50 | 9500 | 1.4 |
| C-52 | 90/10 | 8000 | 1.5 |
| C-53 | 100 | 7000 | 1.5 |
| C-54 | 70/10/10/10 | 5500 | 1.4 |
| C-55 | 80/20 | 6500 | 1.4 |

TABLE 1-continued

| Resin | Composition | Mw | Mw/Mn |
|---|---|---|---|
| C-56 | 30/30/40 | 6000 | 1.4 |
| C-57 | 100 | 6000 | 1.4 |
| C-58 | 90/10 | 8000 | 1.4 |
| C-59 | 80/20 | 7000 | 1.5 |
| C-60 | 50/20/30 | 6000 | 1.4 |
| C-61 | 60/40 | 4500 | 1.5 |
| C-62 | 100 | 6500 | 1.4 |
| C-63 | 80/10/10 | 7000 | 1.5 |
| C-64 | 90/10 | 9000 | 1.5 |
| C-65 | 70/30 | 8000 | 1.4 |
| C-66 | 35/30/10/5/20 | 7000 | 1.4 |
| C-67 | 100 | 6500 | 1.4 |
| C-68 | 80/20 | 6500 | 1.4 |
| C-69 | 70/20/10 | 7000 | 1.4 |
| C-70 | 60/30/10 | 9000 | 1.5 |
| C-71 | 60/20/20 | 8000 | 1.4 |
| C-72 | 100 | 9500 | 1.5 |
| C-73 | 40/60 | 8000 | 1.4 |
| C-74 | 60/10/30 | 7000 | 1.5 |
| C-75 | 100 | 5500 | 1.5 |
| C-76 | 90/10 | 6500 | 1.4 |
| C-77 | 90/10 | 7500 | 1.3 |
| C-78 | 50/10/20/20 | 6000 | 1.5 |
| C-79 | 70/30 | 5000 | 1.3 |
| C-80 | 70/10/20 | 8500 | 1.5 |
| C-81 | 80/20 | 5500 | 1.3 |
| C-82 | 100 | 8000 | 1.3 |
| C-83 | 85/5/10 | 6500 | 1.4 |
| C-84 | 80/20 | 8000 | 1.5 |
| C-85 | 60/30/10 | 10000 | 1.5 |
| C-86 | 100 | 8000 | 1.5 |
| C-87 | 55/30/5/10 | 8000 | 1.3 |
| C-88 | 40/30/30 | 6000 | 1.3 |
| C-89 | 70/30 | 6500 | 1.3 |
| C-90 | 90/10 | 8000 | 1.5 |
| C-91 | 70/20/10 | 6500 | 1.5 |
| C-92 | 100 | 7000 | 1.4 |
| C-93 | 100 | 6000 | 1.5 |
| C-94 | 100 | 13000 | 1.4 |
| C-95 | 100 | 4000 | 1.4 |
| C-96 | 100 | 6000 | 1.5 |
| C-97 | 100 | 10000 | 1.4 |
| C-98 | 100 | 7500 | 1.5 |
| C-99 | 50/50 | 6500 | 1.4 |
| C-100 | 50/50 | 8500 | 1.4 |
| C-101 | 80/20 | 7000 | 1.3 |
| C-102 | 50/20/30 | 4500 | 1.3 |
| C-103 | 90/10 | 5500 | 1.3 |
| C-104 | 60/30/10 | 6000 | 1.5 |
| C-105 | 80/20 | 8000 | 1.3 |
| C-106 | 50/45/5 | 7500 | 1.4 |
| C-107 | 80/20 | 7000 | 1.5 |
| C-108 | 30/30/30/10 | 9000 | 1.6 |
| C-109 | 70/30 | 8000 | 1.3 |
| C-110 | 50/30/20 | 9000 | 1.4 |
| C-111 | 60/10/30 | 6000 | 1.5 |
| C-112 | 60/5/35 | 8000 | 1.5 |
| C-113 | 50/40/10 | 9500 | 1.5 |
| C-114 | 80/20 | 7000 | 1.5 |
| C-115 | 90/10 | 6000 | 1.2 |
| C-116 | 40/20/30/10 | 8000 | 1.3 |
| C-117 | 50/50 | 6000 | 1.5 |
| C-118 | 100 | 9500 | 1.4 |
| C-119 | 50/20/20/10 | 8000 | 1.5 |
| C-120 | 75/10/10/5 | 7000 | 1.3 |
| C-121 | 30/30/10/30 | 5500 | 1.3 |
| C-122 | 100 | 8000 | 1.3 |
| C-123 | 100 | 9500 | 1.5 |
| C-124 | 100 | 9000 | 1.6 |
| C-125 | 90/10 | 9500 | 1.3 |
| C-126 | 70/30 | 7500 | 1.5 |
| C-127 | 70/30 | 8000 | 1.3 |
| C-128 | 85/15 | 6000 | 1.5 |
| C-129 | 90/10 | 7000 | 1.6 |
| C-130 | 50/20/30 | 5000 | 1.3 |
| C-131 | 60/20/20 | 4000 | 1.4 |
| C-132 | 50/30/20 | 6500 | 1.4 |
| C-133 | 70/10/20 | 7000 | 1.4 |

TABLE 1-continued

| Resin | Composition | Mw | Mw/Mn |
|---|---|---|---|
| C-134 | 80/10/10 | 9000 | 1.4 |
| C-135 | 60/40 | 8000 | 1.5 |
| C-136 | 30/70 | 9000 | 1.4 |
| C-137 | 70/15/15 | 7500 | 1.5 |
| C-138 | 70/30 | 8000 | 1.4 |
| C-139 | 75/5/10/10 | 6000 | 1.5 |
| C-140 | 70/30 | 5500 | 1.5 |
| C-141 | 50/25/25 | 6500 | 1.4 |
| C-142 | 100 | 9000 | 1.6 |
| C-143 | 50/40/10 | 7000 | 1.4 |
| C-144 | 50/50 | 9000 | 1.4 |
| C-145 | 50/30/20 | 8000 | 1.4 |
| C-146 | 50/50 | 9000 | 1.5 |
| C-147 | 48/50/2 | 6000 | 1.4 |
| C-148 | 50/50 | 9000 | 1.5 |
| C-149 | 50/25/25 | 6000 | 1.4 |
| C-150 | 50/50 | 9500 | 1.5 |
| C-151 | 50/50 | 8000 | 1.5 |
| C-152 | 50/50 | 7000 | 1.4 |
| C-153 | 95/5 | 3000 | 1.4 |
| C-154 | 100 | 5000 | 1.4 |
| C-155 | 50/50 | 6000 | 1.5 |
| C-156 | 50/50 | 4000 | 1.5 |
| C-157 | 100 | 8000 | 1.4 |
| C-158 | 80/20 | 4500 | 1.4 |
| C-159 | 80/20 | 3500 | 1.4 |
| C-160 | 70/30 | 7000 | 1.4 |
| C-161 | 50/50 | 10000 | 1.3 |
| C-162 | 95/5 | 4500 | 1.4 |
| C-163 | 90/10 | 8500 | 1.4 |
| C-164 | 25/50/25 | 6000 | 1.5 |
| C-165 | 40/40/10/10 | 6500 | 1.4 |
| C-166 | 100 | 8000 | 1.4 |
| C-167 | 100 | 6500 | 1.4 |
| C-168 | 80/20 | 5000 | 1.3 |
| C-169 | 40/30/30 | 4500 | 1.5 |
| C-170 | 90/10 | 3000 | 1.4 |
| C-171 | 100 | 4500 | 1.4 |
| C-172 | 100 | 3500 | 1.4 |
| C-173 | 60/40 | 5000 | 1.4 |
| C-174 | 90/10 | 6000 | 1.4 |
| C-175 | 100 | 4000 | 1.5 |
| C-176 | 100 | 8000 | 1.4 |
| C-177 | 100 | 5000 | 1.4 |
| C-178 | 100 | 10000 | 1.5 |
| C-179 | 100 | 6000 | 1.4 |
| C-180 | 100 | 7000 | 1.3 |
| C-181 | 100 | 5500 | 1.4 |
| C-182 | 100 | 8000 | 1.3 |
| C-183 | 90/10 | 4500 | 1.4 |
| C-184 | 80/20 | 6000 | 1.4 |
| C-185 | 70/30 | 5500 | 1.6 |
| C-186 | 85/15 | 8500 | 1.4 |
| C-187 | 90/10 | 3000 | 1.3 |
| C-188 | 70/30 | 4500 | 1.4 |
| C-189 | 75/25 | 6500 | 1.4 |
| C-190 | 55/45 | 8500 | 1.3 |
| C-191 | 90/10 | 5500 | 1.4 |
| C-192 | 75/25 | 9000 | 1.4 |
| C-193 | 70/30 | 10000 | 1.5 |
| C-194 | 70/30 | 5000 | 1.4 |
| C-195 | 80/20 | 7000 | 1.4 |
| C-196 | 85/15 | 4500 | 1.4 |
| C-197 | 80/20 | 3500 | 1.5 |
| C-198 | 75/25 | 6000 | 1.4 |
| C-199 | 100 | 5000 | 1.4 |
| C-200 | 80/20 | 6000 | 1.4 |
| C-201 | 80/20 | 8000 | 1.5 |
| C-202 | 100 | 4500 | 1.5 |
| C-203 | 70/30 | 3500 | 1.4 |
| C-204 | 80/20 | 10000 | 1.4 |
| C-205 | 80/20 | 7000 | 1.4 |
| C-206 | 90/10 | 4000 | 1.4 |
| C-207 | 80/15/5 | 10000 | 1.4 |
| C-208 | 85/10/5 | 5000 | 1.5 |
| C-209 | 90/8/2 | 13000 | 1.5 |
| C-210 | 85/10/5 | 6000 | 1.5 |
| C-211 | 90/8/2 | 8000 | 1.4 |

TABLE 1-continued

| Resin | Composition | Mw | Mw/Mn |
|---|---|---|---|
| C-212 | 50/50 | 12000 | 1.5 |
| C-213 | 50/50 | 8000 | 1.3 |
| C-214 | 85/15 | 6500 | 1.5 |
| C-215 | 85/15 | 4000 | 1.5 |
| C-216 | 90/10 | 7500 | 1.6 |
| C-217 | 90/10 | 3500 | 1.5 |
| C-218 | 95/5 | 5500 | 1.4 |
| C-219 | 85/10/5 | 5000 | 1.5 |
| C-220 | 88/10/2 | 13000 | 1.4 |
| C-221 | 90/8/2 | 12000 | 1.5 |
| C-222 | 90/8/2 | 11000 | 1.4 |
| C-223 | 90/8/2 | 9000 | 1.5 |
| C-224 | 50/50 | 6000 | 1.5 |
| C-225 | 50/50 | 8000 | 1.5 |
| C-226 | 80/20 | 4500 | 1.3 |
| C-227 | 85/15 | 8500 | 1.6 |
| C-228 | 90/10 | 10000 | 1.4 |
| C-229 | 90/10 | 3500 | 1.5 |
| C-230 | 95/5 | 4500 | 1.5 |
| C-231 | 50/50 | 4000 | 1.5 |
| C-232 | 80/18/2 | 6000 | 1.5 |
| C-233 | 90/8/2 | 9500 | 1.5 |
| C-234 | 80/20 | 6500 | 1.4 |
| C-235 | 90/10 | 8000 | 1.5 |
| C-236 | 100 | 8000 | 1.5 |
| C-237 | 95/5 | 4500 | 1.5 |
| C-238 | 90/10 | 10000 | 1.5 |
| C-239 | 100 | 6500 | 1.4 |
| C-240 | 80/20 | 6500 | 1.4 |
| C-241 | 70/20/10 | 7000 | 1.4 |
| C-242 | 90/10 | 7000 | 1.6 |
| C-243 | 50/20/30 | 5000 | 1.3 |
| C-244 | 40/30/30 | 5000 | 1.4 |
| C-245 | 60/40 | 6000 | 1.4 |
| C-246 | 40/20/40 | 7000 | 1.4 |
| C-247 | 40/30/30 | 8000 | 1.5 |
| C-248 | 40/30/30 | 9500 | 1.5 |
| C-249 | 60/40 | 9500 | 1.5 |
| C-250 | 40/40/20 | 7500 | 1.4 |
| C-251 | 80/20 | 9000 | 1.5 |
| C-252 | 80/20 | 9000 | 1.5 |
| C-253 | 40/30/15/15 | 7000 | 1.4 |
| C-254 | 60/40 | 8500 | 1.4 |
| C-255 | 50/30/20 | 8000 | 1.4 |
| C-256 | 30/30/40 | 9500 | 1.5 |
| C-257 | 30/50/20 | 8000 | 1.3 |
| C-258 | 30/50/20 | 8000 | 1.3 |
| C-259 | 40/40/20 | 6500 | 1.4 |
| C-260 | 50/30/20 | 6000 | 1.4 |
| C-261 | 80/20 | 8500 | 1.5 |
| C-262 | 20/80 | 10000 | 1.5 |
| C-263 | 100 | 8500 | 1.5 |
| C-264 | 100 | 6000 | 1.4 |
| C-265 | 90/10 | 8000 | 1.4 |
| C-266 | 30/70 | 9000 | 1.6 |
| C-267 | 50/50 | 4000 | 1.3 |
| C-268 | 100 | 6500 | 1.4 |
| C-269 | 80/20 | 6500 | 1.4 |
| C-270 | 30/70 | 6500 | 1.4 |
| C-271 | 80/10/10 | 7000 | 1.4 |
| C-272 | 30/70 | 9000 | 1.4 |
| C-273 | 60/30/10 | 8000 | 1.4 |
| C-274 | 80/20 | 9000 | 1.5 |
| C-275 | 60/35/5 | 6000 | 1.4 |
| C-276 | 40/60 | 9000 | 1.5 |
| C-277 | 60/30/10 | 8000 | 1.4 |
| C-278 | 65/20/15 | 9500 | 1.5 |
| C-279 | 85/15 | 8000 | 1.5 |
| C-280 | 90/10 | 7000 | 1.4 |
| C-281 | 100 | 8000 | 1.3 |
| C-282 | 100 | 9500 | 1.5 |
| C-283 | 100 | 9000 | 1.6 |
| C-284 | 90/10 | 9500 | 1.3 |
| C-285 | 70/30 | 7500 | 1.5 |
| C-286 | 90/10 | 8000 | 1.3 |
| C-287 | 80/20 | 6000 | 1.5 |
| C-288 | 90/10 | 7000 | 1.6 |
| C-289 | 50/20/30 | 6500 | 1.3 |

TABLE 1-continued

| Resin | Composition | Mw | Mw/Mn |
|---|---|---|---|
| C-290 | 80/20 | 12000 | 1.6 |
| C-291 | 70/30 | 8500 | 1.5 |
| C-292 | 80/20 | 15000 | 1.6 |
| C-293 | 60/40 | 6000 | 1.4 |
| C-294 | 40/60 | 8000 | 1.5 |
| C-295 | 50/50 | 8000 | 1.5 |
| C-296 | 80/20 | 6000 | 1.4 |
| C-297 | 50/50 | 4000 | 1.5 |
| C-298 | 50/50 | 8000 | 1.6 |
| C-299 | 50/50 | 4000 | 1.5 |
| C-300 | 50/50 | 8000 | 1.6 |
| C-301 | 100 | 8000 | 1.5 |
| C-302 | 100 | 7000 | 1.4 |
| C-303 | 60/40 | 7000 | 1.5 |
| C-304 | 50/30/20 | 8000 | 1.5 |
| C-305 | 100 | 5000 | 1.6 |
| C-306 | 60/40 | 5500 | 1.5 |
| C-307 | 60/40 | 6000 | 1.5 |
| C-308 | 100 | 4500 | 1.5 |
| C-309 | 70/30 | 5000 | 1.5 |
| C-310 | 50/50 | 6000 | 1.5 |
| C-311 | 70/30 | 6500 | 1.6 |
| C-312 | 50/50 | 5000 | 1.5 |
| C-313 | 70/30 | 6000 | 1.5 |
| C-314 | 100 | 7500 | 1.6 |

As for the resin (C), one kind may be used alone, or two or more kinds may be used in combination.

Also, (CP) a resin having at least either a fluorine atom or a silicon atom, which is different from the resin (C), is preferably used in combination.

(CP) Resin having at least either a Fluorine Atom or a Silicon Atom

The actinic ray-sensitive or radiation-sensitive resin composition of the present invention may further contain (CP) a resin having at least either a fluorine atom or a silicon atom, separately from the resin (C). By virtue of containing the resin (C) and the resin (CP), the resin (C) and the resin (CP) are unevenly distributed to the film surface layer and when the immersion medium is water, the film formed can be enhanced in the receding contact angle for water on the resist film surface as well as in the flowability of the immersion liquid. The receding contact angle of the film is preferably from 60 to 90°, more preferably 70° or more. The resin (CP) may be used by appropriately adjusting its content to give a film having a receding contact angle in the range above, but the content is preferably from 0.01 to 10 mass %, more preferably from 0.01 to 5 mass %, still more preferably from 0.01 to 4 mass %, yet still more preferably from 0.01 to 3 mass %, based on the entire solid content of the actinic ray-sensitive or radiation-sensitive resin composition.

The resin (CP) is, as described above, unevenly distributed to the interface but unlike a surfactant, need not have necessarily a hydrophilic group in the molecule and may not contribute to uniform mixing of polar/nonpolar substances.

The fluorine atom or silicon atom in the resin (CP) having at least either a fluorine atom or a silicon atom may be present in the main chain of the resin or may be substituted on the side chain.

The resin (CP) is preferably a resin having, as the fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being replaced by a fluorine atom and may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

Preferred examples of the fluorine atom-containing alkyl group, fluorine atom-containing cycloalkyl group and fluorine atom-containing aryl group include groups represented by formulae (F2) to (F4) described above with respect to the resin (C), but the present invention is not limited thereto.

In the present invention, the group represented by formulae (F2) to (F4) is preferably contained in a (meth)acrylate-based repeating unit.

Specific examples of the repeating unit having a fluorine atom are set forth below, but the present invention is not limited thereto.

In specific examples, $X_1$ represents a hydrogen atom, —$CH_3$, —F or —$CF_3$.

$X_2$ represents —F or —$CF_3$.

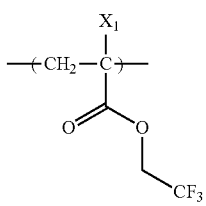
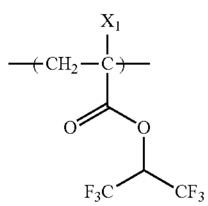
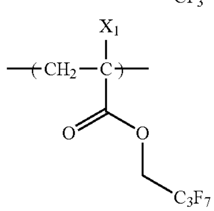
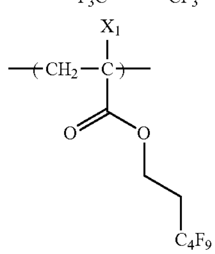
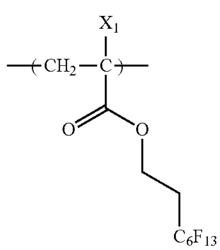
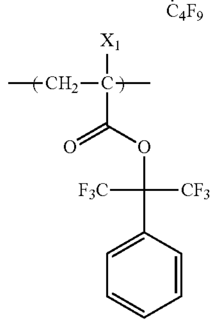
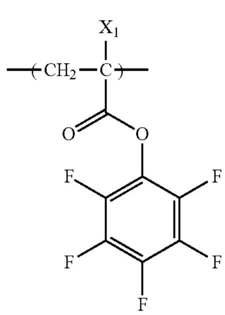
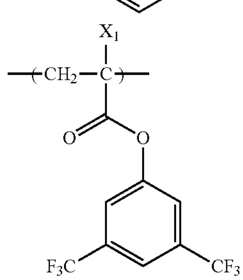

-continued

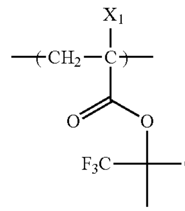
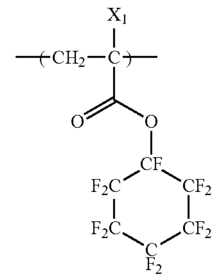
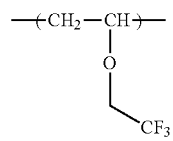
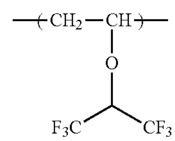
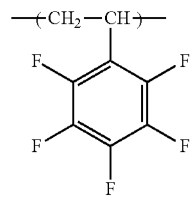
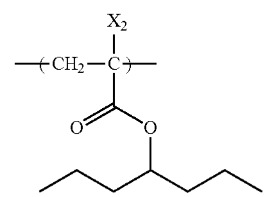
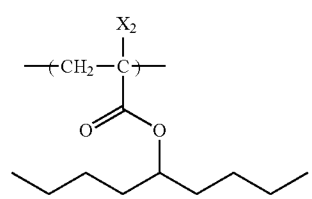
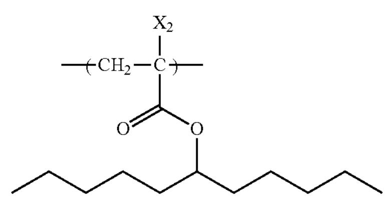
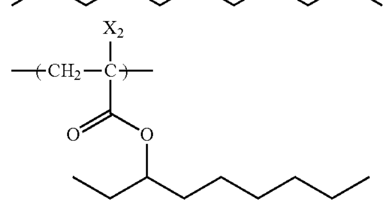
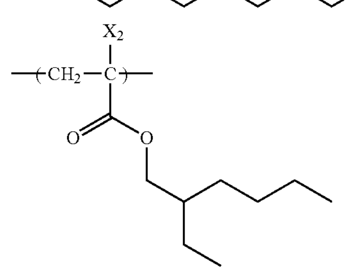
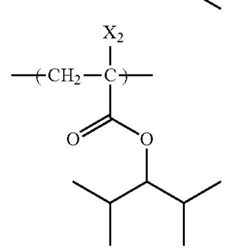
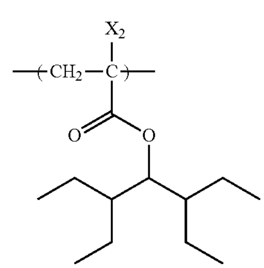

-continued

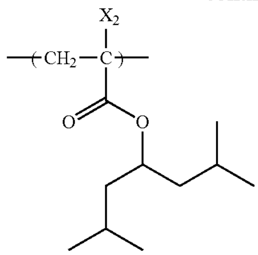

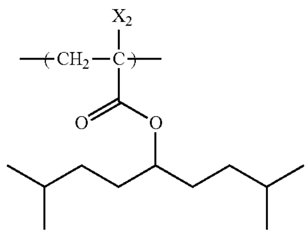

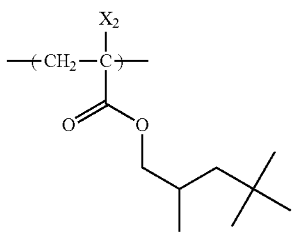

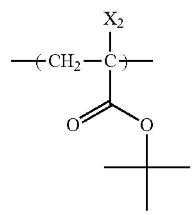

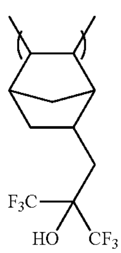

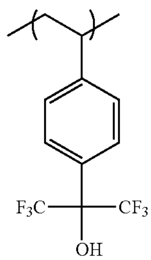

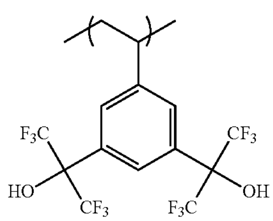

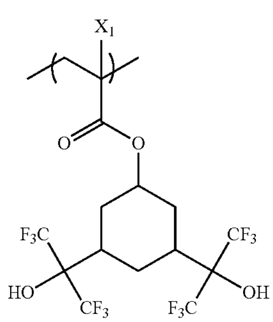

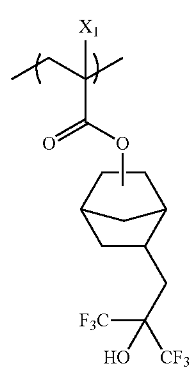

-continued

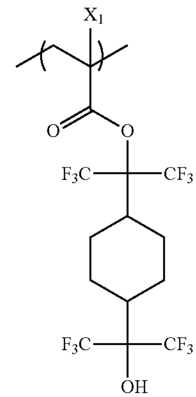

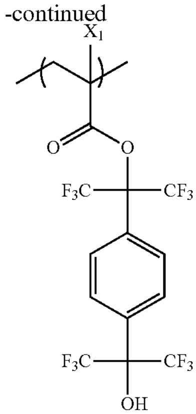

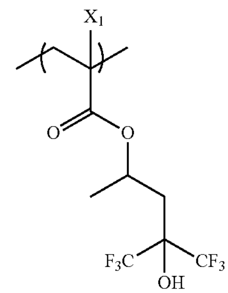

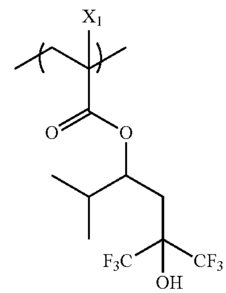

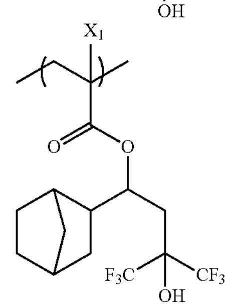

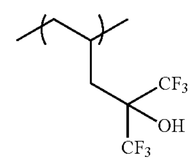

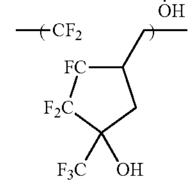

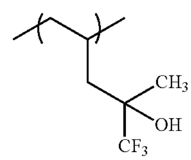

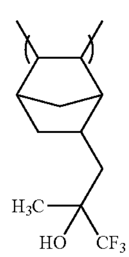

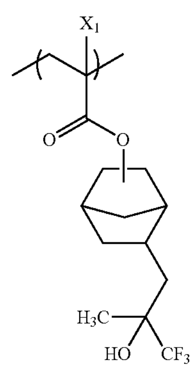

The resin (CP) is preferably a resin having, as the silicon atom-containing partial structure, an alkylsilyl structure (preferably a trialkylsilyl group) or a cyclic siloxane structure.

Specific examples of the alkylsilyl structure and cyclic siloxane structure include groups represented by formulae (CS-1) to (CS-3) described above with respect to the resin (C).

Furthermore, the resin (CP) may contain at least one group selected from the group consisting of the following (x) and (z):

(x) an alkali-soluble group, and (z) a group capable of decomposing by the action of an acid.

Specific examples of these groups are the same as those described above with respect to the resin (C).

Examples of the repeating unit having (z) a group capable of decomposing by the action of an acid, contained in the resin (CP), are the same as those of the repeating unit having an acid-decomposable group described for the resin (A). In the resin (CP), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (CP).

The resin (CP) may further have a repeating unit represented by formula (CIII) described above with respect to the resin (C).

In the case where the resin (CP) contains a fluorine atom, the fluorine atom content is preferably from 5 to 80 mass %, more preferably from 10 to 80 mass %, based on the molecular weight of the resin (CP). Also, the fluorine atom-containing repeating unit preferably occupies from 10 to 100 mass %, more preferably from 30 to 100 mass %, based on all repeating units in the resin (CP).

In the case where the resin (CP) contains a silicon atom, the silicon atom content is preferably from 2 to 50 mass %, more preferably from 2 to 0.30 mass %, based on the molecular weight of the resin (CP). Also, the silicon atom-containing repeating unit preferably occupies from 10 to 100 mass %, more preferably from 20 to 100 mass %, based on all repeating units in the resin (CP).

The standard polystyrene-equivalent weight average molecular of the resin (CP) is preferably from 1,000 to 100,000, more preferably from 1,000 to 50,000, still more preferably from 2,000 to 15,000.

The resin (CP) can be synthesized and purified in the same manner as the resin (A), and it is of course preferred that the amount of impurities such as metal is small, but also the content of residual monomers or oligomer components is preferably from 0 to 10 mass %, more preferably from 0 to 5 mass %, still more preferably from 0 to 1 mass %. By satisfying these conditions, an actinic ray-sensitive or radiation-sensitive resin composition free of extraneous substances in the liquid or change with aging in the sensitivity and the like can be obtained. Furthermore, in view of resolution, resist profile, side wall of resist pattern, roughness and the like, the molecular weight distribution (Mw/Mn, sometimes referred to as "polydispersity") is preferably from 1 to 3, more preferably from 1 to 2, still more preferably from 1 to 1.8, and most preferably from 1 to 1.5.

As for the resin (CP), various commercially available products may be used or the resin may be purified in the same manner as the resin (A) or synthesized by an ordinary method (for example, radical polymerization)). Specifically, the resin may be synthesized in the same manner as the resin (C).

Specific examples of the resin (CP) having at least either a fluorine atom or a silicon atom are set forth below. Also, the molar ratio of repeating units (corresponding to repeating units starting from the left), weight average molecular weight (Mw) and polydispersity (Mw/Mn) of each resin are shown in the Table 2 later.

(CP-1)

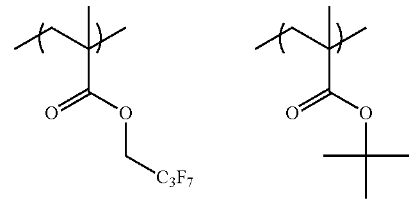

(CP-2)

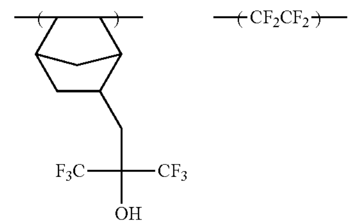

(CP-3)

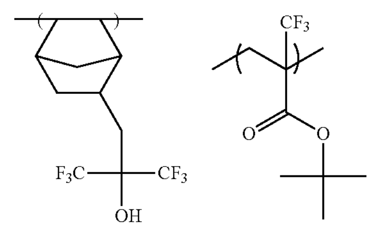

(CP-4)

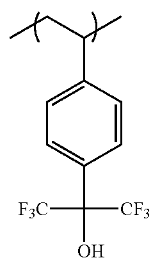

(CP-5)

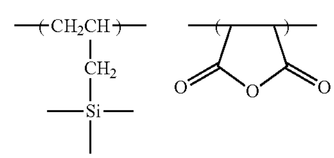

(CP-6)

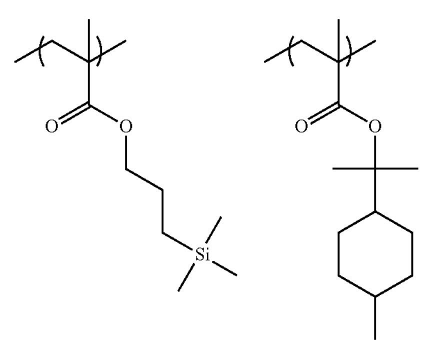

-continued
(CP-7)
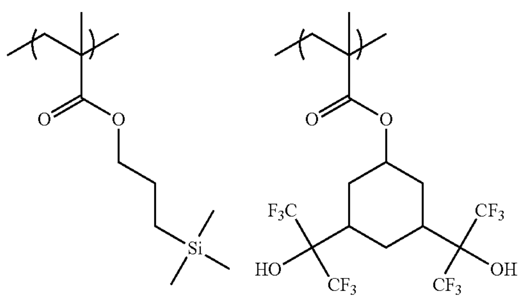
(CP-8)
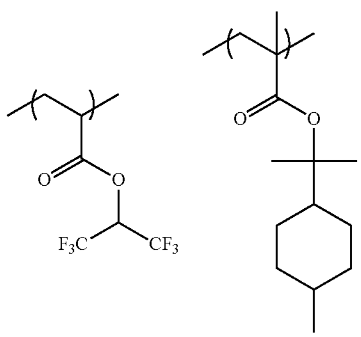
(CP-9)
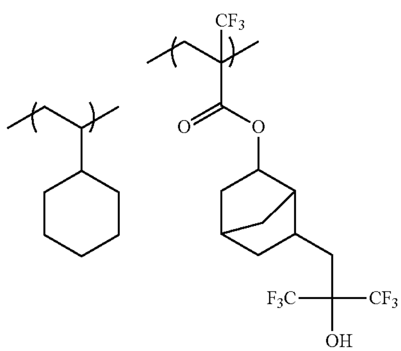
(CP-10)
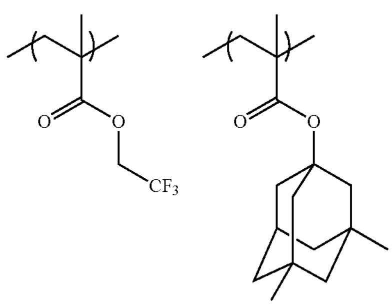
(CP-11)
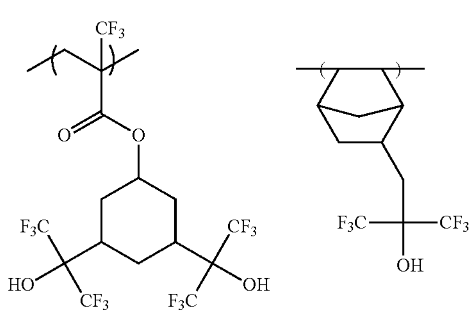
-continued
(CP-12)
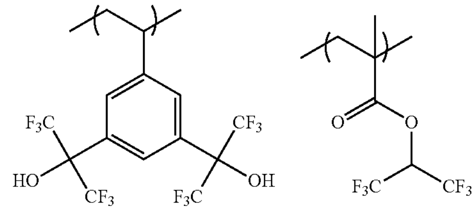
(CP-13)
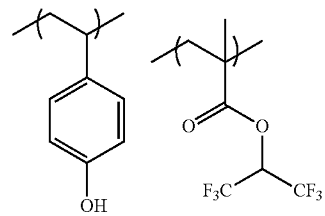
(CP-14)
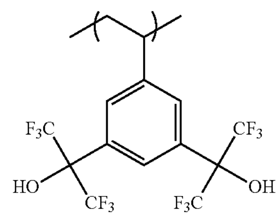
(CP-15)
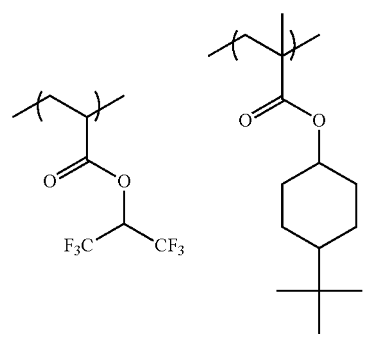
(CP-16)
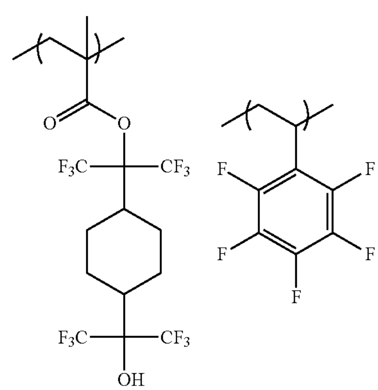
(CP-17)
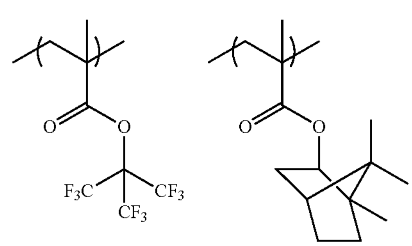

-continued
(CP-18)
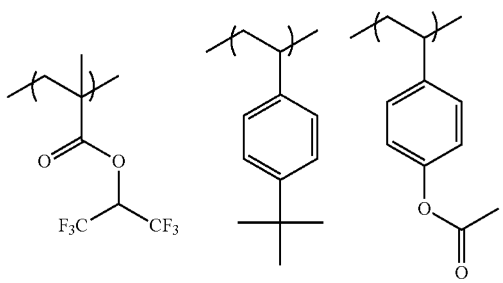
(CP-19)
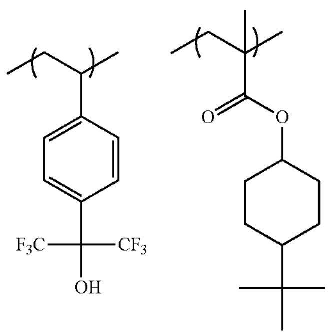
(CP-20)
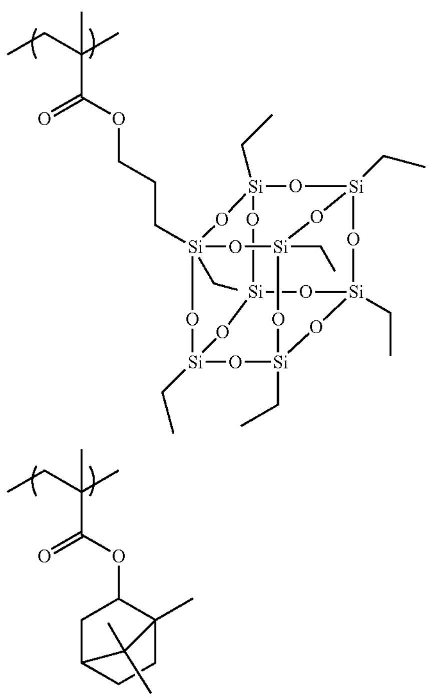
(CP-21)
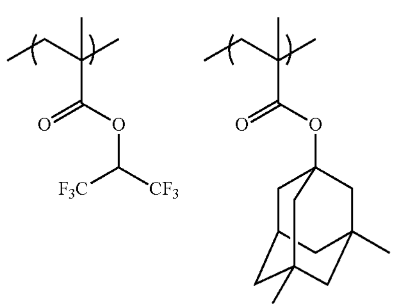
-continued
(CP-22)
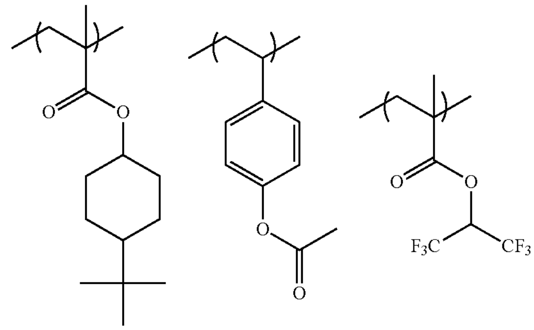
(CP-23)
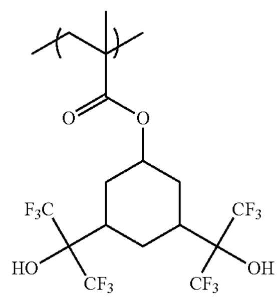
(CP-24)
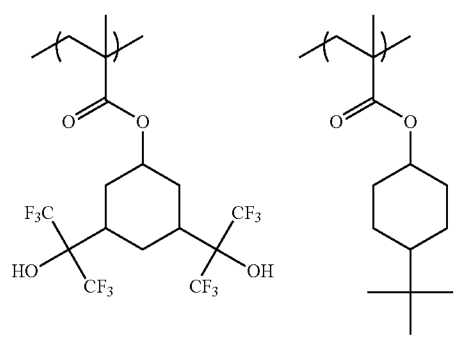
(CP-25)
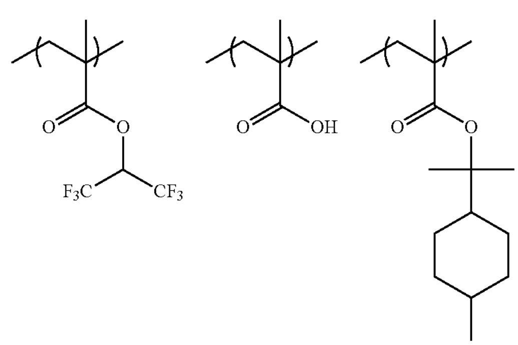

-continued
(CP-26)
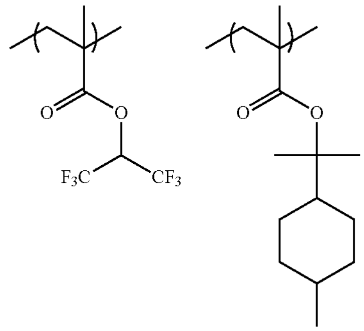
(CP-27)
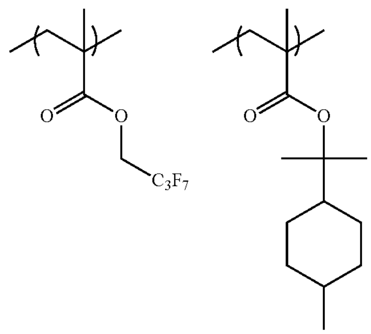
(CP-28)
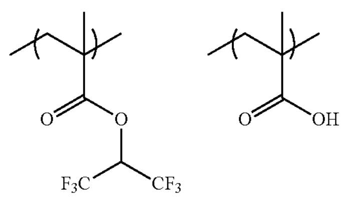
(CP-29)
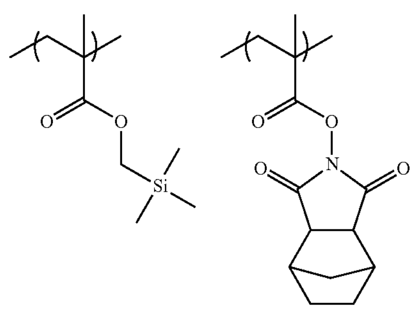
(CP-30)
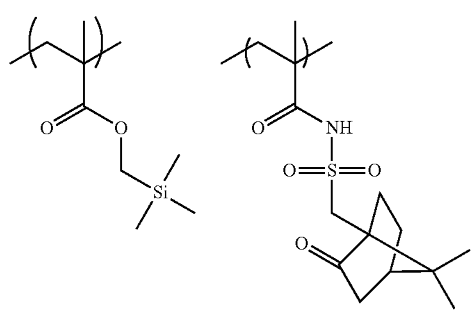
-continued
(CP-31)
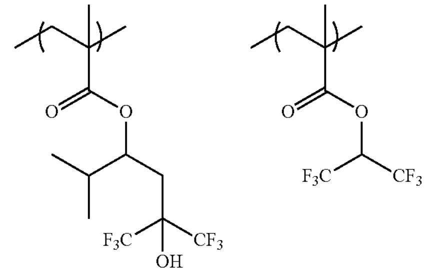
(CP-32)
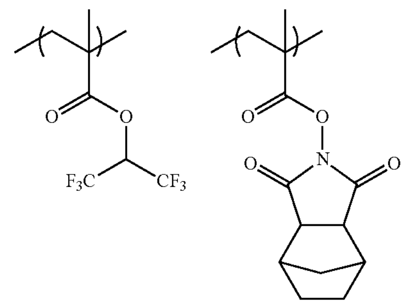
(CP-33)
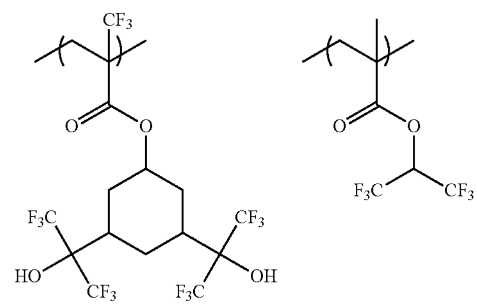
(CP-34)
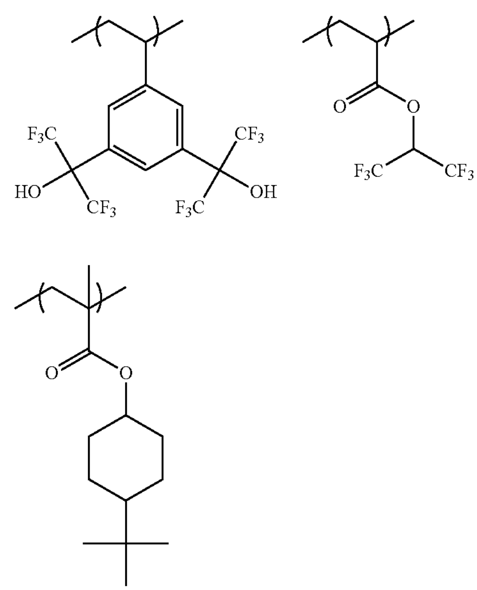

-continued
(CP-35)
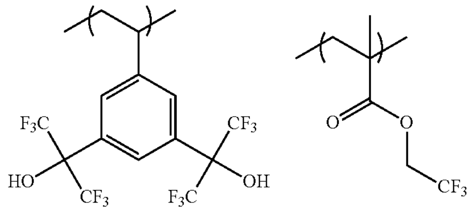
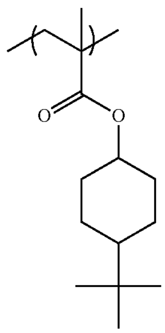
(CP-36)
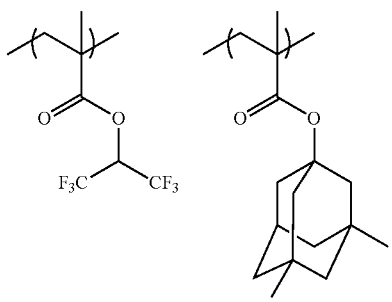
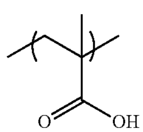
(CP-37)
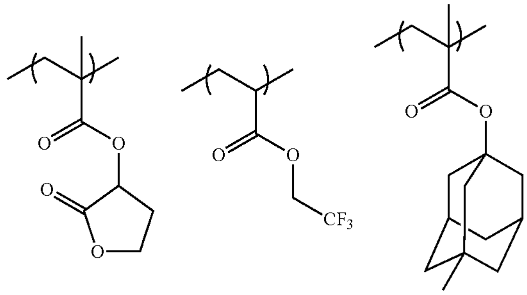
(CP-38)
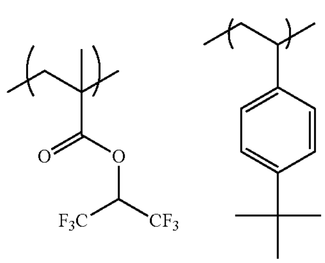
-continued
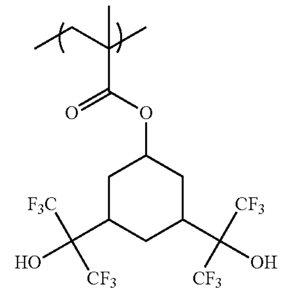
(CP-39)
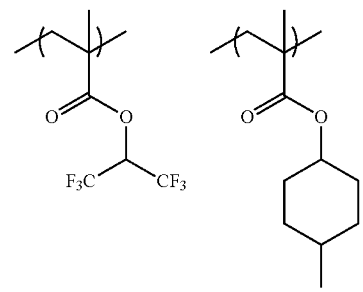
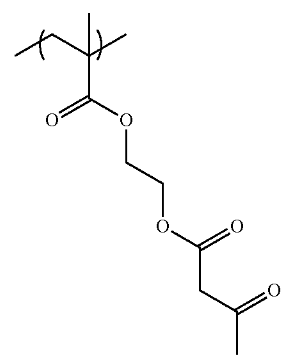
(CP-40)
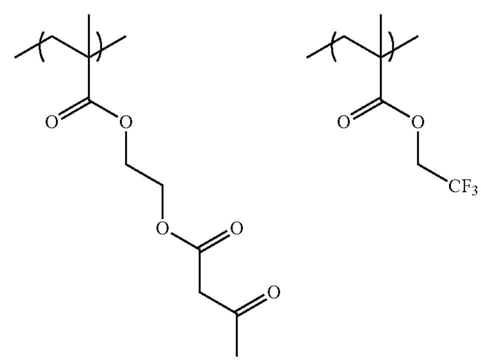
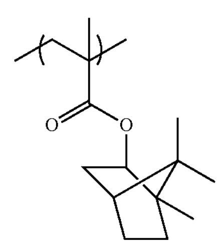

-continued
(CP-41)
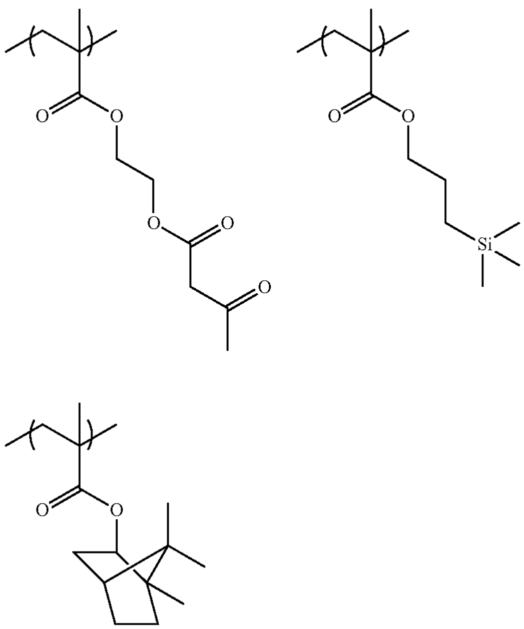
(CP-42)
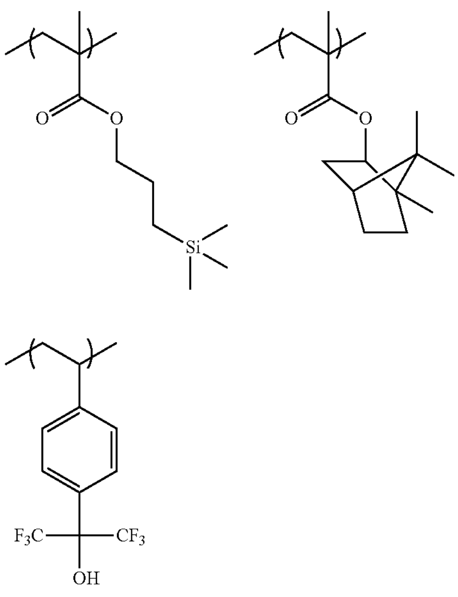
(CP-43)
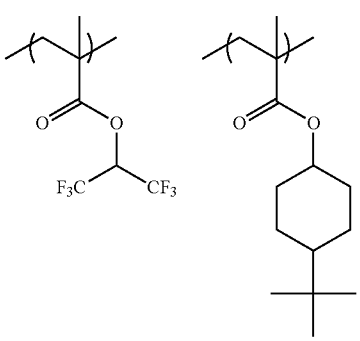
-continued
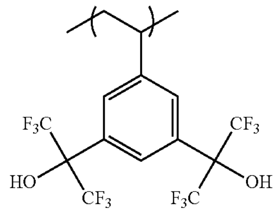
(CP-44)
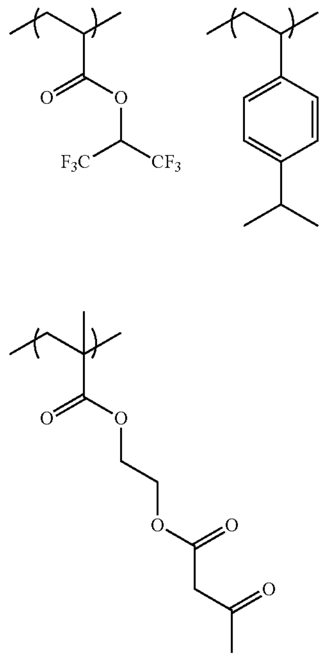
(CP-45)
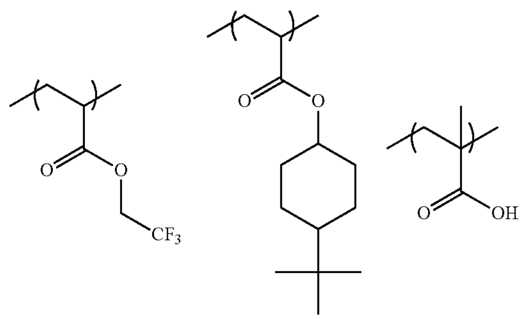
(CP-46)
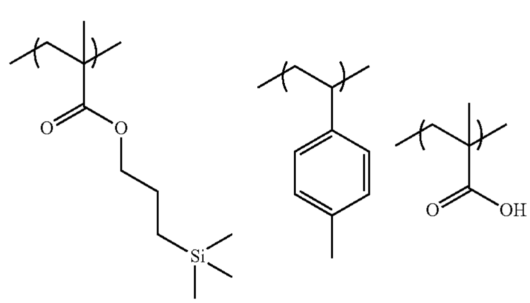

-continued
(CP-47)
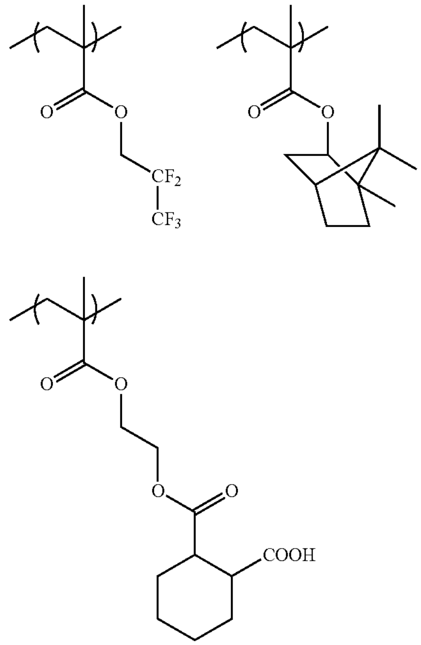
(CP-48)
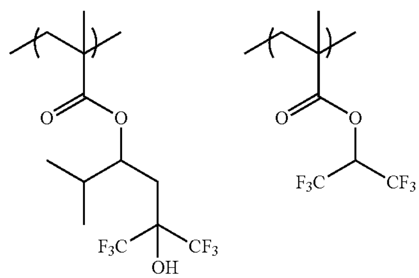
(CP-49)
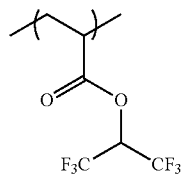
(CP-50)
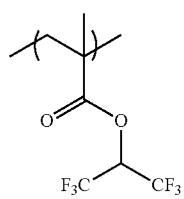
(CP-51)
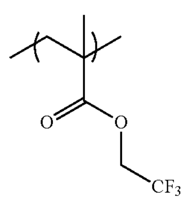
-continued
(CP-52)
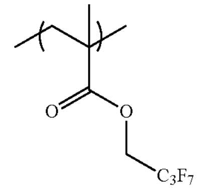
(CP-53)
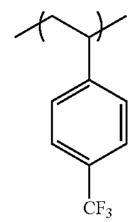
(CP-54)
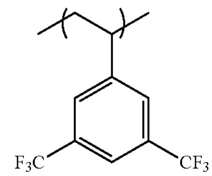
(CP-55)
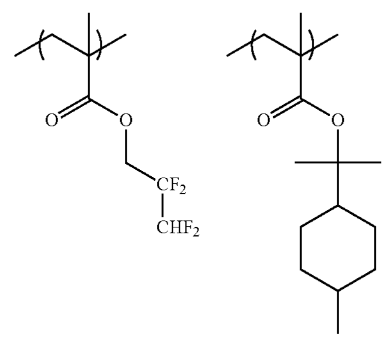
(CP-56)
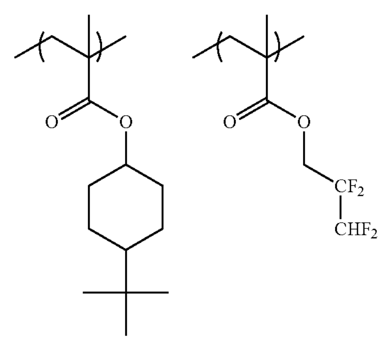
(CP-57)
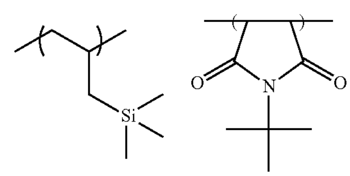

-continued
(CP-58)
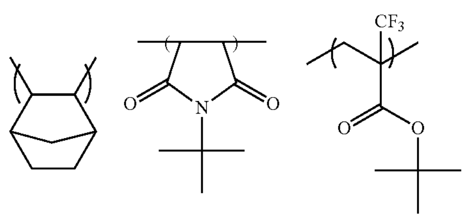
(CP-59)
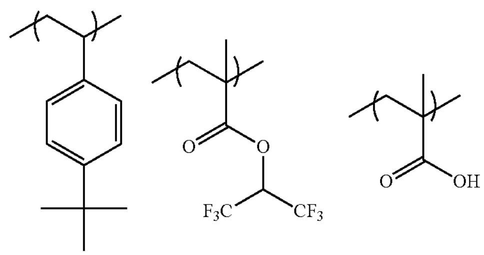
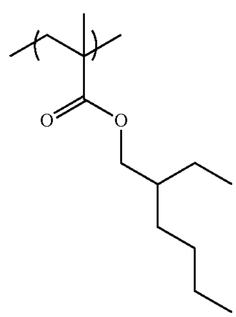
(CP-60)
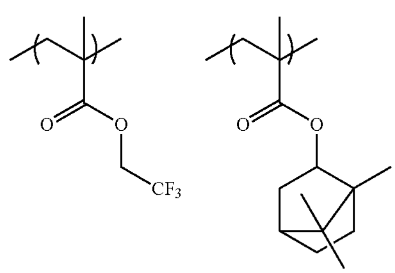
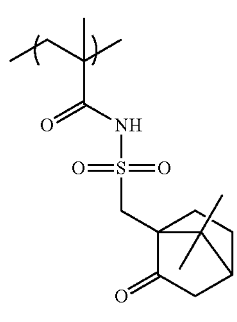
-continued
(CP-61)
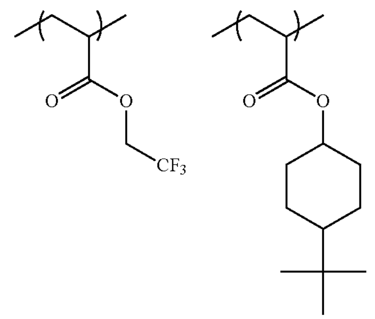
(CP-62)
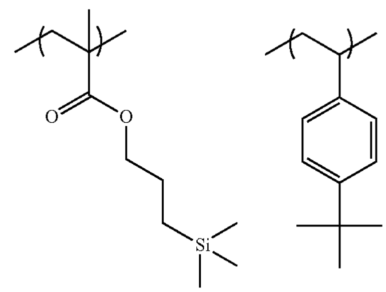
(CP-63)
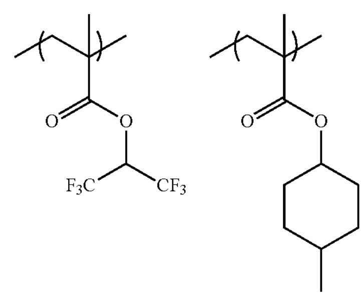
(CP-64)
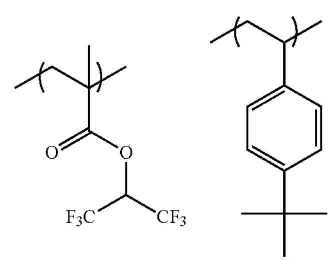
(CP-65)
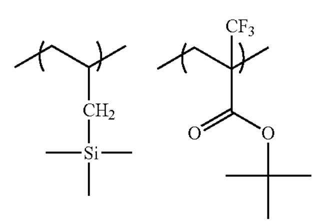

-continued
(CP-66)
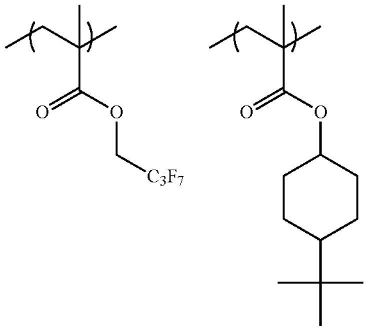
(CP-67)
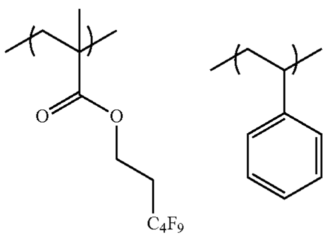
(CP-68)
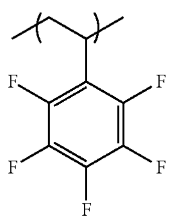
(CP-69)
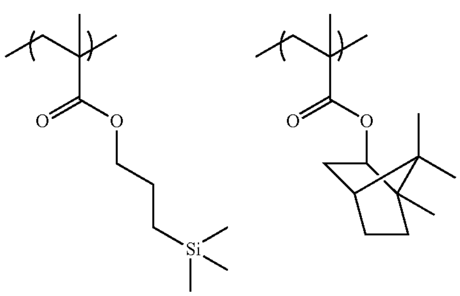
(CP-70)
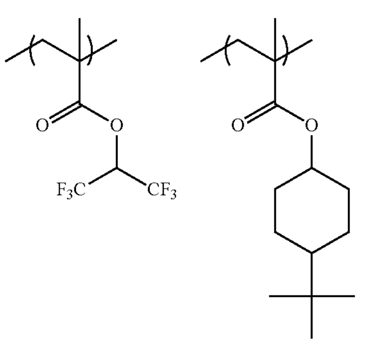
(CP-71)
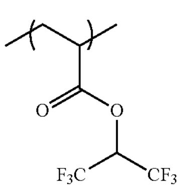
-continued
(CP-72)
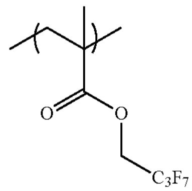
(CP-73)
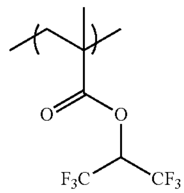
(CP-74)
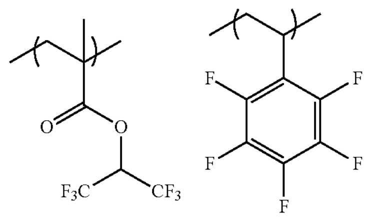
(CP-75)
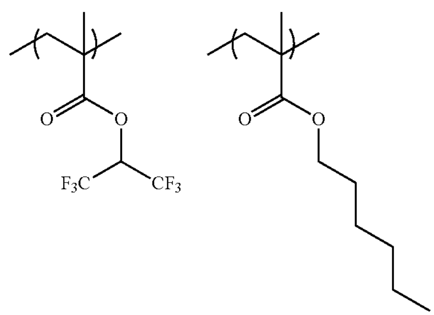
(CP-76)
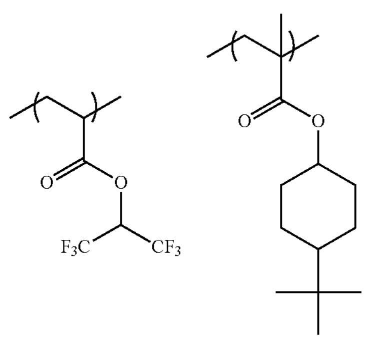
(CP-77)
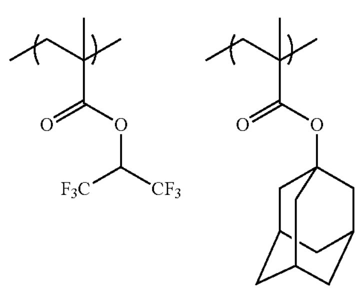

-continued
(CP-78)
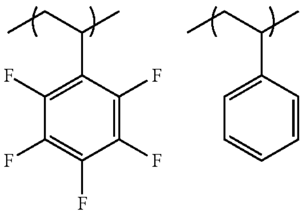
(CP-79)
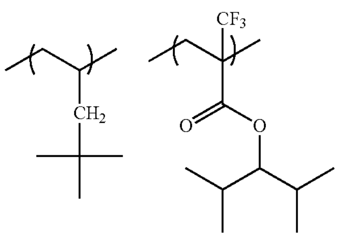
(CP-80)
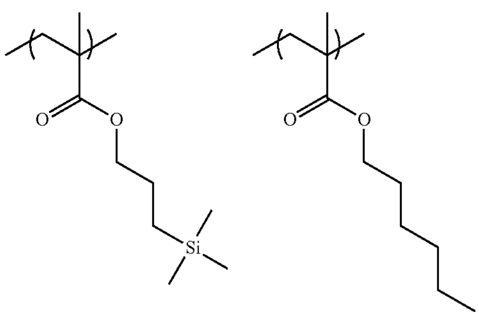
(CP-81)
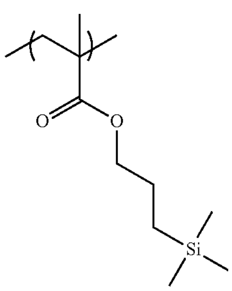
(CP-82)
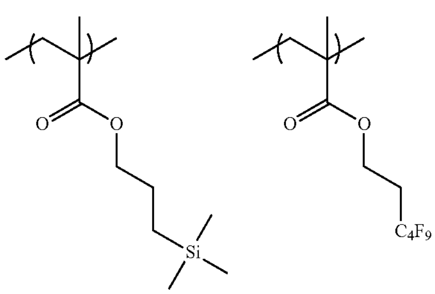
-continued
(CP-83)
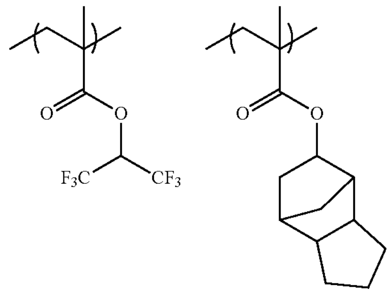
(CP-84)
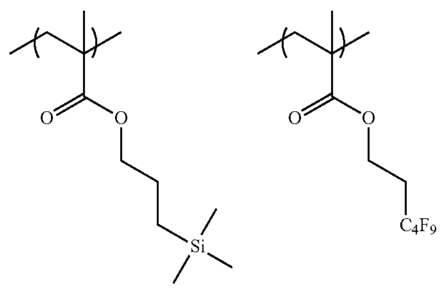
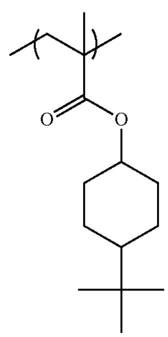
(CP-85)
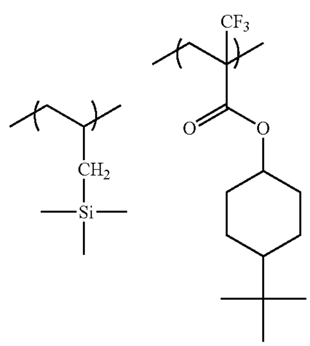
(CP-86)
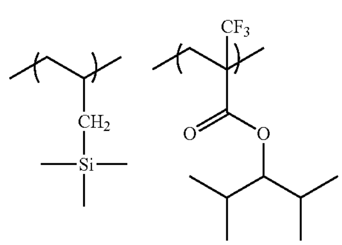

-continued
(CP-87)
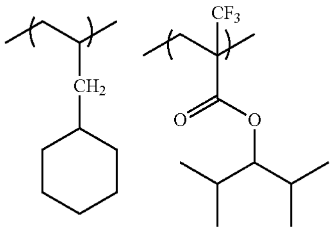
(CP-88)
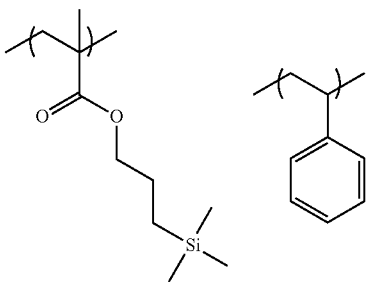
(CP-89)
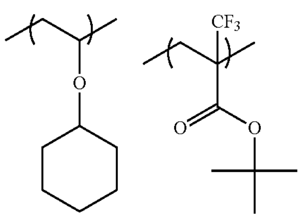
(CP-90)
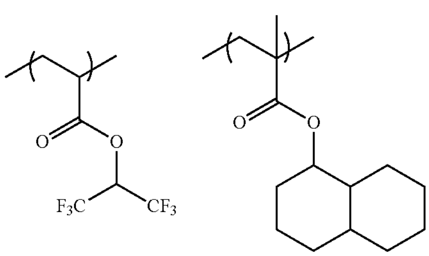
(CP-91)
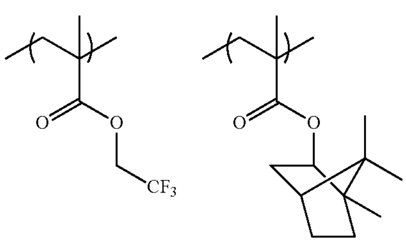
(CP-92)
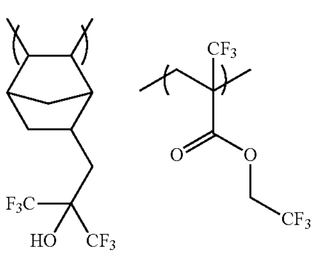
-continued
(CP-93)
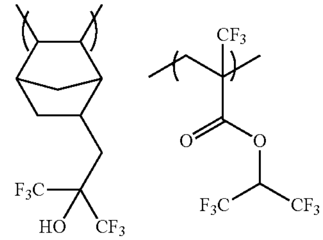
(CP-94)
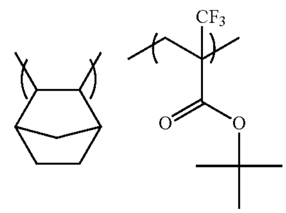
(CP-95)
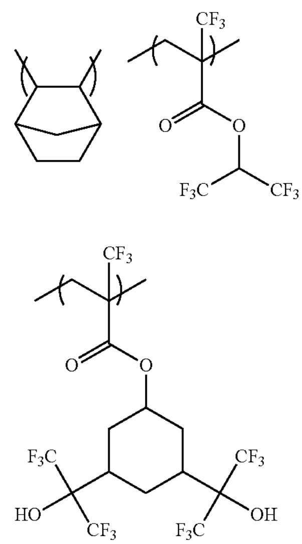
(CP-96)
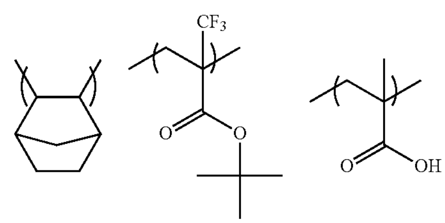
(CP-97)
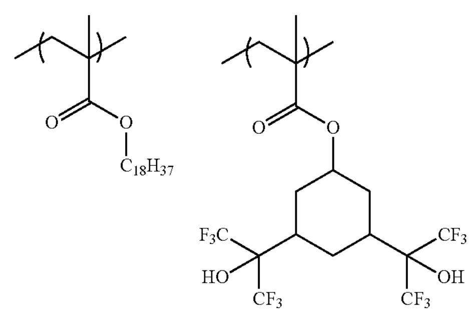

-continued
(CP-98)
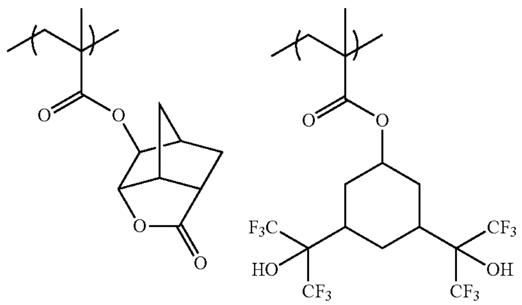
(CP-99)
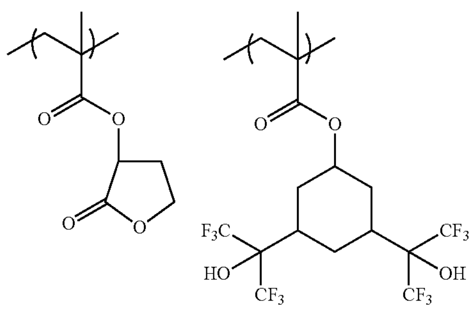
(CP-100)
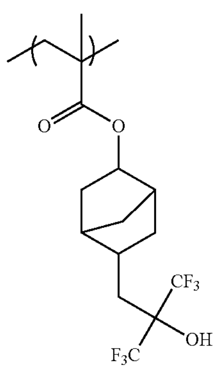
(CP-101)
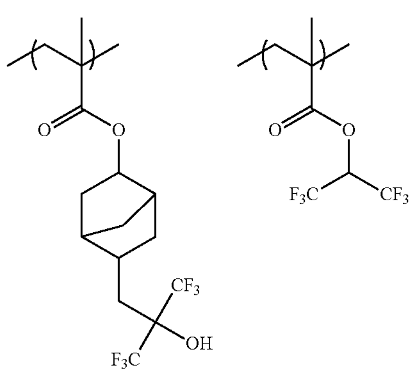
-continued
(CP-102)
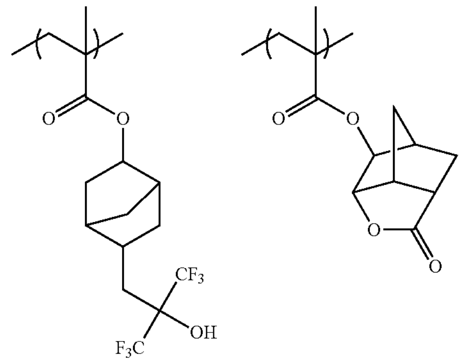
(CP-103)
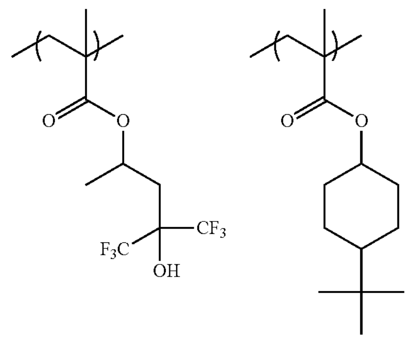
(CP-104)
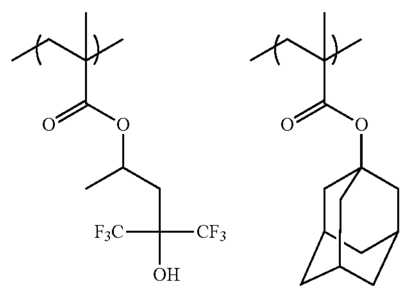
(CP-105)
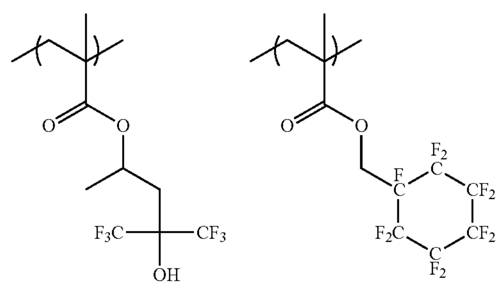
(CP-106)
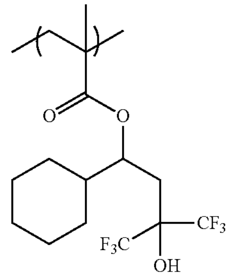

-continued (CP-107)

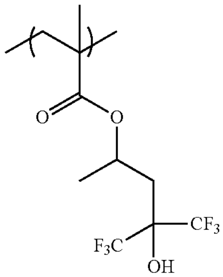

(CP-108)

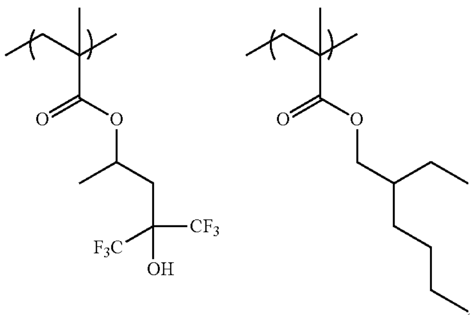

(CP-109)

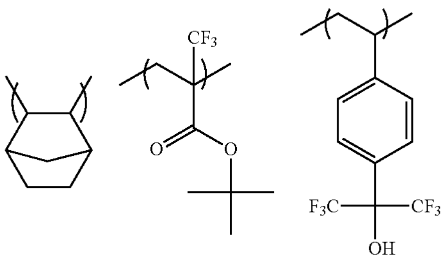

TABLE 2

| Resin | Composition | Mw | Mw/Mn |
|---|---|---|---|
| CP-1 | 50/50 | 6000 | 1.5 |
| CP-2 | 50/50 | 7500 | 1.4 |
| CP-3 | 50/50 | 6000 | 1.4 |
| CP-4 | 100 | 9000 | 1.5 |
| CP-5 | 50/50 | 6000 | 1.4 |
| CP-6 | 40/60 | 8000 | 1.4 |
| CP-7 | 60/40 | 6000 | 1.4 |
| CP-8 | 50/50 | 6500 | 1.4 |
| CP-9 | 50/50 | 8000 | 1.4 |
| CP-10 | 50/50 | 6500 | 1.4 |
| CP-11 | 50/50 | 10000 | 1.6 |
| CP-12 | 40/60 | 7500 | 1.4 |
| CP-13 | 40/60 | 6500 | 1.4 |
| CP-14 | 100 | 8500 | 1.4 |
| CP-15 | 40/60 | 7000 | 1.4 |
| CP-16 | 60/40 | 7500 | 1.4 |
| CP-17 | 40/60 | 6000 | 1.4 |
| CP-18 | 50/30/20 | 5000 | 1.4 |
| CP-19 | 40/60 | 8500 | 1.5 |
| CP-20 | 40/60 | 5500 | 1.4 |
| CP-21 | 50/50 | 6000 | 1.4 |
| CP-22 | 40/20/40 | 5500 | 1.4 |
| CP-23 | 100 | 9500 | 1.5 |
| CP-24 | 40/60 | 8500 | 1.4 |
| CP-25 | 50/10/40 | 8000 | 1.5 |
| CP-26 | 50/50 | 6000 | 1.4 |
| CP-27 | 50/50 | 5000 | 1.4 |
| CP-28 | 70/30 | 9000 | 1.4 |
| CP-29 | 50/50 | 7500 | 1.4 |
| CP-30 | 60/40 | 9000 | 1.5 |
| CP-31 | 80/20 | 10000 | 1.5 |
| CP-32 | 40/60 | 8500 | 1.4 |

TABLE 2-continued

| Resin | Composition | Mw | Mw/Mn |
|---|---|---|---|
| CP-33 | 30/70 | 5500 | 1.4 |
| CP-34 | 20/40/40 | 6500 | 1.4 |
| CP-35 | 20/50/30 | 7000 | 1.4 |
| CP-36 | 35/35/30 | 9000 | 1.5 |
| CP-37 | 25/45/30 | 9000 | 1.5 |
| CP-38 | 30/50/20 | 6000 | 1.4 |
| CP-39 | 40/40/20 | 8000 | 1.5 |
| CP-40 | 10/50/40 | 7000 | 1.4 |
| CP-41 | 30/30/40 | 6500 | 1.3 |
| CP-42 | 40/30/30 | 8000 | 1.5 |
| CP-43 | 40/40/20 | 6000 | 1.3 |
| CP-44 | 50/20/30 | 9500 | 1.5 |
| CP-45 | 45/40/15 | 7000 | 1.3 |
| CP-46 | 50/30/20 | 8000 | 1.5 |
| CP-47 | 35/25/40 | 10000 | 1.5 |
| CP-48 | 50/50 | 8000 | 1.5 |
| CP-49 | 100 | 5000 | 1.3 |
| CP-50 | 100 | 6000 | 1.3 |
| CP-51 | 100 | 4500 | 1.3 |
| CP-52 | 100 | 5000 | 1.5 |
| CP-53 | 100 | 5000 | 1.5 |
| CP-54 | 100 | 5500 | 1.4 |
| CP-55 | 50/50 | 9000 | 1.5 |
| CP-56 | 80/20 | 9000 | 1.5 |
| CP-57 | 50/50 | 6500 | 1.4 |
| CP-58 | 50/25/25 | 6500 | 1.5 |
| CP-59 | 58/38/2/2 | 4500 | 1.4 |
| CP-60 | 40/40/20 | 5500 | 1.5 |
| CP-61 | 60/40 | 8000 | 1.4 |
| CP-62 | 50/50 | 7500 | 1.3 |
| CP-63 | 50/50 | 8000 | 1.3 |
| CP-64 | 50/50 | 7000 | 1.3 |
| CP-65 | 50/50 | 8000 | 1.5 |
| CP-66 | 60/40 | 6000 | 1.3 |
| CP-67 | 70/30 | 8000 | 1.4 |
| CP-68 | 100 | 8000 | 1.5 |
| CP-69 | 50/50 | 9500 | 1.6 |
| CP-70 | 50/50 | 7000 | 1.3 |
| CP-71 | 100 | 6000 | 1.4 |
| CP-72 | 100 | 8000 | 1.5 |
| CP-73 | 100 | 7000 | 1.5 |
| CP-74 | 50/50 | 6000 | 1.5 |
| CP-75 | 70/30 | 6000 | 1.5 |
| CP-76 | 50/50 | 4000 | 1.2 |
| CP-77 | 60/40 | 6000 | 1.3 |
| CP-78 | 80/20 | 8000 | 1.5 |
| CP-79 | 50/50 | 6000 | 1.4 |
| CP-80 | 80/20 | 7000 | 1.5 |
| CP-81 | 100 | 5000 | 1.3 |
| CP-82 | 50/50 | 4000 | 1.3 |
| CP-83 | 50/50 | 6000 | 1.3 |
| CP-84 | 30/30/40 | 6000 | 1.5 |
| CP-85 | 50/50 | 8000 | 1.6 |
| CP-86 | 50/50 | 7000 | 1.3 |
| CP-87 | 50/50 | 6000 | 1.5 |
| CP-88 | 60/40 | 4500 | 1.3 |
| CP-89 | 50/50 | 7500 | 1.5 |
| CP-90 | 60/40 | 8000 | 1.6 |
| CP-91 | 60/40 | 6000 | 1.3 |
| CP-92 | 50/50 | 4500 | 1.3 |
| CP-93 | 50/50 | 5000 | 1.4 |
| CP-94 | 50/50 | 3500 | 1.3 |
| CP-95 | 40/30/30 | 4500 | 1.4 |
| CP-96 | 50/45/5 | 5000 | 1.5 |
| CP-97 | 20/80 | 10000 | 1.5 |
| CP-98 | 30/70 | 9500 | 1.4 |
| CP-99 | 20/80 | 7500 | 1.3 |
| CP-100 | 100 | 5500 | 1.5 |
| CP-101 | 80/20 | 5000 | 1.3 |
| CP-102 | 70/30 | 8000 | 1.4 |
| CP-103 | 80/20 | 9500 | 1.4 |
| CP-104 | 80/20 | 7000 | 1.4 |
| CP-105 | 80/20 | 5000 | 1.5 |
| CP-106 | 100 | 10500 | 1.4 |
| CP-107 | 100 | 8000 | 1.5 |
| CP-108 | 90/10 | 9500 | 1.5 |
| CP-109 | 40/40/20 | 5000 | 1.4 |

With respect to the film formed from the actinic ray-sensitive or radiation-sensitive resin composition of the present invention, the exposure may also be performed by filling a liquid (immersion medium) having a refractive index higher than that of air between the resist film and a lens at the irradiation with an actinic ray or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is intermixed, this incurs distortion of the optical image projected on the resist film. Therefore, the water used is preferably distilled water. Pure water obtained by further filtering the distilled water through an ion exchange filter or the like may also be used.

The electrical resistance of water as the immersion liquid is preferably 18.3 MQcm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or deuterium water ($D_2O$) may be used in place of water.

In order to prevent the film from directly contacting with the immersion liquid, a film (hereinafter, sometimes referred to as a "topcoat") sparingly soluble in an immersion liquid may be provided between the film formed of the composition of the present invention and the immersion liquid. The functions required of the topcoat are suitability for coating as an overlayer of the resist, transparency to radiation particularly at 193 nm, and sparing solubility in the immersion liquid. The topcoat is preferably unmixable with the resist and capable of being uniformly applied as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resins (C) and (CP) are also suitable as the topcoat. If impurities are dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent less permeating the film. From the standpoint that the peeling step can be performed simultaneously with the development step of the film, the topcoat is preferably peelable with an alkali developer and for enabling the peeling with an alkali developer, the topcoat is preferably acidic, but in view of non-intermixing with the film, the topcoat may be neutral or alkaline.

With no difference in the refractive index between the topcoat and the immersion liquid, the resolution is enhanced. In the case of using water as the immersion liquid at the exposure by an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used for the topcoat is preferably a medium that is sparingly soluble in the solvent used for the composition of the present invention and insoluble in water. In the case where the immersion liquid is an organic solvent, the topcoat may be either water-soluble or water-insoluble.

[4] Solvent

Examples of the solvent that can be used at the time of preparing the actinic ray-sensitive or radiation-sensitive resin composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate (PGMEA; also known as 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether (PGME; also known as 1-methoxy-2-propanol), propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent that can be preferably used is a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent not containing a hydroxyl group may be used as the organic solvent.

As for the solvent containing a hydroxyl group and the solvent not containing a hydroxyl group, the compounds illustrated above as examples may be appropriately selected, but preferred examples of the solvent containing a hydroxyl group include an alkylene glycol monoalkyl ether and an alkyl lactate, with propylene glycol monomethyl ether and ethyl lactate being more preferred. Preferred examples of the solvent not containing a hydroxyl group include an alkylene glycol monoalkyl ether acetate, an alkyl alkoxypropionate, a monoketone compound which may contain a ring, a cyclic lactone and an alkyl acetate. Among these, propylene glycol monomethyl ether acetate, ethyl ethoxypropionate, 2-heptanone, γ-butyrolactone, cyclohexanone and butyl acetate are more preferred, and propylene glycol monomethyl ether acetate, ethyl ethoxypropionate and 2-heptanone are most preferred.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group is contained in a ratio of 50 mass % or more is preferred in view of coating uniformity.

The solvent preferably contains propylene glycol monomethyl ether acetate and is preferably a single solvent of propylene glycol monomethyl ether acetate or a mixed solvent of two or more kinds of solvents containing propylene glycol monomethyl ether acetate.

[5] Basic Compound

The actinic ray-sensitive or radiation-sensitive resin composition of the present invention preferably contains a basic compound for reducing the change of performance with aging from exposure until heating.

The basic compound is preferably a compound having a structure represented by the following formulae (A) to (E).

(A)

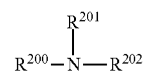

(B)

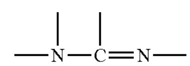

(C)

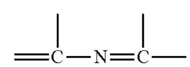

(D)

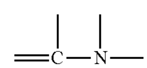

(E)

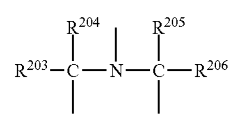

In formulae (A) and (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom. Also, an oxygen atom is preferably contained in the alkyl chain to form an oxyalkylene group. The number of oxyalkylene groups within the molecule is 1 or more, preferably from 3 to 9, more preferably from 4 to 6. Among oxyalkylene groups, structures of —$CH_2CH_2O$—, —$CH(CH_3)CH_2O$— and —$CH_2CH_2CH_2O$— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in [0066] of U.S. Patent Application Publication 2007/0224539.

One of these basic compounds may be used alone, or two or more kinds thereof may be used in combination.

The amount of the basic compound used is usually from 0.001 to 10 mass %, preferably from 0.01 to 5 mass %, based on the solid content of the actinic ray-sensitive or radiation-sensitive resin composition.

[6] (D) Low Molecular Compound having a Group Capable of Leaving by the Action of an Acid The composition of the present invention may contain (D) a low molecular compound having a group capable of leaving by the action of an acid (sometimes referred to as the "component (D)"). The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the low molecular compound having a group capable of leaving by the action of an acid is preferably from 100 to 1,000, more preferably from 100 to 700, still more preferably from 100 to 500.

In the case where the low molecular compound having a group capable of leaving by the action of an acid has a tertiary ester structure, the compound is preferably a carboxylic acid ester or unsaturated carboxylic acid ester represented by the following formula (1a):

(1a)

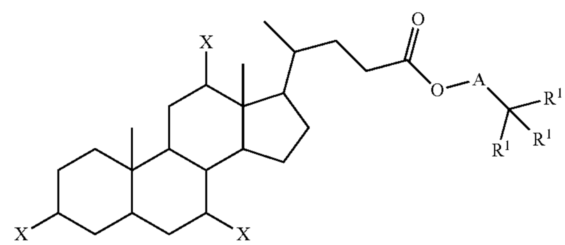

In formula (1a), each $R^1$ independently represents a monovalent alicyclic hydrocarbon group (preferably having a carbon number of 4 to 20) or a derivative thereof or an alkyl group (preferably having a carbon number of 1 to 4) and at the same time, at least one $R^1$ is the alicyclic hydrocarbon group or a derivative thereof or while any two $R^1$'s are combined with each other to form a divalent alicyclic hydrocarbon group (preferably having a carbon number of 4 to 20) or a derivative thereof together with the carbon atom to which they are bonded, the remaining $R^1$ represents an alkyl group (preferably having a carbon number of 1 to 4) or a monovalent alicyclic hydrocarbon group (preferably having a carbon number of 4 to 20) or a derivative thereof.

Each X independently represents a hydrogen atom or a hydroxy group, and at least one X is a hydroxy group.

A represents a single bond or a divalent linking group and is preferably a single bond or a group represented by -D-COO— (wherein D represents an alkylene group (preferably having a carbon number of 1 to 4)).

In formula (1a), examples of the divalent linking group as A include a methylene group, a methylenecarbonyl group, a methylenecarbonyloxy group, an ethylene group, an ethylenecarbonyl group, an ethylenecarbonyloxy group, a propylene group, a propylenecarbonyl group and a propylenecarbonyloxy group, with a methylenecarbonyloxy group being preferred.

In formula (1a), examples of the monovalent alicyclic hydrocarbon group (preferably having a carbon number of 4 to 20) of $R^1$ and the divalent alicyclic hydrocarbon group (preferably having a carbon number of 4 to 20) formed by combining any two $R^1$'s with each other include a group composed of an alicyclic ring derived from norbornane, tricyclodecane, tetracyclododecane, adamantane or cycloalkanes such as cyclobutane, cyclopentane, cyclohexane, cycloheptane and cyclooctane; and a group where the above-described group composed of an alicyclic ring is substituted by one or more kinds of or one or more groups of alkyl groups having a carbon number of 1 to 4, such as methyl group, ethyl group, n-propyl group, i-propyl group, n-butyl group, 2-methylpropyl group, 1-methylpropyl group and tert-butyl group, and cycloalkyl groups. Among these alicyclic hydrocarbon groups, preferred are a group composed of an alicyclic ring derived from norbornane, tricyclodecane, tetracyclododecane, adamantane, cyclopentane or cyclohexane, and a group where the group composed of an alicyclic ring is substituted by the alkyl group above.

Examples of the derivative of the alicyclic hydrocarbon group include a group having one or more kinds of or one or more groups of substituents such as a hydroxyl group; a carboxyl group; an oxo group (i.e., =O); a hydroxyalkyl group having a carbon number of 1 to 4, e.g., hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group and 4-hydroxybutyl group; an alkoxyl group having a carbon number of 1 to 4, e.g., methoxy group, ethoxy group, n-propoxy group, i-propoxy group, n-butoxy group, 2-methylpropoxy group, 1-methylpropoxy group and tert-butoxy group; and a cyanoalkyl group having a carbon number of 2 to 5, e.g., cyanomethyl group, 2-cyanoethyl group, 3-cyanopropyl group and 4-cyanobutyl group. Among these substituents, a hydroxyl group, a carboxyl group, a hydroxymethyl group, a cyano group and a cyanomethyl group are preferred.

Examples of the alkyl group of $R^1$ include an alkyl group having a carbon number of 1 to 4, such as methyl group, ethyl group, n-propyl group, i-propyl group, n-butyl group, 2-methylpropyl group, 1-methylpropyl group and tert-butyl group. Among these alkyl groups, a methyl group, an ethyl group, an n-propyl group and an i-propyl group are preferred.

Specific preferred examples include the following compounds.

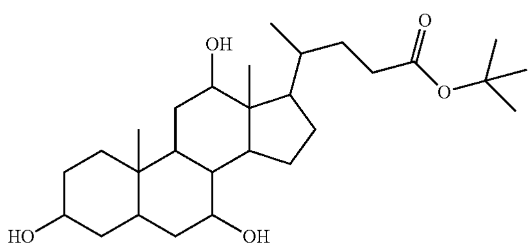

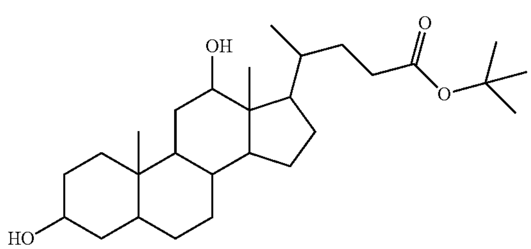

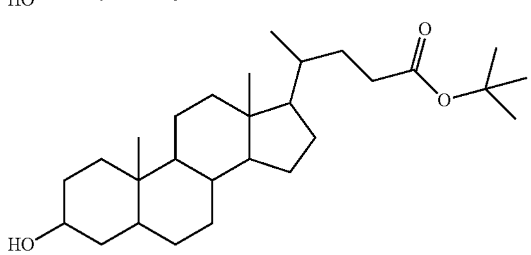

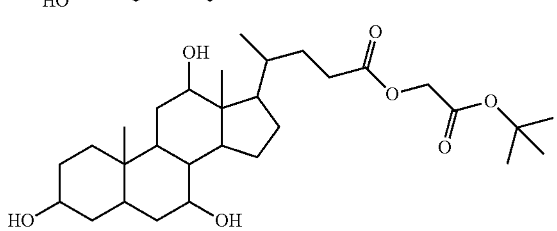

-continued

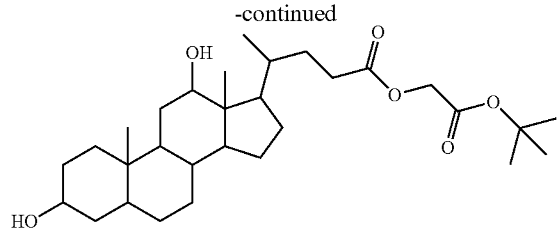

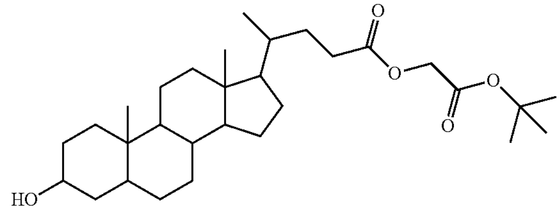

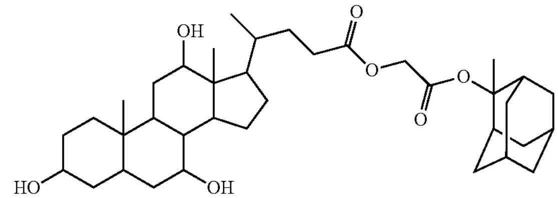

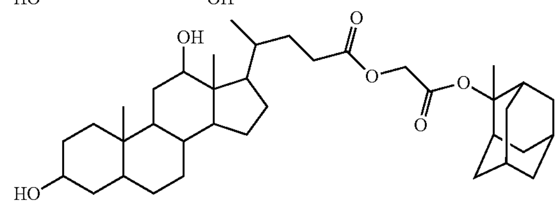

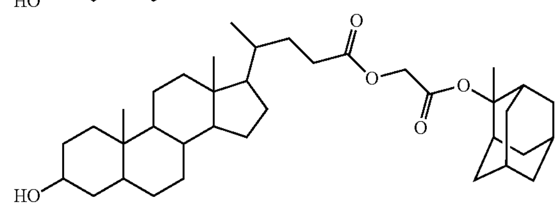

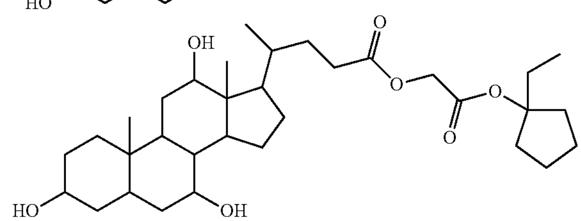

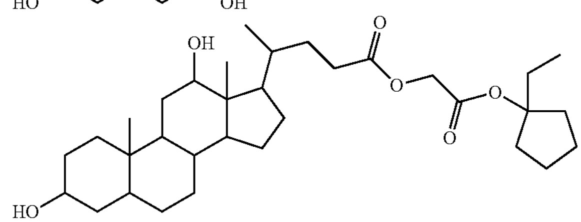

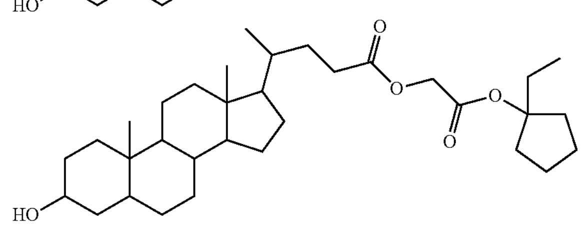

In the case where the low molecular compound is an unsaturated carboxylic acid ester, the compound is preferably a (meth)acrylic acid ester. Specific examples of the (meth)

acrylic acid tertiary eater having a tertiary alkyl group as the group capable of leaving by the action of an acid are set forth below, but the present invention is not limited thereto.
(In the formulae, Rx represents H, $CH_3$, $CF_3$ or $CH_2OH$, and each of Rxa and Rxb represents an alkyl group having a carbon number of 1 to 4.)
1
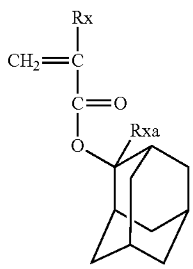
2
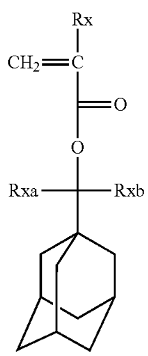
3
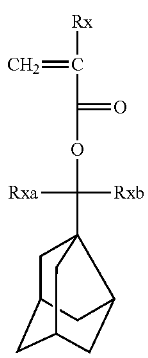
4
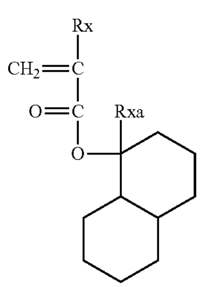
5
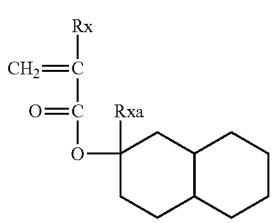
-continued
6
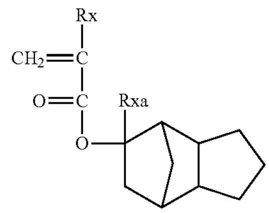
7
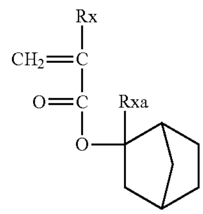
8
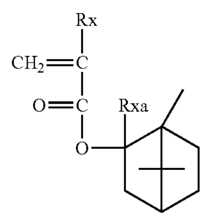
9
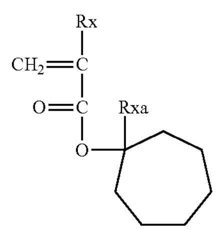
10
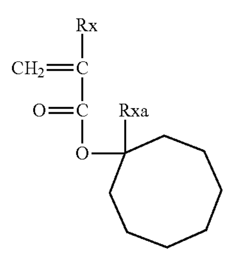
11
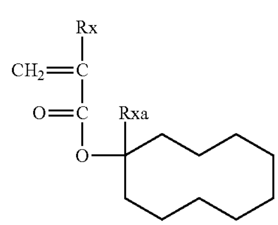
12
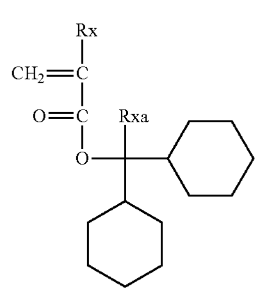

-continued

13

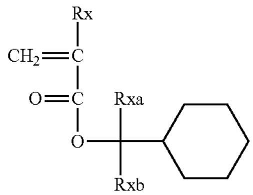

14

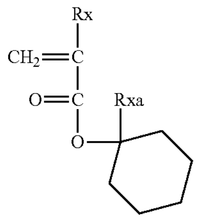

15

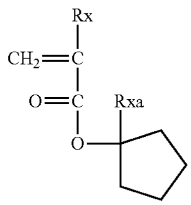

16

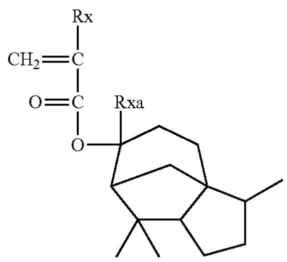

17

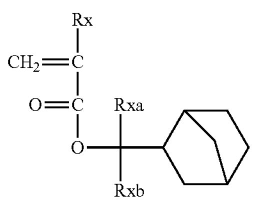

As for the low molecular compound (D) having a group capable of leaving by the action of an acid, a commercially available product may be used or the compound may be synthesized by a known method.

Also, an amine derivative having on the nitrogen atom a group capable of leaving by the action of an acid is preferred as the component D.

The component D may have a protective group-containing carbamate group on the nitrogen atom. The protective group constituting the carbamate group can be represented by the following formula (d-1):

(d-1)

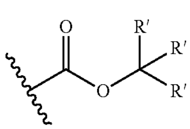

In formula (d-1), each R' independently represents a hydrogen atom, a linear, branched or cyclic alkyl group, an aryl group, an aralkyl group or an alkoxyalkyl group. Each R' may combine with every other R' to form a ring.

R' is preferably a linear or branched alkyl group, a cycloalkyl group or an aryl group, more preferably a linear or branched alkyl group or a cycloalkyl group.

Specific structures of the group represented by formula (d-1) are set forth below.

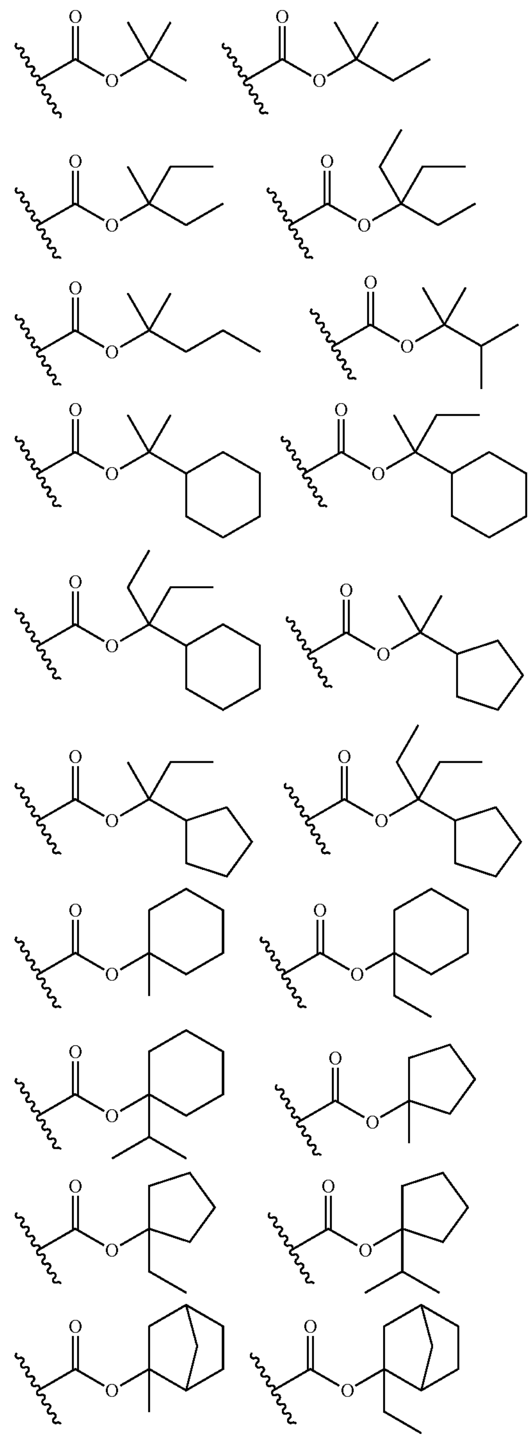

-continued

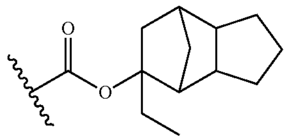

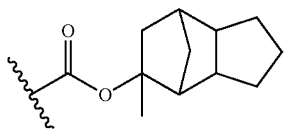

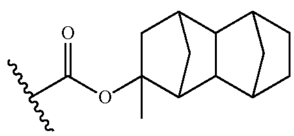

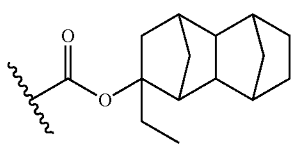

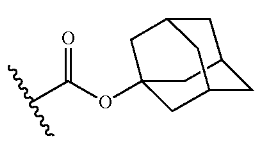

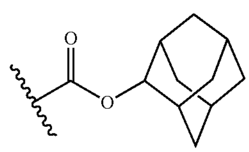

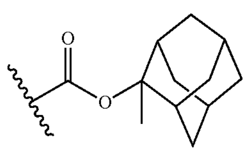

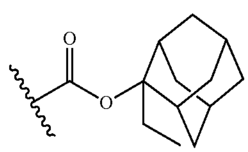

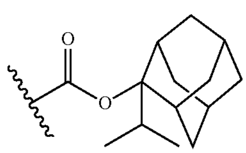

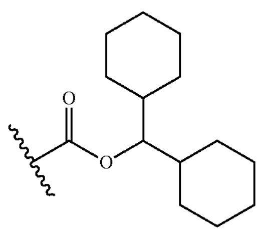

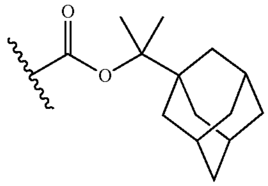

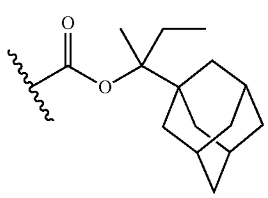

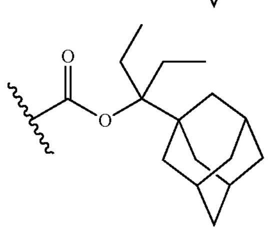

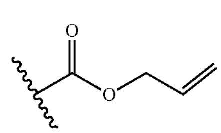

-continued

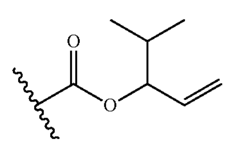

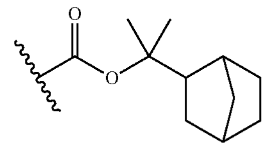

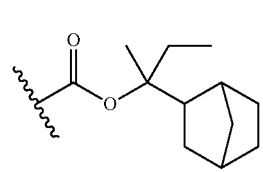

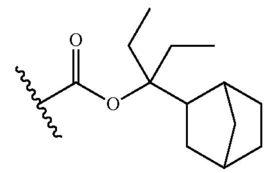

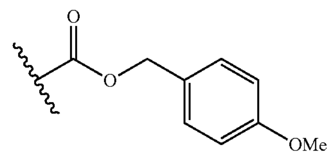

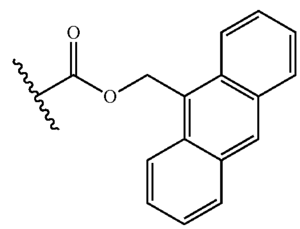

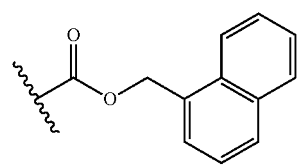

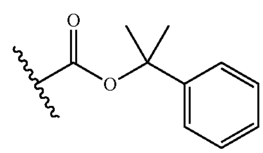

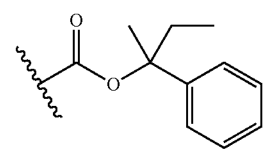

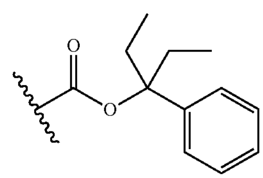

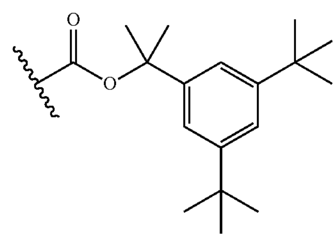

The component D may also be composed by arbitrarily combining the above-described basic compound and the structure represented by formula (d-1).

The component D is more preferably a compound having a structure represented by the following formula (A).

Incidentally, the component D may be a compound corresponding to the above-described basic compound as long as it is a low molecular compound having a group capable of leaving by the action of an acid.

(A)

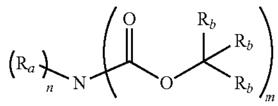

In formula (A), each Ra independently represents a hydrogen atom, an alkyl group, a cycloalkyl group, an aryl group or an aralkyl group. Also, when n=2, two Ra's may be the same or different, and two Ra's may combine with each other to form a heterocyclic hydrocarbon group (preferably having a carbon number of 20 or less) or a derivative thereof.

Each Rb independently represents a hydrogen atom, an alkyl group, a cycloalkyl group, an aryl group or an aralkyl group.

At least two Rb's may combine to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (A), the alkyl group, cycloalkyl group, aryl group and aralkyl group of Ra and Rb may be substitute by a functional group such as hydroxyl group, cyano group, amino group, pyrrolidino group, piperidino group, morpholino group and oxo group, an alkoxy group or a halogen atom.

Examples of the alkyl group, cycloalkyl group, aryl group and aralkyl group (these alkyl, cycloalkyl, aryl and aralkyl groups may be substituted by the above-described functional group, an alkoxy group or a halogen atom) of R include:

a group derived from a linear or branched alkane such as methane, ethane, propane, butane, pentane, hexane, heptane, octane, nonane, decane, undecane and dodecane, and a group where the group derived from an alkane is substituted by one or more kinds of or one or more groups of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, and a group where the group derived from a cycloalkane is substituted by one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, and a group where the group derived from an aromatic compound is substituted by one or more kinds of or one or more groups of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydropyran, tetrahydropyran, indole, indoline, quinoline, perhydroquinoline, indazole and benzimidazole, and a group where the group derived from a heterocyclic compound is substituted by one or more kinds of or one or more groups of linear or branched alkyl groups or aromatic compound-derived groups; a group where the group derived from a linear or branched alkane or the group derived from a cycloalkane is substituted by one or more kinds of or one or more groups of aromatic compound-derived groups such as phenyl group, naphthyl group and anthracenyl group; and a group where the substituent above is substituted by a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted by one or more kinds of or one or more groups of linear or branched alkane-derived groups, cycloalkane-derived groups, aromatic compound-derived groups, heterocyclic compound-derived groups, and functional groups such as hydroxyl group, cyano group, amino group, pyrrolidino group, piperidino group, morpholino group and oxo group.

Specific examples particularly preferred in the present invention include N-tert-butoxycarbonyldi-n-octylamine, N-tert-butoxycarbonyldi-n-nonylamine, N-tert-butoxycarbonyldi-n-decylamine, N-tert-butoxycarbonyldicyclohexylamine, N-tert-butoxycarbonyl-1-adamantylamine, N-tert-butoxycarbonyl-2-adamantylamine, N-tert-butoxycarbonyl-N-methyl-1-adamantylamine, (S)-(−)-1-(tert-butoxycarbonyl)-2-pyrrolidinemethanol, (R)-(+)-1-(tert-butoxycarbonyl)-2-pyrrolidinemethanol, N-tert-butoxycarbonyl-4-hydroxypiperidine, N-tert-butoxycarbonylpyrrolidine, N-tert-butoxycarbonylmorpholine, N-tert-butoxycarbonylpiperazine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N',N'-tetra-tert-butoxycarbonylhexamethylenediamine, N,N'-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole and N-tert-butoxycarbonyl-2-phenylbenzimidazole.

Specific examples of the component D particularly preferred in the present invention are set forth below, but the present invention is not limited thereto.

(D-1)

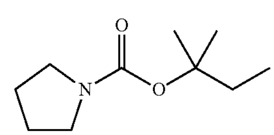

(D-2)

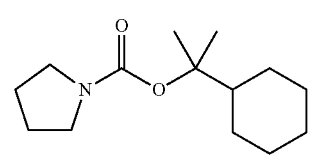

(D-3)
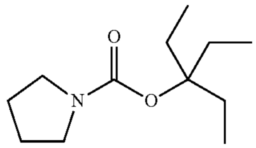
(D-4)
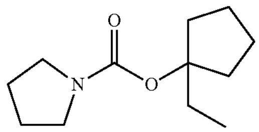
(D-5)
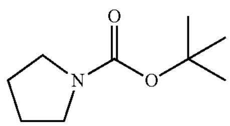
(D-6)
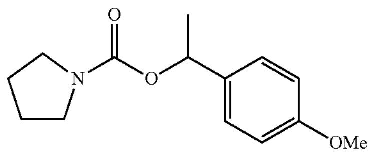
(D-7)
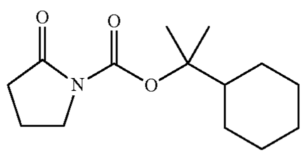
(D-8)
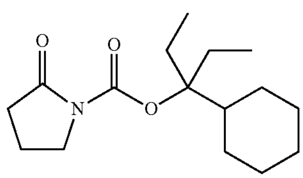
(D-9)
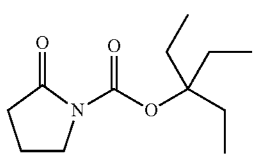
(D-10)
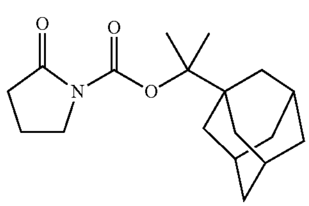
(D-11)
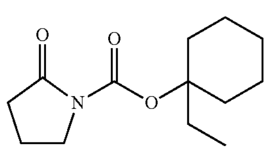
(D-12)
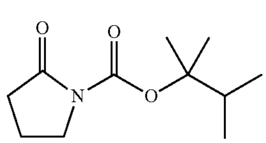
(D-13)
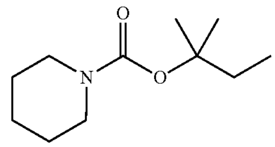
(D-14)
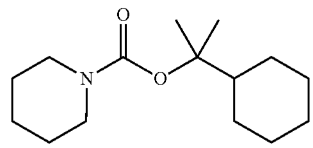
(D-15)
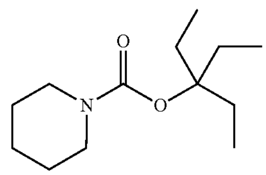
(D-16)
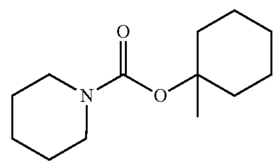
(D-17)
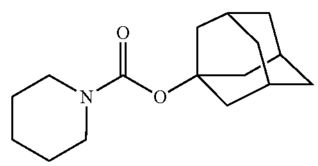
(D-18)
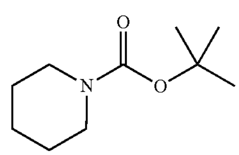
(D-19)
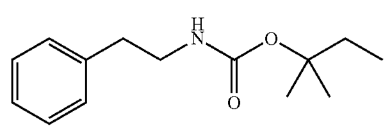
(D-20)
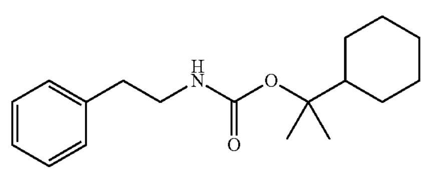
(D-21)
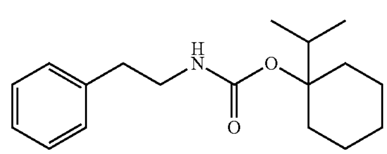
(D-22)
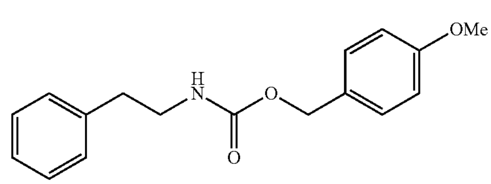

-continued
(D-23)
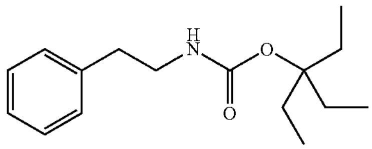
(D-24)
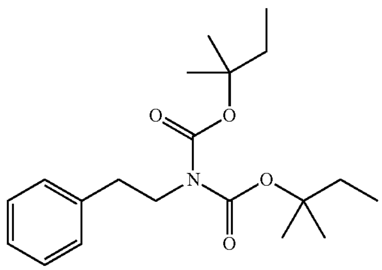
(D-25)
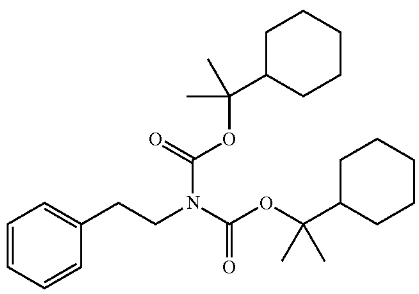
(D-26)
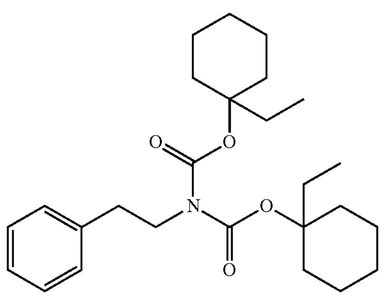
(D-27)
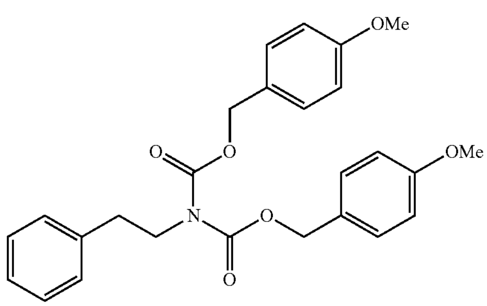
(D-28)
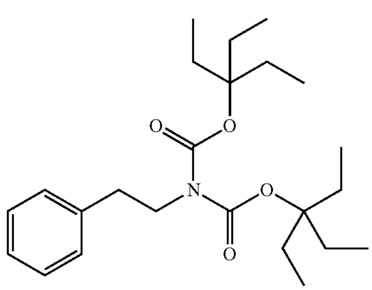
-continued
(D-29)
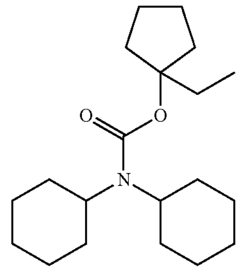
(D-30)
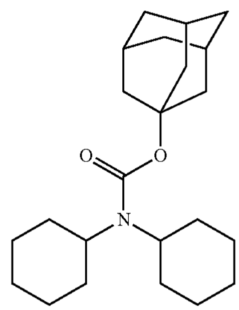
(D-31)
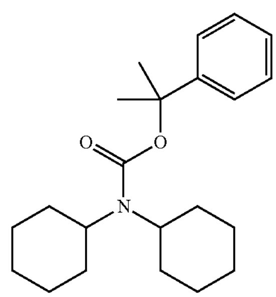
(D-32)
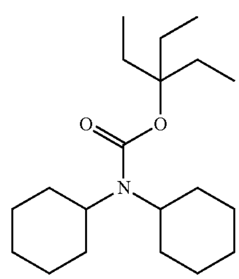
(D-33)
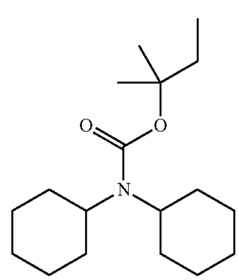

(D-34)
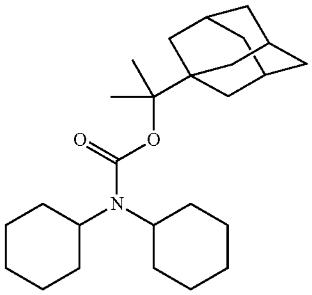
(D-35)
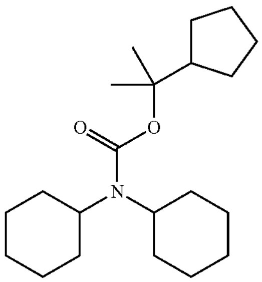
(D-36)
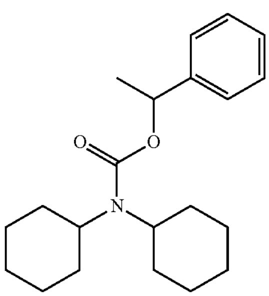
(D-37)
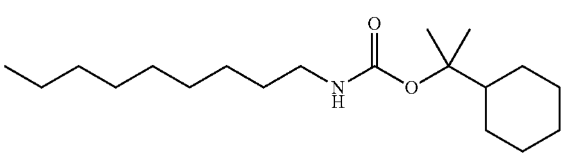
(D-38)
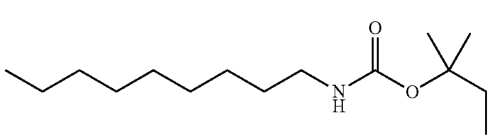
(D-39)
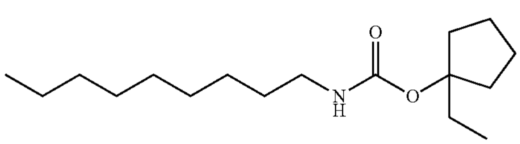
(D-40)
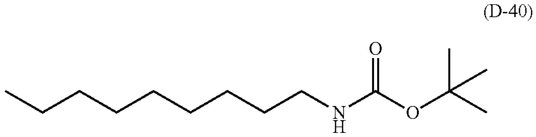
(D-41)
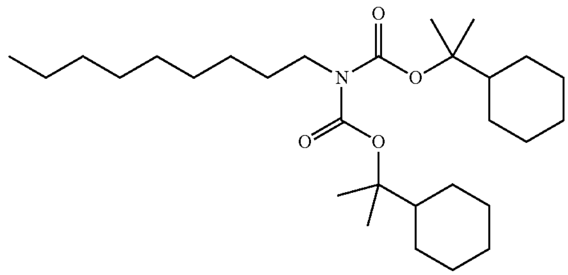
(D-42)
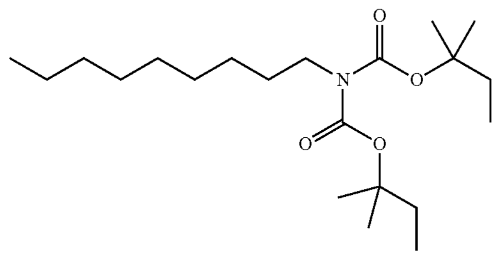
(D-43)
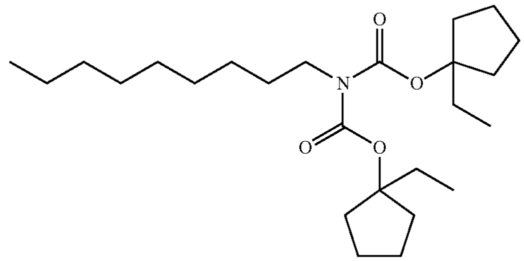
(D-44)
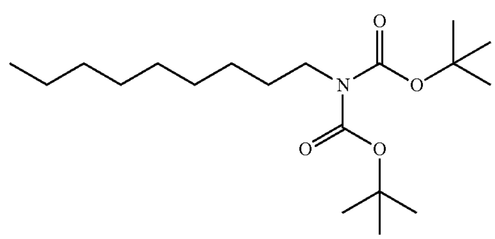
(D-45)
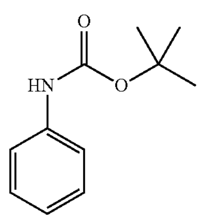
(D-46)
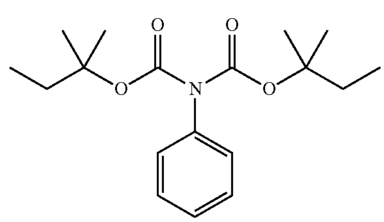

-continued (D-47)

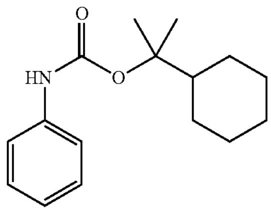

(D-48)

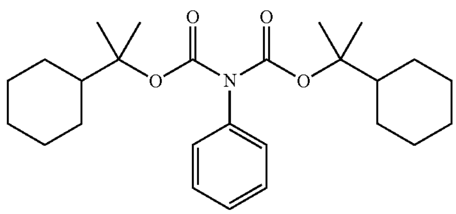

(D-49)

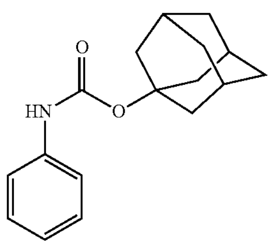

(D-50)

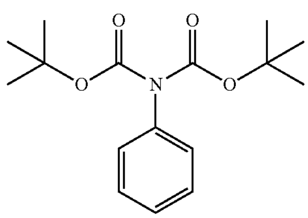

(D-51)

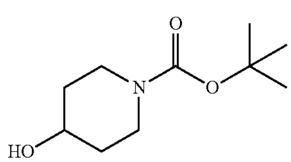

(D-52)

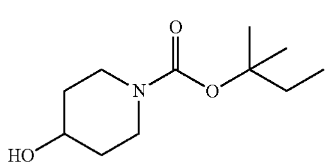

(D-53)

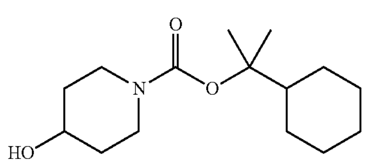

(D-54)

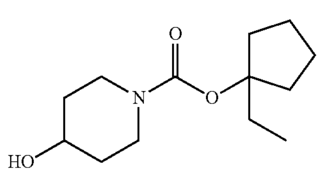

-continued (D-55)

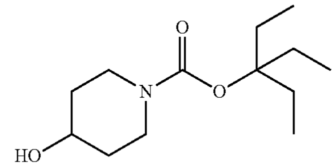

The compound represented by formula (A) can be easily synthesized from a commercially available amine by a method described, for example, in *Protective Groups in Organic Synthesis,* 4th edition. A most general method is a method of causing a dicarbonic acid ester or a haloformic acid ester to act on a commercially available amine to obtain the compound. In the formulae, X represents a halogen atom, and Ra and Rb have the same meanings as Ra and Rb in formula (A).

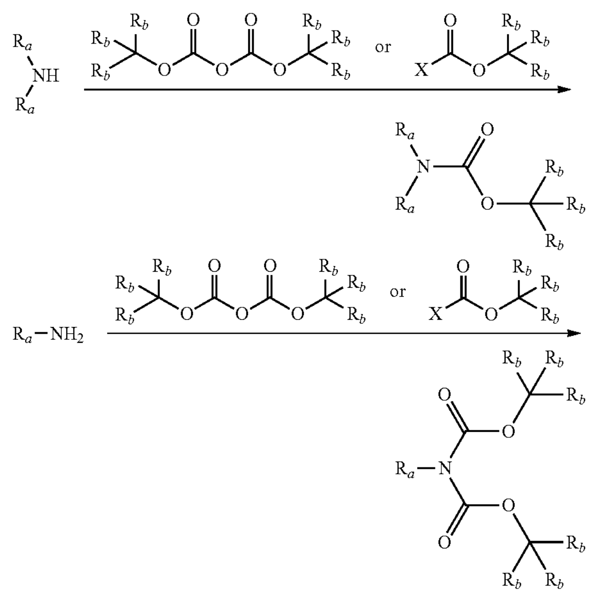

In the present invention, one kind of (D) a low molecular compound having a group capable of leaving by the action of an acid may be used alone, or two or more kinds of the compounds may be mixed and used.

In the present invention, the amount used of the low molecular compound (D) having a group capable of leaving by the action of an acid is usually from 0.001 to 20 mass %, preferably from 0.001 to 10 mass %, more preferably from 0.01 to 5 mass %, based on the entire solid compound of the composition combined with the above-described basic compound.

The ratio between the acid generator and the low molecular compound (D) having a group capable of leaving by the action of an acid, used in the composition, is preferably acid generator/[(D) low molecular compound having a group capable of leaving by the action of an acid+basic compound] (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure to heat treatment. The acid generator/[(D) low molecular compound having a group capable of leaving by the action of an acid+basic compound] (by mol) is more preferably from 5.0 to 200, still more preferably from 7.0 to 150.

[7] Surfactant

The actinic ray-sensitive or radiation-sensitive resin composition of the present invention may or may not further contain a surfactant and in the case of containing a surfactant, the surfactant is preferably any one of fluorine-containing and/or silicon-containing surfactants (a fluorine-containing surfactant, a silicon-containing surfactant and a surfactant containing both a fluorine atom and a silicon atom), or two or more kinds thereof.

By virtue of incorporating the above-described surfactant into the actinic ray-sensitive or radiation-sensitive resin composition of the present invention, a resist pattern with good performance in terms of sensitivity, resolution and adherence as well as less development defects can be provided when using an exposure light source of 250 nm or less, particularly 220 nm or less.

On the other hand, when the amount added of the surfactant is made small, for example, set to 10 ppm or less, uneven distribution of the component (C) to the surface is more successfully achieved, so that the resist film surface can be made more hydrophobic and the flowability of water at the immersion exposure can be enhanced.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

As for the surfactant, other than these known surfactants, a surfactant using a polymer having a fluoro-aliphatic group derived from a fluoro-aliphatic compound that is produced by a telomerization process (also called a telomer process) or an oligomerization process (also called an oligomer process), may be used. The fluoro-aliphatic compound can be synthesized by the method described in [0241] and [0242] of JP-A-2002-90991. The copolymer having a fluoro-aliphatic group may also be a copolymer of a fluoro-aliphatic group-containing monomer and a (poly(oxyalkylene)) acrylate and/or a (poly(oxyalkylene)) methacrylate.

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether), polyoxyethylene alkylaryl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or some of them may be used in combination.

The amount of the surfactant used is preferably from 0.0001 to 2 mass %, more preferably from 0.001 to 1 mass %, based on the entire amount of the actinic ray-sensitive or radiation-sensitive resin composition (excluding the solvent).

[8] Onium Carboxylate

The actinic ray-sensitive or radiation-sensitive resin composition of the present invention may contain an onium carboxylate. The onium carboxylate is preferably an iodonium salt or a sulfonium salt. The anion moiety is preferably a linear, branched, monocyclic or polycyclic alkyl carboxylate anion having a carbon number of 1 to 30, more preferably the carboxylate anion above with the alkyl group being partially or entirely fluorine-substituted. The alkyl chain may contain an oxygen atom. Thanks to such a construction, the transparency to light at 220 nm or less is ensured, the sensitivity and resolution are enhanced, and the iso/dense bias and exposure margin are improved.

Examples of the fluorine-substituted carboxylate anion include fluoroacetate, difluoro acetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

The content of the onium carboxylate in the composition is generally from 0.1 to 20 mass %, preferably from 0.5 to 10 mass %, more preferably from 1 to 7 mass %, based on the entire solid content of the composition.

[9] Dissolution Inhibiting Compound having a Molecular Weight of 3,000 or Less and being Capable of Decomposing by the Action of an Acid to Increase the Solubility in an Alkali Developer The dissolution inhibiting compound having a molecular weight of 3,000 or less and being capable of decomposing by the action of an acid to increase the solubility in an alkali developer (hereinafter, sometimes referred to as a "dissolution inhibiting compound") is preferably an alicyclic or aliphatic compound containing an acid-decomposable group, such as acid-decomposable group-containing cholic acid derivative described in *Proceeding of SPIE,* 2724, 355 (1996), so as not to reduce the transparency to light at 220 nm or less. Examples of the acid-decomposable group and alicyclic structure are the same as those described above in regard to the resin (A).

In the case where the actinic ray-sensitive or radiation-sensitive resin composition of the present invention is exposed by a KrF excimer laser or irradiated with an electron beam, the dissolution inhibiting compound preferably has a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The amount of the dissolution inhibiting compound added is preferably from 3 to 50 mass %, more preferably from 5 to 40 mass %, based on the solid content of the actinic ray-sensitive or radiation-sensitive resin composition.

Specific examples of the dissolution inhibiting compound are set forth below, but the present invention is not limited thereto.

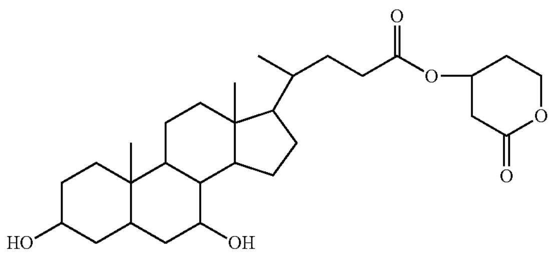

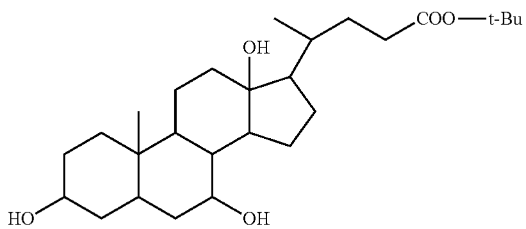

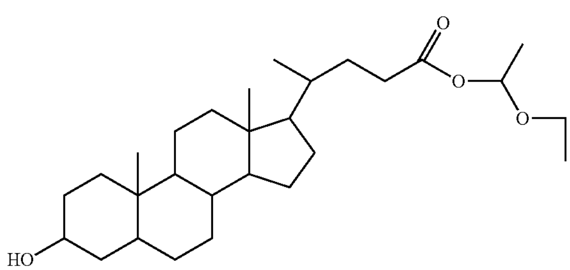

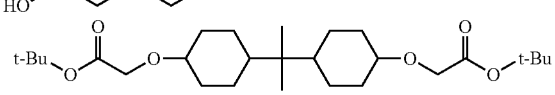

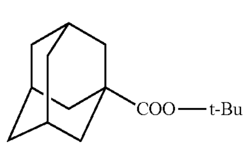

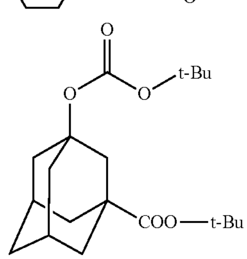

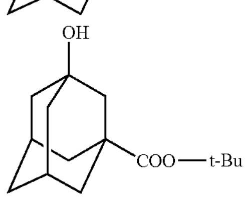

-continued

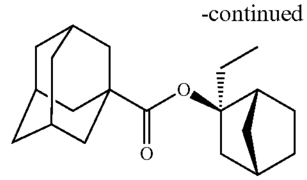

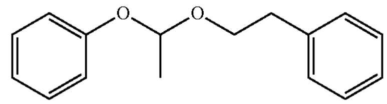

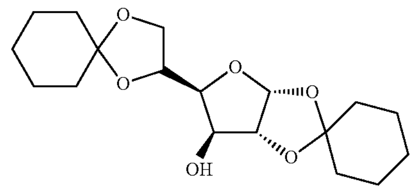 [SMILES: O[C@@H]1[C@H]2OC3(CCCCC3)O[C@H]2O[C@@H]1C1COC2(CCCCC2)O1]

[10] Other Additives

The actinic ray-sensitive or radiation-sensitive resin composition of the present invention may further contain, for example, a dye, a plasticizer, a photosensitizer, a light absorber and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

[11] Pattern Forming Method

The actinic ray-sensitive or radiation-sensitive resin composition of the present invention is preferably used in a film thickness of 30 to 250 nm, more preferably from 30 to 200 nm, from the standpoint of enhancing the resolution. Such a film thickness can be obtained by setting the solid content concentration in the actinic ray-sensitive or radiation-sensitive resin composition to an appropriate range, thereby imparting an appropriate viscosity and enhancing the coatability and film-forming property.

The entire solid content concentration in the actinic ray-sensitive or radiation-sensitive resin composition is generally from 1 to 10 mass %, preferably from 1 to 8.0 mass %, more preferably from 1.0 to 6.0 mass %.

The actinic ray-sensitive or radiation-sensitive resin composition of the present invention is used by dissolving the components above in a predetermined organic solvent, preferably in the above-described mixed solvent, filtering the solution, and applying it on a predetermined support as follows. The filter used for filtration is preferably a polytetrafluoroethylene-, polyethylene- or nylon-made filter having a pore size of 0.1 μm or less, more preferably 0.05 μm or less, still more preferably 0.03 μm or less.

For example, the actinic ray-sensitive or radiation-sensitive resin composition is applied on such a substrate (e.g., a substrate coated with silicon/silicon dioxide) as used in the production of a precision integrated circuit device, by an appropriate coating method such as spinner or coater and dried to form a photosensitive film (resist film).

The photosensitive film is irradiated with an actinic ray or radiation through a predetermined mask, then preferably baked (heated), and subjected to development and rinsing, whereby a good pattern can be obtained.

Examples of the actinic ray or radiation include infrared light, visible light, ultraviolet light, far ultraviolet light, extreme-ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm) and X-ray, with ArF excimer laser, $F_2$ excimer laser and EUV (13 nm) being preferred.

Before forming the photosensitive film, an antireflection film may be previously provided by applying on the substrate.

The antireflection film used may be either an inorganic film type such as titanium, titanium dioxide, titanium nitride, chromium oxide, carbon and amorphous silicon, or an organic film type composed of a light absorber and a polymer material. As for the organic antireflection film, there may also be used a commercially available organic antireflection film such as DUV30 Series and DUV-40 Series produced by Brewer Science, Inc. and AR-2, AR-3 and AR-5 produced by Shipley Co., Ltd.

As for the alkali developer used in the developing step, a quaternary ammonium salt typified by tetramethylammonium hydroxide is usually used, but other than this, an aqueous alkali solution of inorganic alkali, primary amine, secondary amine, tertiary amine, alcohol amine, cyclic amine or the like may also be used.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, a treatment of removing the developer or rinsing solution adhering on the pattern by a supercritical fluid may be performed.

EXAMPLES

The present invention is described in greater detail below by referring to Examples, but the present invention should not be construed as being limited thereto.

Synthesis Example 1

Synthesis of Resin (C-8)

The following Compound (1) was synthesized by the method described in International Publication No. WO07/037,213, pamphlet.

To 35.00 g of Compound (1), 150.00 g of water was added, and 27.30 g of NaOH was further added. The mixture was stirred for 9 hours under heating and refluxing conditions, made acidic by adding hydrochloric acid and then extracted with ethyl acetate. The organic layer was combined and concentrated to obtain 36.90 g of Compound (2) (yield: 93%).

$^1$H-NMR (400 MHz in $(CD_3)_2CO$): δ (ppm)=1.56-1.59 (1H), 1.68-1.72 (1H), 2.13-2.15 (1H), 2.13-2.47 (2H), 3.49-3.51 (1H), 3.68 (1H), 4.45-4.46 (1H).

To 20.00 g of Compound (2), 200 ml of $CHCl_3$ was added, and 50.90 g of 1,1,1,3,3,3-hexafluoroisopropyl alcohol and 30.00 g of 4-dimethylaminopyridine were further added. The obtained mixture was stirred and to the resulting solution, 22.00 g of 1-ethyl-3-(3-dimethylaminopropyl)carbodiimide was added. After stirring for 3 hours, the reaction solution was added to 500 ml of 1N HCl and the reaction was stopped. The organic layer was further washed with 1N HCl, then washed with water and concentrated to obtain 30.00 g of Compound (3) (yield: 85%).

$^1$H-NMR (400 MHz in $(CD_3)_2CO$): δ (ppm)=1.62 (1H), 1.91-1.95 (1H), 2.21-2.24 (1H), 2.45-2.53 (2H), 3.61-3.63 (1H), 3.76 (1H), 4.32-4.58 (1H), 6.46-6.53 (1H).

To 15.00 g of Compound (3), 300,00 g of toluene was added, and 3.70 g of methacrylic acid and 4.20 g of p-toluenesulfonic acid monohydrate were further added. The obtained mixture was refluxed for 15 hours while removing produced water by azeotropy. The reaction solution was concentrated, and the concentrate was purified by column chromatography to obtain 11.70 g of Compound (4) (yield: 65%).

$^1$H-NMR (400 MHz in $(CD_3)_2CO$): δ (ppm)=1.76-1.79 (1H), 1.93 (3H), 2.16-2.22 (2H), 2.57-2.61 (1H), 2.76-2.81 (2H), 3.73-3.74 (1H), 4.73 (1H), 4.84-4.86 (1H), 5.69-5.70 (1H), 6.12 (1H), 6.50-6.56 (1H).

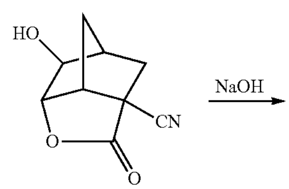

1

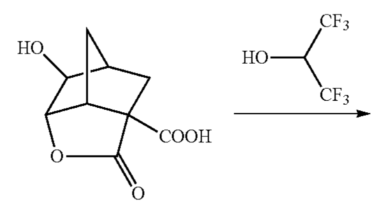

2

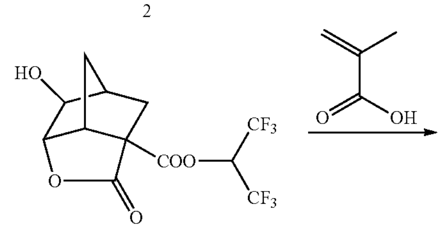

3

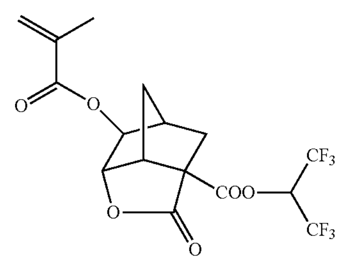

4

In a nitrogen atmosphere, 6.4 g of propylene glycol monomethyl ether acetate (PGMEA) was charged into a three-neck flask and heated to 80° C. Thereto, a solution prepared by dissolving 17.5 g of Compound (4), 4.0 g of tert-butyl methacrylate and polymerization initiator V-601 (produced by Wako Pure Chemical Industries, Ltd.) in a ratio of 5.0 mol % based on the monomers, in 58.0 g of PGMEA was added dropwise over 4 hours. After the completion of dropwise addition, the reaction was further allowed to proceed at 80° C. for 4 hours. The resulting reaction solution was left standing to cool and then added dropwise to a mixed solution of 1,300 g of methanol/150 g of distilled water over 20 minutes, and the powder precipitated was collected by filtration and dried, as a result, 15.2 g of Resin (C-8) was obtained.

The weight average molecular weight of Resin (C-8) was 8,000 in terms of standard polystyrene and the polydispersity (Mw/Mn) was 1.3.

Synthesis Example 2

Synthesis of Resin (C-94)

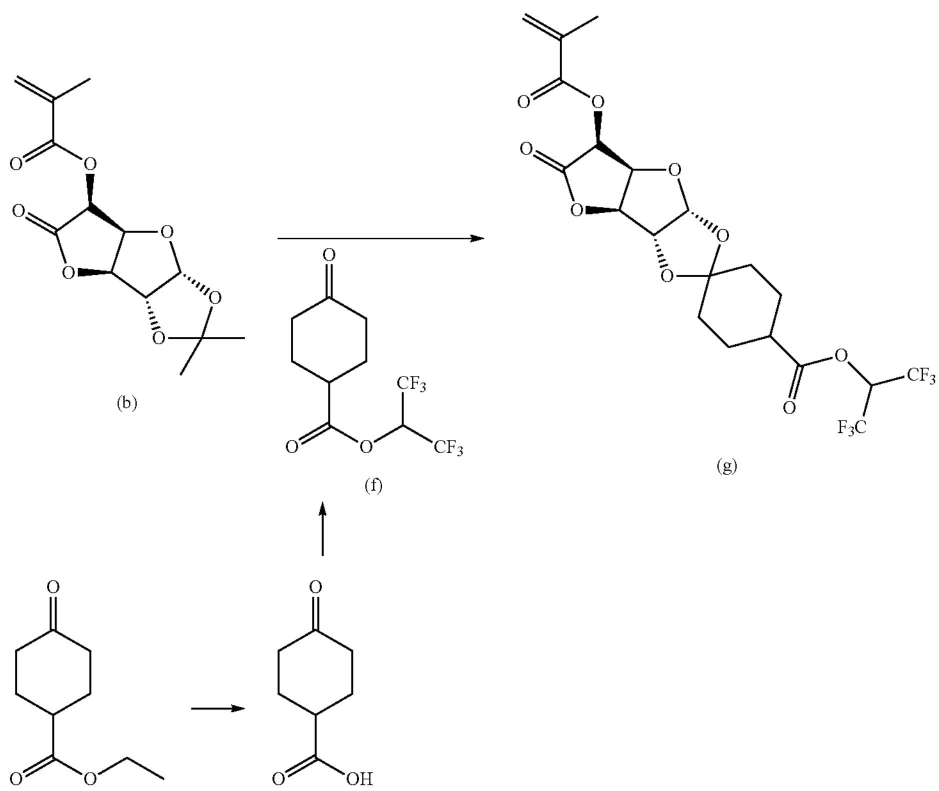

(b) (f) (g) (d) (e)

300.0 Gram of methanol was added to 150.0 g of (d) ethyl 4-cyclohexanonecarboxylate, followed by stirring, and an aqueous sodium hydroxide solution (a mixed solution containing 35.3 g of sodium hydroxide and 300.0 g of distilled water) was added dropwise at 25° C. After 3 hours, disappearance of (d) was confirmed and the reaction solution was added dropwise to 45.7 g of concentrated hydrochloric acid. Subsequently, 2,400 g of ethyl acetate was added, the resulting mixture was washed with distilled water 5 times, and the organic layer was concentrated to obtain 63 g of Compound (e).

Furthermore, 43.7 g of (e) obtained above, 394.0 g of chloroform, 77.6 g of 1,1,1,3,3,3-hexafluoro-2-propanol and 3.8 g of dimethylaminopyridine were added, followed by stirring, and 64.9 g of 1-ethyl-3-(3-dimethylaminopropyl) carbodiimide hydrochloride was added. After stirring at 25° C. for 3 hours, disappearance of (e) was confirmed, and the reaction solution was added dropwise to 1N hydrochloric acid. The resulting solution was stirred, and the organic layer was collected, washed twice with 1N hydrochloric acid and 5 times with distilled water, and then concentrated to obtain 70.0 g of Compound (f). Using 32.1 g of Compound (f) and 26.0 g of Compound (b), a reaction was performed under acidic conditions to obtain 10.0 g of the objective Compound (g).

In a nitrogen atmosphere, 10.1 g of PGMEA was charged into a three-neck flask and heated to 80° C. Thereto, a solution prepared by dissolving 36.3 g of Compound (g) and polymerization initiator V-601 (produced by Wako Pure Chemical Industries, Ltd.) in a ratio of 2.5 mol % based on the monomers, in 96.8 g of PGMEA was added dropwise over 4 hours. After the completion of dropwise addition, the reaction was further allowed to proceed at 80° C. for 4 hours. The resulting reaction solution was left standing to cool and then added dropwise to a mixed solution of 1,300 g of methanol/150 g of distilled water over 20 minutes, and the powder precipitated was collected by filtration and dried, as a result, 25.1 g of Resin (C-94) was obtained.

The weight average molecular weight of Resin (C-94) was 13,000 in terms of standard polystyrene and the polydispersity (Mw/Mn) was 1.4.

Other resins (C) shown in Tables 4 and 5 later were synthesized in the same manner.

Synthesis Example 3

Synthesis of Resin (1)

In a nitrogen atmosphere, 8.6 g of cyclohexanone was charged into a three-neck flask and heated to 80° C. Thereto, a solution prepared by dissolving 9.8 g of 2-adamantyl-isopropyl methacrylate, 4.4 g of dihydroxyadamantyl methacrylate, 8.9 g of norbornane lactone methacrylate and polymerization initiator V-601 (produced by Wako Pure Chemical Industries, Ltd.) in a ratio of 8 mol % based on the monomers, in 79 g of cyclohexanone was added dropwise over 6 hours. After the completion of dropwise addition, the reaction was further allowed to proceed at 80° C. for 2 hours. The resulting reaction solution was left standing to cool and then added dropwise to a mixed solution of 800 ml of hexane/200 ml of ethyl acetate over 20 minutes, and the powder precipitated was collected by filtration and dried, as a result, 19 g of Resin (1) was obtained. The weight average molecular weight of the obtained resin was 8,800 in terms of standard polystyrene and the polydispersity (Mw/Mn) was 1.9.

Other resins (A) shown below were synthesized in the same manner.

Structures of the acid-decomposable resin (A) used in Examples are shown below. Also, the molar ratio of repeating units (from the left in the structural formula), weight average molecular weight (Mw) and polydispersity (Mw/Mn) in each resin are shown in Table 3 below.

(1)

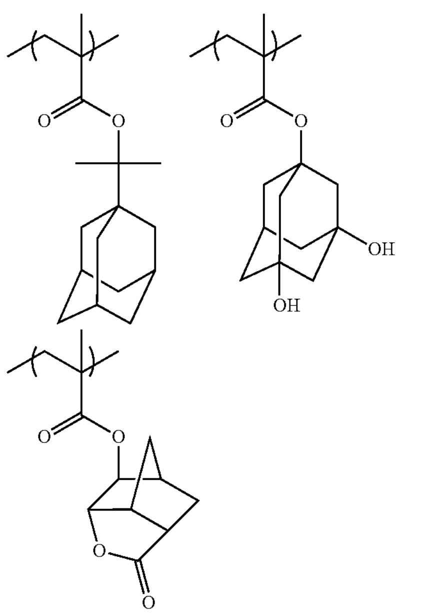

(2)

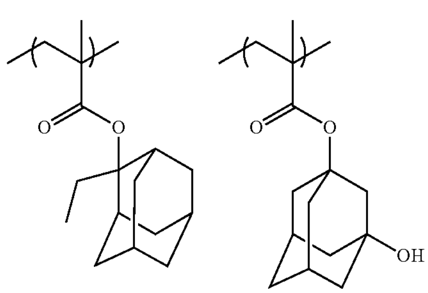

-continued

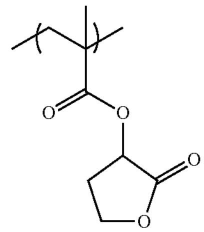

(3)

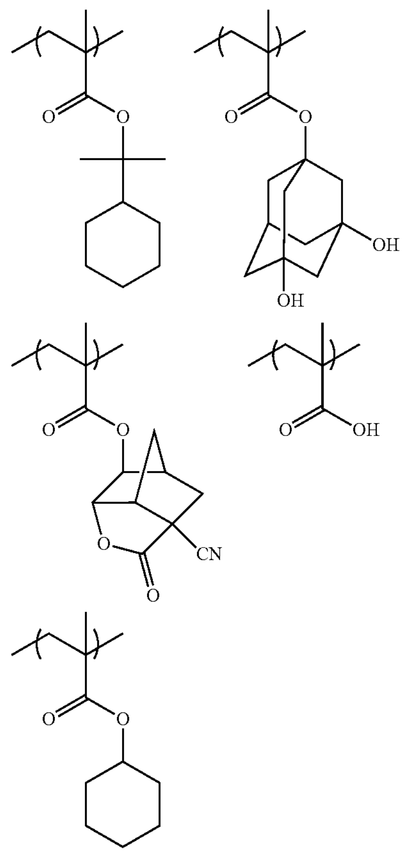

(4)

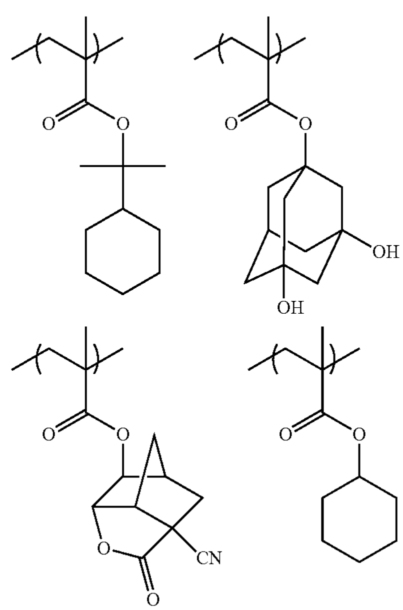

-continued
(5)
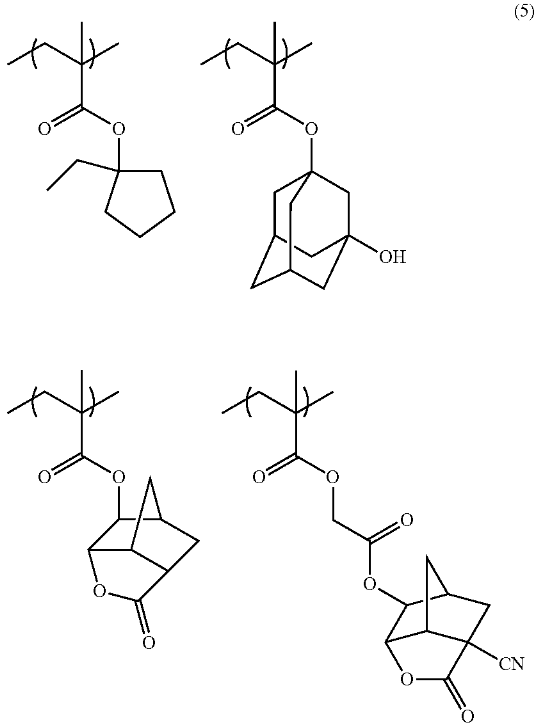
(6)
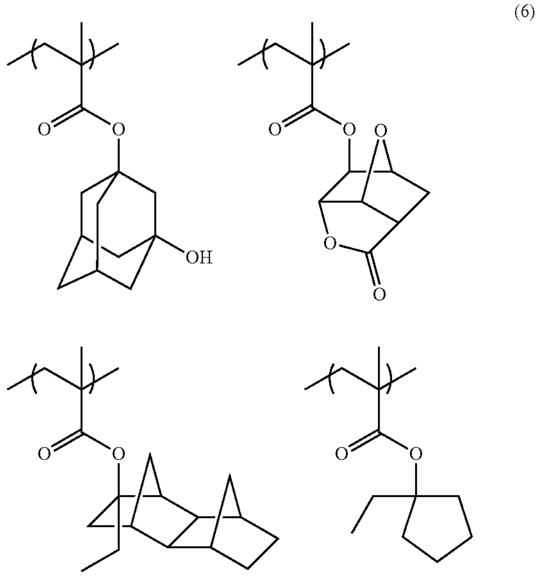
(7)
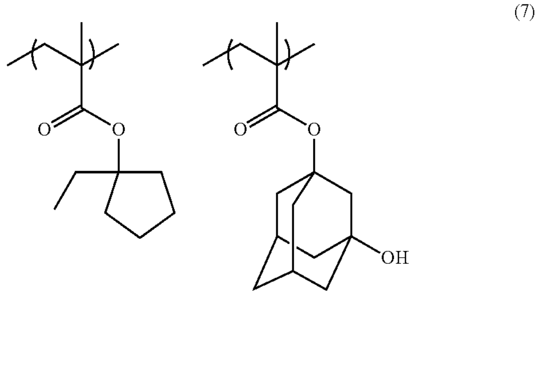
-continued
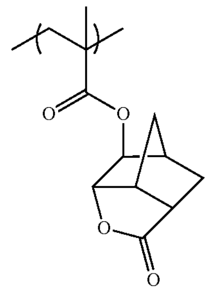
(8)
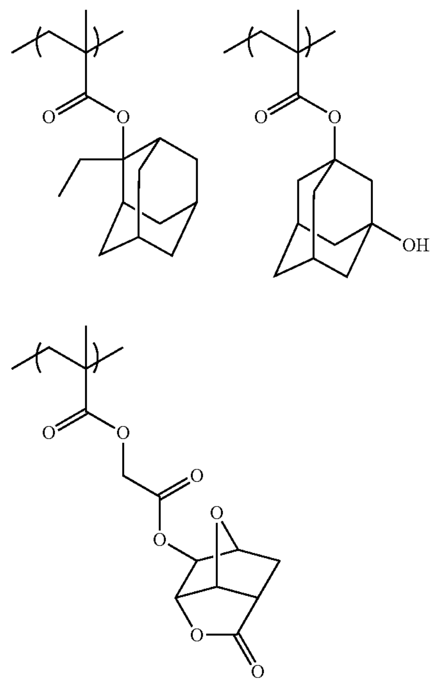
(9)
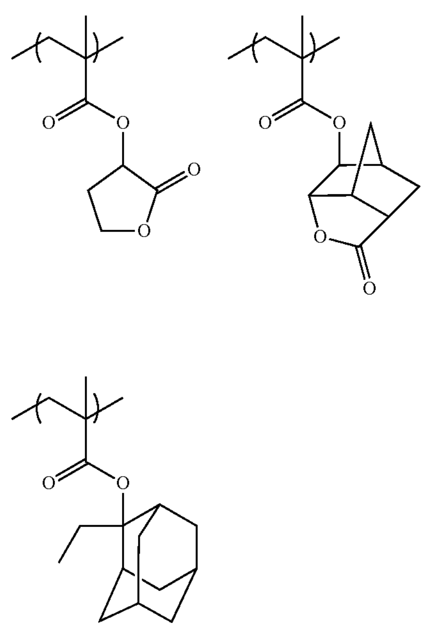

-continued
(10)
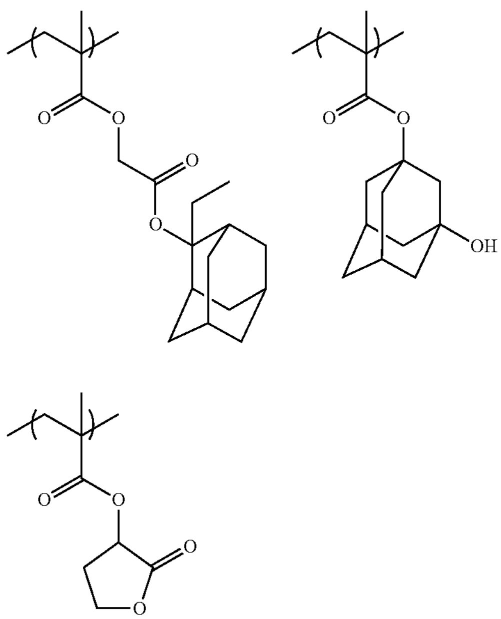
(11)
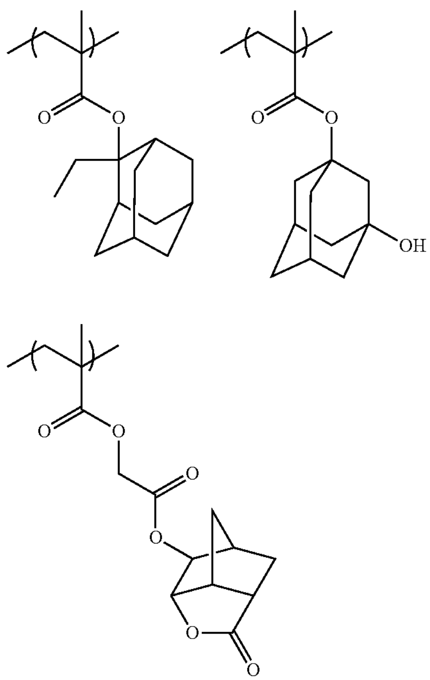
(12)
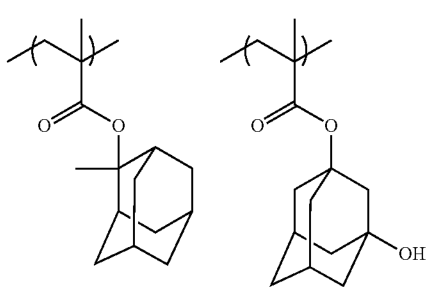
-continued
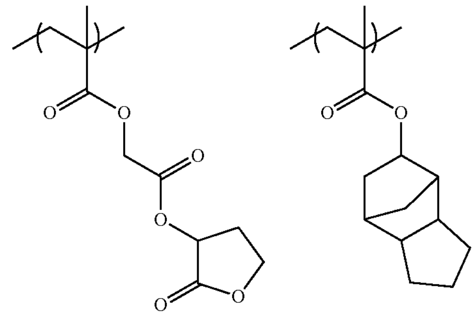
(13)
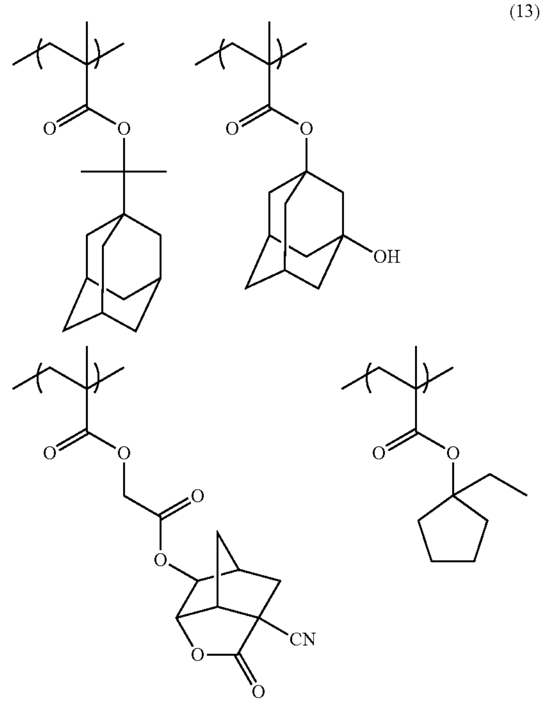
(14)
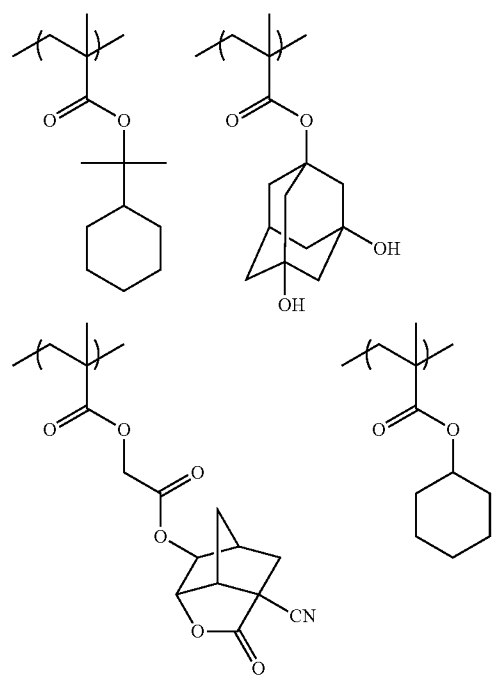

-continued
(15)
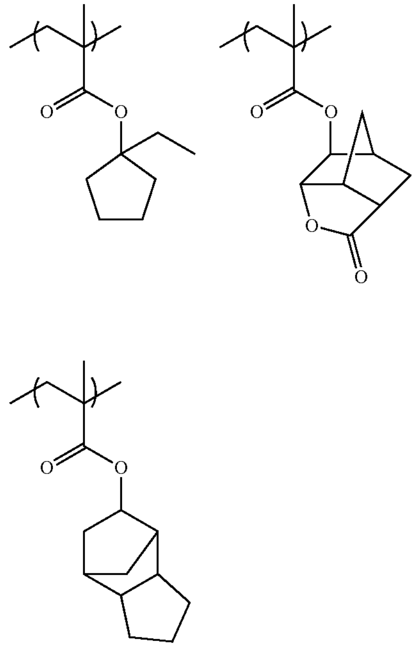
(16)
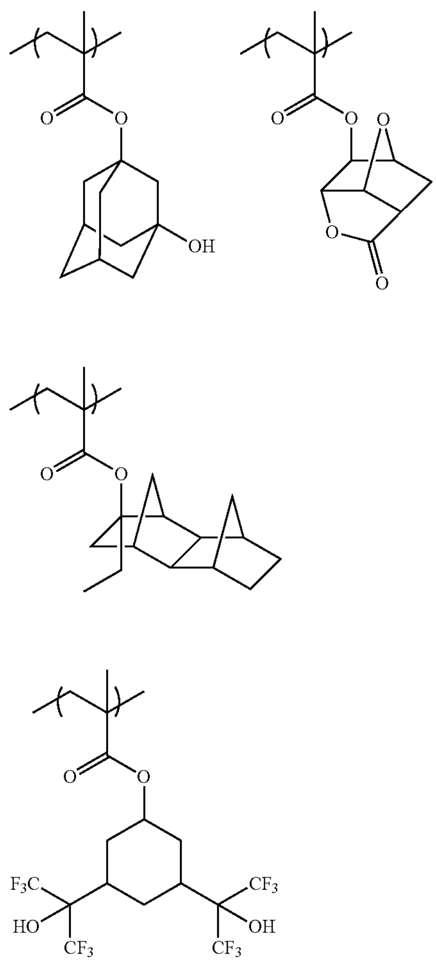
-continued
(17)
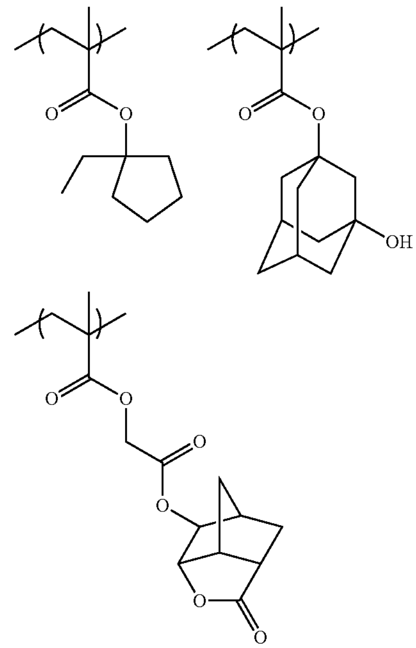
(18)
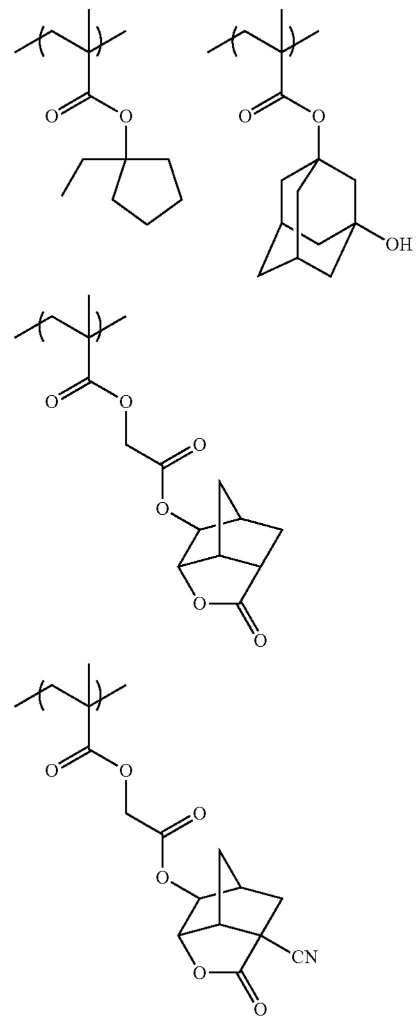

(19)
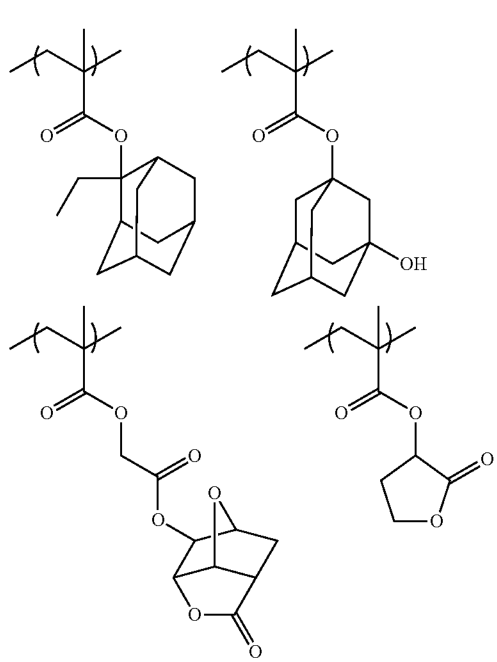
(20)
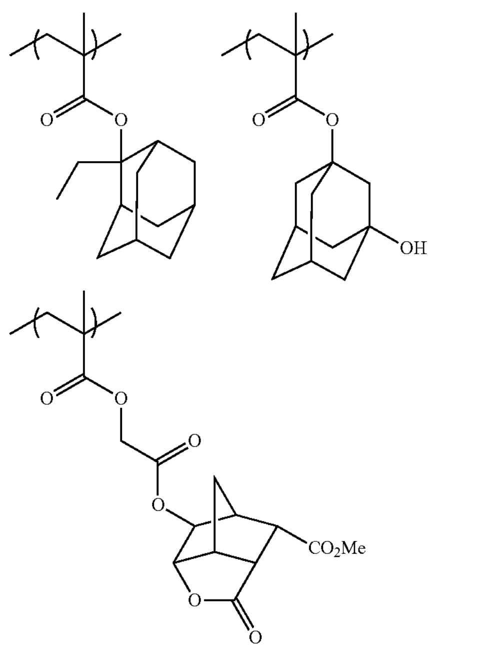
(21)
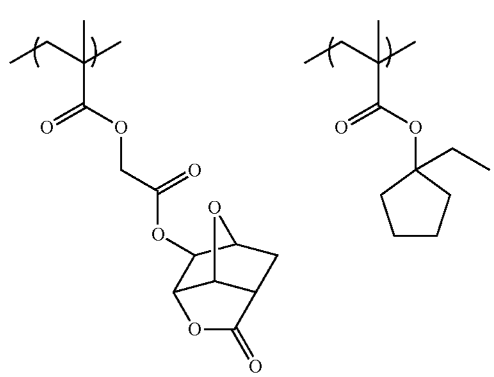
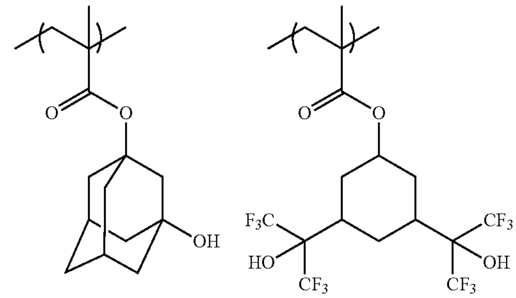
(22)
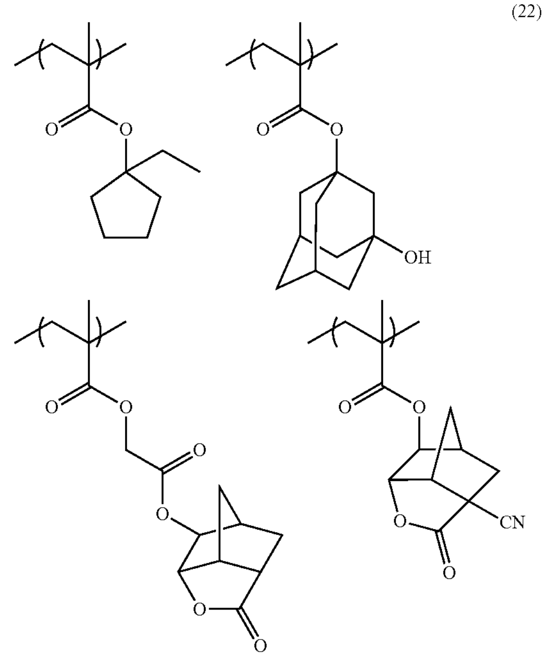
(23)
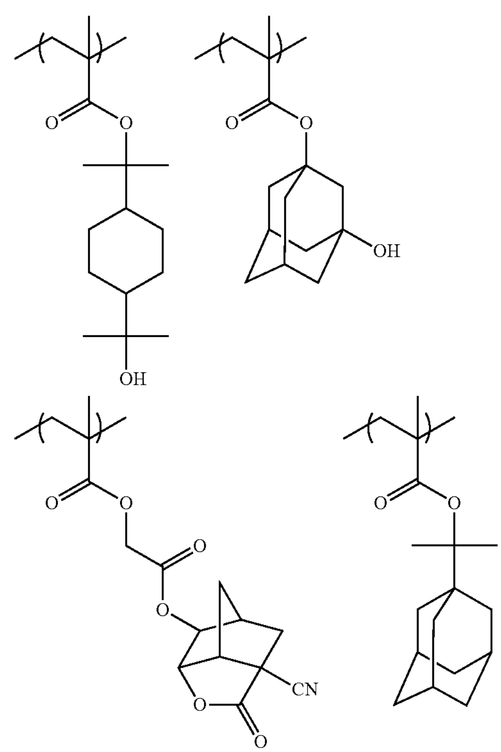

-continued
(24)
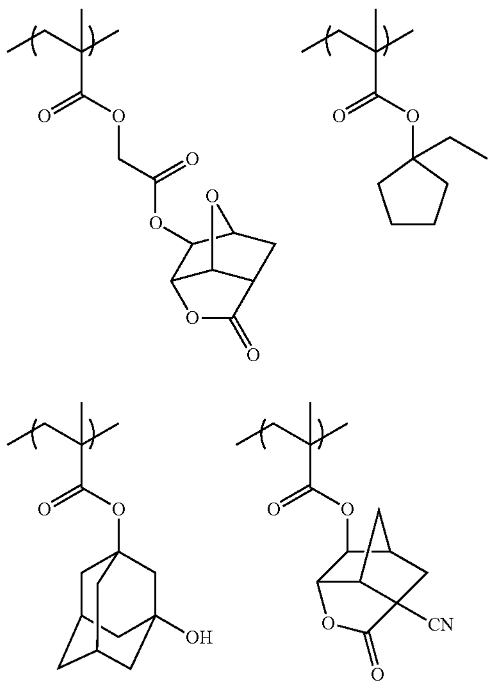
(25)
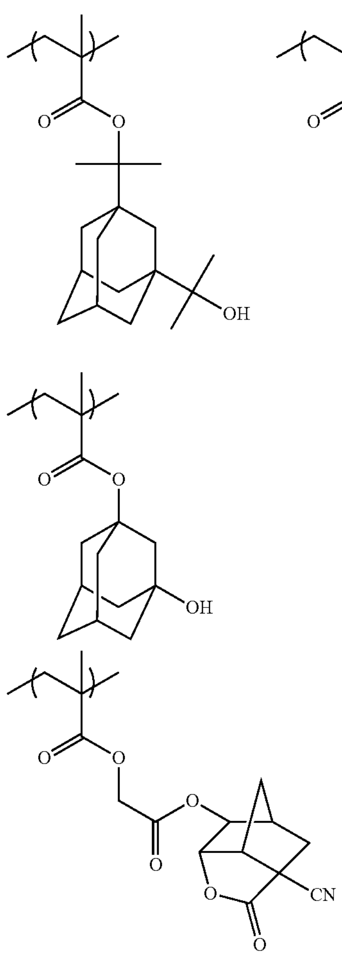
-continued
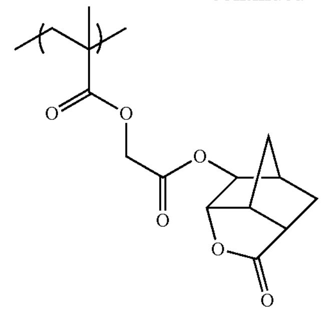
(26)
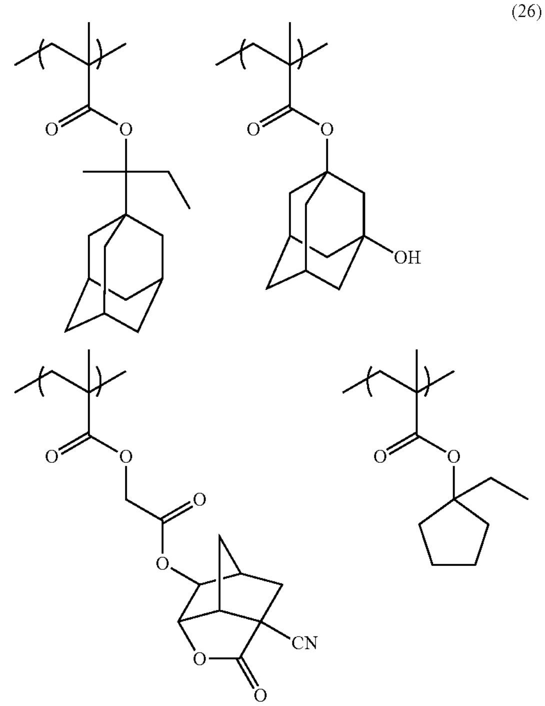
TABLE 3
| Resin (A) | Composition (molar ratio) | Mw | Mw/Mn |
|---|---|---|---|
| 1 | 50/10/40 | 8800 | 1.9 |
| 2 | 40/20/40 | 7000 | 1.6 |
| 3 | 40/10/35/5/10 | 10000 | 1.7 |
| 4 | 40/10/40/10 | 11000 | 1.8 |
| 5 | 40/15/20/25 | 8500 | 1.6 |
| 6 | 10/40/25/25 | 12000 | 1.8 |
| 7 | 50/20/30 | 6500 | 1.6 |
| 8 | 40/10/50 | 8000 | 1.7 |
| 9 | 25/25/50 | 9000 | 1.8 |
| 10 | 50/10/40 | 11000 | 1.8 |
| 11 | 50/10/40 | 8000 | 1.7 |
| 12 | 40/10/40/10 | 7000 | 1.7 |
| 13 | 20/15/35/30 | 10000 | 1.7 |
| 14 | 45/10/35/10 | 8500 | 1.7 |
| 15 | 50/40/10 | 10000 | 1.6 |
| 16 | 10/40/40/10 | 9000 | 1.8 |
| 17 | 55/10/35 | 12000 | 1.8 |
| 18 | 40/15/20/25 | 9000 | 1.7 |
| 19 | 40/15/30/15 | 7500 | 1.6 |
| 20 | 40/15/45 | 8000 | 1.6 |
| 21 | 40/40/10/10 | 9500 | 1.8 |
| 22 | 35/15/25/25 | 10000 | 1.7 |
| 23 | 20/15/45/20 | 8000 | 1.6 |
| 24 | 25/35/15/25 | 9000 | 1.8 |
| 25 | 15/30/10/33/22 | 10000 | 1.7 |
| 26 | 20/10/40/30 | 10500 | 1.6 |

<Preparation of Actinic Ray-Sensitive or Radiation-Sensitive Resin Composition>

The components shown in Tables 4 and 5 below were dissolved in a solvent to prepare a solution having a solid content concentration of 5 mass %, and the obtained solution was filtered through a polyethylene filter having a pore size of 0.1 μm to prepare an actinic ray-sensitive or radiation-sensitive resin composition (positive photosensitive resin composition). The positive photosensitive resin compositions prepared were evaluated by the following methods, and the results are shown in Tables 4 and 5. In the Tables, the resin in "Resin (2 g)" means the resin (A).

<Image Performance Test>

[Exposure Conditions: ArF Immersion Exposure]

An organic antireflection film, ARC29A (produced by Nissan Chemical Industries, Ltd.), was applied on a silicon wafer (12 inches in diameter) and baked at 205° C. for 60 seconds to form a 98 nm-thick antireflection film, and the positive photosensitive resin composition prepared above was applied thereon and baked at 120° C. for 60 seconds to form a 120 nm-thick photosensitive film. The obtained wafer was exposed through a 6% halftone mask having a 1:1 line-and-space pattern with a line width of 75 nm by using an ArF excimer laser immersion scanner (XT1250i, manufactured by ASML, NA: 0.85). As for the immersion liquid, ultrapure water was used. Thereafter, the wafer was heated at 120° C. for 60 seconds, developed with an aqueous tetramethylammonium hydroxide solution (2.38 mass %) for 30 seconds, rinsed with pure water and spin-dried to obtain a resist pattern.

[Line Edge Roughness (LER)]

With respect to the range of 5 μm edge in the longitudinal direction of the line pattern, the distance from the reference line where the edge should be present was measured at 50 points by a Critical Dimension SEM (S-8840, manufactured by Hitachi Ltd.) and after determining the standard deviation, 3σ was computed. The sample was rated A when the value was less than 5.0 nm, rated B when from 5.0 nm to less than 7.0 nm, and rated C when 7.0 nm or more. A smaller value indicates higher performance.

[Scum]

Development residue (scum) in the resist pattern with a line width of 75 nm was observed using a scanning electron microscope (S-4800, manufactured by Hitachi Ltd.), and the sample was rated A when scum was not generated at all, rated D when scum was severely generated, and rated B or C when the level of scum was therebetween.

[Evaluation of Development Defect]

Using a defect inspection apparatus, KLA 2360 (trade name), manufactured by KLA Tencor Ltd., the pattern formed as above on a silicone wafer (12 inches in diameter) was measured in a random mode by setting the pixel size of the defect inspection apparatus to 0.16 μm and the threshold value to 20 so as to detect development defects extracted from the difference produced when superposing pixel units on a reference image. The number of development defects per unit area (pieces/$cm^2$) was computed. The sample was rated A when the value was less than 0.5, rated B when from 0.5 to less than 0.7, rated C when from 0.7 to less than 1.0, and rated D when 1.0 or more. A smaller value indicates higher performance.

[Elution Amount of Generated Acid]

The positive photosensitive resin composition prepared was applied on a silicon wafer (8 inches in diameter) and baked at 120° C. for 60 seconds to form a 120 nm-thick photosensitive film. Subsequently, the entire surface of the 8-inch wafer was exposed at 30 mJ/$cm^2$ by using an ArF excimer laser exposure machine (PAS5500/1100, manufactured by ASML). The wafer was dipped in a quartz vessel having added thereto 100 mL of pure water deionized using an ultrapure water production apparatus (Milli-Q, manufactured by Nihon Millipore K.K.), and the material eluted into water was collected. The amount of this acid elution into an aqueous solution was quantitatively determined by LC-MS.

LC Apparatus: 2695 manufactured by Waters

MS Apparatus: esquire 3000 manufactured by Brucker Daltonics

The detected intensity of ion species having a mass of 299 (corresponding to nonaflate anion) was measured by the LC-MS apparatus, and the elution amount of nonafluorobutanesulfonic acid was computed. The elution amount was computed in the same manner also for other anions. The sample was rated C when the elution amount was $1.0\times10^{-10}$ mol/$cm^2$/sec or more, rated B when from $1.0\times10^{-12}$ mol/$cm^2$/sec to less than $1.0\times10^{-10}$ mol/$cm^2$/sec, and rated A when less than $1.0\times10^{-12}$ mol/$cm^2$/sec.

[Receding Contact Angle]

The positive photosensitive resin composition prepared was applied on a silicon wafer (8 inches in diameter) and baked at 120° C. for 60 seconds to form a 120 nm-thick photosensitive film. The receding contact angle of a water droplet was measured using a dynamic contact angle meter (manufactured by Kyowa Interface Science Co., Ltd.) by an expansion-contraction method. A droplet having an initial droplet size of 35 μL was suctioned at a rate of 6 μL/sec for 5 seconds, and the value when the dynamic contact angle during suction was stabilized was taken as the receding contact angle. The measurement was performed in an environment at room temperature 23±3° C. and a humidity of 45±4%. As the numerical value of this receding contact angle is larger, water can follow the scanning at a higher speed.

TABLE 4

| | Resist Composition | | | | | | Evaluation Results | | | | |
|---|---|---|---|---|---|---|---|---|---|---|---|
| | Resin (2 g) | Photo-acid Generator (mg) | Solvent (ratio by mass) | Basic Compound (mg) | Resin (C) (mg) | Surfactant (mg) | LER | Scum | Development Defect | Elution Amount of Acid | Receding Contact Angle (deg) |
| Example 1 | 1 | z55 (100) | SL-2/SL-4 (60/40) | N-5/N-1 (7/7) | C-1 (80) | W-4 (2) | A | A | B | A | 75 |
| Example 2 | 2 | z66 (100) | SL-2/SL-4 (60/40) | N-8/N-1 (7/7) | C-73 (80) | W-4 (2) | A | B | B | A | 70 |
| Example 3 | 3 | z70 (100) | SL-2/SL-4 (60/40) | N-8/N-1 (7/7) | C-48 (100) | W-4 (2) | A | A | B | A | 70 |
| Example 4 | 4 | z72 (100) | SL-2/SL-4 (60/40) | N-1 (10) | C-276 (80) | W-4 (2) | A | A | B | A | 70 |
| Example 5 | 5 | z67 (90) | SL-4/SL-2 (40/60) | N-5 (7) | C-1 (80) | W-1 (3) | A | A | A | A | 75 |
| Example 6 | 6 | z72 (110) | SL-4/SL-2 (40/60) | N-5 (7) | C-280 (80) | W-1 (3) | A | B | B | A | 70 |
| Example 7 | 7 | Y-7 (100) | SL-4/SL-2 (40/60) | N-3 (6) | C-135 (80) | W-1 (3) | A | A | B | A | 70 |
| Example 8 | 8 | z2 (100) | SL-2/SL-4/SL-6 (40/59/1) | N-6 (10) | C-270 (40) | W-3 (3) | A | B | B | A | 70 |
| Example 9 | 9 | Y-3 (100) | SL-2/SL-4/SL-6 (40/59/1) | N-1 (7) | C-124 (40) | W-3 (3) | A | A | B | A | 70 |
| Example 10 | 10 | Y-43 (100) | SL-2/SL-4/SL-6 (40/59/1) | N-2 (9) | C-8 (50) | W-3 (3) | A | B | B | A | 70 |

TABLE 4-continued

| | Resist Composition | | | | | | Evaluation Results | | | | |
|---|---|---|---|---|---|---|---|---|---|---|---|
| | Resin (2 g) | Photo-acid Generator (mg) | Solvent (ratio by mass) | Basic Compound (mg) | Resin (C) (mg) | Surfac-tant (mg) | LER | Scum | Develop-ment Defect | Elution Amount of Acid | Receding Contact Angle (deg) |
| Example 11 | 11 | z66 (100) | SL-2/SL-4 (70/30) | N-3 (6) | C-39 (80) | W-6 (3) | A | A | A | A | 75 |
| Example 12 | 12 | z38/Y-65 (40/60) | SL-2/SL-4 (70/30) | N-3 (6) | C-73 (80) | W-6 (3) | A | A | B | A | 70 |
| Example 13 | 13 | z66 (100) | SL-2/SL-4 (60/40) | N-7 (6) | C-3 (80) | W-1 (5) | A | A | A | A | 75 |
| Example 14 | 14 | Y-3 (100) | SL-3/SL-4 (30/70) | N-6 (10) | C-98 (80) | W-5 (4) | A | A | A | A | 75 |
| Example 15 | 15 | z55 (100) | SL-2/SL-4/SL-5 (40/58/2) | N-1 (7) | C-72 (20) | W-1 (4) | A | A | B | A | 70 |
| Example 16 | 16 | z72 (100) | SL-1/SL-2 (60/40) | N-4 (13) | C-79 (30) | W-6 (4) | A | B | A | A | 70 |
| Example 17 | 17 | Y-4 (110) | SL-1/SL-2 (60/40) | N-3 (6) | C-283 (80) | W-2 (3) | A | A | A | A | 75 |
| Example 18 | 18 | z68 (100) | SL-2/SL-4/SL-6 (40/59/1) | N-2 (9) | C-281 (50) | W-3 (3) | A | A | A | A | 75 |
| Example 19 | 4 | z66 (120) | SL-2/SL-4/SL-6 (40/59/1) | N-6 (10) | C-41 (60) | W-4 (5) | A | A | B | A | 70 |
| Example 20 | 5 | z66/z80 (100/25) | SL-2/SL-4 (60/40) | N-5/N-1 (7/7) | C-8 (80) | W-4 (2) | A | A | A | B | 75 |
| Example 21 | 1 | z2 (100) | SL-2/SL-4 (60/40) | N-5/N-1 (7/7) | C-1 (80) | W-4 (2) | A | B | B | B | 75 |
| Example 22 | 19 | X17 (100) | SL-2/SL-4 (60/40) | N-4 (7) | C-314 (80) | W-4 (2) | A | A | A | A | 75 |
| Example 23 | 20 | X27 (100) | SL-2/SL-4 (60/40) | N-8/N-1 (7/7) | C-301 (100) | W-4 (2) | A | B | A | B | 75 |
| Example 24 | 21 | X38 (100) | SL-2/SL-4 (60/40) | N-4 (7) | C-303 (80) | W-4 (2) | A | A | A | A | 68 |
| Example 25 | 22 | z66 (100) | SL-2/SL-4 (60/40) | N-1 (10) | C-308 (80) | W-4 (2) | A | A | A | A | 75 |
| Example 26 | 23 | z66 (100) | SL-4/SL-2 (40/60) | N-5 (7) | C-313 (80) | W-4 (2) | A | A | A | A | 75 |
| Example 27 | 24 | z2 (100) | SL-4/SL-2 (40/60) | N-5 (7) | C-300 (80) | W-1 (3) | A | B | A | B | 75 |
| Example 28 | 13 | z66 (100) | SL-2/SL-4 (60/40) | D-51 (10) | C-3 (80) | W-1 (5) | A | A | A | A | 75 |
| Example 29 | 1 | z55 (100) | SL-2/SL-4 (60/40) | D-30/D-52 (7/7) | C-1 (80) | W-4 (2) | A | B | B | A | 75 |
| Example 30 | 5 | X9 (100) | SL-2/SL-4 (60/40) | N-5/N-1 (7/7) | C-8 (80) | W-4 (2) | A | A | A | A | 75 |
| Example 31 | 5 | X9 (100) | SL-2/SL-4 (60/40) | N-5/N-1 (7/7) | C-292 (80) | W-4 (2) | A | A | A | A | 70 |
| Example 32 | 5 | z67 (90) | SL-4/SL-2 (40/60) | N-5 (7) | C-1/CP-75 (80/8) | W-1 (3) | A | A | A | A | 80 |
| Example 33 | 2 | z66 (100) | SL-2/SL-4 (60/40) | N-8/N-1 (7/7) | C-73/CP-75 (80/6) | W-4 (2) | A | B | B | A | 75 |
| Example 34 | 2 | z66 (100) | SL-2/SL-4 (60/40) | N-8/N-1 (7/7) | C-100 (80) | W-4 (2) | A | A | B | A | 70 |
| Example 35 | 3 | z55 (100) | SL-2/SL-4 (60/40) | N-8/N-1 (7/7) | C-109 (100) | W-4 (2) | A | A | B | A | 70 |
| Example 36 | 9 | Y-3 (100) | SL-2/SL-4/SL-6 (40/59/1) | N-1 (7) | C-110 (40) | W-3 (3) | A | A | B | A | 70 |
| Example 37 | 12 | z66/z80 (40/60) | SL-2/SL-4 (70/30) | N-3 (6) | C-61 (80) | W-6 (3) | A | A | B | A | 70 |
| Example 38 | 13 | z72 (100) | SL-2/SL-4 (60/40) | N-7 (6) | C-92 (80) | W-1 (5) | A | A | A | A | 75 |
| Example 39 | 17 | z80 (110) | SL-1/SL-2 (60/40) | N-3 (6) | C-94 (80) | W-2 (3) | A | A | A | A | 75 |
| Example 40 | 3 | z55 (100) | SL-2/SL-4 (60/40) | N-8/N-1 (7/7) | C-87 (100) | W-4 (2) | A | A | B | A | 70 |
| Example 41 | 7 | z88 (100) | SL-4/SL-2 (40/60) | N-3 (6) | C-125 (80) | W-1 (3) | A | A | B | A | 70 |
| Example 42 | 9 | z80 (100) | SL-2/SL-4/L-6 (40/59/1) | N-1 (7) | C-151 (40) | W-3 (3) | A | A | B | A | 70 |
| Example 43 | 11 | z38 (100) | SL-2/SL-4 (70/30) | N-3 (6) | C-145 (80) | W-6 (3) | A | A | A | A | 75 |
| Example 44 | 13 | z31 (100) | SL-2/SL-4 (60/40) | N-7 (6) | C-137 (80) | W-1 (5) | A | A | B | A | 75 |
| Example 45 | 15 | z60 (100) | SL-2/SL-4/SL-5 (40/58/2) | N-1 (7) | C-159 (40) | W-1 (4) | A | A | B | A | 70 |
| Example 46 | 4 | z80 (100) | SL-2/SL-4 (60/40) | N-1 (10) | C-154 (80) | W-4 (2) | A | A | B | A | 70 |
| Example 47 | 4 | z80 (120) | SL-2/SL-4 (60/40) | N-6 (10) | C-154 (60) | W-4 (5) | A | A | B | A | 70 |
| Example 48 | 4 | z66/z80 (100/25) | SL-2/SL-4 (60/40) | N-5/N-1 (7/7) | C-159 (80) | W-4 (2) | A | A | A | A | 75 |
| Example 49 | 5 | z66 (100) | SL-2/SL-4 (60/40) | N-5/N-1 (7/7) | C-94 (80) | W-4 (2) | A | A | A | A | 75 |
| Example 50 | 5 | z66 (100) | SL-2/SL-4 (60/40) | N-5/N-1 (7/7) | C-167 (80) | W-4 (2) | A | B | B | A | 75 |
| Example 51 | 19 | z14 (100) | SL-2/SL-4 (60/40) | D-15/N-3 (7/7) | C-113 (80) | W-6 (2) | A | A | B | A | 75 |
| Example 52 | 5 | Y-2 (100) | SL-2/SL-4 (60/40) | N-6 (10) | C-176 (80) | W-5 (2) | A | A | B | A | 75 |
| Example 53 | 25 | Y-7 (100) | SL-2/SL-4 (60/40) | D-14 (10) | C-183 (80) | W-6 (2) | A | A | B | A | 75 |
| Example 54 | 4 | z66 (100) | SL-2/SL-4 (60/40) | N-3 (10) | C-206 (80) | W-6 (2) | A | A | A | A | 80 |
| Example 55 | 21 | X38 (100) | SL-2/SL-4 (60/40) | N-4 (7) | C-303/C-6 (80/40) | W-4 (2) | A | A | A | A | 72 |
| Example 56 | 14/24 (1/1) | z66 (100) | SL-2/SL-4 (60/40) | N-1 (10) | C-308 (80) | W-4 (2) | A | A | A | A | 75 |
| Example 57 | 26 | z66 (100) | SL-2/SL-4 (60/40) | N-3 (10) | C-1/CP-64 (80/7) | W-4 (2) | A | A | A | A | 80 |
| Example 58 | 1 | z92 (100) | SL-2 (100) | N-1 (8) | C-4 (80) | W-4 (2) | A | A | A | A | 75 |
| Example 59 | 4 | z93 (100) | SL-2/L-1 (90/10) | N-3 (8) | C-72 (80) | W-4 (2) | A | A | A | A | 75 |
| Example 60 | 5 | z94 (100) | SL-2/SL-4 (90/10) | N-5 (8) | C-263 (80) | W-3 (2) | A | A | A | A | 80 |
| Example 61 | 24 | z95 (100) | SL-2/SL-4 (80/20) | N-2 (8) | C-154 (80) | W-1 (2) | A | A | A | A | 80 |
| Example 62 | 21 | z96 (100) | SL-2 (100) | N-1 (8) | C-265 (80) | W-2 (2) | A | A | A | A | 80 |
| Example 63 | 2 | z95 (100) | SL-2/SL-1 (90/10) | N-5 (8) | C-206 (80) | W-3 (2) | A | A | A | A | 80 |
| Example 64 | 1 | z93 (100) | SL-2 (100) | N-1 (8) | C-209 (80) | W-4 (2) | A | A | A | A | 75 |
| Example 65 | 4 | z93 (100) | SL-2/SL-1 (90/10) | N-3 (8) | C-72 (80) | — | A | A | A | A | 75 |

TABLE 5

| | Resist Composition | | | | | | Evaluation Results | | | | |
|---|---|---|---|---|---|---|---|---|---|---|---|
| | Resin (2 g) | Photo-acid Generator (mg) | Solvent (ratio by mass) | Basic Compound (mg) | Resin (C) (mg) | Surfactant (mg) | LER | Scum | Development Defect | Elution Amount of Acid | Receding Contact Angle (deg) |
| Comparative Example 1 | 1 | z55 (100) | SL-2/SL-4 (60/40) | N-5/N-1 (7/7) | — | W-4 (2) | C | D | C | C | 55 |
| Comparative Example 2 | 1 | z55 (100) | SL-2/SL-4 (60/40) | N-5/N-1 (7/7) | C'-1 (80) | W-4 (2) | C | D | C | B | 75 |
| Comparative Example 3 | 1 | z55 (100) | SL-2/SL-4 (60/40) | N-5/N-1 (7/7) | C'-2 (80) | W-4 (2) | C | D | D | C | 80 |
| Comparative Example 4 | 17 | Y-4 (110) | SL-1/SL-2 (60/40) | N-3 (6) | C'-1 (80) | W-2 (3) | C | D | C | B | 75 |
| Comparative Example 5 | 17 | Y-4 (110) | SL-1/SL-2 (60/40) | N-3 (6) | C'-2 (80) | W-2 (3) | C | D | D | B | 80 |

The denotations and resins (C') in Tables 4 and 5 are as follows.

The acid generators, resins (C) and components (D) are corresponding to those illustrated above as examples.

[Basic Compound]

N-1: N,N-Dibutylaniline

N-2: N,N-dihexylaniline

N-3: 2,6-Diisopropylaniline

N-4: Tri-n-octylamine

N-5: N,N-dihydroxyethylaniline

N-6: 2,4,5-Triphenylimidazole

N-7: Tris(methoxyethoxyethyl)amine

N-8: 2-[2-{2-(2,2-dimethoxy-phenoxyethoxy)ethyl}-bis-(2-methoxyethyl)]-amine

[Surfactant]

W-1: Megaface F176 (produced by Dainippon Ink & Chemicals, Inc., fluorine-containing)

W-2: Megaface R08 (produced by Dainippon Ink & Chemicals, Inc., fluorine- and silicon-containing)

W-3: Polysiloxane Polymer KP-341 (produced by Shin-Etsu Chemical Co., Ltd., silicon-containing)

W-4: Troysol S-366 (produced by Troy Chemical)

W-5: PF656 (produced by OMNOVA, fluorine-containing)

W-6: PF6320 (produced by OMNOVA, fluorine-containing)

[Solvent]

SL-1: Cyclohexanone

SL-2: Propylene glycol monomethyl ether acetate (PGMEA: 1-methoxy-2-acetoxypropane)

SL-3: Ethyl lactate

SL-4: Propylene glycol monomethyl ether (PGME: 1-methoxy-2-propanol)

SL-5: γ-Butyrolactone

SL-6: Propylene carbonate

[Resin (C')]

TABLE 6

| Resin | Composition | Mw | Mw/Mn |
|---|---|---|---|
| C'-1 | 40/40/20 | 7500 | 1.4 |
| C'-2 | 100 | 6000 | 1.3 |

It is seen from Tables 4 and 5 that the resist pattern formed using the actinic ray-sensitive or radiation-sensitive resin composition of the present invention exhibits excellent performance in terms of all of line edge roughness, scum, development defect and followability for immersion liquid at the immersion exposure.

Industrial Applicability

According to the present invention, a resist pattern improved in the elution of acid, line edge roughness, development defect and scum generation and assured of good followability for the immersion liquid at the immersion exposure can be provided. The actinic ray-sensitive or radiation-sensitive resin composition of the present invention is suitable as a positive photosensitive resin composition, particularly as a positive resist composition.

The entire disclosure of Japanese Patent Application Nos. 2008-317751 filed on Dec. 12, 2008, 2008-317752 filed on Dec. 12, 2008, 2008-317753 filed on Dec. 12, 2008, 2008-317754 filed on Dec. 12, 2008, 2009-054291 filed on Mar. 6, 2009, 2009-091616 filed on Apr. 3, 2009, 2009-122470 filed on May 20, 2009, 2009-131275 filed on May 29, 2009, 2009-167004 filed on Jul. 15, 2009 and 2009-251478 filed on Oct. 30, 2009 and U.S. Provisional Patent Application Nos. 61/122,185 filed on Dec. 12, 2008 and 61/122,166 filed on Dec. 12, 2008, from which the benefit of foreign priority has been claimed in the present application, is incorporated herein by reference, as if fully set forth.

The invention claimed is:

1. An actinic ray-sensitive or radiation-sensitive resin composition comprising:

(A) a resin capable of increasing the solubility in an alkali developer by the action of an acid, (B) a compound capable of generating an acid upon irradiation with an actinic ray or radiation, and (C) a resin which contains (c) a repeating unit having at least one polarity conversion group and has at least either a fluorine atom or a silicon atom, wherein the repeating unit (c) has at least either a fluorine atom or a silicon atom; and wherein:

(i) the repeating unit (c) is (c') repeating unit having a fluorine atom and a polarity conversion group on one side chain;

(ii) the resin (A) contains no fluorine atom and no silicon atom; and (iii) the amount of the resin (A) is 70 to 98 mass% based on the entire solids content of the resin composition.

2. The actinic ray-sensitive or radiation-sensitive resin composition as claimed in claim 1, wherein the repeating unit (c) has at least one of partial structures represented by the following formulae (KA-1) and (KB-1), and the polarity conversion group is represented by X in the partial structure represented by the formula (KA-1) or (KB-1):

(KA-1)

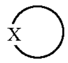

(KB-1)

$Y^1—X—Y^2$ wherein

X represents any one of a carboxylic acid ester, an acid anhydride, an acid imide, a carboxylic acid thioester, a carbonic acid ester, a sulfuric acid ester and a sulfonic acid ester, and each of $Y^1$ and $Y^2$, which may be the same or different, represents an electron-withdrawing group.

3. The actinic ray-sensitive or radiation-sensitive resin composition as claimed in claim 1, wherein the repeating unit (c) contains at least one of partial structures represented by the following formulae (KA-1-1) to (KA-1-17):

KA-1-1

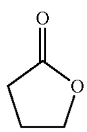

KA-1-2

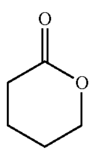

KA-1-3

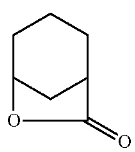

KA-1-4

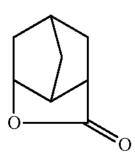

KA-1-5

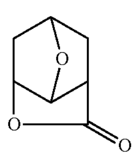

KA-1-6

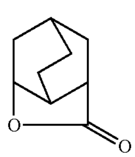

KA-1-7

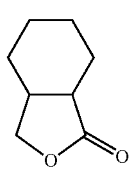

-continued

KA-1-8

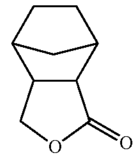

KA-1-9

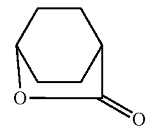

KA-1-10

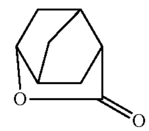

KA-1-11

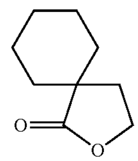

KA-1-12

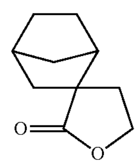

KA-1-13

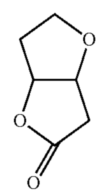

KA-1-14

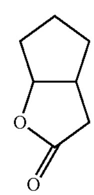

KA-1-15

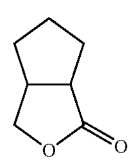

KA-1-16

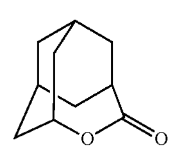

KA-1-17

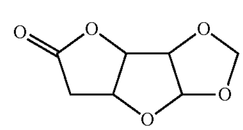

4. The actinic ray-sensitive or radiation-sensitive resin composition as claimed in claim 1, wherein the repeating unit (c) has at least one group represented by any of the following formulae (F2) to (F4) and formulae (CS-1) to (CS-3):

(F2)

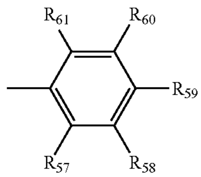

(F3)

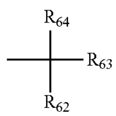

(F4)

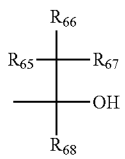

wherein each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or a fluoroalkyl group, and $R_{62}$ and $R_{63}$ may combine with each other to form a ring;

(CS-1)

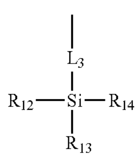

(CS-2)

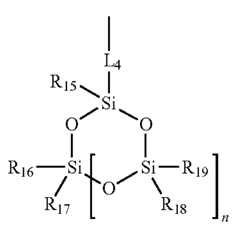

(CS-3)

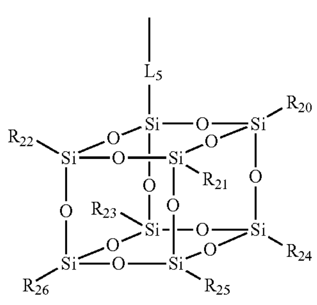

wherein each of $R_{12}$ to $R_{26}$ independently represents an alkyl group or a cycloalkyl group, each of $L_3$ to $L_5$ represents a single bond or a divalent linking group, and n represents an integer of 1 to 5.

5. The actinic ray-sensitive or radiation-sensitive resin composition as claimed in claim 1, wherein the resin (A) contains a repeating unit represented by the following formula (3):

(3)

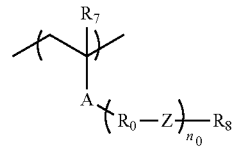

wherein

A represents an ester bond (—COO—) or an amide bond (—CONH—), $R_0$ represents a methylene group, Z represents an ester bond, $R_8$ represents a monovalent organic group having a lactone structure, $n_0$ is 1, and $R_7$ represents a hydrogen atom, a halogen atom or an alkyl group.

6. The actinic ray-sensitive or radiation-sensitive resin composition as claimed in claim 1, wherein the acid generated from the compound (B) upon irradiation with an actinic ray or radiation has a molecular weight of 300 or more and contains a monocyclic or polycyclic, alicyclic or aromatic ring which may contain a heteroatom.

7. The actinic ray-sensitive or radiation-sensitive resin composition as claimed in claim 1, wherein the content of the resin (C) is from 0.1 to 10 mass % based on the entire solid content of the actinic ray-sensitive or radiation-sensitive resin composition.

8. The actinic ray-sensitive or radiation-sensitive resin composition as claimed in claim 1, wherein with respect to a photosensitive film formed from the actinic ray-sensitive or radiation-sensitive resin composition, the receding contact angle with water is 70° or more.

9. A resist film formed from the actinic ray-sensitive or radiation-sensitive resin composition claimed in claim 1.

10. A pattern forming method comprising steps of immersion-exposing and developing the resist film claimed in claim 9.

11. The actinic ray-sensitive or radiation-sensitive resin composition as claimed in claim 1, wherein the resin (A) has substantially no aromatic group.

12. The actinic ray-sensitive or radiation-sensitive resin composition as claimed in claim 1, wherein all repeating units of the resin (A) are composed of a methacrylate-based repeating unit and an acrylate-based repeating unit.

13. The actinic ray-sensitive or radiation-sensitive resin composition as claimed in claim 6, wherein an acid generated from the compound (B) has a polycyclic alicyclic ring.

14. The actinic ray-sensitive or radiation-sensitive resin composition as claimed in claim 6, wherein the compound (B) is a compound represented by formula (I):

(I)

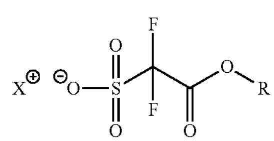

wherein $X^+$ represents an organic counter ion, and R represents an organic group.

15. The actinic ray-sensitive or radiation-sensitive resin composition as claimed in claim 6, wherein the compound (B) is a compound capable of generating an acid represented by formula (P1):

(P1)

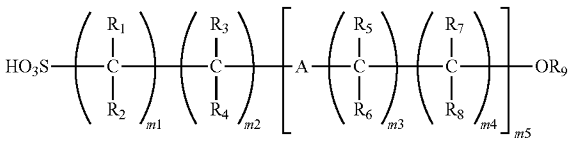

wherein each of $R_1$ to $R_8$ independently represents a hydrogen atom, an alkyl group, a cycloalkyl group, a halogen atom or a hydroxyl group, $R_9$ represents a hydrogen atom, an alkyl group, a cycloalkyl group, an alkenyl group, an acyl group or —$SO_2Rs$, A represents a heteroatom-containing divalent linking group or a single bond, Rs represents an alkyl group, a cycloalkyl group or an aryl group, each of m1 to m4 independently represents an integer of 0 to 12, provided that m3+m4>1, m5 represents an integer of 1 to 3, and when any of ml to m5 is an integer of 2 or more, a plurality of members for each of $R_1$ to $R_8$ and A may be the same or different.

16. The actinic ray-sensitive or radiation-sensitive resin composition as claimed in claim 1, wherein the polarity conversion group contained in the resin (C) is a carboxylic acid ester group or a carbonic acid ester group.

17. The actinic ray-sensitive or radiation-sensitive resin composition as claimed in claim 1, wherein the resin composition further contains a mixed solvent of two or more kinds of solvents containing propylene glycol monomethyl ether acetate.

18. The actinic ray-sensitive or radiation-sensitive resin composition as claimed in claim 17, wherein the mixed solvent contains at least one kind selected from the group consisting of γ-butyrolactone, cyclohexanone, and propylene carbonate.

19. The actinic ray-sensitive or radiation-sensitive resin composition as claimed in claim 1, wherein the resin composition further contains (D) a low molecular compound having a group capable of leaving by the action of an acid and the low molecular compound (D) has a molecular weight of 100 to 1000.

20. The actinic ray-sensitive or radiation-sensitive resin composition as claimed in claim 1, wherein the resin composition further contains an onium carboxylate.

21. An actinic ray-sensitive or radiation-sensitive resin composition comprising:

(A) a resin capable of increasing the solubility in an alkali developer by the action of an acid, (B) a compound capable of generating an acid upon irradiation with an actinic ray or radiation, and (C) a resin which contains (c) a repeating unit having at least one polarity conversion group and has at least either a fluorine atom or a silicon atom, wherein the repeating unit (c) has at least either a fluorine atom or a silicon atom;

wherein the acid generated from the compound (B) upon irradiation with an actinic ray or radiation has a molecular weight of 300 or more and contains a monocyclic or polycyclic, alicyclic or aromatic ring which may contain a heteroatom;

wherein the repeating unit (c) is (c') repeating unit having at least either a fluorine atom or a silicon atom and a polarity conversion group on one side chain.

22. The actinic ray-sensitive or radiation-sensitive resin composition as claimed in claim 21, wherein an acid generated from the compound (B) has a polycyclic alicyclic ring.

23. The actinic ray-sensitive or radiation-sensitive resin composition as claimed in claim 21, wherein the compound (B) is a compound represented by formula (I):

(I)

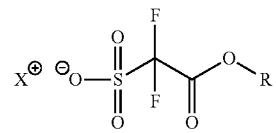

wherein $X^+$ represents an organic counter ion, and R represents an organic group.

24. The actinic ray-sensitive or radiation-sensitive resin composition as claimed in claim 21, wherein the compound (B) is a compound capable of generating an acid represented by formula (P1):

(P1)

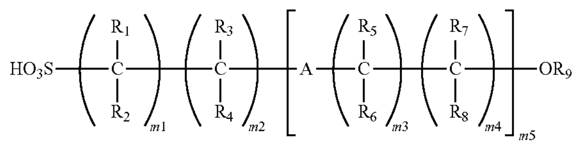

wherein each of $R_1$ to $R_8$ independently represents a hydrogen atom, an alkyl group, a cycloalkyl group, a halogen atom or a hydroxyl group, $R_9$ represents a hydrogen atom, an alkyl group, a cycloalkyl group, an alkenyl group, an acyl group or —$SO_2Rs$, A represents a heteroatom-containing divalent linking group or a single bond, Rs represents an alkyl group, a cycloalkyl group or an aryl group, each of m1 to m4 independently represents an integer of 0 to 12, provided that m3+m4>1, m5 represents an integer of 1 to 3, and when any of m1 to m5 is an integer of 2 or more, a plurality of members for each of $R_1$ to $R_8$ and A may be the same or different.

25. The actinic ray-sensitive or radiation-sensitive resin composition as claimed in claim 21, wherein a content of the resin (C) is 0.1 to 10 mass %, based on the entire solid content of the resin composition.

26. The actinic ray-sensitive or radiation-sensitive resin composition as claimed in claim 21, wherein the polarity conversion group contained in the resin (C) is a carboxylic acid ester group or a carbonic acid ester group.

27. An actinic ray-sensitive or radiation-sensitive resin composition comprising:

(A) a resin capable of increasing the solubility in an alkali developer by the action of an acid, (B) a compound capable of generating an acid upon irradiation with an actinic ray or radiation, and (C) a resin which contains (c) a repeating unit having at least one polarity conversion group and has at least either a fluorine atom or a silicon atom, wherein the repeating unit (c) has at least either a fluorine atom or a silicon atom; and wherein:

(i) the repeating unit (c) is (c') repeating unit having at least either a fluorine atom or a silicon atom and a polarity conversion group on one side chain;

(ii) the resin (A) contains no fluorine atom and no silicon atom; and (iii) the amount of the resin (A) is 70 to 98 mass % based on the entire solids content of the resin composition;

(iv) the resin A contains a repeating unit represented by formula (AI):

(AI)

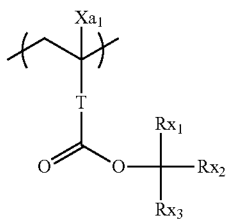

wherein $Xa_1$ represents a hydrogen atom, a methyl group which may have a substituent, or a group represented by —$CH_2$—$R_9$, wherein $R_9$ represents a hydroxyl group or a monovalent organic group, T represents a single bond or a divalent linking group, each of $Rx_1$ to $Rx_3$ independently represents a linear or branched alkyl group or a monocyclic or polycyclic cycloalkyl group, and two members out of $Rx_1$ to $Rx_3$ may combine to form a monocyclic or polycyclic cycloalkyl group; and (v) the resin (A) contains, as the repeating unit represented by formula (AI), at least two kinds of repeating units represented by formula (1) or both a repeating unit represented by formula (1) and a repeating unit represented by formula (2):

(1)

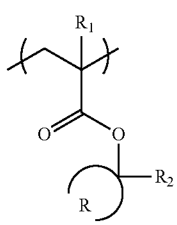

(2)

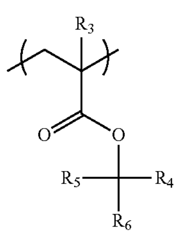

wherein each of $R_1$ and $R_3$ independently represents a hydrogen atom, a methyl group which may have a substituent, or a group represented by —$CH_2$—$R_9$, wherein $R_9$ represents a hydroxyl group or a monovalent organic group, each of $R_2$, $R_4$, $R_5$ and $R_6$ independently represents an alkyl group or a cycloalkyl group, and R represents an atomic group necessary for forming an alicyclic structure together with the carbon atom.

28. An actinic ray-sensitive or radiation-sensitive resin composition comprising:

(A) a resin capable of increasing the solubility in an alkali developer by the action of an acid, (B) a compound capable of generating an acid upon irradiation with an actinic ray or radiation, and (C) a resin which contains (c) a repeating unit having at least one polarity conversion group and has at least either a fluorine atom or a silicon atom, wherein the repeating unit (c) has at least either a fluorine atom or a silicon atom; and wherein:

(i) the repeating unit (c) is (c') repeating unit having at least either a fluorine atom or a silicon atom and a polarity conversion group on one side chain;

(ii) the resin (A) contains no fluorine atom and no silicon atom;

(iii) the amount of the resin (A) is 70 to 98 mass % based on the entire solids content of the resin composition;

(iv) the acid generated from the compound (B) upon irradiation with an actinic ray or radiation has a molecular weight of 300 or more and contains a monocyclic or polycyclic, alicyclic or aromatic ring which may contain a heteroatom; and (v) the compound (B) is a compound represented by formula (I):

(I)

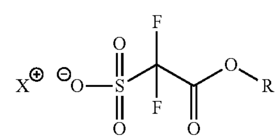

wherein $X^+$ represents an organic counter ion, and R represents an organic group.

* * * * *